US007479516B2

(12) United States Patent
Chen et al.

(10) Patent No.: US 7,479,516 B2
(45) Date of Patent: Jan. 20, 2009

(54) NANOCOMPOSITES AND METHODS THERETO

(75) Inventors: Jian Chen, Richardson, TX (US); Ramasubramaniam Rajagopal, Richardson, TX (US)

(73) Assignee: Zyvex Performance Materials, LLC, Columbus, OH (US)

( * ) Notice: Subject to any disclaimer, the term of this patent is extended or adjusted under 35 U.S.C. 154(b) by 481 days.

(21) Appl. No.: 10/850,721

(22) Filed: May 21, 2004

(65) Prior Publication Data

US 2007/0265379 A1 Nov. 15, 2007

Related U.S. Application Data

(60) Provisional application No. 60/472,820, filed on May 22, 2003.

(51) Int. Cl.
*C01B 31/02* (2006.01)

(52) U.S. Cl. ................ 524/495; 423/445 B; 423/445 R

(58) Field of Classification Search ................ 524/495, 524/445, 404; 424/443; 423/445
See application file for complete search history.

(56) References Cited

U.S. PATENT DOCUMENTS 4,663,230 A 5/1987 Tennent
5,098,771 A 3/1992 Friend
5,204,038 A 4/1993 Heeger et al.
5,281,406 A 1/1994 Stalling et al.
5,482,601 A 1/1996 Ohshima et al.
5,560,898 A 10/1996 Uchida et al.
5,578,543 A 11/1996 Tennent et al.
5,611,964 A 3/1997 Friend et al.
5,627,140 A 5/1997 Fossheim et al.
5,753,088 A 5/1998 Olk
5,824,470 A 10/1998 Baldeschwieler et al.
5,866,434 A 2/1999 Massey et al.
5,877,110 A 3/1999 Snyder et al.
5,965,470 A 10/1999 Bening et al.
5,968,650 A 10/1999 Tennent et al.
6,017,390 A 1/2000 Charych et al.
6,066,448 A 5/2000 Wohlstadter et al.
6,113,819 A 9/2000 Tennent et al.
6,140,045 A 10/2000 Wohlstadter et al.
6,146,227 A 11/2000 Mancevski
6,146,230 A 11/2000 Kim et al.
6,180,114 B1 1/2001 Yager et al.
6,187,823 B1 2/2001 Haddon et al.
6,203,814 B1 * 3/2001 Fisher et al. ................ 424/443
6,276,214 B1 8/2001 Kimura et al.
6,284,832 B1 9/2001 Foulger et al.
6,299,812 B1 10/2001 Newman et al.
6,315,956 B1 11/2001 Foulger
6,331,262 B1 12/2001 Haddon et al.
6,362,011 B1 3/2002 Massey et al.
6,368,569 B1 4/2002 Haddon et al.
6,417,265 B1 7/2002 Foulger
6,422,450 B1 7/2002 Zhou et al.
6,426,134 B1 * 7/2002 Lavin et al. .............. 428/300.1
6,430,511 B1 8/2002 Tour et al.
6,432,320 B1 8/2002 Bonsignore et al.
6,464,908 B1 10/2002 Friend et al.
6,491,789 B2 12/2002 Niu
6,524,466 B1 2/2003 Bonaventura et al.
6,531,513 B2 3/2003 Haddon et al.
6,555,945 B1 4/2003 Baughman et al.
6,569,937 B2 5/2003 Foulger et al.
6,576,341 B1 6/2003 Davey et al.
6,597,090 B1 7/2003 Mancevski
6,599,961 B1 7/2003 Pienkowski et al.
6,610,351 B2 8/2003 Shchegolikhin et al.
6,617,398 B2 9/2003 Yeager et al.
6,630,772 B1 10/2003 Bower et al.
6,634,321 B2 10/2003 Hussain et al.
6,641,793 B2 11/2003 Haddon et al.
6,645,455 B2 11/2003 Margrave et al.
6,656,763 B1 12/2003 Oglesby et al.
6,669,918 B2 12/2003 Schleier-Smith et al.
6,670,179 B1 12/2003 Mattson et al.
6,680,016 B2 * 1/2004 Wang et al. ................. 264/105
6,682,677 B2 1/2004 Lobovsky et al.
6,683,783 B1 1/2004 Smalley et al.
6,685,810 B2 2/2004 Noca et al.
6,693,055 B2 2/2004 Yoon et al.
6,695,974 B2 2/2004 Withers et al.
6,709,566 B2 3/2004 Cumings et al.

(Continued)

FOREIGN PATENT DOCUMENTS

| | | | |
|---|---|---|---|
| DE | 31 18 503 | A | 11/1982 |
| DE | 3118503 | | 11/1982 |
| EP | 0949199 | A1 | 10/1999 |
| EP | 13559169 | A2 | 11/2003 |
| EP | EP 1359121 | A2 | 11/2003 |
| EP | 1449887 | A1 | 8/2004 |
| JP | 2003096313 | | 4/2003 |
| JP | 2003138040 | | 5/2003 |
| JP | 2003292801 | | 10/2003 |
| JP | 2004002849 | | 1/2004 |

(Continued)

OTHER PUBLICATIONS

Brabec, C.J., et al.: "Photoactive blends of poly(para-phenylenevinylene) (PPV) with methanofullerenes from a novel precursor: photophysics and device performance" *Journal of Chemical Physics,* vol. 105, Jan. 31, 2001, pp. 1528-1536.

(Continued)

*Primary Examiner*—Katarzyna Wyrozebski
(74) *Attorney, Agent, or Firm*—Haynes and Boone, LLP

(57) ABSTRACT

Electrical, thermal and mechanical applications are provided for nanocomposite materials having low percolation thresholds for electrical conductivity, low percolation thresholds for thermal conductivity, or improved mechanical properties.

99 Claims, 6 Drawing Sheets

U.S. PATENT DOCUMENTS

| | | | |
|---|---|---|---|
| 6,712,864 B2 | 3/2004 | Horiuchi et al. | |
| 6,723,299 B1 | 4/2004 | Chen et al. | |
| 6,734,087 B2 | 5/2004 | Hidaka et al. | |
| 6,737,939 B2 | 5/2004 | Hoppe et al. | |
| 6,741,019 B1 | 5/2004 | Filas et al. | |
| 6,746,627 B2 | 6/2004 | Niu et al. | |
| 6,746,971 B1 | 6/2004 | Ngo et al. | |
| 6,749,712 B2 | 6/2004 | Kuper | |
| 6,756,025 B2 | 6/2004 | Colbert et al. | |
| 6,756,795 B2 | 6/2004 | Hunt et al. | |
| 6,758,891 B2 | 7/2004 | Bergemann et al. | |
| 6,762,025 B2 | 7/2004 | Cubicciotti | |
| 6,762,237 B2 | 7/2004 | Glatkowski et al. | |
| 6,764,540 B2 | 7/2004 | Taguchi | |
| 6,770,583 B2 | 8/2004 | Keller | |
| 6,770,905 B1 | 8/2004 | Buynoski et al. | |
| 6,773,954 B1 | 8/2004 | Subramanian et al. | |
| 6,774,333 B2 | 8/2004 | Hannah | |
| 6,782,154 B2 | 8/2004 | Zhao et al. | |
| 6,783,702 B2 | 8/2004 | Niu et al. | |
| 6,783,746 B1 | 8/2004 | Zhang et al. | |
| 6,790,425 B1 | 9/2004 | Smalley et al. | |
| 6,790,790 B1 | 9/2004 | Lyons et al. | |
| 6,798,127 B2 | 9/2004 | Mao et al. | |
| 6,803,840 B2 | 10/2004 | Hunt et al. | |
| 6,805,642 B2 | 10/2004 | Meyer | |
| 6,805,801 B1 | 10/2004 | Humayun et al. | |
| 6,806,996 B2 | 10/2004 | Tatsuura et al. | |
| 6,818,821 B2 | 11/2004 | Fujieda et al. | |
| 6,824,974 B2 | 11/2004 | Pisharody et al. | |
| 6,825,060 B1 | 11/2004 | Lyons et al. | |
| 6,827,918 B2 | 12/2004 | Margrave et al. | |
| 6,835,366 B1 | 12/2004 | Margrave et al. | |
| 6,841,139 B2 | 1/2005 | Margrave et al. | |
| 6,842,328 B2 | 1/2005 | Schott et al. | |
| 6,843,850 B2 | 1/2005 | Avouris et al. | |
| 6,852,410 B2 | 2/2005 | Veedu et al. | |
| 6,861,481 B2 | 3/2005 | Ding et al. | |
| 6,866,891 B2 | 3/2005 | Liebau et al. | |
| 6,872,681 B2 | 3/2005 | Niu et al. | |
| 6,875,274 B2 | 4/2005 | Wong et al. | |
| 6,875,412 B2 | 4/2005 | Margrave et al. | |
| 6,878,961 B2 | 4/2005 | Lyons et al. | |
| 6,890,654 B2 | 5/2005 | Stupp et al. | |
| 6,894,359 B2 | 5/2005 | Bradley et al. | |
| 6,896,864 B2 | 5/2005 | Clarke | |
| 6,897,009 B2 | 5/2005 | Johnson, Jr. et al. | |
| 6,899,945 B2 | 5/2005 | Smalley et al. | |
| 6,900,264 B2 | 5/2005 | Kumar et al. | |
| 6,902,658 B2 | 6/2005 | Talin et al. | |
| 6,902,720 B2 | 6/2005 | McGimpsey | |
| 6,905,667 B1 * | 6/2005 | Chen et al. | 423/447.1 |
| 6,908,261 B2 | 6/2005 | Hannay et al. | |
| 6,914,372 B1 | 7/2005 | Akiyama et al. | |
| 6,921,462 B2 | 7/2005 | Montgomery et al. | |
| 6,924,003 B2 | 8/2005 | Zhang | |
| 6,934,144 B2 | 8/2005 | Ooma et al. | |
| 6,936,322 B2 | 8/2005 | Sakakibara et al. | |
| 6,936,653 B2 * | 8/2005 | McElrath et al. | 524/496 |
| 6,946,597 B2 | 9/2005 | Sager et al. | |
| 6,949,216 B2 | 9/2005 | Brice et al. | |
| 6,955,939 B1 | 10/2005 | Lyons et al. | |
| 6,958,216 B2 | 10/2005 | Kelley et al. | |
| 6,960,425 B2 | 11/2005 | Jung et al. | |
| 6,962,092 B2 | 11/2005 | Pasquali et al. | |
| 6,969,536 B1 | 11/2005 | Tuck et al. | |
| 6,969,690 B2 | 11/2005 | Zhou et al. | |
| 6,972,467 B2 | 12/2005 | Zhang et al. | |
| 6,974,927 B2 | 12/2005 | Hannah | |
| 6,979,248 B2 | 12/2005 | Hu et al. | |
| 6,979,709 B2 | 12/2005 | Smalley et al. | |
| 6,982,174 B2 | 1/2006 | Bonnell et al. | |
| 6,989,325 B2 | 1/2006 | Uang et al. | |
| 6,991,528 B2 | 1/2006 | Hu et al. | |
| 7,008,563 B2 | 3/2006 | Smalley et al. | |
| 7,008,758 B2 | 3/2006 | Park et al. | |
| 7,015,393 B2 | 3/2006 | Weiner et al. | |
| 7,018,261 B2 | 3/2006 | Perlo et al. | |
| 7,025,840 B1 | 4/2006 | Adams | |
| 7,026,432 B2 | 4/2006 | Charati et al. | |
| 7,029,598 B2 | 4/2006 | Sato | |
| 7,029,646 B2 | 4/2006 | Margrave et al. | |
| 7,040,948 B2 | 5/2006 | Mao et al. | |
| 7,045,087 B2 | 5/2006 | Kotov | |
| 7,048,903 B2 | 5/2006 | Colbert et al. | |
| 7,048,999 B2 | 5/2006 | Smalley et al. | |
| 7,052,668 B2 | 5/2006 | Smalley et al. | |
| 7,056,452 B2 | 6/2006 | Niu et al. | |
| 7,056,455 B2 | 6/2006 | Matyjaszewski et al. | |
| 7,060,241 B2 | 6/2006 | Glatkowski | |
| 7,061,749 B2 | 6/2006 | Liu et al. | |
| 7,065,857 B2 | 6/2006 | Watanabe et al. | |
| 7,066,800 B2 | 6/2006 | Chen et al. | |
| 7,067,096 B2 | 6/2006 | Iijima et al. | |
| 7,070,753 B2 | 7/2006 | Niu et al. | |
| 7,070,810 B2 | 7/2006 | Hirsch et al. | |
| 7,070,923 B1 | 7/2006 | Loftus | |
| 7,071,287 B2 | 7/2006 | Rhine et al. | |
| 7,074,980 B2 | 7/2006 | Prato et al. | |
| 7,075,067 B2 | 7/2006 | Joyce et al. | |
| 7,081,429 B2 | 7/2006 | Kishi et al. | |
| 7,087,290 B2 | 8/2006 | Feist et al. | |
| 7,093,664 B2 | 8/2006 | Todd et al. | |
| 7,094,367 B1 | 8/2006 | Harmon et al. | |
| 7,094,467 B2 | 8/2006 | Zhang et al. | |
| 7,105,596 B2 | 9/2006 | Smalley et al. | |
| 7,112,816 B2 | 9/2006 | Schlaf et al. | |
| 7,115,305 B2 | 10/2006 | Bronikowski et al. | |
| 7,116,273 B2 | 10/2006 | Morikawa et al. | |
| 7,118,881 B2 | 10/2006 | Lee et al. | |
| 7,122,165 B2 | 10/2006 | Wong et al. | |
| 7,122,461 B2 | 10/2006 | Dubin | |
| 7,125,533 B2 | 10/2006 | Khabashesku et al. | |
| 7,126,207 B2 | 10/2006 | Mosley et al. | |
| 7,148,269 B2 | 12/2006 | Winey et al. | |
| 7,151,625 B2 | 12/2006 | Nagamura et al. | |
| 7,153,903 B1 | 12/2006 | Barraza et al. | |
| 7,160,531 B1 | 1/2007 | Jacques et al. | |
| 7,244,407 B2 * | 7/2007 | Chen et al. | 423/445 B |
| 2001/0004471 A1 | 6/2001 | Zhang | |
| 2001/0010809 A1 | 8/2001 | Haddon et al. | |
| 2001/0016283 A1 | 8/2001 | Shiraishi et al. | |
| 2001/0016608 A1 | 8/2001 | Haddon et al. | |
| 2001/0031900 A1 | 10/2001 | Margrave et al. | |
| 2001/0041160 A1 | 11/2001 | Margrave et al. | |
| 2002/0004028 A1 | 1/2002 | Margrave et al. | |
| 2002/0004556 A1 | 1/2002 | Foulger et al. | |
| 2002/0008956 A1 | 1/2002 | Niu | |
| 2002/0025490 A1 | 2/2002 | Shchegolikhin et al. | |
| 2002/0028337 A1 | 3/2002 | Yeager et al. | |
| 2002/0034757 A1 | 3/2002 | Cubicciotti | |
| 2002/0046872 A1 | 4/2002 | Smalley et al. | |
| 2002/0048632 A1 | 4/2002 | Smalley et al. | |
| 2002/0049495 A1 | 4/2002 | Kutryk et al. | |
| 2002/0053257 A1 | 5/2002 | Brice et al. | |
| 2002/0053522 A1 | 5/2002 | Cumings et al. | |
| 2002/0054995 A1 * | 5/2002 | Mazurkiewicz | 428/364 |
| 2002/0068170 A1 | 6/2002 | Smalley et al. | |
| 2002/0081397 A1 | 6/2002 | McGill et al. | |
| 2002/0081460 A1 | 6/2002 | Feist et al. | |
| 2002/0085968 A1 | 7/2002 | Smalley et al. | |
| 2002/0086124 A1 | 7/2002 | Margrave et al. | |
| 2002/0090330 A1 | 7/2002 | Smalley et al. | |
| 2002/0090331 A1 | 7/2002 | Smalley et al. | |

| | | | | |
|---|---|---|---|---|
| 2002/0092613 | A1 | 7/2002 | Kuper | |
| 2002/0094311 | A1 | 7/2002 | Smalley et al. | |
| 2002/0098135 | A1 | 7/2002 | Smalley et al. | |
| 2002/0100578 | A1 | 8/2002 | Withers et al. | |
| 2002/0102194 | A1 | 8/2002 | Smalley et al. | |
| 2002/0102196 | A1 | 8/2002 | Smalley et al. | |
| 2002/0102617 | A1 | 8/2002 | MacBeath et al. | |
| 2002/0110513 | A1 | 8/2002 | Margrave et al. | |
| 2002/0113335 | A1 | 8/2002 | Lobovsky et al. | |
| 2002/0117659 | A1 | 8/2002 | Lieber et al. | |
| 2002/0122765 | A1 | 9/2002 | Horiuchi et al. | |
| 2002/0127162 | A1 | 9/2002 | Smalley et al. | |
| 2002/0127169 | A1 | 9/2002 | Smalley et al. | |
| 2002/0136681 | A1 | 9/2002 | Smalley et al. | |
| 2002/0136683 | A1 | 9/2002 | Smalley et al. | |
| 2002/0141934 | A1 | 10/2002 | Gogotsi et al. | |
| 2002/0150524 | A1 | 10/2002 | Smalley et al. | |
| 2002/0159943 | A1 | 10/2002 | Smalley et al. | |
| 2002/0167374 | A1 | 11/2002 | Hunt et al. | |
| 2002/0167375 | A1 | 11/2002 | Hoppe et al. | |
| 2002/0172639 | A1 | 11/2002 | Horiuchi et al. | |
| 2002/0172963 | A1 | 11/2002 | Kelley et al. | |
| 2002/0176650 | A1 | 11/2002 | Zhao et al. | |
| 2002/0180077 | A1 | 12/2002 | Glatkowski et al. | |
| 2002/0180306 | A1 | 12/2002 | Hunt et al. | |
| 2002/0197474 | A1 | 12/2002 | Reynolds | |
| 2003/0001141 | A1 | 1/2003 | Sun et al. | |
| 2003/0008123 | A1 | 1/2003 | Glatkowski et al. | |
| 2003/0012723 | A1 | 1/2003 | Clarke | |
| 2003/0017936 | A1 | 1/2003 | Yoon et al. | |
| 2003/0026754 | A1 | 2/2003 | Clarke et al. | |
| 2003/0039604 | A1 | 2/2003 | Niu et al. | |
| 2003/0039860 | A1 | 2/2003 | Cheon et al. | |
| 2003/0044608 | A1 | 3/2003 | Yoshizawa et al. | |
| 2003/0052006 | A1 | 3/2003 | Noca et al. | |
| 2003/0065206 | A1 | 4/2003 | Bolskar et al. | |
| 2003/0065355 | A1 | 4/2003 | Weber et al. | |
| 2003/0066956 | A1 | 4/2003 | Gruber et al. | |
| 2003/0077515 | A1 | 4/2003 | Chen et al. | |
| 2003/0083421 | A1 | 5/2003 | Kumar et al. | |
| 2003/0086858 | A1 | 5/2003 | Niu et al. | |
| 2003/0089890 | A1 | 5/2003 | Niu et al. | |
| 2003/0089893 | A1 | 5/2003 | Niu et al. | |
| 2003/0091750 | A1 | 5/2003 | Chen | |
| 2003/0093107 | A1 | 5/2003 | Parsonage et al. | |
| 2003/0101901 | A1 | 6/2003 | Bergemann et al. | |
| 2003/0102585 | A1 | 6/2003 | Poulin et al. | |
| 2003/0108477 | A1 | 6/2003 | Keller et al. | |
| 2003/0111333 | A1 | 6/2003 | Montgomery et al. | |
| 2003/0111646 | A1 | 6/2003 | Niu et al. | |
| 2003/0111946 | A1 | 6/2003 | Talin et al. | |
| 2003/0113714 | A1 | 6/2003 | Belcher et al. | |
| 2003/0116757 | A1 | 6/2003 | Miyosha et al. | |
| 2003/0118815 | A1 | 6/2003 | Rodriguez et al. | |
| 2003/0122111 | A1 | 7/2003 | Glatkowski | |
| 2003/0129471 | A1 | 7/2003 | Kitade et al. | |
| 2003/0133865 | A1 | 7/2003 | Smalley et al. | |
| 2003/0134736 | A1 | 7/2003 | Keller | |
| 2003/0142456 | A1 | 7/2003 | Carhahan et al. | |
| 2003/0144185 | A1 | 7/2003 | McGimpsey | |
| 2003/0148086 | A1 | 8/2003 | Pfefferle et al. | |
| 2003/0151030 | A1 | 8/2003 | Gurin | |
| 2003/0153965 | A1* | 8/2003 | Supronowicz et al. | ...... 607/116 |
| 2003/0155143 | A1 | 8/2003 | Fujieda et al. | |
| 2003/0158351 | A1 | 8/2003 | Smith et al. | |
| 2003/0164477 | A1 | 9/2003 | Zhou et al. | |
| 2003/0168756 | A1 | 9/2003 | Balkus, Jr. et al. | |
| 2003/0170166 | A1 | 9/2003 | Smalley et al. | |
| 2003/0170167 | A1 | 9/2003 | Nikolaev et al. | |
| 2003/0175803 | A1 | 9/2003 | Tsionsky et al. | |
| 2003/0178607 | A1 | 9/2003 | Swager et al. | |
| 2003/0180491 | A1 | 9/2003 | Hirsch et al. | |
| 2003/0180526 | A1 | 9/2003 | Winey et al. | |
| 2003/0181328 | A1 | 9/2003 | Hwang et al. | |
| 2003/0183560 | A1 | 10/2003 | Hannah | |
| 2003/0185741 | A1 | 10/2003 | Malyjaszewski et al. | |
| 2003/0185985 | A1 | 10/2003 | Bronikowski et al. | |
| 2003/0186167 | A1 | 10/2003 | Johnson, Jr. et al. | |
| 2003/0203139 | A1 | 10/2003 | Ren et al. | |
| 2003/0205457 | A1 | 11/2003 | Choi et al. | |
| 2003/0207984 | A1 | 11/2003 | Ding et al. | |
| 2003/0209448 | A1 | 11/2003 | Hu et al. | |
| 2003/0211028 | A1 | 11/2003 | Smalley et al. | |
| 2003/0211029 | A1 | 11/2003 | Someya et al. | |
| 2003/0215816 | A1 | 11/2003 | Sundararajan et al. | |
| 2003/0216502 | A1 | 11/2003 | McElrath et al. | |
| 2003/0218224 | A1 | 11/2003 | Schlaf et al. | |
| 2003/0220518 | A1 | 11/2003 | Bolskar et al. | |
| 2003/0227243 | A1 | 12/2003 | Perlo et al. | |
| 2003/0228467 | A1 | 12/2003 | Liebau et al. | |
| 2004/0006661 | A1 | 1/2004 | Sato et al. | |
| 2004/0007528 | A1 | 1/2004 | Bakajin et al. | |
| 2004/0009114 | A1 | 1/2004 | Margrave et al. | |
| 2004/0013597 | A1 | 1/2004 | Mao et al. | |
| 2004/0016912 | A1 | 1/2004 | Bandyopadhyay et al. | |
| 2004/0018139 | A1 | 1/2004 | Mancevski | |
| 2004/0018371 | A1 | 1/2004 | Mao | |
| 2004/0018423 | A1 | 1/2004 | Bollito et al. | |
| 2004/0018543 | A1 | 1/2004 | Balavoine et al. | |
| 2004/0022677 | A1 | 2/2004 | Wohlstadter et al. | |
| 2004/0022718 | A1 | 2/2004 | Stupp et al. | |
| 2004/0023610 | A1 | 2/2004 | Hu et al. | |
| 2004/0028599 | A1 | 2/2004 | Pierard et al. | |
| 2004/0028859 | A1 | 2/2004 | LeGrande et al. | |
| 2004/0029297 | A1 | 2/2004 | Bonnell et al. | |
| 2004/0029706 | A1 | 2/2004 | Barrera et al. | |
| 2004/0034177 | A1* | 2/2004 | Chen | .......................... 525/416 |
| 2004/0035355 | A1 | 2/2004 | Avouris et al. | |
| 2004/0036056 | A1 | 2/2004 | Shea et al. | |
| 2004/0036128 | A1 | 2/2004 | Zhang et al. | |
| 2004/0038007 | A1 | 2/2004 | Kotov et al. | |
| 2004/0038251 | A1 | 2/2004 | Smalley et al. | |
| 2004/0040834 | A1 | 3/2004 | Smalley et al. | |
| 2004/0041154 | A1 | 3/2004 | Watanabe et al. | |
| 2004/0048241 | A1 | 3/2004 | Freeman et al. | |
| 2004/0051933 | A1 | 3/2004 | Tatsuura et al. | |
| 2004/0058058 | A1 | 3/2004 | Shchegolikhin et al. | |
| 2004/0058457 | A1 | 3/2004 | Huang et al. | |
| 2004/0069454 | A1 | 4/2004 | Bonsignore et al. | |
| 2004/0070326 | A1 | 4/2004 | Mao et al. | |
| 2004/0071624 | A1 | 4/2004 | Tour et al. | |
| 2004/0071949 | A1 | 4/2004 | Glatkowski et al. | |
| 2004/0076681 | A1 | 4/2004 | Dennis et al. | |
| 2004/0082247 | A1 | 4/2004 | Desai et al. | |
| 2004/0084353 | A1 | 5/2004 | Hannah | |
| 2004/0092329 | A1 | 5/2004 | Meyer | |
| 2004/0092330 | A1 | 5/2004 | Meyer et al. | |
| 2004/0101634 | A1 | 5/2004 | Park et al. | |
| 2004/0102577 | A1 | 5/2004 | Hsu et al. | |
| 2004/0105726 | A1 | 6/2004 | Hannay et al. | |
| 2004/0113127 | A1 | 6/2004 | Min et al. | |
| 2004/0115232 | A1 | 6/2004 | Giroud et al. | |
| 2004/0115501 | A1 | 6/2004 | Hinokuma et al. | |
| 2004/0120100 | A1 | 6/2004 | Reynolds III | |
| 2004/0120879 | A1 | 6/2004 | Chen et al. | |
| 2004/0121018 | A1 | 6/2004 | Grate et al. | |
| 2004/0124504 | A1 | 7/2004 | Hsu | |
| 2004/0127637 | A1 | 7/2004 | Hsu et al. | |
| 2004/0131835 | A1 | 7/2004 | Schmitt et al. | |
| 2004/0131859 | A1 | 7/2004 | Yerushalmi-Rozen et al. | |
| 2004/0131934 | A1 | 7/2004 | Sugnaux et al. | |
| 2004/0132072 | A1 | 7/2004 | Zheng et al. | |
| 2004/0132845 | A1 | 7/2004 | Rhine et al. | |
| 2004/0136893 | A1 | 7/2004 | Horiucji et al. | |
| 2004/0136894 | A1 | 7/2004 | Yoshizawa et al. | |
| 2004/0137834 | A1 | 7/2004 | Webb et al. | |

2004/0142172 A1 7/2004 Sugiyama et al.
2004/0142285 A1 7/2004 Jung et al.
2004/0146452 A1 7/2004 Fujieda et al.
2004/0146863 A1 7/2004 Pisharody et al.
2004/0149759 A1 8/2004 Moser et al.
2004/0160156 A1 8/2004 Ohata et al.
2004/0166152 A1 8/2004 Hirsch et al.
2004/0167014 A1 8/2004 Yan et al.
2004/0169151 A1 9/2004 Yagi et al.
2004/0171779 A1 9/2004 Matyjaszewski et al.
2004/0177451 A1 9/2004 Poulin et al.
2004/0179989 A1 9/2004 Height et al.
2004/0180201 A1 9/2004 Veedu et al.
2004/0180244 A1 9/2004 Tour et al.
2004/0184982 A1 9/2004 Burrington et al.
2004/0185342 A1 9/2004 Takeuchi et al.
2004/0186220 A1 9/2004 Smalley et al.
2004/0191698 A1 9/2004 Yagi et al.
2004/0194944 A1 10/2004 Hendricks et al.
2004/0197638 A1 10/2004 McElrath et al.
2004/0202603 A1 10/2004 Fischer et al.
2004/0204915 A1 10/2004 Steinthal et al.
2004/0206941 A1 10/2004 Gurin
2004/0206942 A1 10/2004 Hsu
2004/0209782 A1 10/2004 Zhang et al.
2004/0211942 A1 10/2004 Clark et al.
2004/0217336 A1 11/2004 Niu et al.
2004/0217520 A1 11/2004 Hong et al.
2004/0219093 A1 11/2004 Kim et al.
2004/0219221 A1 11/2004 Moore et al.
2004/0222080 A1 11/2004 Tour et al.
2004/0222413 A1 11/2004 Hsu et al.
2004/0223900 A1 11/2004 Khabashesku
2004/0231975 A1 11/2004 Boyd et al.
2004/0232073 A1 11/2004 Papadimitrakopoulos
2004/0232389 A1 11/2004 Elkovitch et al.
2004/0240144 A1 12/2004 Schott et al.
2004/0241080 A1 12/2004 Nagy et al.
2004/0241896 A1 12/2004 Zhou et al.
2004/0241900 A1 12/2004 Tsukamoto et al.
2004/0245085 A1 12/2004 Srinivasan et al.
2004/0247808 A1 12/2004 Cooper et al.
2004/0248282 A1 12/2004 Sobha et al.
2004/0251042 A1 12/2004 Weiner et al.
2004/0254297 A1 12/2004 Hsu et al.
2004/0257307 A1 12/2004 Bae et al.
2004/0258603 A1 12/2004 Yakobson et al.
2004/0262636 A1 12/2004 Yang et al.
2004/0265209 A1 12/2004 Colbert et al.
2004/0265755 A1 12/2004 Park et al.
2004/0266939 A1* 12/2004 Chen et al. .................. 524/496
2005/0001100 A1 1/2005 His-Wu et al.
2005/0001528 A1 1/2005 Mao et al.
2005/0002849 A1 1/2005 Mitsui et al.
2005/0002851 A1 1/2005 McElrath et al.
2005/0006623 A1 1/2005 Wong et al.
2005/0006643 A1 1/2005 Lan et al.
2005/0007680 A1 1/2005 Naganuma et al.
2005/0008919 A1 1/2005 Extrand et al.
2005/0019791 A1 1/2005 Jung et al.
2005/0022726 A1 2/2005 Wong et al.
2005/0025694 A1 2/2005 Zhang et al.
2005/0026163 A1 2/2005 Sundararajan et al.
2005/0029498 A1 2/2005 Elkovitch et al.
2005/0031525 A1 2/2005 Iijima et al.
2005/0031526 A1 2/2005 Clarke
2005/0035334 A1 2/2005 Korzhenko et al.
2005/0038171 A1 2/2005 Elkovitch et al.
2005/0038203 A1 2/2005 Elkovitch et al.
2005/0038225 A1 2/2005 Charati et al.
2005/0040370 A1 2/2005 Gurin
2005/0040371 A1 2/2005 Watanabe et al.
2005/0042450 A1 2/2005 Sano et al.
2005/0043503 A1 2/2005 Stoddart et al.
2005/0045030 A1 3/2005 Tonkovich et al.
2005/0045477 A1 3/2005 Wei et al.
2005/0045877 A1 3/2005 Lyons et al.
2005/0048697 A1 3/2005 Uang et al.
2005/0053826 A1 3/2005 Wang et al.
2005/0061451 A1 3/2005 Busnaina et al.
2005/0062034 A1 3/2005 Dubin
2005/0064647 A1 3/2005 Manabe et al.
2005/0065229 A1 3/2005 Bonnet et al.
2005/0069669 A1 3/2005 Sakaibara et al.
2005/0069701 A1 3/2005 Watanabe et al.
2005/0070654 A1 3/2005 Hsu
2005/0074390 A1 4/2005 Tour et al.
2005/0074565 A1 4/2005 Cok
2005/0074613 A1 4/2005 Tour et al.
2005/0079386 A1 4/2005 Brown Jr. et al.
2005/0081625 A1 4/2005 Chen et al.
2005/0083635 A1 4/2005 Ooma et al.
2005/0087726 A1 4/2005 Anazawa et al.
2005/0089677 A1 4/2005 Marissen et al.
2005/0089684 A1 4/2005 Barron et al.
2005/0090015 A1 4/2005 Hartmann-Thompson
2005/0090388 A1 4/2005 Kishi et al.
2005/0093425 A1 5/2005 Sugiyama
2005/0095191 A1 5/2005 Goel et al.
2005/0098204 A1 5/2005 Roscheisen et al.
2005/0098205 A1 5/2005 Roscheisen et al.
2005/0098437 A1 5/2005 Shiepe
2005/0100499 A1 5/2005 Oya et al.
2005/0100501 A1 5/2005 Veedu et al.
2005/0100960 A1 5/2005 Dai et al.
2005/0103097 A1 5/2005 Faltum et al.
2005/0107182 A1 5/2005 Meyer et al.
2005/0112052 A1 5/2005 Gu et al.
2005/0112451 A1 5/2005 Lee et al.
2005/0113669 A1 5/2005 Helfer et al.
2005/0113676 A1 5/2005 Weiner et al.
2005/0113874 A1 5/2005 Connelly et al.
2005/0113876 A1 5/2005 Weiner et al.
2005/0116214 A1 6/2005 Mammana et al.
2005/0116336 A1 6/2005 Chopra et al.
2005/0118372 A1 6/2005 Bonnet et al.
2005/0118403 A1 6/2005 Anazawa et al.
2005/0121068 A1 6/2005 Sager et al.
2005/0124020 A1 6/2005 Lee et al.
2005/0124535 A1 6/2005 McGimpsey
2005/0127030 A1 6/2005 Watanabe et al.
2005/0129573 A1 6/2005 Gabriel et al.
2005/0129858 A1 6/2005 Jin et al.
2005/0130258 A1 6/2005 Trent et al.
2005/0130296 A1 6/2005 Pisharody et al.
2005/0131163 A1 6/2005 Rhine et al.
2005/0133363 A1 6/2005 Hu et al.
2005/0133372 A1 6/2005 Zhou et al.
2005/0143508 A1 6/2005 Tyagi et al.
2005/0147373 A1 7/2005 Zhang
2005/0147553 A1 7/2005 Wong et al.
2005/0148984 A1 7/2005 Lindsay et al.
2005/0154116 A1 7/2005 Nagy et al.
2005/0155216 A1 7/2005 Cho et al.
2005/0158390 A1 7/2005 Rana et al.
2005/0158612 A1 7/2005 LeCostaouec et al.
2005/0159524 A1 7/2005 Rajagopalan et al.
2005/0160798 A1 7/2005 Pasquali et al.
2005/0161212 A1 7/2005 Leismer et al.
2005/0162606 A1 7/2005 Doane et al.
2005/0165155 A1 7/2005 Blanchet-Fincher
2005/0169798 A1 8/2005 Bradley et al.
2005/0169830 A1 8/2005 Smalley et al.
2005/0169831 A1 8/2005 Montgomery et al.
2005/0170121 A1 8/2005 Bonnet et al.
2005/0170169 A1 8/2005 Watanabe et al.

| | | | |
|---|---|---|---|
| 2005/0179594 | A1 | 8/2005 | Morikawa et al. |
| 2005/0181209 | A1 | 8/2005 | Karandikar |
| 2005/0184294 | A1 | 8/2005 | Zhang |
| 2005/0186333 | A1 | 8/2005 | Douglas |
| 2005/0186378 | A1 | 8/2005 | Bhatt |
| 2005/0186565 | A1 | 8/2005 | Malak |
| 2005/0191490 | A1 | 9/2005 | Ton-That et al. |
| 2005/0194036 | A1 | 9/2005 | Basol |
| 2005/0194038 | A1 | 9/2005 | Brabec |
| 2005/0195354 | A1 | 9/2005 | Doane et al. |
| 2005/0203203 | A1 | 9/2005 | Bonnet et al. |
| 2005/0205265 | A1 | 9/2005 | Todd et al. |
| 2005/0205860 | A1 | 9/2005 | Hsu et al. |
| 2005/0207963 | A1 | 9/2005 | Tour et al. |
| 2005/0208328 | A1 | 9/2005 | Hsu et al. |
| 2005/0209388 | A1 | 9/2005 | Hsu et al. |
| 2005/0211294 | A1 | 9/2005 | Chittibabu et al. |
| 2005/0212395 | A1 | 9/2005 | Anazawa et al. |
| 2005/0214196 | A1 | 9/2005 | Ohashi et al. |
| 2005/0214197 | A1 | 9/2005 | Gu et al. |
| 2005/0214198 | A1 | 9/2005 | Park et al. |
| 2005/0214535 | A1 | 9/2005 | Denes et al. |
| 2005/0215718 | A1 | 9/2005 | Rajagopalan et al. |
| 2005/0218045 | A1 | 10/2005 | Hannah |
| 2005/0221038 | A1 | 10/2005 | Park |
| 2005/0221473 | A1 | 10/2005 | Dubin et al. |
| 2005/0222333 | A1 | 10/2005 | Hsu |
| 2005/0224765 | A1 | 10/2005 | Hsu et al. |
| 2005/0224788 | A1 | 10/2005 | Hsu et al. |
| 2005/0226778 | A1 | 10/2005 | Houser et al. |
| 2005/0228110 | A1 | 10/2005 | Ko et al. |
| 2005/0228140 | A1 | 10/2005 | Rajagopalan et al. |
| 2005/0229334 | A1 | 10/2005 | Huang et al. |
| 2005/0229335 | A1 | 10/2005 | Hunag et al. |
| 2005/0230270 | A1 | 10/2005 | Ren et al. |
| 2005/0233158 | A1 | 10/2005 | Tour et al. |
| 2005/0234263 | A1 | 10/2005 | Prato et al. |
| 2005/0238810 | A1 | 10/2005 | Scaringe et al. |
| 2005/0239948 | A1 | 10/2005 | Haik et al. |
| 2005/0242089 | A1 | 11/2005 | Benitsch et al. |
| 2005/0242344 | A1 | 11/2005 | Lee et al. |
| 2005/0244326 | A1 | 11/2005 | Colbert et al. |
| 2005/0244991 | A1 | 11/2005 | Mao et al. |
| 2005/0245667 | A1 | 11/2005 | Harmon et al |
| 2005/0245690 | A1 | 11/2005 | Rajagopalan et al. |
| 2005/0247237 | A1 | 11/2005 | Schukat et al. |
| 2005/0250244 | A1 | 11/2005 | Li et al. |
| 2005/0254760 | A1 | 11/2005 | Sakakibara et al. |
| 2005/0255030 | A1 | 11/2005 | Tour et al. |
| 2005/0255312 | A1 | 11/2005 | Fujihara et al. |
| 2005/0257946 | A1 | 11/2005 | Kirby et al. |
| 2005/0261670 | A1 | 11/2005 | Weber et al. |
| 2005/0262674 | A1 | 12/2005 | Reynolds, III |
| 2005/0263456 | A1 | 12/2005 | Cooper et al. |
| 2005/0266605 | A1 | 12/2005 | Kawakami |
| 2005/0271648 | A1 | 12/2005 | Sugiyama |
| 2005/0271829 | A1 | 12/2005 | Kumar et al. |
| 2005/0272143 | A1 | 12/2005 | Bureau et al. |
| 2005/0272856 | A1 | 12/2005 | Cooper et al. |
| 2005/0276743 | A1 | 12/2005 | Lacombe et al. |
| 2005/0277160 | A1 | 12/2005 | Shiba et al. |
| 2005/0277201 | A1 | 12/2005 | Sivarajan et al. |
| 2005/0277675 | A1 | 12/2005 | Fuugetsu et al. |
| 2005/0279478 | A1 | 12/2005 | Draper et al. |
| 2005/0284337 | A1 | 12/2005 | Shigematsu et al. |
| 2005/0287371 | A1 | 12/2005 | Chaudhari et al. |
| 2005/0287414 | A1 | 12/2005 | Noh |
| 2006/0001013 | A1 | 1/2006 | Dupire et al. |
| 2006/0002841 | A1* | 1/2006 | Chen et al. ............... 423/447.1 |
| 2006/0003203 | A1 | 1/2006 | Wang et al. |
| 2006/0003401 | A1 | 1/2006 | Lee et al. |
| 2006/0014068 | A1 | 1/2006 | Boysen et al. |
| 2006/0014155 | A1 | 1/2006 | Hamers et al. |
| 2006/0014375 | A1 | 1/2006 | Ford et al. |
| 2006/0016552 | A1 | 1/2006 | Barbone et al. |
| 2006/0019093 | A1 | 1/2006 | Zhang et al. |
| 2006/0024503 | A1 | 2/2006 | Wong et al. |
| 2006/0025515 | A1 | 2/2006 | Scaringe et al. |
| 2006/0027499 | A1 | 2/2006 | Ajayan et al. |
| 2006/0029537 | A1 | 2/2006 | Zhang et al. |
| 2006/0032702 | A1 | 2/2006 | Linsmeier et al. |
| 2006/0033226 | A1 | 2/2006 | Wang |
| 2006/0036018 | A1 | 2/2006 | Winey et al. |
| 2006/0036045 | A1 | 2/2006 | Wilson et al. |
| 2006/0039848 | A1 | 2/2006 | Matarredona et al. |
| 2006/0040381 | A1 | 2/2006 | Zhao et al. |
| 2006/0041050 | A1 | 2/2006 | Manane et al. |
| 2006/0041104 | A1* | 2/2006 | Ait-Haddou et al. ........ 528/397 |
| 2006/0045838 | A1 | 3/2006 | Malenfant et al. |
| 2006/0047052 | A1 | 3/2006 | Barrera et al. |
| 2006/0051579 | A1 | 3/2006 | Chokai et al. |
| 2006/0052509 | A1 | 3/2006 | Saitoh et al. |
| 2006/0054488 | A1 | 3/2006 | Harmon et al. |
| 2006/0054555 | A1 | 3/2006 | Sun |
| 2006/0054866 | A1* | 3/2006 | Ait-Haddou et al. .... 252/378 R |
| 2006/0057016 | A1 | 3/2006 | Kumar et al. |
| 2006/0057053 | A1 | 3/2006 | Otobo et al. |
| 2006/0057055 | A1 | 3/2006 | Resasco et al. |
| 2006/0057290 | A1 | 3/2006 | Glatkowski et al. |
| 2006/0057361 | A1 | 3/2006 | Ounaies et al. |
| 2006/0058443 | A1 | 3/2006 | Ohashi et al. |
| 2006/0062714 | A1 | 3/2006 | Tang et al. |
| 2006/0062718 | A1 | 3/2006 | Bahr et al. |
| 2006/0062924 | A1 | 3/2006 | Horiuchi et al. |
| 2006/0062930 | A1 | 3/2006 | Kumar et al. |
| 2006/0062985 | A1 | 3/2006 | Karandikar |
| 2006/0065546 | A1 | 3/2006 | Curodeau |
| 2006/0065887 | A1 | 3/2006 | Tiano et al. |
| 2006/0067939 | A1 | 3/2006 | Buzatu et al. |
| 2006/0067941 | A1 | 3/2006 | Buzatu et al. |
| 2006/0069199 | A1 | 3/2006 | Charati et al. |
| 2006/0073089 | A1 | 4/2006 | Ajayan et al. |
| 2006/0081775 | A1 | 4/2006 | Joyce et al. |
| 2006/0081882 | A1 | 4/2006 | Malenfant et al. |
| 2006/0084742 | A1 | 4/2006 | Ishida et al. |
| 2006/0084752 | A1 | 4/2006 | Ounaies et al. |
| 2006/0094309 | A1 | 5/2006 | Holtkamp et al. |
| 2006/0098389 | A1 | 5/2006 | Liu et al. |
| 2006/0099135 | A1 | 5/2006 | Yodh et al. |
| 2006/0099715 | A1 | 5/2006 | Munoz et al. |
| 2006/0103641 | A1 | 5/2006 | Marhefka et al. |
| 2006/0104886 | A1 | 5/2006 | Wilson |
| 2006/0104890 | A1 | 5/2006 | Harutyunyan et al. |
| 2006/0110537 | A1 | 5/2006 | Huang et al. |
| 2006/0115640 | A1 | 6/2006 | Yodh et al. |
| 2006/0115711 | A1 | 6/2006 | Kim et al. |
| 2006/0116284 | A1 | 6/2006 | Pak et al. |
| 2006/0121275 | A1 | 6/2006 | Poulin et al. |
| 2006/0122284 | A1 | 6/2006 | Rodriguez-Macias et al. |
| 2006/0122614 | A1 | 6/2006 | Truckai et al. |
| 2006/0124028 | A1 | 6/2006 | Hunag et al. |
| 2006/0124613 | A1 | 6/2006 | Kumar et al. |
| 2006/0126175 | A1 | 6/2006 | Lu et al. |
| 2006/0127470 | A1 | 6/2006 | Hirsch et al. |
| 2006/0131440 | A1 | 6/2006 | Yen |
| 2006/0131570 | A1 | 6/2006 | Meng |
| 2006/0135030 | A1 | 6/2006 | Mao |
| 2006/0135281 | A1 | 6/2006 | Palumbo et al. |
| 2006/0135282 | A1 | 6/2006 | Palumbo et al. |
| 2006/0135677 | A1 | 6/2006 | Huang et al. |
| 2006/0137817 | A1 | 6/2006 | Ma et al. |
| 2006/0140847 | A1 | 6/2006 | Yang et al. |
| 2006/0142148 | A1 | 6/2006 | Ma et al. |
| 2006/0142149 | A1 | 6/2006 | Ma et al. |
| 2006/0142466 | A1 | 6/2006 | Tour et al. |
| 2006/0145194 | A1 | 7/2006 | Barron et al. |

| | | | |
|---|---|---|---|
| 2006/0148642 | A1 | 7/2006 | Ryu et al. |
| 2006/0151844 | A1 | 7/2006 | Avouris et al. |
| 2006/0154195 | A1 | 7/2006 | Mather et al. |
| 2006/0154489 | A1 | 7/2006 | Tornow et al. |
| 2006/0159612 | A1 | 7/2006 | Ziegler et al. |
| 2006/0159921 | A1 | 7/2006 | Murthy et al. |
| 2006/0162818 | A1 | 7/2006 | Kumar et al. |
| 2006/0165586 | A1 | 7/2006 | Wong et al. |
| 2006/0165896 | A1 | 7/2006 | Afzali-Ardakani et al. |
| 2006/0166003 | A1 | 7/2006 | Khabashesku et al. |
| 2006/0167139 | A1 | 7/2006 | Nelson et al. |
| 2006/0167147 | A1 | 7/2006 | Asgari |
| 2006/0171874 | A1 | 8/2006 | Khabashesku et al. |
| 2006/0172179 | A1 | 8/2006 | Gu et al. |
| 2006/0174789 | A1 | 8/2006 | Liebau et al. |
| 2006/0175581 | A1 | 8/2006 | Douglas |
| 2006/0177946 | A1 | 8/2006 | Dubin |
| 2006/0180755 | A1 | 8/2006 | Chang et al. |
| 2006/0185714 | A1 | 8/2006 | Nam et al. |
| 2006/0188723 | A1 | 8/2006 | Rowley et al. |
| 2006/0188774 | A1 | 8/2006 | Niu et al. |
| 2006/0189412 | A1 | 8/2006 | Sullivan et al. |
| 2006/0192475 | A1 | 8/2006 | Lee et al. |
| 2006/0193026 | A1 | 8/2006 | Nagamura et al. |
| 2006/0193868 | A1 | 8/2006 | Fisher et al. |
| 2006/0194058 | A1 | 8/2006 | Amlani et al. |
| 2006/0199770 | A1 | 9/2006 | Bianco et al. |
| 2006/0201880 | A1 | 9/2006 | Ziegler et al. |
| 2006/0202168 | A1 | 9/2006 | Barrera et al. |
| 2006/0205872 | A1 | 9/2006 | Elkovitch |
| 2006/0207785 | A1 | 9/2006 | Jow et al. |
| 2006/0210466 | A1 | 9/2006 | Mitra et al. |
| 2006/0211236 | A1 | 9/2006 | Bureau et al. |
| 2006/0211807 | A1 | 9/2006 | Koning et al. |
| 2006/0214262 | A1 | 9/2006 | Mosley et al. |
| 2006/0218689 | A1 | 10/2006 | Hunag et al. |
| 2006/0223991 | A1 | 10/2006 | Zhang et al. |
| 2006/0228497 | A1 | 10/2006 | Kumar et al. |
| 2006/0231399 | A1 | 10/2006 | Smalley et al. |
| 2006/0233692 | A1 | 10/2006 | Scaring et al. |
| 2006/0235113 | A1 | 10/2006 | Dorgan et al. |
| 2006/0237217 | A1 | 10/2006 | Glew |
| 2006/0237218 | A1 | 10/2006 | Glew |
| 2006/0237219 | A1 | 10/2006 | Glew |
| 2006/0237221 | A1 | 10/2006 | Glew |
| 2006/0237693 | A1 | 10/2006 | O'hara |
| 2006/0237708 | A1 | 10/2006 | Choi et al. |
| 2006/0240305 | A1 | 10/2006 | Huang |
| 2006/0249020 | A1 | 11/2006 | Tonkovich et al. |
| 2006/0249711 | A1 | 11/2006 | Niu et al. |
| 2006/0251568 | A1 | 11/2006 | Fahlman |
| 2006/0252853 | A1 | 11/2006 | Ajayan et al. |
| 2006/0257556 | A1 | 11/2006 | Dai et al. |
| 2006/0257645 | A1 | 11/2006 | Asaka et al. |
| 2006/0270777 | A1 | 11/2006 | Wise et al. |
| 2006/0270790 | A1 | 11/2006 | Comeau |
| 2006/0274049 | A1 | 12/2006 | Spath et al. |
| 2006/0275371 | A1 | 12/2006 | Dai et al. |
| 2006/0275596 | A1 | 12/2006 | Payne et al. |
| 2006/0275956 | A1 | 12/2006 | Konesky |
| 2006/0276056 | A1 | 12/2006 | Ward et al. |
| 2006/0278444 | A1 | 12/2006 | Binstead |
| 2006/0286023 | A1 | 12/2006 | Huang |
| 2006/0286297 | A1 | 12/2006 | Bronikowski et al. |
| 2006/0291142 | A1 | 12/2006 | Grigorian et al. |
| 2006/0292297 | A1 | 12/2006 | Mao et al. |
| 2006/0293434 | A1 | 12/2006 | Yodh et al. |
| 2007/0003471 | A1 | 1/2007 | Kawabata et al. |
| 2007/0004857 | A1 | 1/2007 | Barraza et al. |
| 2007/0009379 | A1 | 1/2007 | Bau et al. |

FOREIGN PATENT DOCUMENTS

| | | | |
|---|---|---|---|
| JP | 2004002850 | | 1/2004 |
| WO | WO 99/57222 | A1 | 11/1999 |
| WO | WO 00/44094 | A1 | 7/2000 |
| WO | WO01/30694 | | 5/2001 |
| WO | WO2001/30694 | | 5/2001 |
| WO | WO01/57917 | | 8/2001 |
| WO | WO2001/57917 | | 8/2001 |
| WO | WO 02/16257 | A2 | 2/2002 |
| WO | WO 02/060812 | A2 | 8/2002 |
| WO | WO 02/060812 | A3 | 8/2002 |
| WO | WO 02/076888 | A1 | 10/2002 |
| WO | WO 02/088025 | A1 | 11/2002 |
| WO | WO 02/095099 | A1 | 11/2002 |
| WO | WO2004/060988 | | 7/2004 |

OTHER PUBLICATIONS

Hirsch A.: "Functionalization of Single-Walled Carbon Nanotubes" *Angewandte Chemie. International Edition,* Verlag Chemie. Weinheim, DE, vol. 41, No. 11, 2002, pp. 1853-1859.

Ait-Haddou et al., U.S. Appl. No. 10/920,877, filed Aug. 18, 2004.

Erdogan et al., Synthesis and Mesoscopic Order of a Sugar-Coated Poly (p-phenyleneethynylene), *Marcromolcules* (2002), pp. 7863-7864, American Chemical Society.

Kim et al., "Ion-Specific Aggregation in Conjugated Polymers: Highly Sensitive and Selective Fluorescent Ion Chemosensors", *Angew. Chem. Int. Ed.* (2000), pp. 3868-3872, Wiley-VCH Verlag GmbH.

Moroni, M. et al., "Rigid Rod Conjugated Polymers for Nonlinear Optics. 3. Intramolecular H Bond Effects on Poly(pheyleneethynylene) Chains", *Macromolecules*, (1997), pp. 1964-1972, vol. 30, American Chemical Society.

Shultz, D. et al., "A Modified Procedure for Songogashira Couplings: Synthesis and Characterization of a Bisporphyrin, 1,1-Bis[zinc(II) 5'-ethynyl-10', 15',20'-trimesityloporphyrinyl]methylenecyclohexane", *J. Org. Chem.,* (1998), pp. 4034-4038, vol. 63, American Society.

Sonogashira, K., et al., "A Convenient Synthesis of Acetylenes: Catalytic Substitutions of Acetylenic Hydrogen With Bromoalkenes, Iodoarenes, and Bromopyridines", *Tetrahedron Letters*, (1975), pp. 4467-4470, No. 50., Pergamon Press, GB.

Zhou, Q., et al. "Fluorescent Chemosensors Based on Energy Migration in Conjugated Polymers: The Molecular Wire Approach to Increased Sensitivity", *J. Am. Chem. Soc.,* (1995), pp. 12593-12602, vol. 117, American Chemical Society.

Carbon Nanotube Functionalization features On-line Product Display, Zyvex Dried Film, (2003), Zyvex Corporation. (http://www.zyvex.com/products/zdf_features.html.

Carbon Nanotube Functionalization benefits On-line Product Display, Zyvex Dried Film, (2003), Zyvex Corporation. (http://www.zyvex.com/products/zdf_benefits.html.

Chinese Office Action and translation thereof from Republic of China Application No. 03136785.2 dated Dec. 17, 2004.

Chinese Office Action and translation thereof from Republic of China Application No. 03136786.0, dated Jan. 21, 2005.

Translation of Japanese office Action from Japanese Application JP2003-127114, dated Nov. 30, 2004.

Translation of Japanese office Action from Japanese Application JP2003-127132, dated Nov. 30, 2004.

Korean Office Action and translation thereof from Korean Application 10-2003-0029184, dated Apr. 30, 2005.

Notice of Preliminary Rejection, dated Aug. 19, 2005, issued by The Korean Intellectual Property Office reguarding Patent Application No. 10-2003-0029185.

Written Opinion of the International Searching Authority Issued Jan. 14, 2005 in connection with International Application No. PCT/US2004/016226.

International Search Report Issued Jan. 14, 2005 in connection with International Application No. PCT/US2004/016226.

Andreas Hirsch; *Functionalization of Single-Walled Carbon Nanotubes;* Angew. Chem. Int. Ed. 2002, 41, No. 11; pp. 1853-1859.
C.J. Brabec, A. Cravino; G. Zerza, N.S. Sariciftci, R. Kiebooms, D. Vanderzande, J.C. Hummelen; *Photoactive Blends of Poly(para-phenylenevinylene) (PPV) with Methanofullerenes from a Novel Precursor: Photophysics and Device Performance*; J. Phys. Chem. B 2001, 105, pp. 1528-1536.
Ajayan, P.M., "Nanotubes from Carbon", *Chem. Rev,* (1999), pp. 1787-1799, vol. 99, American Chemical Society.
Ajayan, P. et al., "Single-Walled Carbon Nanotube-Polymer Composites: Strength and Weakness", *Adv. Mater*., (2000), vol. 12, No. 10, pp. 750-753, Wiley-VCH Verlag GmbH.
Andrews, R. et al., "Nanotube Composite Carbon Fibers", *Appl. Phys. Lett*, (1999), pp. 1329-1331, vol. 75, No. 9, American Institute of Physics.
Andrews et al., "Fabrication of Carbon Multiwall Nanotube/Polymer Composites by Shear Mixing", *Macromolecular Materials and Engineering*, (2002), pp. 395-403, vol. 287, No. 6, Wiley-VCH Verlag GmbH.
Bahr, J. et al., "Dissolution of Small Diameter Single-Wall Carbon Nanotubes in Organic Solvents?", *Chem. Commun.* (2001), pp. 193-194, The Royal Society of Chemistry.
Barraza et al., "SWNT-Filled Thermoplastic and Elastomeric Composites Prepared by Miniemulsion Polymerization", *Nano Letters,* (2002), pp. 797-802, vol. 2, No. 8, American Chemical Society.
Baughman, R. et al., "Carbon Nanotube Actuators", *Science,* (1999), pp. 1340-1344, vol. 284, American Association for the Advancement of Science.
Baughman et al., "Carbon Nanotubes—the Route Toward Applications", *Science*, (2002), pp. 787-792, vol. 297, American Association for the Advancement of Science.
Berber et al., "Unusually High Thermal Conductivity of Carbon Nanotubes", *Physical Review Letters*, (2000), pp. 4613-4616, vol. 84, No. 20, The American Physical Society.
Biercuk et al., "Carbon Nanotube Composites for Thermal Management",*Applied Physics Letters*, (2002), pp. 2767-2769, vol. 80, No. 15, American Institute of Physics.
Blanchet et al., "Polyaniline Nanotube Composites: A High-Resolution Printable Conductor", *Applied Physics Letters,* (2003), pp. 1290-1292, vol. 82, No. 8, American Institute of Physics.
Boul, P. et al., "Reversible Sidewall Functionalization of Buckytubes", *Chemical Physics Letters*, (1999), pp. 367-372, vol. 310, Elsevier Science B.V.
Bunz, U "Poly(aryleneethynylene)s: Syntheses, Properties, Structures, and Applications", *Chem. Rev.,* (2000), pp. 1605-1644, vol. 100, American Chemical Society.
Calvert, P., "A Recipe for Strength," *Nature*, (1999), pp. 210-211, vol. 399, Macmillan Magazines Ltd.
U.S. Appl. No. 60/377,856, filed May 2, 2002, Chen.
U.S. Appl. No. 60/377,920, filed May 2, 2002, Chen et al.
U.S. Appl. No. 10/318,730, filed Dec. 13, 2002, Chen et al.
U.S. Appl. No. 60/472,820, filed May 22, 2003, Chen et al.
U.S. Appl. No. 10/895,161, filed Jul. 20, 2004, Chen et al.
U.S. Appl. No. 10/894,738, filed Jul. 20, 2004, Chen et al.
Chen, J. et al., "Solution Properties of Single Walled Carbon Nanotubes", *Science*, (1998), pp. 95-98, vol. 282, American Association for the Advancement of Science.
Chen, J. et al., "Disolution of Full-Length Single-Walled Carbon Nanotubes", *J. Phys. Chem. B*, (2001), pp. 2525-2528, vol. 105, American Chemical Society.
Chen et al., "Mechanochemical Synthesis of Boron Nitride Nanotubes", *Materials Science Forum*, (1999), pp. 173-177; vols. 312-314 and *Journal of Metastable and Nanocrystalline Materials* , (1999), pp. 173-177, vol. 2-6, Trans Tech Publications.
Chen et al., "Noncovalent Engineering of Carbon Nanotube Surfaces by Rigid, Functional Conjugated Polymers", *Journal of American Chemical Society,* (2000), pp. 9034-9035, vol. 124, No. 131, American Chemical Society.
Chen et al., Supporting Information for "Noncovalent Engineering of Carbon Nanotube Surface by Rigid, Functional Conjugated Polymers", (2002), pp. S1-S7.
Chen, R. et al., "Noncovalent Sidewall Functionalization of Single-Walled Carbon Nanotubes for Protein Immobilization", *J. Am. Chem. Soc.,* (2001) pp. 3838-3839, vol. 123, American Chemical Society.
Chen, J. et al. "Noncovalent Engineering of Carbon Nanotube Surfaces", Nanotech 2004 Conference Technical Program Abstract, Summary and Power Point Slides, Mar. 7-11, 2004, Boston, 2004 NSTI Nanotechnology Confernce and Trade Show.
Chen, J., Presentation at 227$^{th}$ ACS National Meeting entitled "Noncovalent Engineering of Carbon Nanotube Surfaces", Anaheim, California, Mar. 31, 2004. (subject matter was identical to above entry).
Coleman et al., "Percolation-Dominated Conductivity in a Conjugated-Polymer-Carbon-Nanotube Composite", *Physical Review B*, (1998), pp. R7492-R7495, vol. 58, No. 12, The American Physical Society.
Dalton et al. "Selective Interaction of a Semiconjugated Organic Polymer wih Single-Wall Nanotubes", *J. Phys. Chem. B.,* (2000), pp. 10012-10016, vol. 104, No. 43, American Chemical Society.
Dresselhaus, M.S., et al., "Applications of Carbon Nanostructure", *Science of Fullerenes and Carbon Nanotubes,* (1996), pp. 902-905, Academic Press.
Ebbesen, T., "Cones and Tubes: Geometry in the Chemistry of Carbon", *Acc. Chem. Res*., (1998), pp. 558-566, vol. 31, American Chemical Society.
Garboczi et al., "Geometrical Percolation Threshold of Overlapping Ellipsoids", *Physical Review E*, (1995), pp. 819-828, vol. 52, No. 1, The American Physical Society.
Georgakilas, V. et al., "Organic Functionalization of Carbon Nanotubes", *J. Am. Chem. Soc*., (2002), pp. 760-761, vol. 124, No. 5, , American Chemical Society.
Han, W. et al., "Synthesis of Boron Nitride Nanotubes from Carbon Nanotubes by a Substitution Reaction", *Applied Physics Letters*, (1998), pp. 3085-3087, vol. 73, No. 21, American Institute of Physics.
Harper, C., "Appendix D—Electrical Properties of Resins and Compounds", *Handbook of Plastics, Elastomers, and Composites, 4$^{th}$ Edition*, (2002), pp. 861-863, McGraw-Hill.
Journet, C. et al., "Production of Carbon Nanotubes", *Appl. Phys. A*, (1998), pp. 1-9, vol. 67, Springer-Verlag.
Journet, C. et al., "Large-Scale Production of Single-Walled Carbon Nanotubes by the Electric-Arc Technique", *Nature*, (1997), pp. 756-758, vol. 388, Nature Publishing Group.
Kilbride et al., "Experimental Observation of Scaling Laws for Alternating Current and Direct Current Conductivity in Polymer-Carbon Nanotube Composite Thin Films,"*Journal of Applied Physics*, (2002), pp. 4024-4030, vol. 92, No. 7, American Institute of Physics.
Krishnan et al., "Young'Modulus of Single-Walled Nanotubes", *Physical Review B*, (1998), pp. 14013-14019, vol. 58, No. 20, The American Physical Society.
McQuade, D. et al., "Signal Amplification of a 'Turn-on' Sensor: Harvesting the Light Captured by a Conjugated Polymer", *J. Am. Chem. Soc*., (2000), pp. 12389-12390, vol. 122; and Supplementary Materials, pp. S1-S7, American Chemical Society.
Miller, B., "Tiny Graphite 'Tubes' Create High-Efficiency Conductive Plastics", *Plastics World*, (1996), pp. 73-77, publisher unknown.
Nikolaev, P. et al., "Gas-Phase Catalytic Growth of Single-Walled Carbon Nanotubes from Carbon Monoxide", *Chemical Physics Letters*, (1999), pp. 91-97 vol. 313, Elsevier Science B.V.
O'Connell, M. et al., "Reversible water-solubilization of single-walled carbon nanotubes by polymer wrapping", *Chemical Physics Letters*, (2001), pp. 265-271, vol. 342, Elsevier Science B.V.
Park et al., "Dispersion of Single Wall Carbon Nanotubes by in Situ Polymerization Under Sonication", *Chemical Physical Letters*, (2002)., pp. 303-308, vol. 364, Elsevier Sciences B.V.
Pötschke et al. "Rheological Behavior of Muliwalled Carbon Nanotube/Polycarbonate Composites", *Polymer*, (2002), pp. 3247-3255, vol. 43, Elsevier Science Ltd.
Rajagopal et al., "Homogenous Carbon Nanotube/Polymer Composites for Electrical Applications", *Applied Physics Letters*,(2003), pp. 2928-2930, vol. 83, No. 14, American Institute of Physics.
Rinzler, A.G. et al., "Large-Scale Purfication of Single-Wall Carbon Nanotubes: Process, Product, and Characterization", *Appl. Phys. A*, (1998), pp. 29-37, vol. 67, Springer-Verlag.

Rutkofsky et al., "Using a Carbon Nanotube Additive to Make Electrically Conductive Commerical Polymer Composites", 9709 Zyvex Application Note, (Mar. 19, 2004), Zyvex Corporation
Rutkofsky et al., "Using a Carbon Nanotube Additive to Make a Thermally and Electrically Conductive Polyurethane", 9711 Zyvex Application Note, (May 5, 2004), Zyvex Corporation.
Schadler, L. et al., "Load transfer in carbon nanotube epoxy composites", *Applied Physics Letters*, (1998), pp. 3842-3844.vol. 73, No. 26.
Star et al., "Preparation and Properties of Polymer-Wrapped Single-Walled Carbon Nanotubes", *Angew. Chem. Int. Ed.*, (2001), pp. 1721-1725, vol. 40, No. 9, Wiley-VCH Verlag GmbH.
Watts et al., "The Complex Permittivity of Multi-Walled Carbon Nanotube—Polystyrene Composite Films in X-Band", *Chemical Physics Letters*, (2003), pp. 609-614, vol. 378, Elsevier B.V.
Yakobson et al. "Fullerene Nanotubes: $C_{1,000,000}$ and Beyond", *American Scientist*, (1997), pp. 324-337, vol. 84, Sigma Xi, The Scientific Research Society.
Carbon Nanotube Fuctionalization faqs On-line Product Display, (Mar. 2003), Zyvex Corporation (http://www.zyvex.com/products/cnt_faqs_2.html).
Carbon Nanotube Functionalization specifications—Zyvex Dried Film On-line Product Display, (Mar. 2003), Zyvex Corporation (http://www.zyvex.com/products/zdf_specs.html).
Ausman et al., "Organic Solvent Dispersions of Single-Walled Carbon Nanotubes: Toward Solutions of Pristine Nanotubes", Phys. Chem. B, 2000, 104, 8911-8915.
Bahr et al., "Funcationalization of Carbon Nanotubes by Electrochemical Reduction of Aryl Diazonium Salts: A Bucky Paper Electrode", J. Am. Chem. Soc. 2001, 123, 6536-6542.
Cheng et al., "Noncovalent Functionalization and Solubilization of Carbon Nanotubes by Using Conjugated Zn-Porphyrin Polymer", Chem. Eur. J. 2006, 12 pp. 5053-5059.
Craighead, "Nanoelectromechanical Systems", Science 2000, 290, 1532-1535.
Derycke et al., "Carbon Nanotube Inter-and Intramolecular Logic Gates", Nano Lett. 2001, 1, 453-456.
Dresselhaus, M.S. et al., *Science of Fullerenes and Carbon Nanotubes*, 1996, San Diego: Academic Press, 870-917.
European Patent Application No. 03252761.6, Search Report dated Sep. 18, 2003.
European Patent Application No. 03252762.4, Search Report dated Sep. 18, 2003.
Gerdes et al., "Combing a Carbon Nanotube on a Flat Metal-Insulator-Metal Nanojunction", Europhys. Lett., 1999, 48, (3), 292-298.
Haddon et al., "Chemistry of the Fullerenes: The Manifestation of Strain in a Class of Continuous Aromatic Molecules", Science, 1993, 261, 1545.
Hamon et al., "Dissolution of Single-Walled Carbon Nanotubes", Advanced Materials, 1999, vol. 11, Issue 10, 834-840.
Holzinger et al., "Sidwall Functionalization of Carbon Nanotubes," Angew. Chem. Int. Ed. 2001, 40, 4002-4005.
Koishi et al., "Synthesis and Non-Linear Optical Properties of 1,3- and 1,4-distributed type of poly(phenyleneethynylene)s containing electron-donor and acceptor group", Macromol. Chem. Phys. 201, 2000, pp. 525-532.
Mickelson et al., "Solvation of Fluorinated Single-Wall Carbon Nanotubes in Alcohol Solvents", Phys. Chem. B, 1999, 103, 4318-4322.
Moroni et al., "Rigid Rod Conjugated Polymers for Non-Linear Optics.1. Characterization and Linear Optical Propertes of Poly(aryleneethynylene) Derivatives", American Chemical Society, 1994, vol. 27, No. 2, pp. 562-571.
Patent Cooperation Treaty Application PCT/US2002/40789 International Patent Cooperation Treaty Search Report dated Apr. 14, 2003.
Patent Cooperation Treaty Application PCT/US2005/012717 International Patent Cooperation Treaty Search Report and Written Opinion dated Sep. 22, 2005.
Srivastava et al., "Predictions of Enhanced Chemical Reactivity at Reigons of Local Conformational Strain on Carbon Nanotubes: Kinky Chemistry", J. Phys. Chem. B., 1999, 103, 4330-4337.
Sun, Y. et al., "Soluble Dendron-Functionalized Carbon Nanotubes: Preparation, Characterization, and Properties," Chem. Mater. 2001, 13, 2864-2869.
Tang et al., "Preparation Alignment, and Optical Properties of Soluble Poly (phenylacetylene)-Wrapped Carbon Nanotubes", Macromolecules 1999, 32, 2569-2576.
Tasis et al., "Chemistry of Carbon Nanotubes", American Chemical Society, B Chemical Reviews, Published on the Web Feb. 23, 2006, pp. 1-32.
Taylor et al., "Synthesis and Characterization of Poly (p-phenylene)s with Nonlinear Optical Side Chains," Macromolecules 2000, 33, pp. 2355-2358.
Wu et al., "Synthesis of Carboxyl-Containing Conducting Oligomer and Non-Covalent Sidewall Functionalization of Single-Walled Carbon Nanotubes", Journal of Materials Chemistry, 2005, 15 pp. 1833-1873.
Yamamoto et al., "Preparation of Pi-Conjugated Polymers Composed of Hydroquinone, *p*-Benzoquinone, and *p*-Diacetoxyphenylene Units. Optical Redox Properties of the Polymers", Macromolecules, American Chemical Society, 1999, 32, 5556-8896.
Yang et al., "Efficient Blue Polymer Light-Emitting Diodes From a Series of Soluble Poly(Paraphenylene)s", Journal of Applied Physics—Jan. 15, 1996—vol. 79, Issue 2, pp. 934-939.
Ausman et al., "Organic Solvent Dispersions of Single-Walled Carbon Nanotubes: Toward Solutions of Pristine Nanotubes", Phys. Chem. B, 2000, 104, 8911-8915.
Bachtold et al., "Logic Circuits with Carbon Nanotube Transistors" Science 2001, 294, 1317-1320.
Bahr et al., "Fuctionalization of Carbon Nanotubes by Electrochemical Reduction of Aryl Diazonium Salts: A Bucky Paper Electrode", J. Am. Chem. Soc. 2001, 123, 6536-6542.
Banhart, "The Formation of a Connection Between Carbon Nanotubes in an Electron Beam," Nano Lett. 2001, 1, 329-332.
Chen et al, "Cyclodextrin-Mediated Soft Cutting of Single-Walled Carbon Nanotubes" J. Am. Chem. Soc. 2001, 123, 6201-6202.
Chen, J. et al., "Room-Temperature Assembly of Directional Carbon Nanotube Strings," J. Am. Chem. Soc. 2002, 124, 758-759.
Cheng et al., "Noncovalent Functionalization and Solubilization of Carbon Nanotubes by Using Conjugated Zn-Porphyrin Polymer", Chem. Eur. J. 2006, 12, pp. 5053-5059.
Collins et al., "Engineering Carbon Nanotubes and Nanotube Circuits Using Electrical Breakdown", Science 2001, 292, 706-709.
Collins et al., "Extreme Oxygen Sensitivity of Electronic Properties of Carbon Nanotubes", Science 2000, 287, 1801-1804.
Craighead, "Nanoelectromechanical Systems", Science 2000, 290, 1532-1535.
Derycke et al., "Carbon Nanotube Inter-and Intramolecular Logic Gates", Nano Lett. 2001, 1, 453-456.
Diehl et al., "Self-Assembled, Deterministic Carbon Nanotube Wiring Networks," Angew. Chem. Int. Ed. 2002, 41, 353-356.
Dresselhaus, M.S. et al., *Science of Fullerenes and Carbon Nanotubes*, 1996, San Diego: Academic Press, 870-917.
European Patent Application No. 03252761.6, Search Report dated Sep. 18, 2003.
European Patent Application No. 03252762.4, Search Report dated Sep. 18 2003.
Franklin et al., "An Enhanced CVD Approach to Extensive Nanotube Networks with Directionality." Adv. Mater. 2000, 12, 890-894.
Gerdes et al., "Combing a Carbon Nanotube on a Flat Metal-Insulator-Metal Nanojunction", Europhys. Lett., 1999, 48, (3), 292-298.
Haddon et al., "Chemistry of the Fullerenes: The Manifestation of Strain in a Class of Continuous Aromatic Molecules", Science, 1993, 261, 1545.
Haddon, "Electronic Properties of Carbon Toroids," Nature, 1997, 388, 31-32.
Haddon, R. C., "Magnetism of the carbon allotropes", Nature 1995, 378, 249-255.
Hammon et al., "Dissolution of Single-Walled Carbon Nanotubes", Advanced Materials, 1999, vol. 11, Issue 10, 834-840.
Holzinger et al., "Sidewall Functionalization of Carbon Nanotubes," Angew. Chem. Int. Ed. 2001, 40, 4002-4005.
Hornyak et al., "Template Synthesis of Carbon Nanotubes", Nanostructured Materials, Elsevier, New York, New York, US, vol. 12, No. 1-4, pp. 83-88, 1999.

Huang et al., "Directed Assembly of One-Dimensional Nanostructures into Functional Networks", Science 2001, 291, 630-633.
Iijima et al., "Structural Flexibility of Carbon Nanotubes", J. Chem. Phys., 1996, 104, No. 5, 2089-2092.
Kim et al., "Micromolding in Capillaries: Applications in Materials Science", J. Am. Chem. Soc. 1996, 188, 5722-5731.
Koishi et al., "Synthesis and Non-Linear Optical Properties of 1,3- and 1,4-disubstituted type of poly(phenyleneethynylene)s containing electron-donor and acceptor group", Macromol. Chem. Phys. 2001, 200, pp. 525-532.
Kong et al., "Nanotube Molecular Wires as Chemical Sensors", Science 2000, 287, 622-625.
Korean Application 29184/2003, Korean Office Action and translation therof dated Aug. 19, 2005.
Korean Patent Application No. 29185/2003, Korean Office Action dated Feb. 17, 2006.
Kuroda et al., "Synthesis of a nonionic water soluble semiconductive polymer", Chem. Commun., 2003, 26-27.
Lakowicz et al., "Radiative Decay Engineering: Biophysical and Biomedical Applications," Analytical Biochemistry, 2001, 298, 1-24.
Li et al., "Highly-Ordered Carbon Nanotube Arrays for Electronics Applications," Applied Physics Letters, American Institute of Physics, New York, US, vol. 75, No. 3, pp. 367-369, Jul. 19, 1999.
Liu et al., "Controlled Deposition of Individual Single-Walled Carbon Nanotubes on Chemically Functionalized Templates", Chem. Phys. Lett., 1999, 303, 125-129.
Liu, J. et al., "Fullerene Pipes", Science, vol. 280, 1998, 1253-1256.
Martel, "Rings of Single-Walled Carbon Nanotubes", Nature, vol. 398, 1999, 299.
Mattson et al., "Molecular Functionalization of Carbon Nanotubes and Use as Substrates for Neuronal Growth", J. Molecular Neuroscience, 2000, 14, 175-182.
Messer et al., "Microchannel Networks for Nanowire Patterning", J. Am. Chem. Soc. 2000, 122, 10232-10233.
Mickelson et al., "Solvation of Fluorinated Single-Wall Carbon Nanotubes in Alcohol Solvents", Phys. Chem. B, 1999, 103, 4318-4322.
Moroni et al., "Rigid Rod Conjugated Polymers for Non-Linear Optics.1. Characterization and Linear Optical Properties of Poly(arleneethynylene) Derivatives", American Chemical Society, 1994, vol. 27, No. 2, pp. 562-571.
Niyogi, S. et al., "Chromatographic Purification of Soluble Single-Walled Carbon Nanotubes (s-SWNTs), " J. Am. Chem. Soc., 2001, 123, 733-734.
Oh et al., "Stability And Cap Formation Mechanism Of Single-Walled Carbon Nanotubes", Phys. Rev. B, 1998, 58, No. 11, 7407-7411.
Patent Cooperation Treaty Application PCT/US2002/40789 International Patent Cooperation Treaty Search Report dated Apr. 14, 2003.
Patent Cooperation Treaty Application PCT/US2005/012717 International Patent Cooperation Treaty Search Report and Written Opinion dated Sep. 22, 2005.
Rappe et al., "UFF, a Full Periodic Table Force Field for Molecular Mechanics and Molecular Dynamics Simulators", J. Am. Chem. Soc. 1992, 114, 100024.
Riggs et al., "Strong Luminescence of Solubilized Carbon Nanotubes", J. Am. Chem. Soc. 2000, 122, 5879-5880.
Roncali, "Synthetic Principles for Bandgap Control in Linear .pi.-Conjugated Systems," Chem. Rev. 1997, 97, pp. 173-205.
Schlittler et al., "Single Crystals of Single-Walled Carbon Nanotubes Formed by Self-Assembly", Science 2001, 292, 1136-1139.
Smith et al., "Formation Mechanism of Fullerene) Peapods and Coaxial Tubes: A Path to Large Scale Synthesis", Chem. Phys. Lett 2000, 321, 169-174.
Srivastava et al., "Predictions of Enhanced Chemical Reactivity at Regions of Local Conformational Strain on Carbon Nanotubes: Kinky Chemistry", J. Phys. Chem. B., 1999, 103, 4330-4337.
Stephanek, I. et al., "Nano-mechanical cutting and opening of single wall carbon Nanotubes," Chemical Physics Letters 331 (2000), 125-131.
Sun, Y. et al., "Soluble Dendron-Functionalized Carbon Nanotubes: Preparation, Characterization, and Properties," Chem. Mater. 2001, 13, 2864-2869.
Sutton et al., "On The Morphology And Growth Of Electrochemically Polymerized Polypyrrole," Polymer vol. 36, No. 9, pp. 1849-1857, 1995.
Szejtli, J., "Introduction and general overview of Cyclodextrin Chemistry," Chem. Rev. 1998, 98, 1743-1753.
Tang et al., "Preparation, Alignment, and Optical Properties of Soluble Poly (phenylacetylene)-Wrapped Carbon Nanotubes", Macromolecules 1999, 32, 2569-2576.
Tang et al., "Superconductivity in 4 Angstrom Single-Walled Carbon Nanotubes," Science 2001, 2462-2465.
Tasis et al., "Chemistry of Carbon Nanotubes", American Chemical Society, B Chemical Reviews, Published on the Web Feb. 23, 2006, pp. 1-32.
Taylor et al., "Synthesis and Characterization of Poly (p-phenylene)s with Nonlinear Optical Side Chains," Macromolecules 2000, 33, pp. 2355-2358.
Tombler et al., "Reversible Electromechanical Characteristics of Carbon Nanotubes Under Local-Probe Manipulation", Nature 2000, 405, 769-772.
Waldeck, D. H., et al., "Nonradiative dampling of molecular electronic excited states by metal surfaces," Surf. Sci. 1985, 158, 103.
Wong et al., "Covalently-Functionalized Single-Walled Carbon Nanotube Probe Tips for Chemical Force Microscopy", J. Am. Chem. Soc., 1998, 120, 8557-8558.
Wu et al., "Synthesis of Carboxyl-Containing Conducting Oligomer and Non-Covalent Sidewall Functionalization of Single-Walled Carbon Nanotubes", Journal of Materials Chemistry, 2005, 15, pp. 1833-1873.
Yamamoto et al., "Preparation of Pi-Conjugated Polymers Composed of Hydroquinone, *p*-Benzoquinone, and *p*-Diacetoxyphenylene Units. Optical Redox Properties of the Polymers", Macromolecules, American Chemical Society, 1999, 32, 5556-8896.
Yang et al., "Efficient Blue Polymer Light-Emitting Diodes From A Series Of Soluble Poly(Paraphenylene)S", Journal of Applied Physics -- Jan. 15, 1996 -- vol. 79, Issue 2, pp. 934-939.
Zhang et al., "Electric-Field-Directed Growth of Aligned Single-Walled Carbon Nanotubes", Applied Physics Letters, vol. 79, No. 19, 2001, 3155-3157.
Zhao et al., "Chromatographic Purification and Properties of Soluble Single-Walled Carbon Nanotubes, " J. Am. Chem. Soc. 2001, 123, 11673-11677.
European Patent Examination Report form European Patent Application No. 03252762.4 dated Jun. 26, 2007.
U.S. Appl. No. 60/780,606, "Methods for Preparing Carbon Nanotube Coatings".
U.S. Appl. No. 60/780,607, "Flexible Transparent Conductive Coatings Based on Carbon Nanotubes".
U.S. Appl. No. 60/780,631, "Dispersing Carbon Nanotubes in Organic Solvent".
Yamamoto, Takakazu, "PAEs With Heteroaromatic Rings", Adv. Polym. Sci. (2005), 177, pp. 181-208.
Zhao et al., "Meta-Linked Poly(phenylene ethynylene) Conjugated Polyelectrolyte Featuring a Chiral Side Group: Helical Folding and Guest Binding", Langmuir, 2006, 22, pp. 4856-4862.
European Patent Application No. 03252761.6 Examination Report dated Nov. 15, 2007 (3 pages).
Great Britain Patent Application No. 0523751.6 Examination Report dated Jul. 24, 2007 (4 pages).

* cited by examiner

NANOCOMPOSITES AND METHODS THERETO

The present application claims the benefit of U.S. Ser. No. 60/472,820 filed May 22, 2003, the entire contents of which are incorporated by reference herein.

FIELD OF THE INVENTION

The present patent application relates generally to the technical field of nanomaterial-based nanocomposites and their applications.

BACKGROUND OF THE INVENTION

A carbon nanotube can be visualized as a sheet of hexagonal graph paper rolled up into a seamless tube and joined. Each line on the graph paper represents a carbon-carbon bond, and each intersection point represents a carbon atom.

In general, carbon nanotubes are elongated tubular bodies which are typically only a few atoms in circumference. The carbon nanotubes are hollow and have a linear fullerene structure. The length of the carbon nanotubes potentially may be millions of times greater than their molecular-sized diameter. Both single-walled carbon nanotubes (SWNTs), as well as multi-walled carbon nanotubes (MWNTs) have been recognized.

Carbon nanotubes (also referred to as "CNTs") are currently being proposed for a number of applications since they possess a very desirable and unique combination of physical properties relating to, for example, strength and weight. Carbon nanotubes have also demonstrated electrical conductivity (Yakobson, B. I., et al., *American Scientist,* 85, (1997), 324-337; and Dresselhaus, M. S., et al., *Science of Fullerenes and Carbon Nanotubes*, (1996), San Diego, Academic Press, 902-905). For example, carbon nanotubes conduct heat and electricity better than copper or gold and have 100 times the tensile strength of steel, with only a sixth of the weight of steel. Carbon nanotubes may be produced having extraordinary small size. For example, carbon nanotubes are being produced that are approximately the size of a DNA double helix (or approximately 1/50,000th the width of a human hair).

Considering the excellent properties of carbon nanotubes, they are well suited for a variety of uses, such as building computer circuits, reinforcing composite materials, and even to delivering medicine. In addition, carbon nanotubes may be useful in microelectronic device applications, which often demand high thermal conductivity, small dimensions, and lightweight. One application of carbon nanotubes that has been recognized from their use in flat-panel displays uses electron field-emission technology (since carbon nanotubes can be good conductors and electron emitters). Further applications that have been recognized include electromagnetic shielding, for cellular phones and laptop computers, radar absorption for stealth aircraft, nano-electronics (including memories in new generations of computers), and use as high-strength, lightweight, multifunctional composites.

However, attempts to use carbon nanotubes in composite materials have produced results that are far less than what is possible because of poor dispersion of nanotubes and agglomeration of the nanotubes in the host material. Pristine SWNTs are generally insoluble in common solvents and polymers, and difficult to chemically functionalize without altering the nanotube's desirable intrinsic properties. Techniques, such as physical mixing, that have been successful with larger scale additives to polymers, such as glass fibers, carbon fibers, metal particles, etc. have failed to achieve good dispersion of CNTs. Two common approaches have been used previously to disperse the SWNTs in a host polymer:

1) Dispersing the SWNTs in a polymer solution by lengthy sonication (up to 48 h, M. J. Biercuk, et al., *Appl. Phys. Lett.* 80, 2767 (2002)), and 2) In situ polymerization in the presence of SWNTs.

Lengthy sonication of approach 1), however, can damage or cut the SWNTs, which is undesirable for many applications. The efficiency of approach 2), is determined by the degree of dispersion of the nanotubes in solution which is very poor and is highly dependent on the specific polymer. For example, it works better for polyimide (Park, C. et al., *Chem. Phys. Lett.,* 364, 303(2002)) than polystyrene (Barraza, H. J. et al., *Nano Ltrs,* 2, 797 (2002)).

Although CNTs have exceptional physical properties, incorporating them into other materials has been inhibited by the surface chemistry of carbon. Problems such as phase separation, aggregation, poor dispersion within a matrix, and poor adhesion to the host must be overcome.

A process of noncovalent functionalization and solubilization of carbon nanotubes is described by Chen, J. et al. (*J. Am. Chem. Soc.,* 124, 9034 (2002)) which process results in excellent nanotube dispersion. SWNTs were solubilized in chloroform with poly(phenyleneethynylene)s (PPE) along with vigorous shaking and/or short bath-sonication as described by Chen et al. (ibid) and in U.S. patent application US 2004/0034177 published Feb. 19, 2004, having U.S. Ser. No. 10/255,122, filed Sep. 24, 2002, and U.S. patent application U.S. Ser. No. 10/318,730 filed Dec. 13, 2002; the contents of such patent applications are incorporated by reference herein in their entirety. Composites of such functionalized and solubilized carbon nanotubes with the host polymers polycarbonate or polystyrene were fabricated and certain mechanical properties of such composites were reported in U.S. patent application US 2004/0034177 published Feb. 19, 2004, U.S. Ser. No. 10/255,122, filed Sep. 24, 2002, and in U.S. patent application U.S. Ser. No. 10/318,730 filed Dec. 13, 2002; the contents of which are incorporated by reference herein in their entirely.

The present inventors have addressed the problem of nanocomposites having nonuniform dispersion of nanomaterials in host polymer matrices that cause undesirable consequences to the composite material such as loss of strength, particle generation, increased viscosity, loss of processability, or other material degradation, and provide herein nanocomposites having improved properties.

SUMMARY OF THE INVENTION

The present invention provides nanocomposites of functionalized, solubilized nanomaterials and host matrices where the nanocomposites provide increased electrical conductivity with lower electrical percolation thresholds, increased thermal conductivity with lower thermal percolation thresholds, or an improved mechanical property as compared to those of nanocomposites comprising the host matrix and nanomaterial other than the functionalized, solubilized nanomaterial. The low percolation thresholds demonstrate that a high dispersion of the nanomaterials in host matrices is achieved. Further, since a small amount of functionalized solubilized nanomaterial is needed to achieve increased conductivity or improved properties of a host matrix, the host matrix's other desired physical properties and processability are not compromised.

A nanocomposite comprising a host matrix comprising polymer matrix or nonpolymer matrix and functionalized, solubilized nanomaterial dispersed within the host matrix is an embodiment of the invention. The nanocomposite has an electrical conductivity percolation threshold or a thermal conductivity percolation threshold that is lower than that of a nanocomposite comprising the host matrix and nanomaterial other than the functionalized, solubilized nanomaterial. The host matrix may be an organic polymer matrix, an inorganic polymer matrix, or a nonpolymer matrix, as described infra, or a combination thereof.

A further embodiment of the invention is the above-cited nanocomposite wherein the functionalized, solubilized nanomaterial of the nanocomposite is a first filler and the nanocomposite further comprises a second filler to form a complex nanocomposite. In this embodiment, the second filler comprises a continuous fiber, a discontinuous fiber, a nanoparticle, a microparticle, a macroparticle, or a combination thereof, and the second filler is other than a functionalized, solubilized nanomaterial.

A nanocomposite comprising a host matrix of polymer matrix or nonpolymer matrix, wherein the polymer matrix is other than polystyrene and polycarbonate, and functionalized, solubilized nanomaterial dispersed within the host matrix is a further embodiment of the invention. The nanocomposite has a mechanical property that is enhanced as compared to that of a nanocomposite comprising the host matrix and the nanomaterial other than the functionalized, solubilized nanomaterial. The nanocomposite may further comprise a second host polymer matrix wherein the functionalized, solubilized nanomaterial is dispersed within the first and second host polymer matrices. Further, where the functionalized, solubilized nanomaterial of the nanocomposite is a first filler, the nanocomposite may further comprise a second filler to form a complex nanocomposite wherein the second filler is other than a functionalized, solubilized nanomaterial.

A further nanocomposite of the present invention comprises a polystyrene, and a functionalized, solubilized nanomaterial dispersed within the polystyrene. Such a nanocomposite has a mechanical property that is enhanced as compared to that of a nanocomposite comprising the host matrix and the nonmaterial other than the functionalized, solubilized nanomaterial. The nanocomposite may further comprise a second host polymer matrix, wherein the functionalized, solubilized nanomaterial is dispersed within the first and second host polymer matrices.

In one embodiment, a nanocomposite comprises a host matrix comprising a first polymer matrix and a second polymer matrix and functionalized, solubilized nanomaterial dispersed within the host matrix wherein the first polymer matrix is polycarbonate.

A method of increasing electrical or thermal conductivity of a host matrix comprising a polymer matrix or a nonpolymer matrix comprises dispersing functionalized, solubilized nanomaterial within host matrix material to form a nanocomposite. In this embodiment, the nanocomposite has an electrical conductivity percolation threshold or a thermal conductivity percolation threshold that is lower than that of a nanocomposite comprising the host matrix and nanomaterial other than the functionalized, solubilized nanomaterial. The host matrix material may be the host matrix or a monomer of a host polymer matrix and, in such an embodiment, the method further comprises the step of polymerizing the host polymer matrix material in the presence of the functionalized, solubilized nanomaterial. In a further embodiment, the host matrix is a first host polymer matrix and the method further comprises dispersing a second host polymer matrix material with functionalized, solubilized nanomaterial and with first host polymer matrix material to form a nanocomposite comprising a first host polymer matrix and a second host polymer matrix. In one embodiment, functionalized, solubilized nanomaterial is a first filler, and the dispersing further comprises dispersing a second filler within host matrix material to form a complex nanocomposite, wherein the second filler comprises a continuous fiber, a discontinuous fiber, a nanoparticle, a microparticle, a macroparticle, or a combination thereof, and wherein the second filler is other than a functionalized, solubilized nanomaterial.

A method of improving a mechanical property of a host matrix comprising a polymer matrix or a nonpolymer matrix, wherein the host matrix is other than polystyrene or polycarbonate is an aspect of the present invention. The method comprises dispersing functionalized, solubilized nanomaterial within host matrix material to form a nanocomposite wherein the nanocomposite has an improved mechanical property compared to that of a nanocomposite comprising the host matrix and nanomaterial other than the functionalized, solubilized nanomaterial. The host matrix material may be the host matrix or comprise a monomer of the host matrix and the method then further comprises the step of polymerizing the host matrix material in the presence of the functionalized, solubilized nanomaterial. The method may further comprise dispersing a second host polymer matrix material with functionalized, solubilized nanomaterial and with first host polymer matrix material to form a nanocomposite comprising a first host polymer matrix and a second host polymer matrix. Further, when the functionalized, solubilized nanomaterial is a first filler, the dispersing may further comprise dispersing a second filler within host matrix material to form a complex nanocomposite wherein the second filler is other than a functionalized, solubilized nanomaterial.

A method of improving a mechanical property of a polystyrene comprises dispersing functionalized, solubilized nanomaterial within styrene polymeric material to form a nanocomposite wherein the nanocomposite has an improved mechanical property compared to that of a nanocomposite comprising the polystyrene and nanomaterial other than the functionalized, solubilized nanomaterial. A second host matrix or a second filler may be added to produce further embodiments for improving a mechanical property of a polystyrene.

A method of improving a mechanical property of a host matrix comprising a first polymer matrix and a second polymer matrix wherein the first polymer matrix is polycarbonate is an aspect of the present invention. The method comprises dispersing functionalized, solubilized nanomaterial within host polymeric material to form a nanocomposite wherein the nanocomposite has an improved mechanical property compared to that of a nanocomposite comprising the host matrix and nanomaterial other than the functionalized, solubilized nanomaterial. A second filler may be added to produce a complex nanocomposite.

An article of manufacture comprising a nanocomposite having an improved electrical, thermal, or mechanical property as described herein is a further embodiment of the invention. Further, a product produced by a method as described herein is an embodiment of the present invention.

BRIEF DESCRIPTION OF THE DRAWINGS

For a more complete understanding of the present invention, reference is made to the following descriptions taken in conjunction with the accompanying drawings.

FIG. 5A shows an architecture typically used in laptop applications, and FIG. 5B shows an architecture typically used in desktop and server applications. The large arrow pointing upward indicates the primary heat transfer path in each architecture. See Example 2 for designation of components.

DESCRIPTION

Figure 1A:
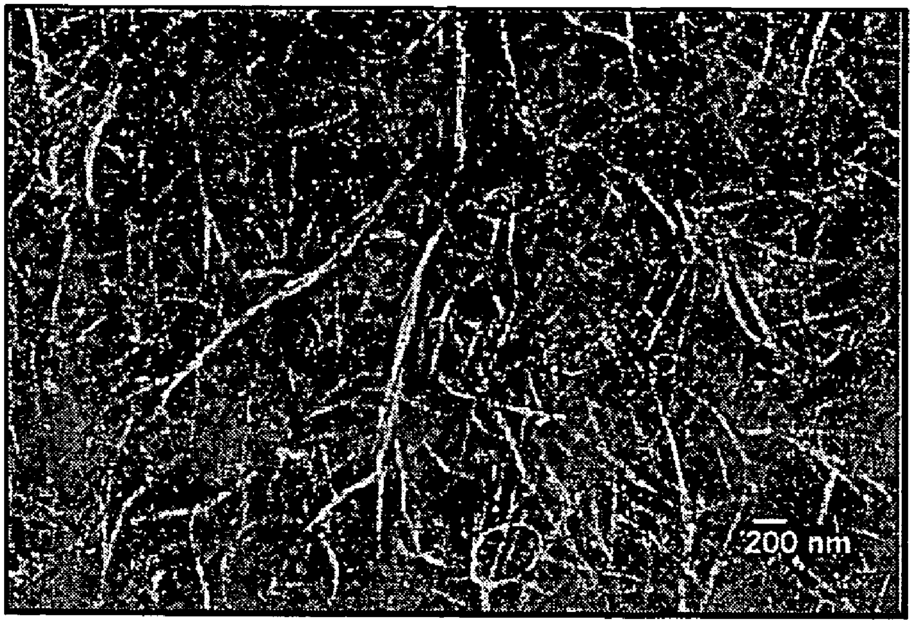
FIG. 1A is a scanning electron microscopy image showing the surface of PPE-SWNTs/polystyrene nanocomposite film prepared by an embodiment of the present invention using 5 wt % of SWNTs.

Highly dispersed carbon nanotube/polymer nanocomposites were fabricated using functionalized, solubilized single-walled carbon nanotubes (f-s-SWNTs). Such nanocomposites have demonstrated, for example, electrical conductivity with very low percolation threshold (0.05-0.1 wt % of SWNT loading). A very low f-s-SWNT loading is needed to achieve conductivity levels required for various electrical applications without compromising the host polymer's other preferred physical properties and processability.

Nanocomposite: The term "nanocomposite," as used herein, means a noncovalently functionalized solubilized nanomaterial dispersed within a host matrix. The host matrix may be a host polymer matrix or a host nonpolymer matrix.

Host polymer matrix: The term "host polymer matrix," as used herein, means a polymer matrix within which the nanomaterial is dispersed. A host polymer matrix may be an organic polymer matrix or an inorganic polymer matrix, or a combination thereof.

Examples of a host polymer matrix include a nylon, polyethylene, epoxy resin, polyisoprene, sbs rubber, polydicyclopentadiene, polytetrafluoroethulene, poly(phenylene sulfide), poly(phenylene oxide), silicone, polyketone, aramid, cellulose, polyimide, rayon, poly(methyl methacrylate), poly(vinylidene chloride), poly(vinylidene fluoride), carbon fiber, polyurethane, polycarbonate, polyisobutylene, polychloroprene, polybutadiene, polypropylene, poly(vinyl chloride), poly(ether sulfone), poly(vinyl acetate), polystyrene, polyester, polyvinylpyrrolidone, polycyanoacrylate, polyacrylonitrile, polyamide, poly(aryleneethynylene), poly(phenylene-ethynylene), polythiophene, thermoplastic, thermoplastic polyester resin (such as polyethylene terephthalate), thermoset resin (e.g., thermosetting polyester resin or an epoxy resin), polyaniline, polypyrrole, or polyphenylene such as PARMAX®, for example, other conjugated polymers (e.g., conducting polymers), or a combination thereof.

Further examples of a host polymer matrix includes a thermoplastic, such as ethylene vinyl alcohol, a fluoroplastic such as polytetrafluoroethylene, fluoroethylene propylene, perfluoroalkoxyalkane, chlorotrifluoroethylene, ethylene chlorotrifluoroethylene, or ethylene tetrafluoroethylene, ionomer, polyacrylate, polybutadiene, polybutylene, polyethylene, polyethylenechlorinates, polymethylpentene, polypropylene, polystyrene, polyvinylchloride, polyvinylidene chloride, polyamide, polyamide-imide, polyaryletherketone, polycarbonate, polyketone, polyester, polyetheretherketone, polyetherimide, polyethersulfone, polyimide, polyphenylene oxide, polyphenylene sulfide, polyphthalamide, polysulfone, or polyurethane. In certain embodiments, the host polymer includes a thermoset, such as allyl resin, melamine formaldehyde, phenol-formaldehyde plastic, polyester, polyimide, epoxy, polyurethane, or a combination thereof.

Examples of inorganic host polymers include a silicone, polysilane, polycarbosilane, polygermane, polystannane, a polyphosphazene, or a combination thereof.

More than one host matrix may be present in a nanocomposite. By using more than one host matrix, mechanical, thermal, chemical, or electrical properties of a single host matrix nanocomposite are optimized by adding f-s-SWNTs to the matrix of the nanocomposite material. Example 4 infra provides an example of such an embodiment where polycarbonate and epoxy are provided as host polymers in a nanocomposite material of the present invention. Addition of polycarbonate in addition to epoxy appears to reduce voids in a nanocomposite film as compared to a nanocomposite film with just epoxy as the host polymer. Such voids degrade the performance of nanocomposites.

In one embodiment, using two host polymers is designed for solvent cast epoxy nanocomposites where the f-s-SWNTs, the epoxy resin and hardener, and the polycarbonate are dissolved in solvents and the nanocomposite film is formed by solution casting or spin coating.

Host nonpolymer matrix: The term "host nonpolymer matrix," as used herein, means a nonpolymer matrix within which the nanomaterial is dispersed. Examples of host nonpolymer matrices include a ceramic matrix (such as silicon carbide, boron carbide, or boron nitride), or a metal matrix (such as aluminum, titanium, iron, or copper), or a combination thereof. Functionalized solubilized SWNTs are mixed with, for example, polycarbosilane in organic solvents, and then the solvents are removed to form a solid (film, fiber, or powder). The resulting solid f-s-SWNTs/polycarbosilane nanocomposite is further converted to SWNTs/SiC nanocomposite by heating at 900-1600° C. either under vacuum or under inert atmosphere (such as Ar).

Nanomaterial: The term "nanomaterial," as used herein, includes, but is not limited to, functionalized and solubilized multi-wall carbon or boron nitride nanotubes, single-wall carbon or boron nitride nanotubes, carbon or boron nitride nanoparticles, carbon or boron nitride nanofibers, carbon or boron nitride nanoropes, carbon or boron nitride nanoribbons, carbon or boron nitride nanofibrils, carbon or boron nitride nanoneedles, carbon or boron nitride nanosheets, carbon or boron nitride nanorods, carbon or boron nitride nanohorns, carbon or boron nitride nanocones, carbon or boron nitride nanoscrolls, graphite nanoplatelets, nanodots, other fullerene materials, or a combination thereof. The term "nanotubes" is used broadly herein and, unless otherwise qualified, is intended to encompass any type of nanomaterial. Generally, a "nanotube" is a tubular, strand-like structure that has a circumference on the atomic scale. For example, the diameter of single walled nanotubes typically ranges from approximately 0.4 nanometers (nm) to approximately 100 nm, and most typically have diameters ranging from approximately 0.7 nm to approximately 5 nm.

While the term "SWNTs," as used herein, means single walled nanotubes, the term means that other nanomaterials as cited supra may be substituted unless otherwise stated herein.

Functionalized, solubilized nanomaterial: The term "functionalized, solubilized nanomaterial," as used herein, means that the nanomaterial is solubilized by a nonwrapping, noncovalent functionalization with a rigid, conjugated polymer. Such functionalization and solubilization is exemplified by the process and compositions for carbon nanotubes of Chen, J. et al. (*J. Am. Chem. Soc.,* 124, 9034 (2002)) which process results in excellent nanotube dispersion and is described in U.S. patent application US 2004/0034177 published Feb. 19, 2004, having U.S. Ser. No. 10/255,122, filed Sep. 24, 2002, and U.S. patent application U.S. Ser. No. 10/318,730 filed Dec. 13, 2002; the contents of which are incorporated by reference herein in their entirety.

The term "rigid, conjugated polymer," as used herein for functionalization and solubilization contains a backbone portion for noncovalently bonding with a nanotube in a nonwrapping fashion. The backbone portion may comprise a group having the formula:

a)

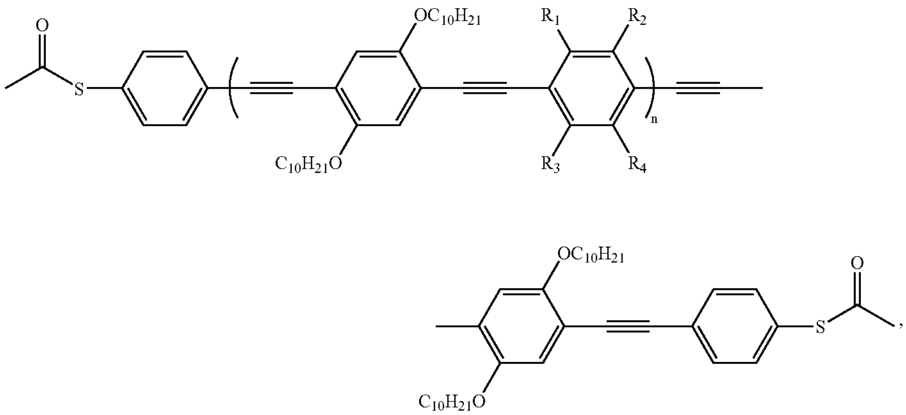

b(i))

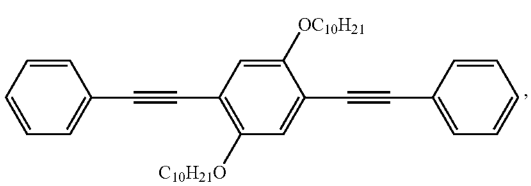

b(ii))

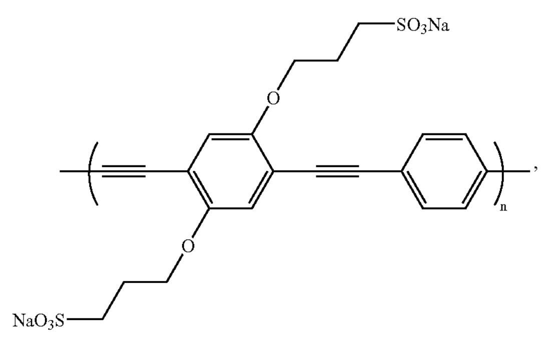

c)

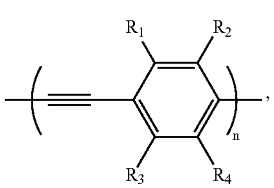

d)

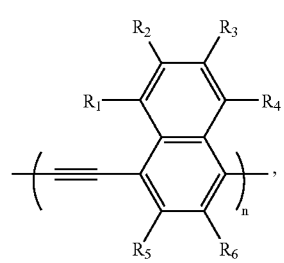

-continued
e)
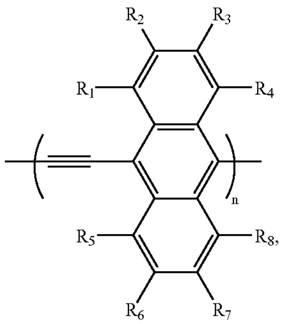
f)
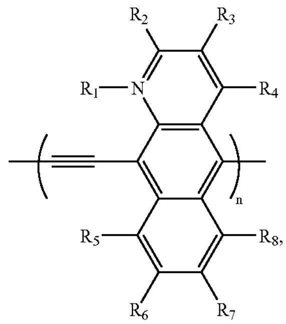
h)
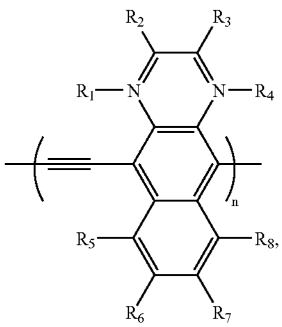
i)
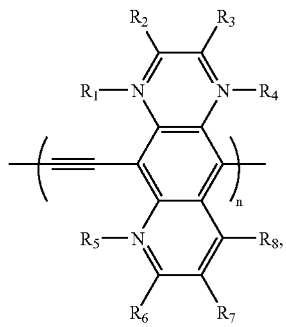
j)
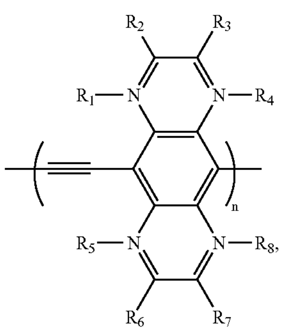
k)
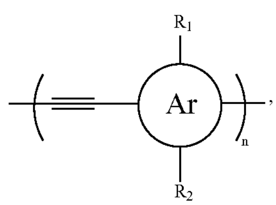
l)
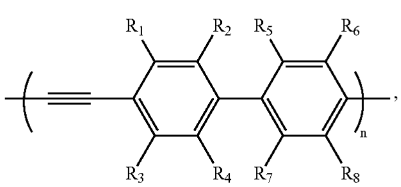
m)
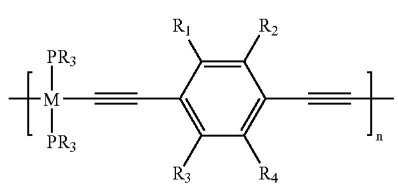
wherein M is selected from the group consisting of Ni, Pd, and Pt,
n)
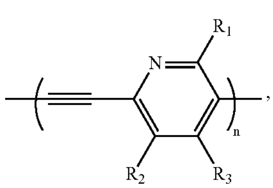
-continued
o)
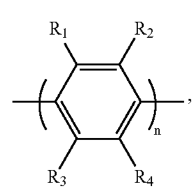

-continued p)

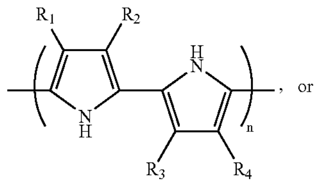

q)

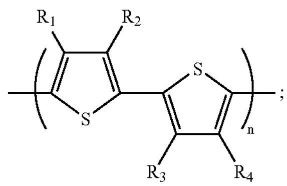

wherein each of $R_1$-$R_8$ in the above-listed backbone portions a)-q) represents H, or F, or an R group bonded to the backbone via a carbon or an oxygen linkage as described infra.

For example, the backbone may comprise a poly(arylene-ethynylene) of a) supra wherein the R groups are as follows:

i) $R_1$=$R_4$=H and $R_2$=$R_3$=$OC_{10}H_{21}$, ii) $R_1$=$R_2$=$R_3$=$R_4$=F, iii) $R_1$=$R_4$=H and $R_2$=$R_3$=

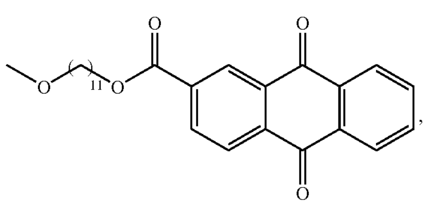

or iiii) $R_1$=$R_4$=H and $R_2$=$R_3$=

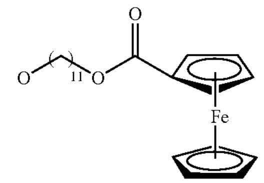

or any combination thereof. That is, an R group may be H, $OC_{10}H_{21}$, F,

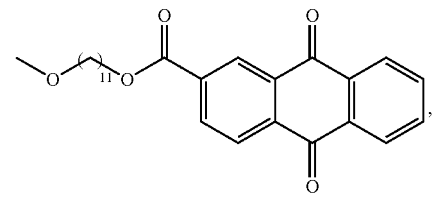

or

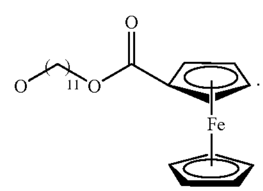

Further embodiments of a rigid, conjugated polymer include those having a backbone and R groups bonded to a backbone via an ether linkage as follows:

r)

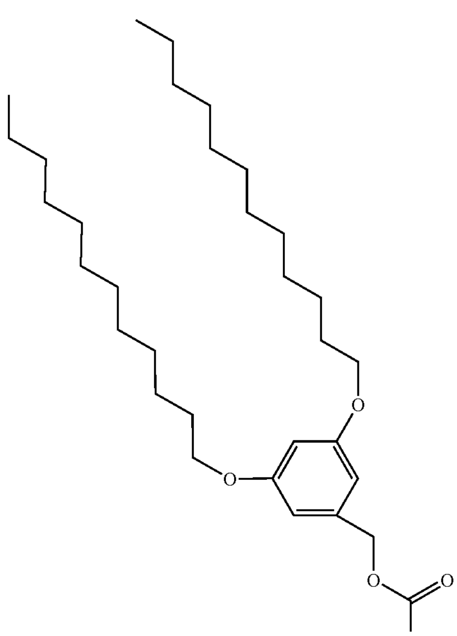

-continued
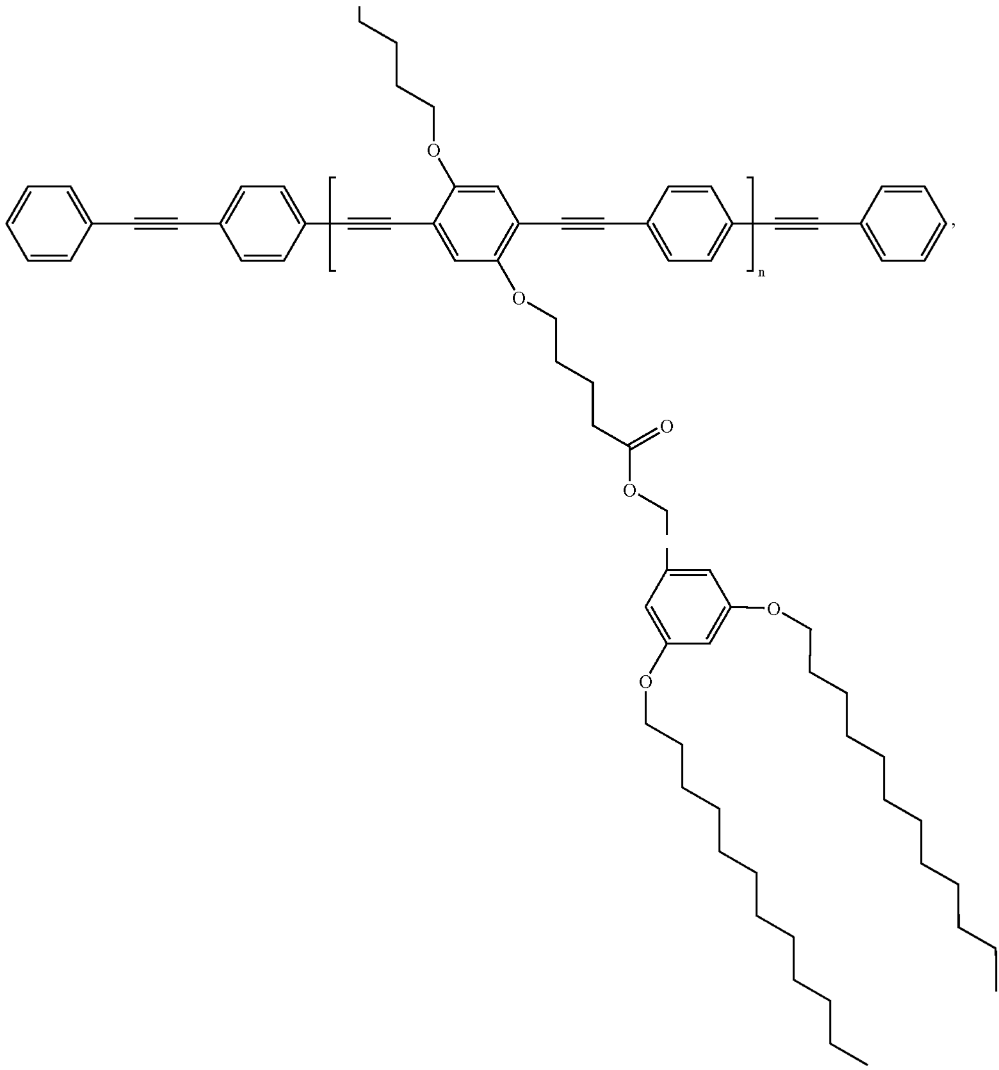
s)
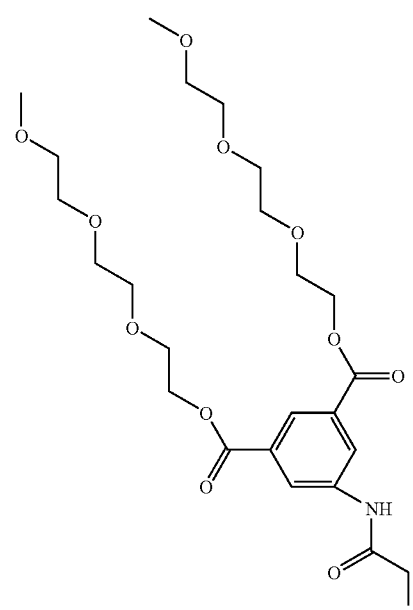

-continued
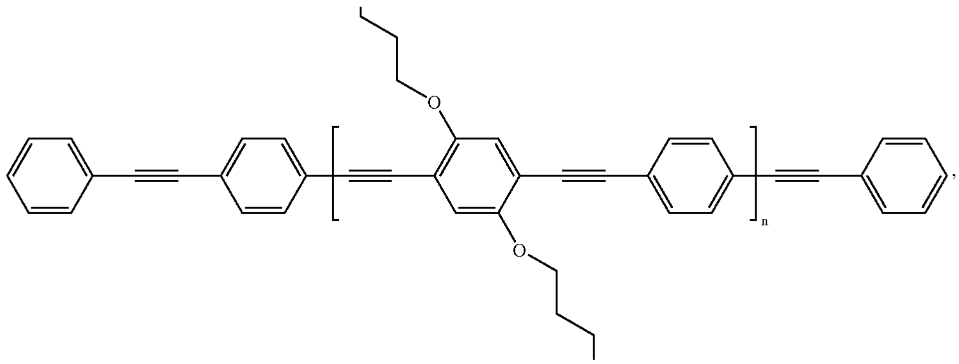
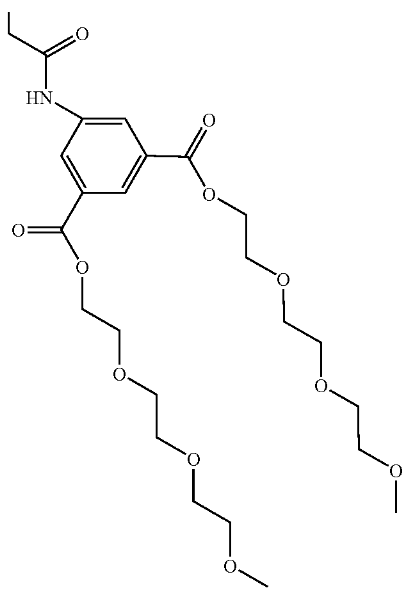
t)
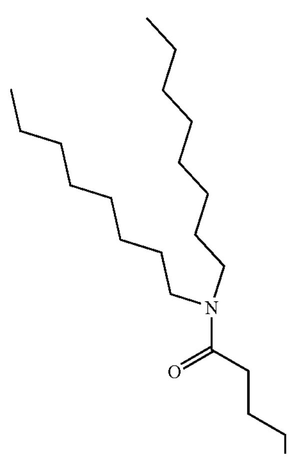

-continued
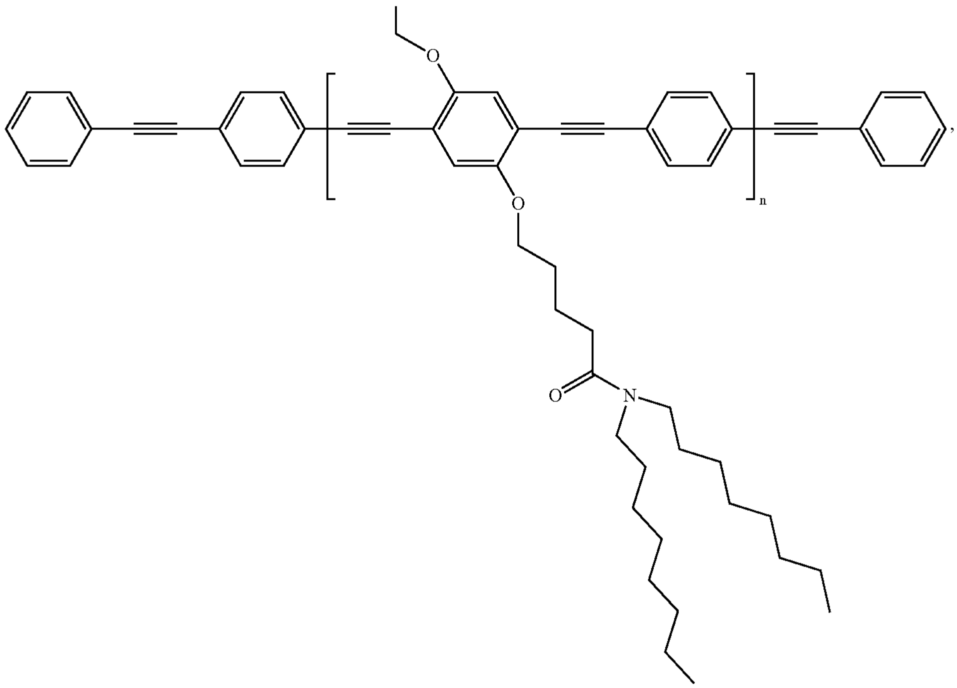
u)
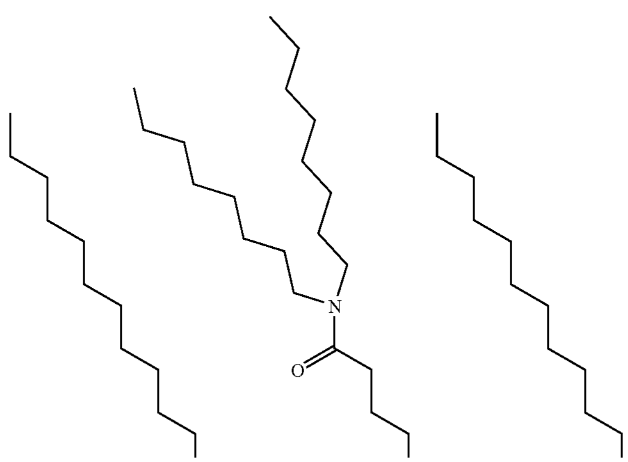

-continued
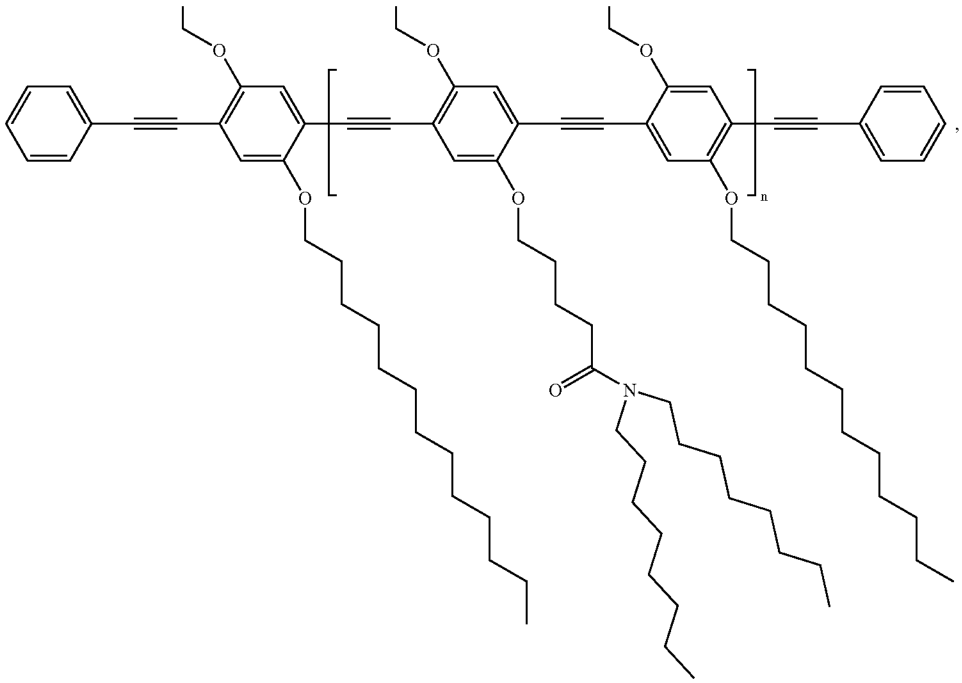
v)
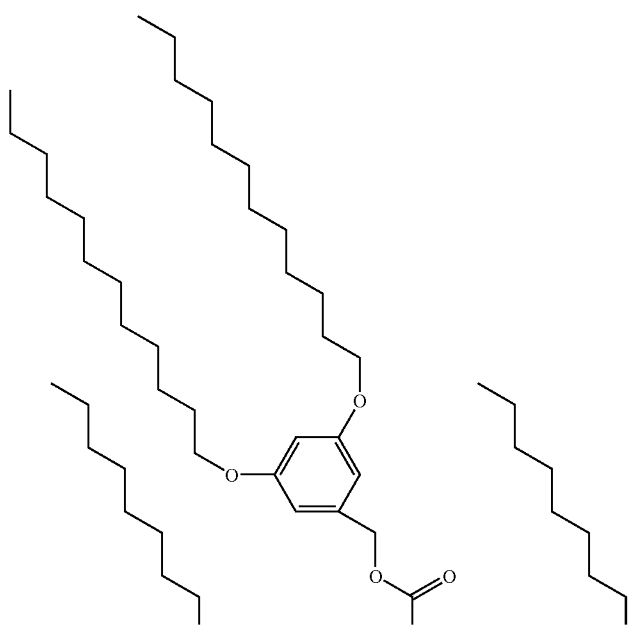

-continued
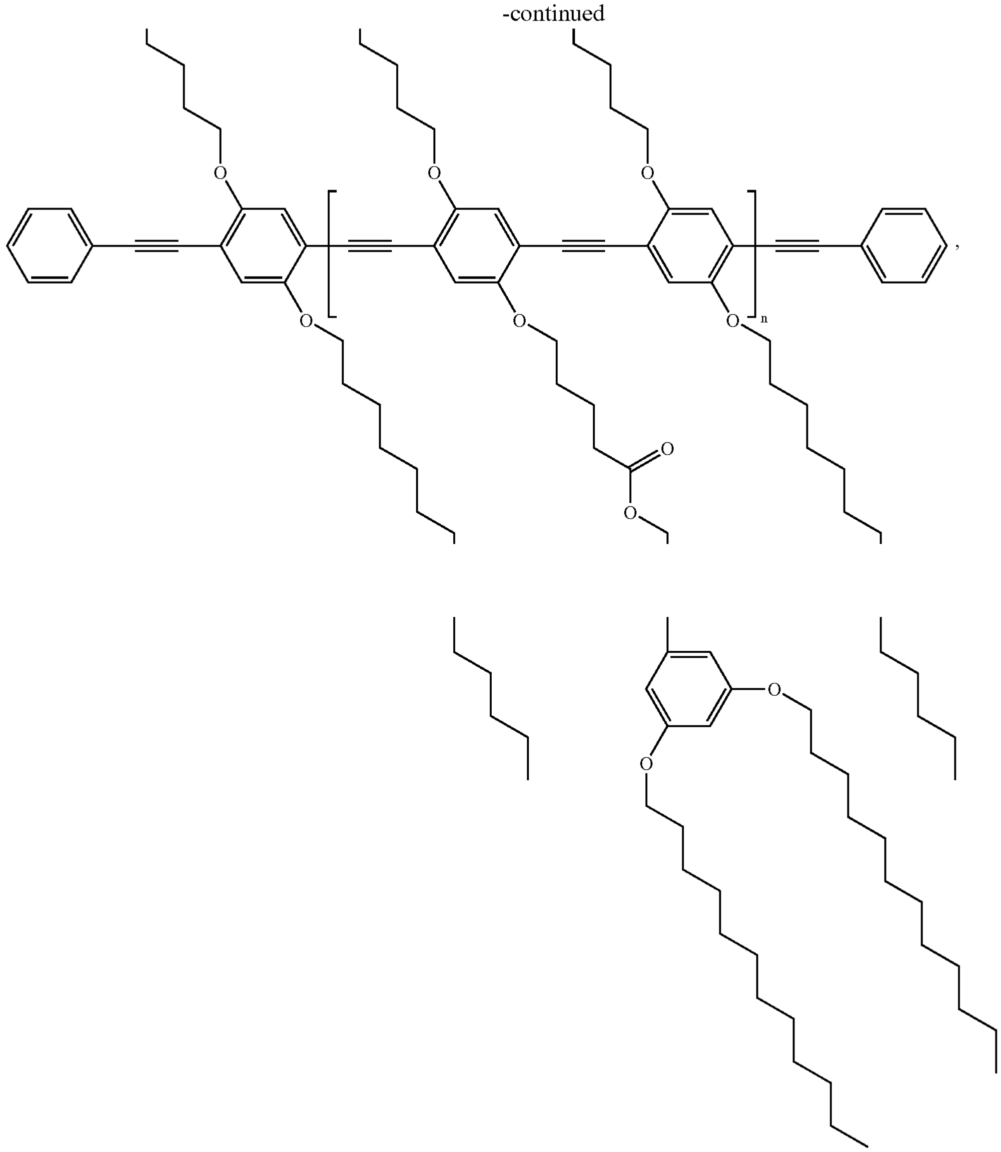
w)
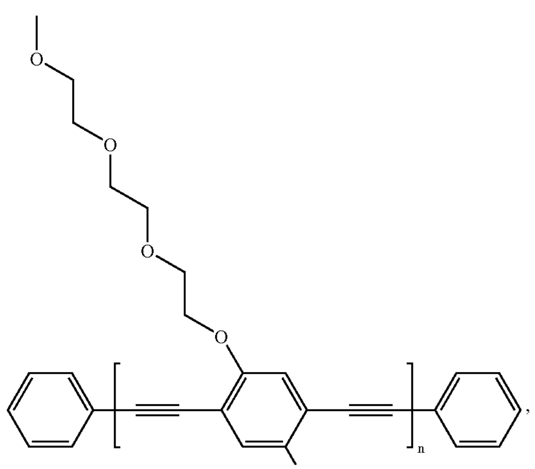

-continued
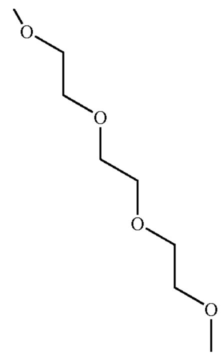
x)
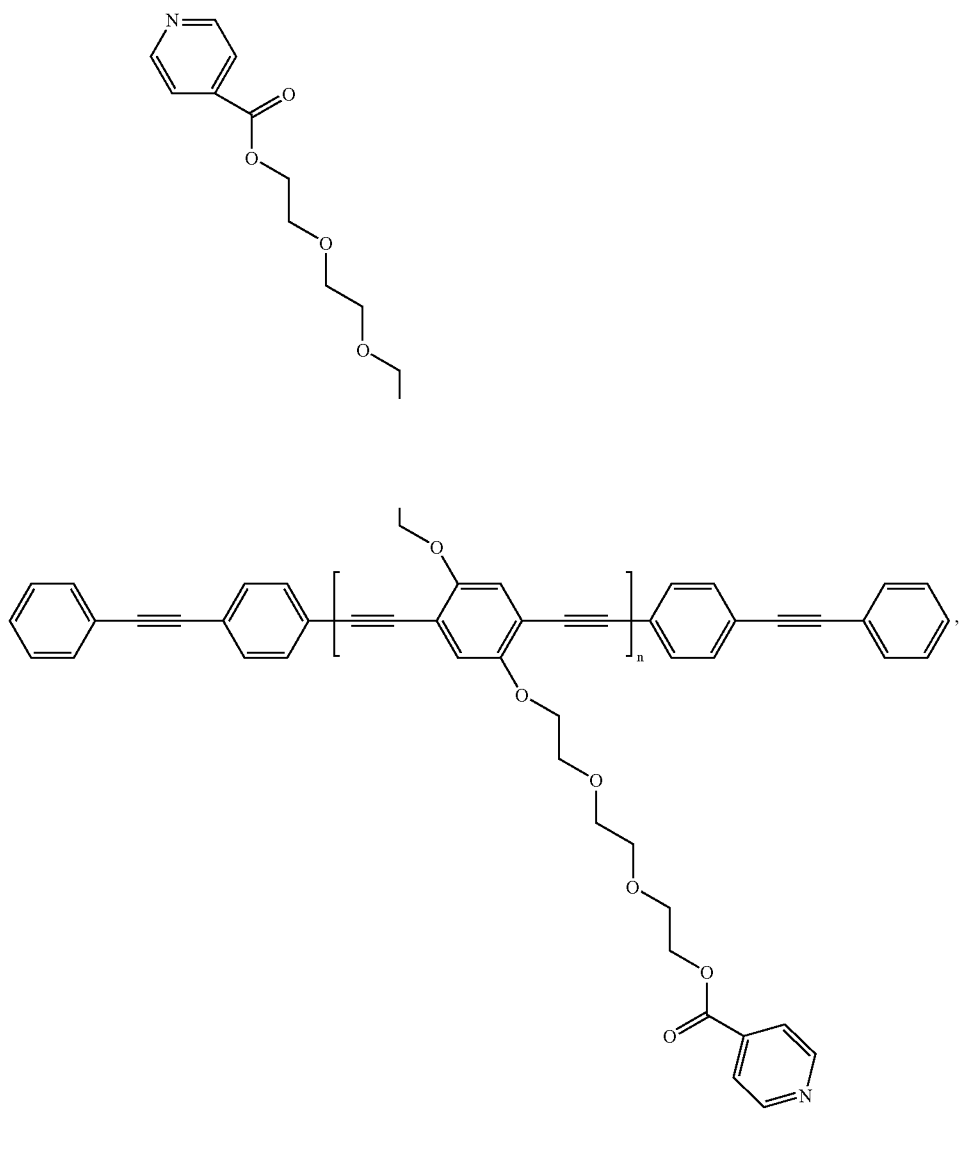

-continued
y)
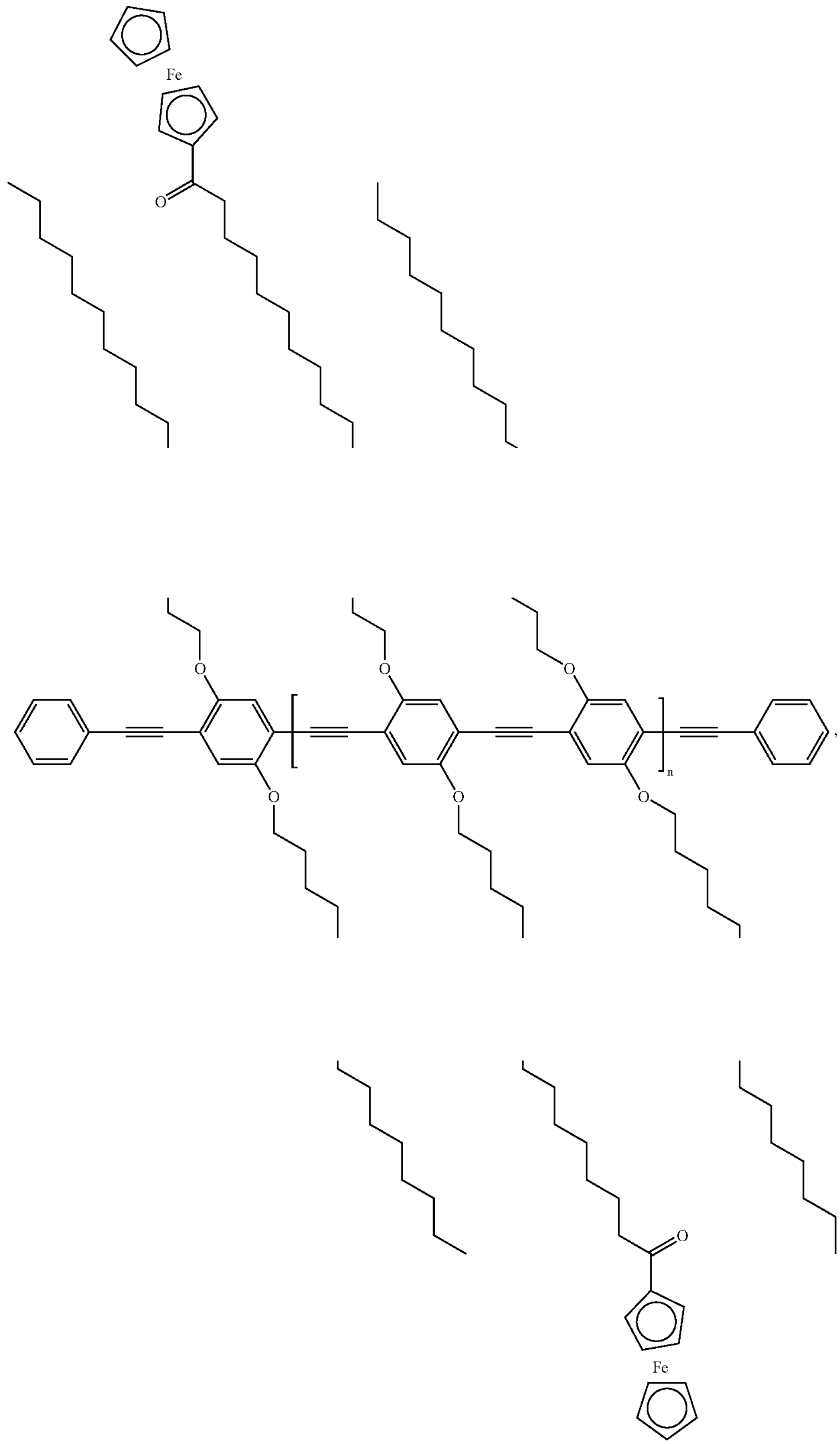

-continued
z)
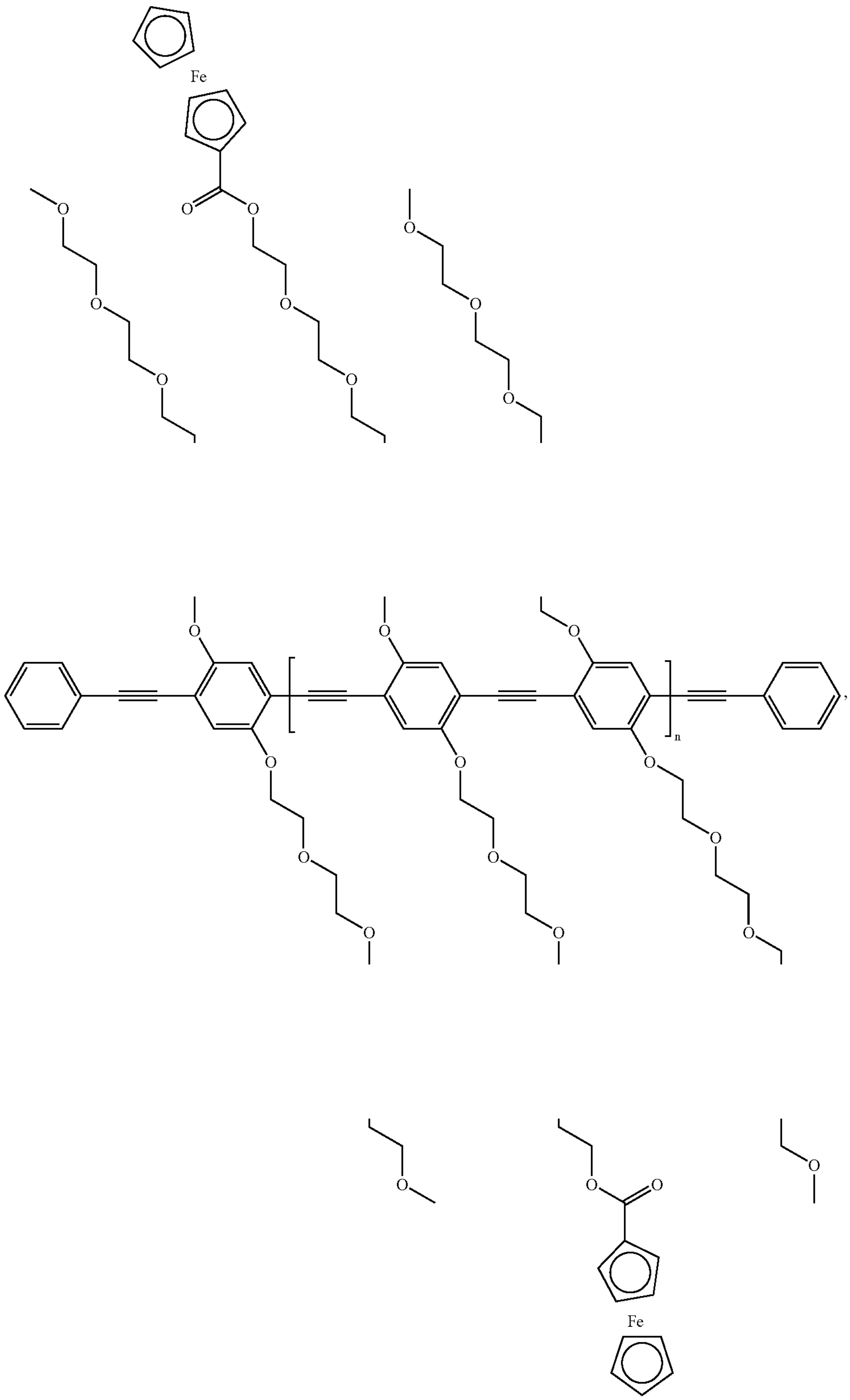

-continued
aa)
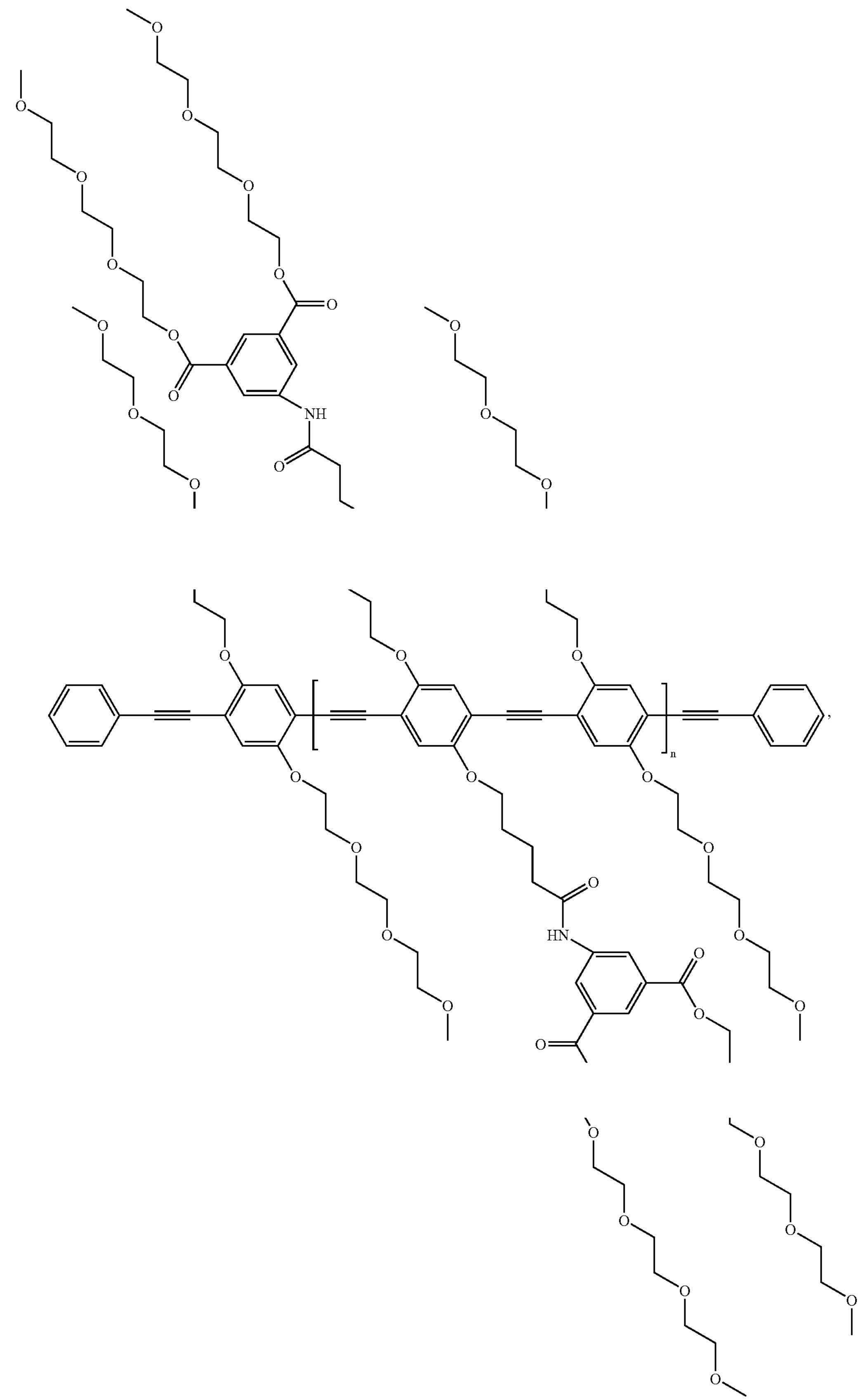

-continued
bb)
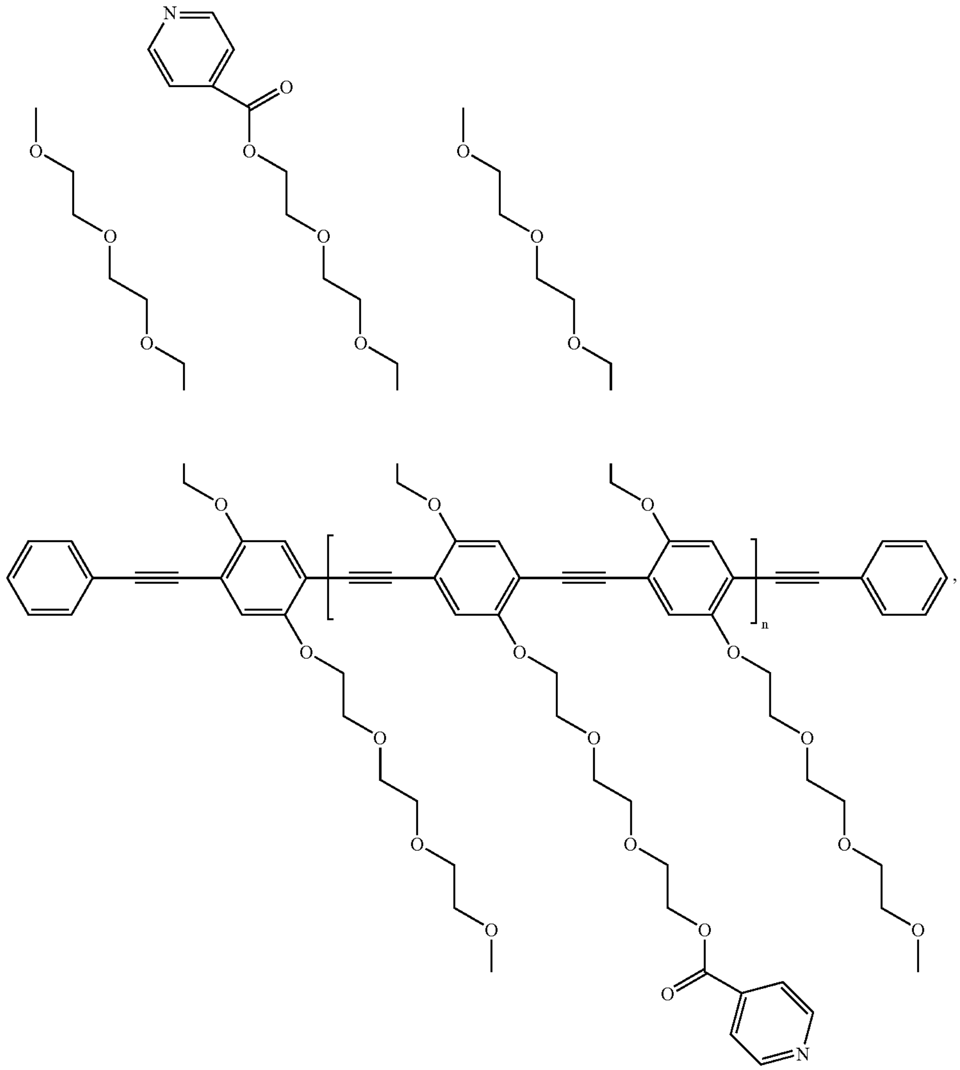
cc)
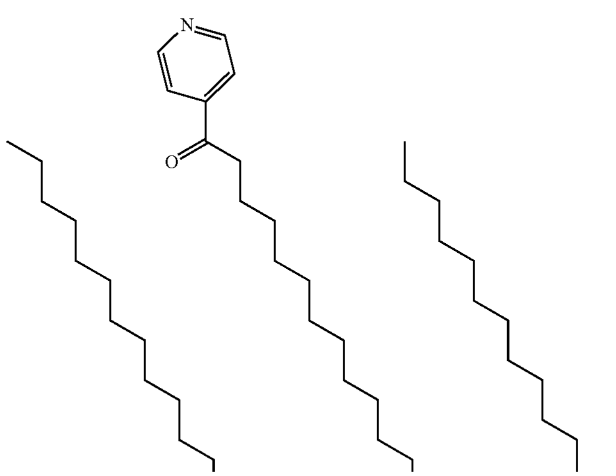

-continued
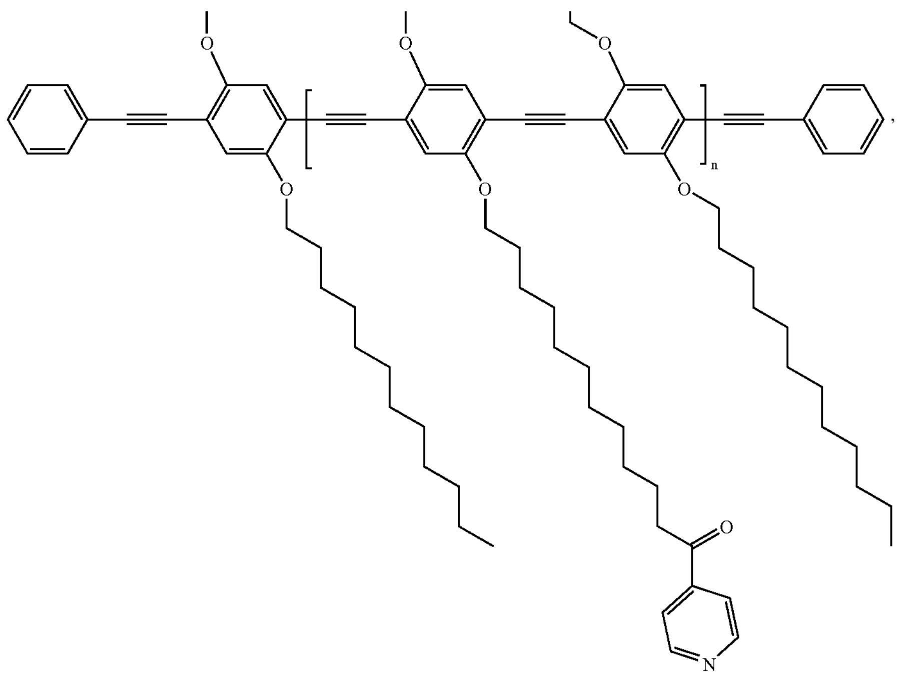
dd)
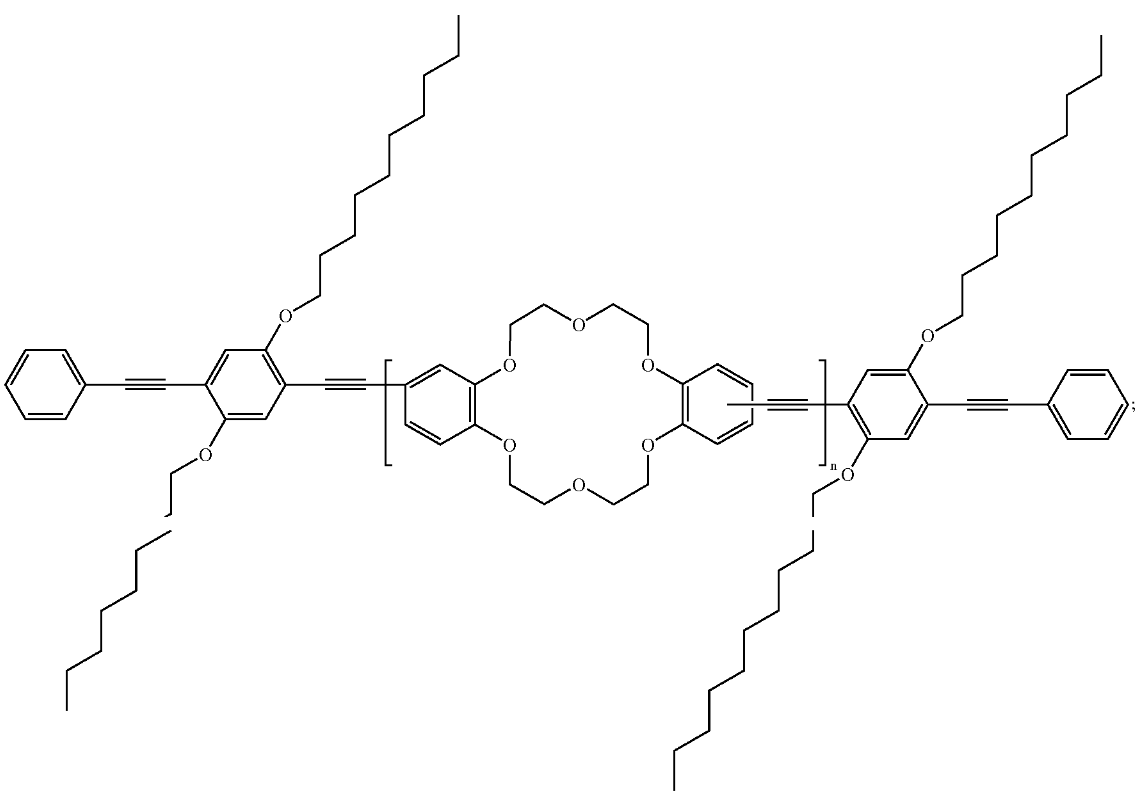
or, in addidtion, a carbon linkage as shown in ee) or jj), -continued
ee)
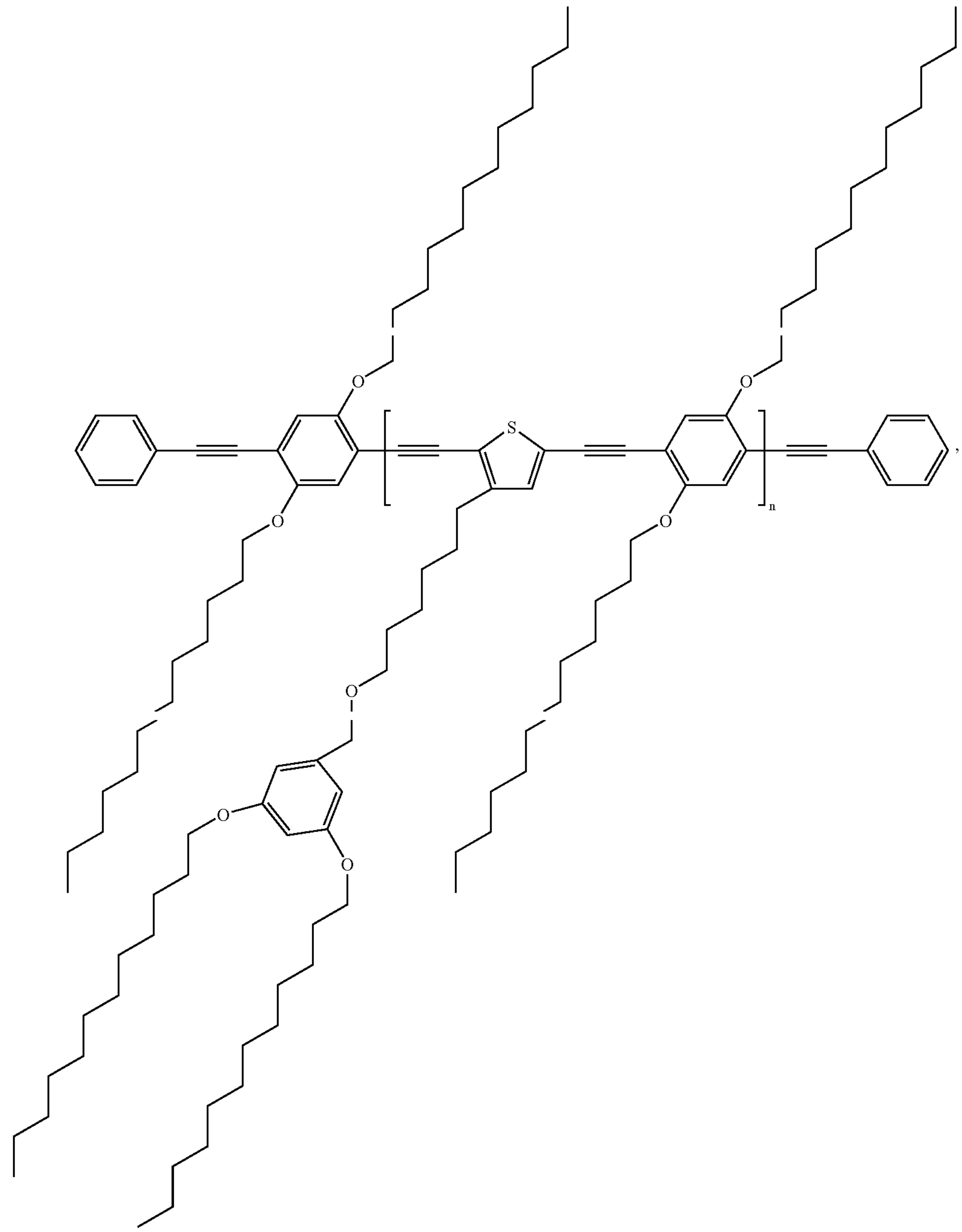
ff)
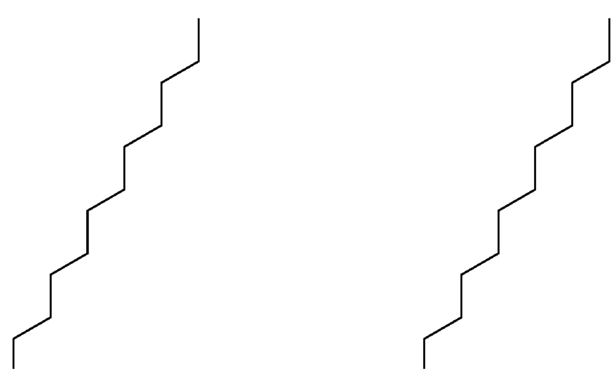

-continued
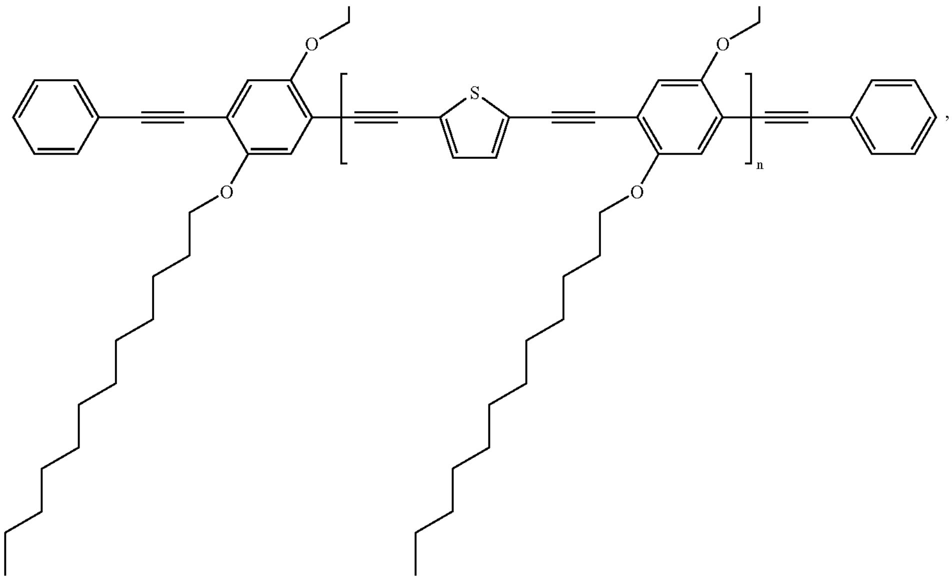
gg)
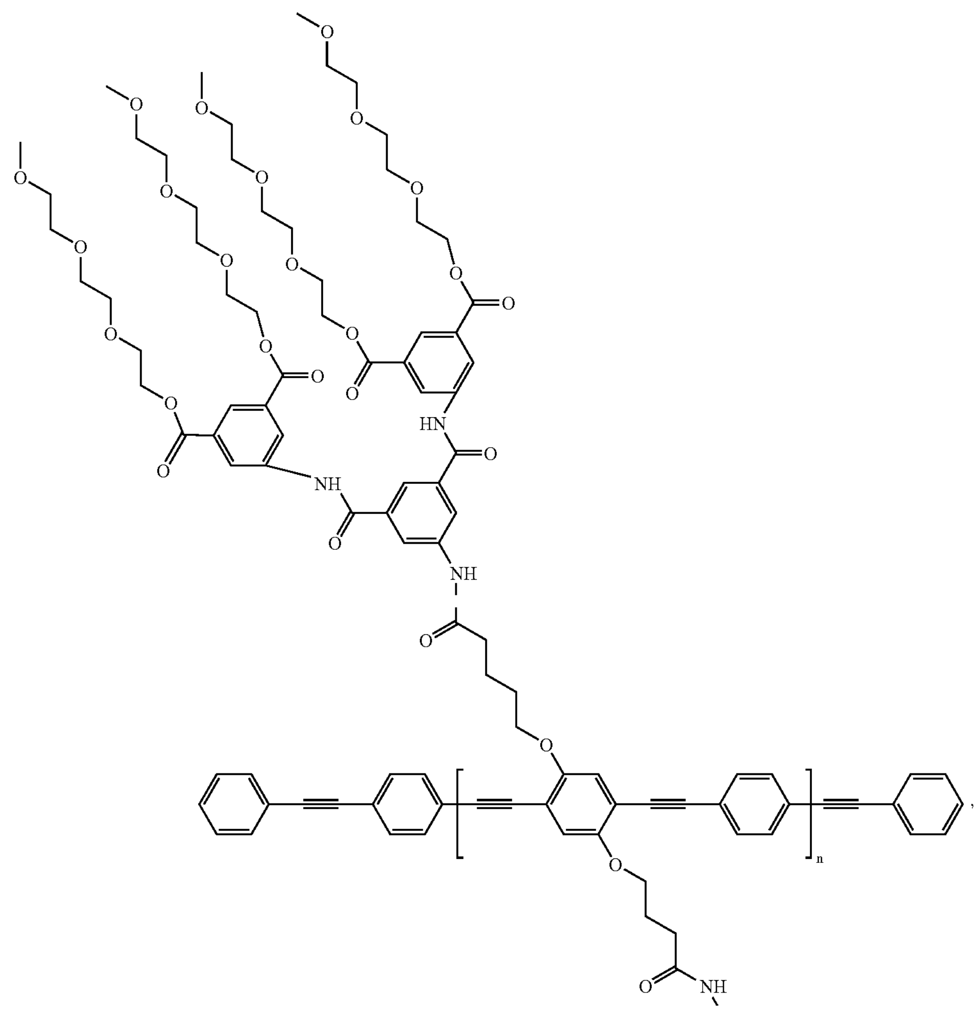

-continued
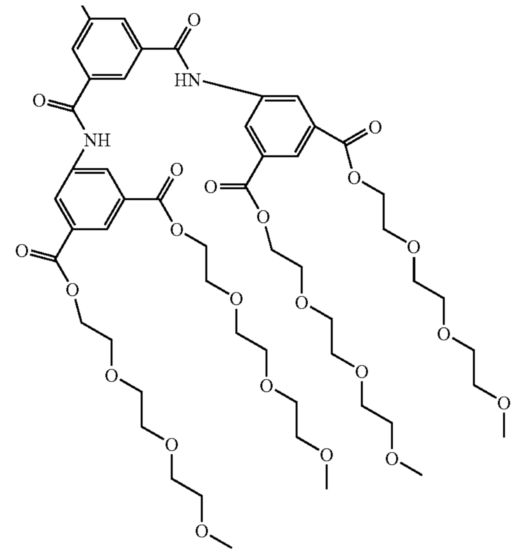
hh)
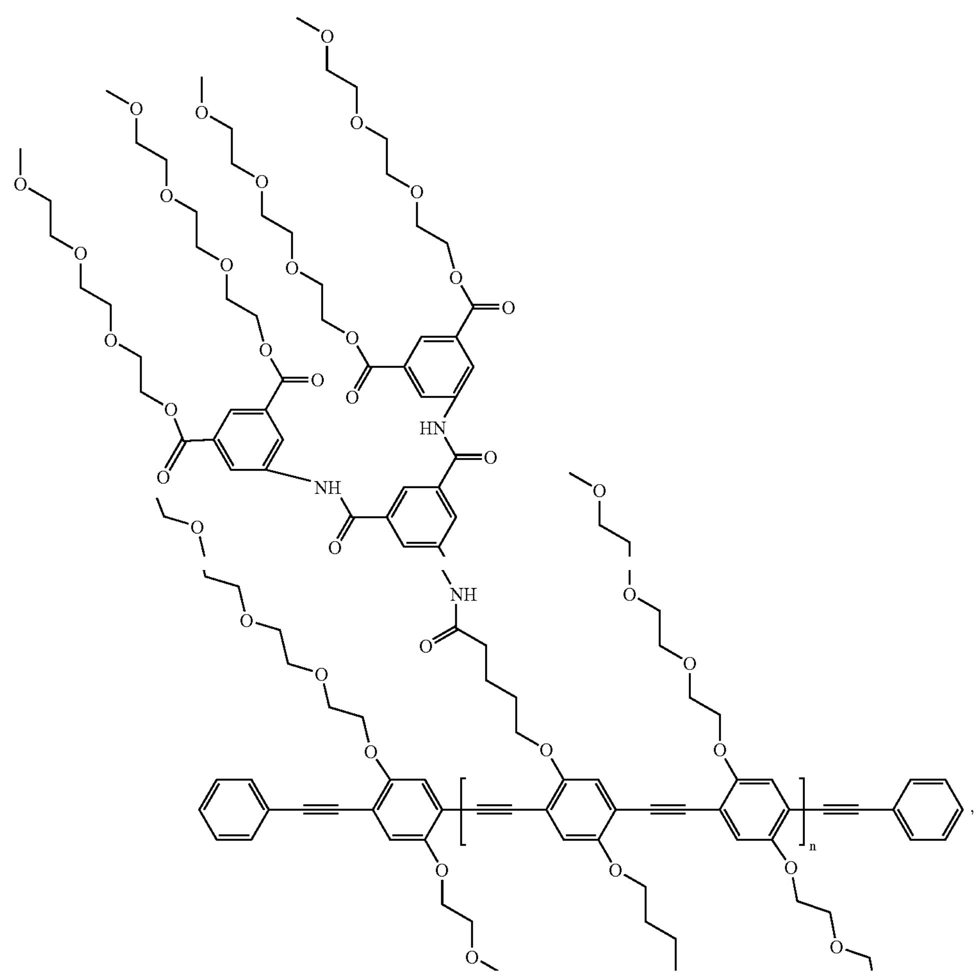

-continued
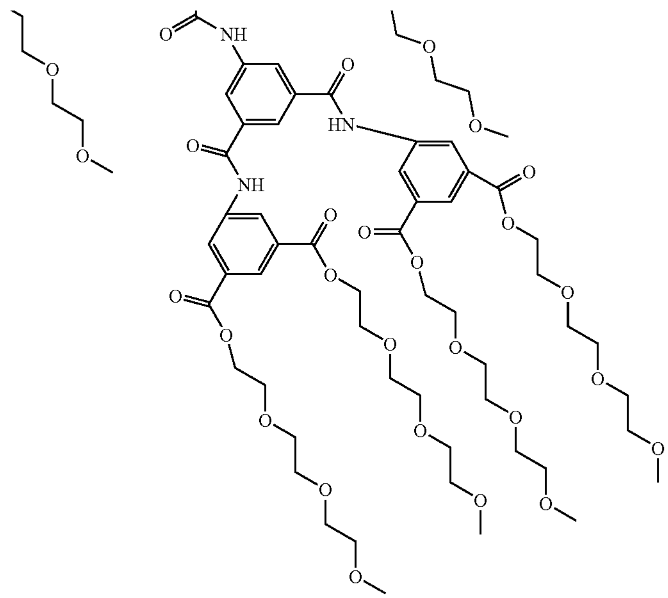
ii)
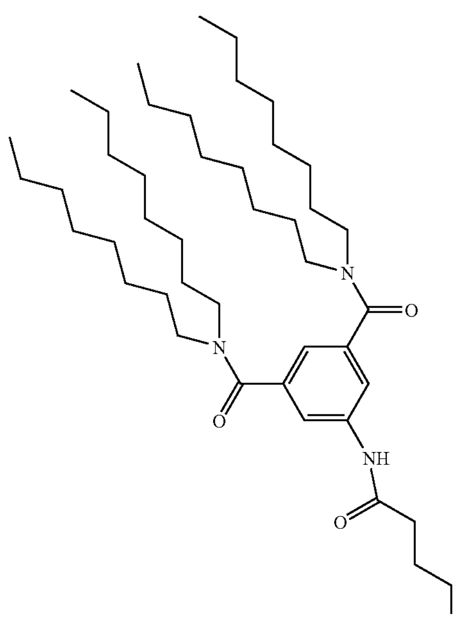

-continued
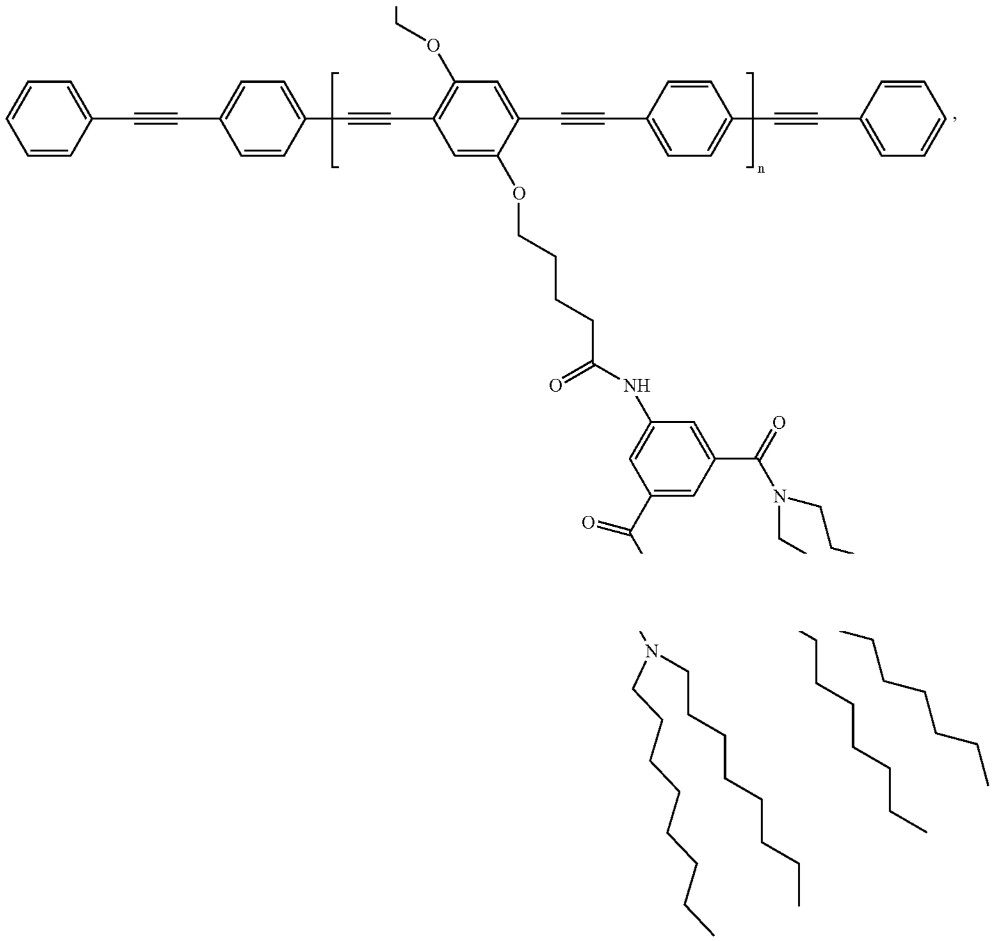
jj)
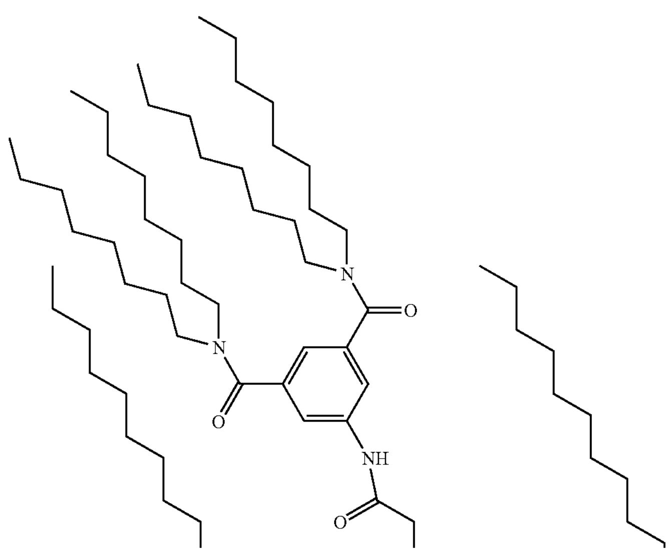

-continued
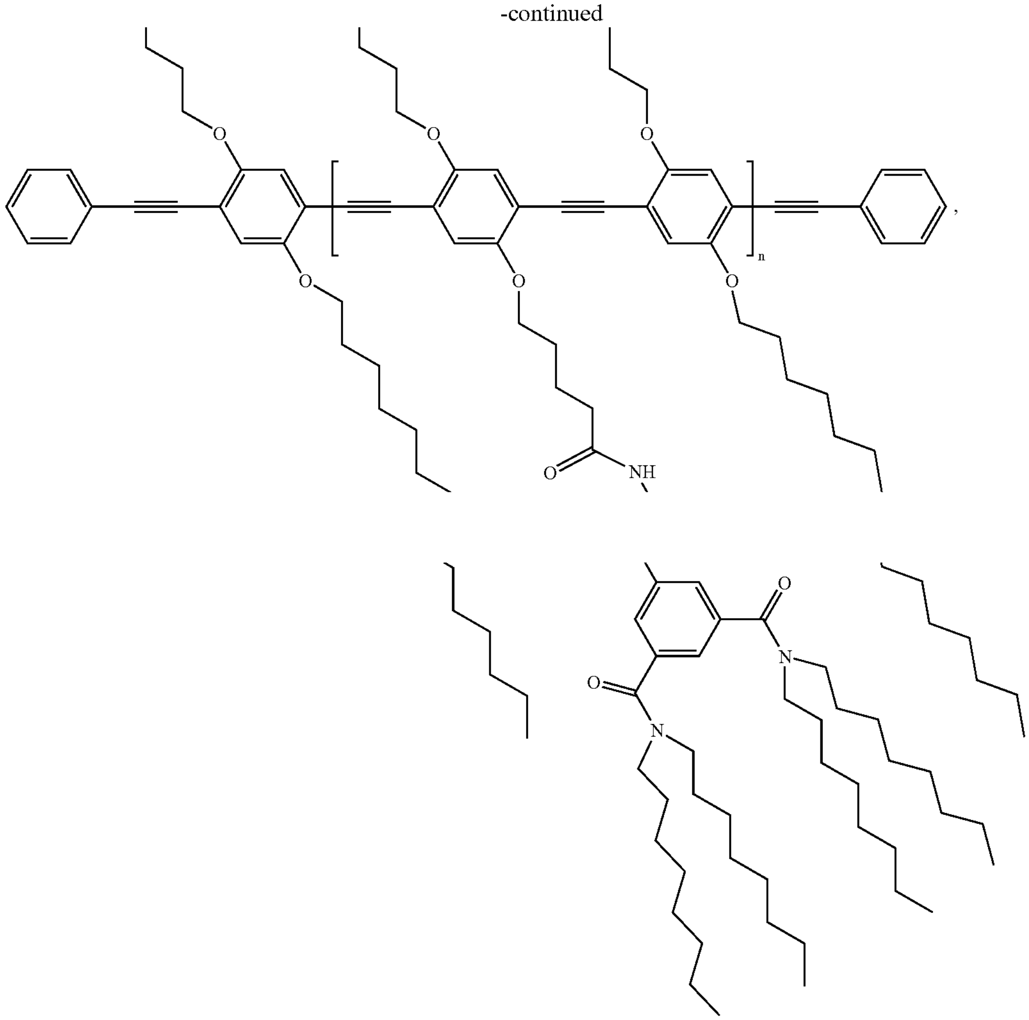
kk)
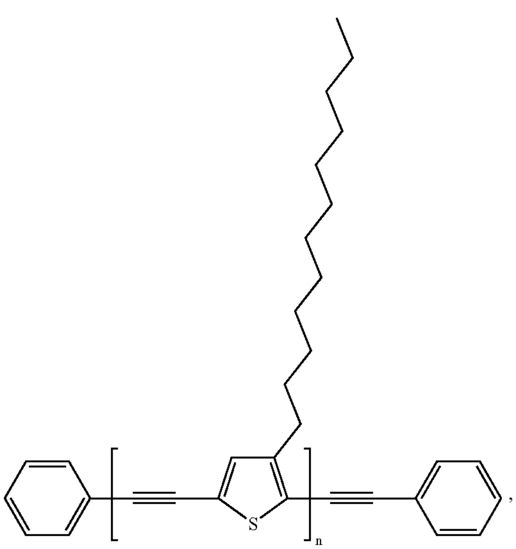
, or

-continued ll)

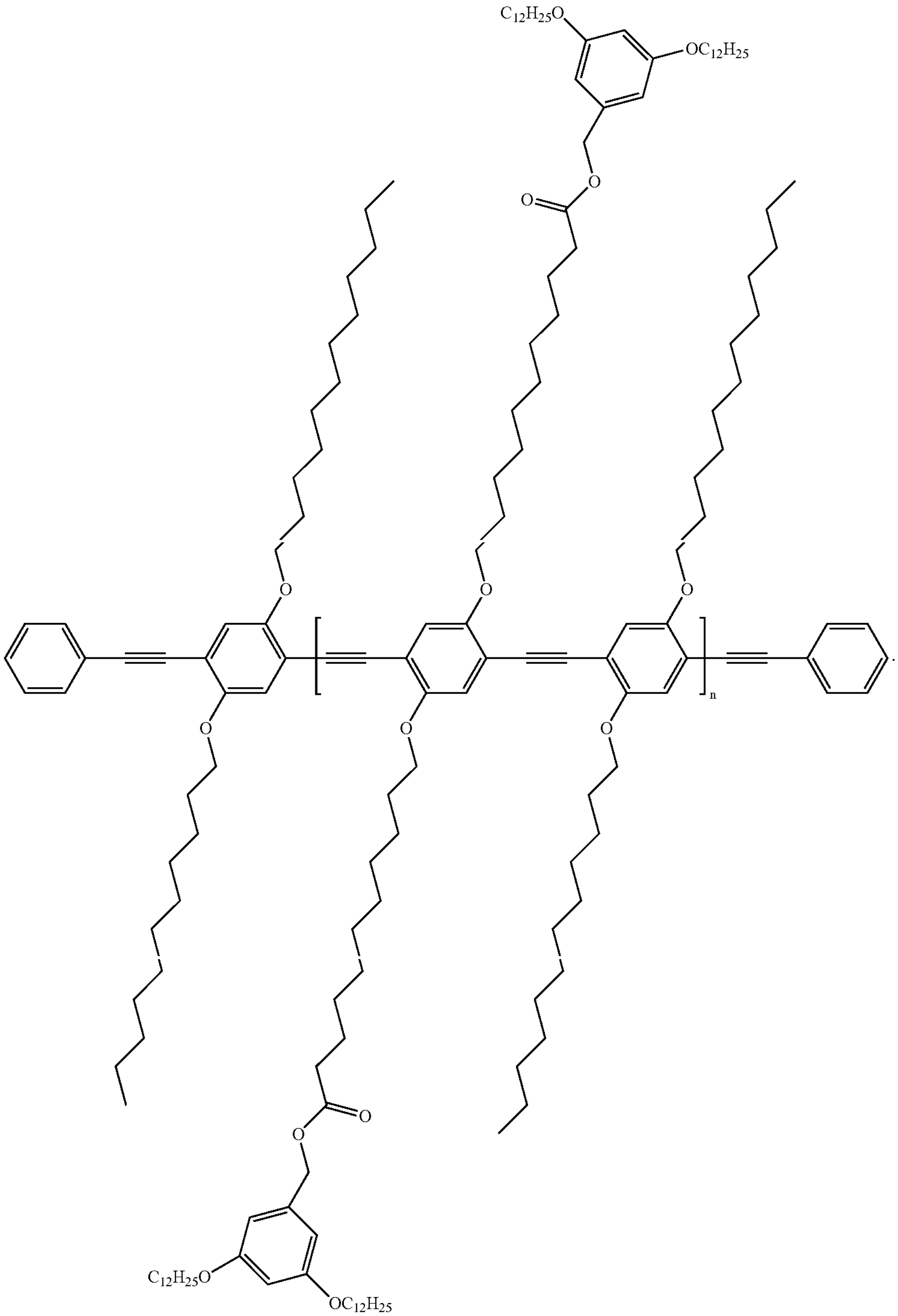

In an embodiment, the R group is designed to adjust the CNTs' solubility in various solvents, for example, using PPE polymers with linear or branched glycol side chains provides for high solubility of SWNTs in DMF or NMP, which further provides for uniform mixing of f-s-SWNTs with host polymers (for example, polyacrylonitrile) that are soluble in DMF or NMP, but not in halogenated solvents (such as chloroform). In further embodiments, the R groups bonded to the backbone via a carbon-carbon bond or an oxygen-carbon bond as described supra may have additional reactive species, i.e, functional groups, at the periphery of the R groups. The term "periphery," as used herein, means at the outer end of such R group side chains, away or distal from the backbone. Such functional groups include, for example, acetal, acid halide, acyl azide, aldehyde, alkane, anhydride, cyclic alkane, arene, alkene, alkyne, alkyl halide, aryl halide, amine, amide, amino acid, alcohol, azide, aziridine, azo compounds, calixarene, carbohydrate, carbonate, carboxylic acid, carboxylate, carbodiimide, cyclodextrin, crown ether, cryptand, diaminopyridine, diazonium compounds, ester, ether, epoxide, fullerene, glyoxal, imide, imine, imidoester, ketone, nitrile, isothiocyanate, isocyanate, isonitrile, lactone, maleimide, metallocene, NHS ester, nitroalkane, nitro compounds, nucleotide, oligosaccharide, oxirane, peptide, phenol, phthalocyanine, porphyrin, phosphine, phosphonate, polyimine (2,2'-bipyridine, 1,10-phenanthroline, terpyridine, pyridazine, pyrimidine, purine, pyrazine, 1,8-naphthyridine, polyhedral oligomeric silsesquioxane (POSS), pyrazolate, imidazolate, torand, hexapyridine, 4,4'-bipyrimidine, for example), pyridine, quaternary ammonium salt, quaternary phosphonium salt, quinone, Schiff base, selenide, sepulchrate, silane, sulfide, sulfone, sulfonyl chloride, sulfonic acid, sulfonic acid ester, sulfonium salt, sulfoxide, sulfur and selenium compounds, thiol, thioether, thiol acid, thio ester, thymine, or a combination thereof.

Peripheral functional groups at the ends of R groups distal to the backbone of the functionalized, solubilized nanotube enhance interaction between the functionalized, solubilized nanomaterial and the host matrix of composites of the present invention. Such peripheral functional groups are designed to improve the interfacial bonding between functionalized, solubilized CNTs and the host matrix. For example, using PPE polymers with reactive functional groups (such as epoxide, or amine, or pyridine) at the end of linear or branched side chains distal to the backbone provides for covalent bonding between f-s-SWNTs and an epoxy matrix, therefore increasing mechanical properties of an f-s-SWNTs/epoxy nanocomposite, for example. Further, using a PPE polymer with a thiol group at or near the end of a linear or branched side chain provides for enhanced interaction between f-s-SWNTs and gold or silver nanoparticles (host matrices), for example. A further example provides SWNTs functionalized with a PPE polymer having thymine at the end of a linear side chain. A fiber can then be assembled with SWNTs functionalized with such PPE polymers and with PPE polymers having diaminopyridine in the end of linear side chain by forming extensive parallel triple (three-point) hydrogen bonds.

While the term "f-s-SWNTs," as used herein, means functionalized, solubilized single walled nanotubes, the term means that other nanomaterials as cited supra may be substituted unless otherwise stated herein.

Rigid, conjugated polymers for functionalization include a poly(phenyleneethynylene) (PPE), poly(aryleneethynylene), or poly(3-decylthiophene), for example. Such functionalization provides for a solubility of carbon nanomaterial in solvents and lengthy sonication procedures are not needed. This non-wrapping functionalization is suitable for nanomaterial as described herein. Since the polymer is attached to the nanomaterial surface by noncovalent bonding instead of covalent bonding, the underlying electronic structure of the nanotubes and their key attributes are not affected.

Complex nanocomposites: Nanocomposites can themselves be used as a host matrix for a second filler to form a complex nanocomposites. Examples of a second filler include: continuous fibers (such as carbon fibers, carbon nanotube fibers, carbon nanotube nanocomposite fibers, KEVLAR® fibers, ZYLON® fibers, SPECTRA® fibers, nylon fibers, or a combination thereof, for example), discontinuous fibers (such as carbon fibers, carbon nanotube fibers, carbon nanotube nanocomposite fibers, KEVLAR® fibers, ZYLON® fibers, SPECTRA® fibers, nylon fibers, or a combination thereof, for example), nanoparticles (such as metallic particles, polymeric particles, ceramic particles, nanoclays, diamond particles, or a combination thereof, for example), and microparticles (such as metallic particles, polymeric particles, ceramic particles, clays, diamond particles, or a combination thereof, for example).

A number of existing materials use continuous fibers, such as carbon fibers, in a matrix. These fibers are much larger than carbon nanotubes. Adding f-s-SWNTs to the matrix of a continuous fiber reinforced nanocomposite results in a complex nanocomposite material having improved properties such as improved impact resistance, reduced thermal stress, reduced microcracking, reduced coefficient of thermal expansion, or increased transverse or through-thickness thermal conductivity. Resulting advantages in complex nanocomposite structures include improved durability, improved dimensional stability, elimination of leakage in cryogenic fuel tanks or pressure vessels, improved through-thickness or inplane thermal conductivity, increased grounding or electromagnetic interference (EMI) shielding, increased flywheel energy storage, or tailored radio frequency signature (Stealth), for example. Improved thermal conductivity also could reduce infrared (IR) signature. Further existing materials that demonstrate improved properties by adding f-s-SWNTs include metal particle nanocomposites for electrical or thermal conductivity, nano-clay nanocomposites, or diamond particle nanocomposites, for example.

Method of fabricating nanocomposites: Methods to incorporate nanomaterial into the host matrix include, but are not limited to: (i) in-situ polymerization of monomer(s) of the host polymer in a solvent system in the presence of functionalized solubilized nanomaterial; (ii) mixing both functionalized solubilized nanomaterial and host matrix in a solvent system; or (iii) mixing functionalized solubilized nanomaterial with a host polymer melt.

A method of forming nanocomposites in accordance with certain embodiments of the present invention includes the use of solvents for dissolving functionalized solubilized nanomaterial and host matrix. A solvent may be organic or aqueous such as, for example, $CHCl_3$, chlorobenzene, water, acetic acid, acetone, acetonitrile, aniline, benzene, benzonitrile, benzyl alcohol, bromobenzene, bromoform, 1-butanol, 2-butanol, carbon disulfide, carbon tetrachloride, chlorobenzene, chloroform, cyclohexane, cyclohexanol, decalin, dibromoethane, diethylene glycol, diethylene glycol ethers, diethyl ether, diglyme, dimethoxymethane, N,N-dimethylformamide, ethanol, ethylamine, ethylbenzene, ethylene glycol ethers, ethylene glycol, ethylene oxide, formaldehyde, formic acid, glycerol, heptane, hexane, iodobenzene, mesitylene, methanol, methoxybenzene, methylamine, methylene bromide, methylene chloride, methylpyridine, morpholine, naphthalene, nitrobenzene, nitromethane, octane, pentane, pentyl alcohol, phenol, 1-propanol, 2-propanol, pyridine, pyrrole, pyrrolidine, quinoline, 1,1,2,2-tetrachloroethane, tetrachloroethylene, tetrahydrofuran, tetrahydropyran, tetralin, tetramethylethylenediamine, thiophene, toluene, 1,2,4-trichlorobenzene, 1,1,1-trichloroethane, 1,1,2-trichloroethane, trichloroethylene, triethylamine, triethylene glycol dimethyl ether, 1,3,5-trimethylbenzene, m-xylene, o-xylene, p-xylene, 1,2-dichlorobenzene, 1,3-dichlorobenzene, 1,4-dichlorobenzene, or N-methyl-2-pyrrolidone.

Further examples of solvents include ionic liquids or supercritical solvents. Examples of ionic liquids include, for example, tetra-n-butylphosphonium bromide, tetra-n-butylammonium bromide, 1-ethyl-3-methyl-imidazolium chloride, 1-butyl-3-methyl-imidazolium chloride, 1-hexyl-3-methyl-imidazolium chloride, 1-methyl-3-octyl-imidazolium chloride, 1-butyl-4-methyl-pyridinium chloride, 1-ethyl-3-methyl-imidazolium tetrafluoroborate, 1-butyl-3-methyl-imidazolium tetrafluoroborate, 1-hexyl-3-methyl-imidazolium tetrafluoroborate, 3-methyl-1-octyl-imidazolium tetrafluoroborate, 1-butyl-4-methyl-pyridinium tetrafluoroborate, 1-ethyl-3-methyl-imidazolium hexafluorophosphate, 1-butyl-3-methyl-imidazolium hexafluorophosphate, 1-hexyl-3-methyl-imidazolium hexafluorophosphate, 1-butyl-4-methyl-pyridinium hexafluorophosphate, 1,3-dimethylimidazolium methylsulfate, 1-butyl-3-methyl-imidazolium methylsulfate, dimethylimidazolium triflate, 1-ethyl-3-methylimidazolium triflate, 1-butyl-3-methylimidazolium triflate, 1-butyl-3-ethylimidazolium triflate, or trihexyltetradecylphosphonium chloride. Examples of supercritical solvents include, for example, supercritical carbon dioxide, supercritical water, supercritical ammonia, or supercritical ethylene.

The functionalized solubilized nanomaterial may comprise an amount by weight or volume of the nanocomposite greater than zero and less than 100%; an amount equal to or within a range of any of the following percentages: 0.01%, 0.02%, 0.04%, 0.05%, 0.075%, 0.1% 0.5%, 1.0%, 1.5%, 2.0%, 2.5%, 3.0%, 3.5%, 4.0%, 4.5%, 5.0%, 5.5%, 6.0%, 7.0%, 8.0%, 9.0%, 10%, 15%, 20%, 25%, 30%, 35%, 40%, 45%, 50%, 55%, 60%, 65%, 70%, and 75%; an amount by weight or volume of the nanocomposite equal to or greater than 0.1% and less than or equal to 50%; or an amount by weight or volume of the nanocomposite equal to or greater than 1% to 10%.

The f-s-SWNT mass-fraction loading values for f-s-SWNTs/host matrix nanocomposites are based on pristine SWNT material only and exclude the additive material (the "f-s" material).

Percolation threshold: Nanocomposites of the present invention provide superior electrical or thermal conductivity, or superior mechanical properties as compared with nanocomposites that lack functionalized solubilized nanomaterial. One measure of such nanocomposite properties is the percolation threshold of the nanocomposite. The percolation threshold is the minimum amount by weight or volume of functionalized solubilized nanomaterial present within the host matrix that provides an interconnectivity within the matrix. A low percolation threshold indicates good dispersion of nanomaterial within the host matrix. The percolation threshold is unique to the type of host matrix, type of nanomaterial, type of functionalization/solubilization, and conditions of fabricating the nanocomposites. The percolation threshold is also unique to a particular property, i.e., a percolation threshold for an electrical property may be different from a percolation threshold for a thermal property for a particular nanocomposite since an electrical property enhancement mechanism is different from a thermal property enhancement mechanism.

Composites of the present invention demonstrate a percolation threshold for electrical conductivity, or a percolation threshold for thermal conductivity within a range of any of the following percentages: 0.01%, 0.02%, 0.04%, 0.05%, 0.075%, 0.1% 0.5%, 1.0%, 1.5%, 2.0%, 2.5%, 3.0%, 3.5%, 4.0%, 4.5%, 5.0%, 6%, 7%, 8%, 9%, 10%, 15%, 20%, 25%, 30% and 33% by weight of volume. In other embodiments, a percolation threshold for electrical conductivity or a percolation threshold for thermal conductivity is equal to or greater than 0.01%, 0.02%, 0.04%, 0.05%, 0.1% 0.5%, 1.0%, 1.5%, 2.0%, 3.0%, 4.0%, 5.0%, 10% and less than or equal to 20.0% by weight or volume. In further embodiments, a percolation threshold for electrical conductivity or a percolation threshold for thermal conductivity is equal to or greater than 0.01%, 0.02%, 0.04%, 0.05%, 0.1%, 0.5%, 1.0%, 1.5%, 2.0%, 3.0%, 4.0%, and less than or equal to 5.0% by weight or volume.

Percolation threshold is determined by measuring the property of interest of a nanocomposite versus the mass fraction of loading of functionalized, solubilized nanomaterial into a matrix such as provided in the examples infra. For example, the nanocomposite PPE-SWNTs/polystyrene has a percolation threshold for electrical conductivity of 0.045 wt % of SWNT loading, while the nanocomposite PPE-SWNTs/polycarbonate has a percolation threshold for electrical conductivity of 0.11 wt % of SWNT loading.

Nanocomposites for electrical applications: Nanocomposite embodiments of the present invention have an electrical conductivity percolation threshold that is lower than that of the nanocomposite comprising the host matrix and nanomaterial other than the functionalized, solubilized nanomaterial. By providing electrical conductivity at acceptable loadings, embodiments of the present invention make possible applications such as electrostatic dissipation, electrostatic painting, electromagnetic interference (EMI) shielding, printable circuit wiring, transparent conductive coatings.

Articles of manufacture comprising a nanocomposite of the present invention include wire, printable circuit wire, coatings, transparent coatings, coatings for resist materials, resist materials, films, fibers, powders, inks, ink jettable nanocomposite solutions, paints, electrosprayed paints, EMI shields, conductive sealants, conductive caulks, conductive adhesives, opto-electronic devices, for example, and other articles for electrically conductive applications such as electrostatic dissipation, electrostatic painting, or electromagnetic interference (EMI) shielding, for example.

Nanocomposites for thermal applications: Nanocomposite embodiments of the present invention have a thermal conductivity percolation threshold that is lower than that of the nanocomposite comprising the host matrix and nanomaterial other than the functionalized, solubilized nanomaterial. Enhanced thermal conductivity provides many applications. Nanocomposite materials can be engineered to be more compliant and conforming, thus providing much better heat transfer to take advantage of the high thermal conductivity in the material. Therefore, nanocomposites herein are useful for heat transfer, either heating or cooling, or packaging, for example.

Articles of manufacture comprising a nanocomposite of the present invention include electronics, photonics, microelectromechanical (MEMS) packaging, heat spreaders, heat sinks, packages, modules, heat pipes, housings, enclosures, heat exchangers, radiant heaters, thermal interface materials, heat spreaders, films, fibers, powders, coatings, automotive applications including, for example, under-hood components, radiators, sensor housings, electronic modules, or fuel cells, industrial applications, including, for example, electrical coil components, pump parts, electric motor parts, transformers, piping, tubing, or heating, ventilation or air conditioning (HVAC) equipment.

Figure 5B:
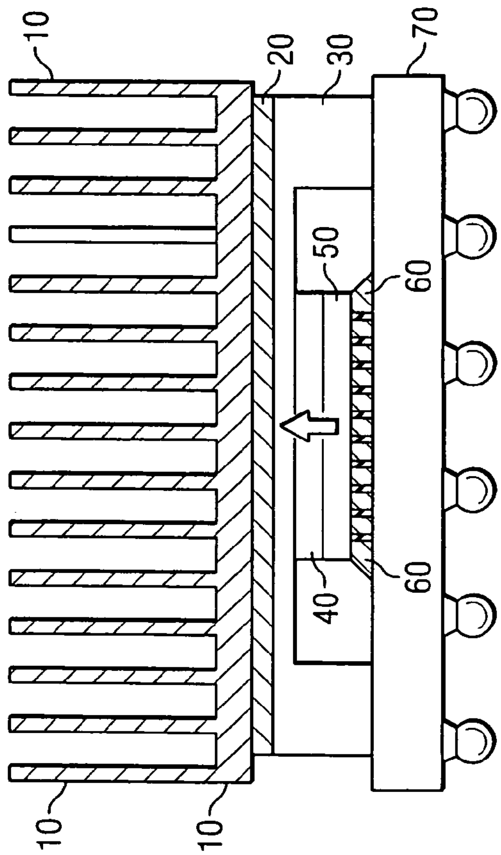
FIG. 5A and FIG. 5B show example heat transfer applications of a CNT-polymer composite in accordance with certain embodiments of the present invention.
Figure 5A:
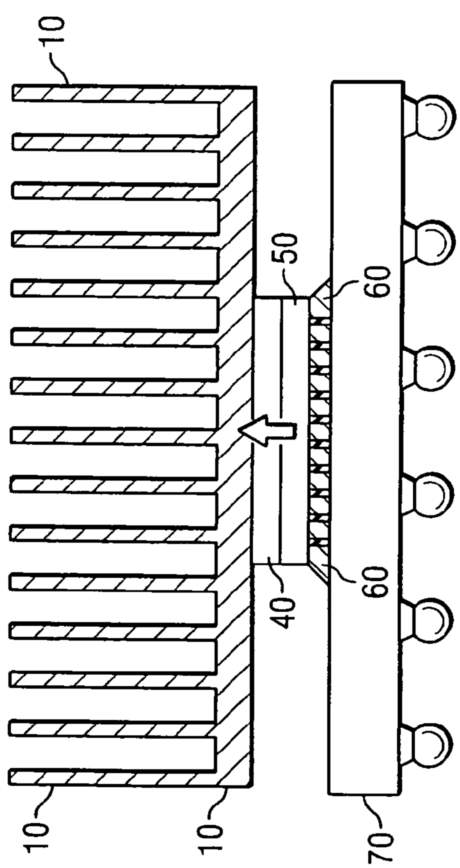

For example, a heat transfer application using nanocomposites of the present invention as a thermal interface between an integrated circuit ("IC") (or IC package) and an accompanying heat sink is shown in FIG. 5A and FIG. 5B and includes heatsink 10, TIM2 20 (thermal-interface material over the integrated heat spreader), integrated heat spreader 30 (HIS), TIM1 40 (thermal-interface material over the die), die 50, underfill 60, and substrate 70. FIG. 5A shows an example thermal-solution architecture that is typically used in laptop applications. The example architecture of FIG. 5A comprises heatsink 10, TIM1 (thermal-interface material over the die) 40, die 50, underfill 60, and substrate 70. FIG. 5B shows another example thermal-solution architecture that is typically used in desktop and server applications. The example architecture of FIG. 5B comprises heatsink 10, TIM2 (thermal-interface material over the integrated heat spreader) 20, integrated heat spreader (HIS) 30, TIM1 (thermal-interface material over the die) 40, die 50, underfill 60, and substrate 70. For example, nanocomposites of the present invention may be used in TIM1 40 or TIM2 20 in the architectures of FIG. 5A and FIG. 5B.

The thermal conductivity properties provided by nanocomposites of the present invention make the nanocomposites suitable for cooling electrical components, such as in the example architectures of FIG. 5A and FIG. 5B, by effectively conducting heat away from the component (e.g., to a heat sink 10). In certain embodiments, the nanocomposite interface (e.g., TIM1 40 and/or TIM2 20) may be implemented as a solid material (e.g., a solid sheet) that is formed to fit in the architecture in a desired manner. In other embodiments, the nanocomposite interface may be implemented as a viscous (e.g., "gooey") substance.

Nanocomposites for mechanical applications: Nanocomposite embodiments of the present invention have an improved mechanical property, such as any one of tensile stress, tensile strain, stiffness, strength, fracture toughness, creep resistance, creep rupture resistance, and fatigue resistance, as compared to that of the nanocomposite comprising the host matrix and nanomaterial other than the functionalized, solubilized nanomaterial. By providing an improved mechanical property at acceptable loadings, embodiments of the present invention make various mechanical applications possible.

Articles of manufacture comprising a nanocomposite of the present invention include adhesives, reinforced continuous fiber materials, aircraft structures, aircraft gas turbine engine components, spacecraft structures, instrument structures, missiles, launch vehicle structures, reusable launch vehicle cryogenic fuel tanks fitting attachment, compressed natural gas and hydrogen fuel tanks, ship and boat structures, pressure vessel fitting attachment, sporting goods, industrial equipment, automotive and mass transit vehicles, offshore oil exploration and production equipment, wind turbine blades, medical equipment (e.g. x-ray tables), orthotics, prosthetics, films, fibers, powders, or furnitures.

Nanocomposites having low percolation thresholds for more than one property or more than one improved property: While a nanocomposite of the present invention may have different percolation thresholds for different properties, a nanocomposite may have low percolation thresholds for more than one property and therefore provide multiple advantageous properties. For example, a nanocomposite may have an increased electrical conductivity at a low f-s-SWNT loading and, in addition, an enhanced mechanical or thermal property at that loading. Due to the multifunctional nature of f-s-SWNTs, nanocomposites herein may be useful for one or more than one of electrical, mechanical, thermal, chemical, sensing and actuating applications, for example.

Adhesives are widely used to assemble electronics. In many applications, they must be electrical insulators. However, there many applications for which electrical conductivity is desirable or at least acceptable. There are also strong drivers for adhesives with improved thermal conductivity. For example, diamond particle-reinforced adhesives are now used in production applications. Based on the advantageous thermal conductivity of nanocomposites herein, this could be an important application. In instances where high thermal conductivity is desirable, but electrical insulation is required, very thin electrically insulating interfaces can be used in conjunction with nanocomposites so that the multi-layered structure would provide both electrical insulation and high thermal conductivity.

Further articles of manufacture comprising nanocomposites of the present invention include aircraft structures, aircraft gas turbine engine components, spacecraft structures, instrument structures, missiles, launch vehicle structures, reusable launch vehicle cryogenic fuel tanks, ship or boat structures, sporting goods, industrial equipment, automotive or mass transit vehicles, offshore oil exploration or production equipment, wind turbine blades, medical equipment (e.g. x-ray tables), orthotics, or prosthetics, for example.

The process of noncovalent functionalization of carbon nanotubes used in the present examples for making nanocomposite materials is described by Chen, J. et al. (*J. Am. Chem. Soc.,* 124, 9034 (2002)) which process results in excellent nanotube dispersion. SWNTs produced by high pressure carbon monoxide process (HiPco) were purchased from Carbon Nanotechnologies, Inc. (Houston, Tex.), and were solubilized in chloroform with poly(phenyleneethynylene)s (PPE) along with vigorous shaking and/or short bath-sonication as described by Chen et al. (ibid) and in U.S. patent application US 2004/0034177 published Feb. 19, 2004, having U.S. Ser. No. 10/255,122, filed Sep. 24, 2002, and U.S. patent application U.S. Ser. No. 10/318,730 filed Dec. 13, 2002, previously incorporated herein by reference. For the present examples, the PPE was provided by Haiying Liu (Department of Chemistry, Michigan Technological University, Houghton, Mich. 49931).

The following examples are presented to further illustrate various aspects of the present invention, and are not intended to limit the scope of the invention.

EXAMPLE 1

Electrical Conductivity of Nanocomposites of Polymer and Functionalized, Solubilized Nanomaterial Noncovalently functionalized, soluble SWNTs/polymer nanocomposites of the present example show improvements in electrical conductivity over the polymer itself, with very low percolation thresholds (0.05-0.1 wt % of SWNT loading).

PPE-functionalized SWNT solutions were mixed with a host polymer (polycarbonate or polystyrene) solution in chloroform to give a homogeneous nanotube/polymer nanocomposite solution. A uniform nanocomposite film was prepared from this solution on a silicon wafer with a 100 nm thick thermal oxide layer either by drop casting or by slow-speed spin coating. The samples were then heated to 80° C. to 90° C. to remove residual solvent.

Figure 1B:
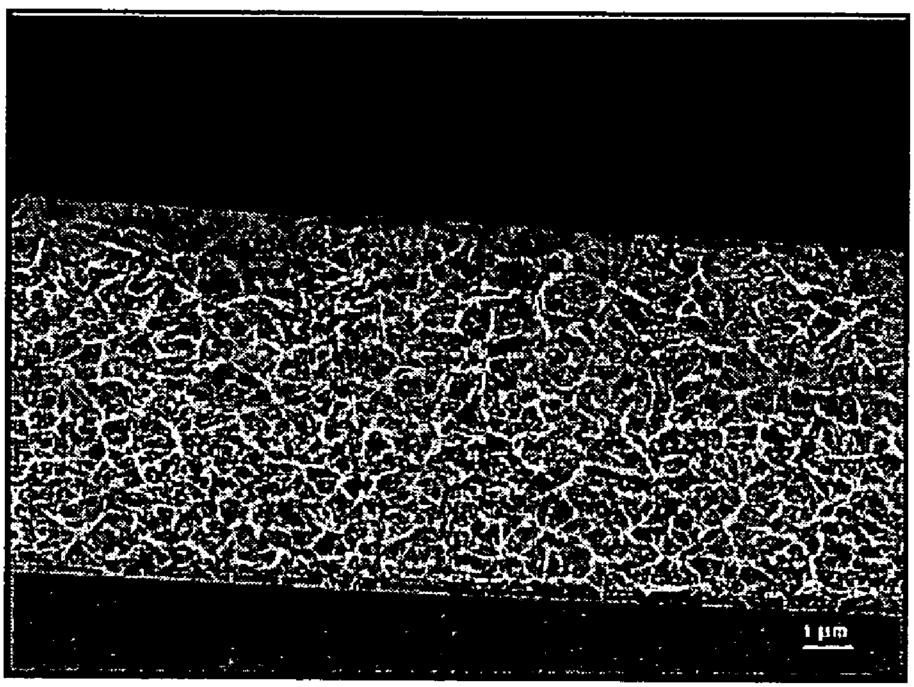
FIG. 1B is a scanning electron microscopy image showing the cross-section of PPE-SWNTs/polystyrene nanocomposite film prepared by an embodiment of the present invention using 5 wt % of SWNTs.

Nanotube polymer nanocomposite films with various amounts of solubilized and functionalized SWNT loadings from 0.01 wt % to 10 wt % in polystyrene as well as in polycarbonate were prepared. Thicknesses of the films were measured using a LEO 1530 Scanning Electron Microscope or a profilameter. A typical thickness of a nanocomposite film was in the range of 2-10 μm. The SWNT mass-fraction loading values for f-s-SWNTs/host polymer nanocomposites are based on pristine SWNT material only and exclude the additive material. FIG. 1A and FIG. 1B show scanning electron microscope (SEM) images of the surface (1A) and the cross section (1B) of PPE-SWNTs/polystyrene nanocomposite film (5 wt % SWNTs) prepared by solution casting. The images show excellent dispersion of PPE-functionalized SWNTs in host polymer matrix. f-s-SWNTs are randomly distributed not only along the surface (FIG. 1A), but also through the cross section (FIG. 1B), indicating the formation of an isotropic, three dimensional nanotube network in host polymer matrix, thereby allowing for the possibility that the nanocomposites demonstrate isotropic electrical conductivity. The films show individual and bundles of f-s-SWNTs uniformly mixed in the polymer matrix.

Electrical conductivity measurements were performed using a standard four point probe method to reduce the effects of contact resistance. A Phillips DM 2812 power supply and a Keithly 2002 digital multimeter were used to measure the current-voltage characteristics of the samples.

Figure 2A:
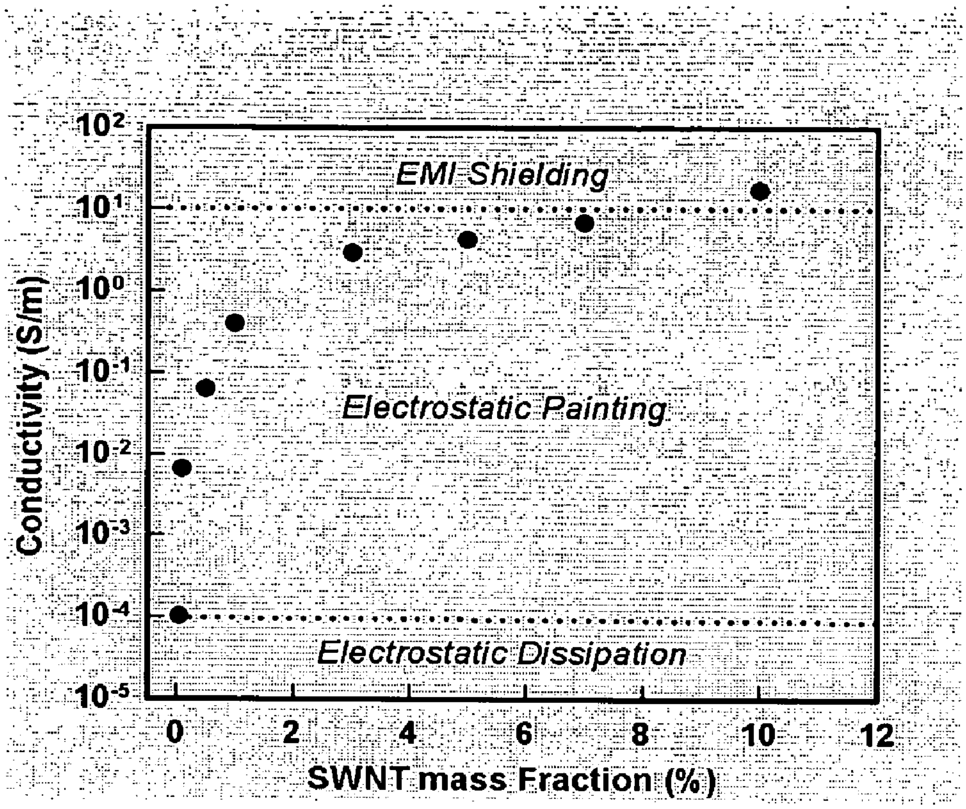
FIG. 2A shows room temperature electrical conductivity in siemens/meter (S/m) (also known as measured volume conductivity) of a PPE-SWNTs/polystyrene nanocomposite versus the SWNT weight loading for embodiments formed in accordance with the present invention. The dashed lines represent approximate conductivity lower bounds required for EMI shielding, electrostatic painting, and for electrostatic dissipation. At 0% mass fraction, the conductivity is about $10^{-14}$ S/m.
Figure 2B:
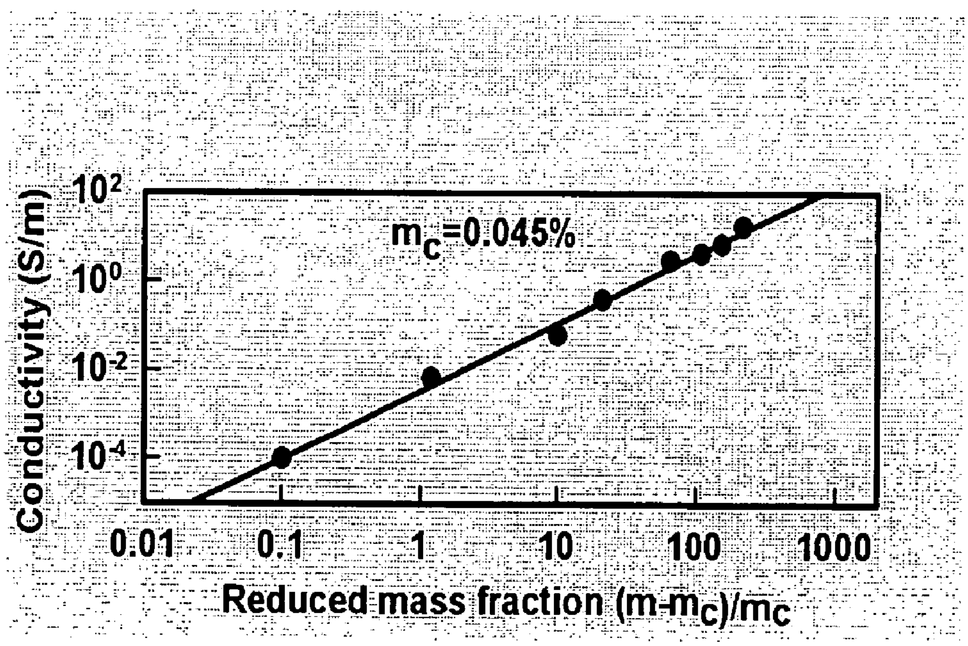
FIG. 2B shows room temperature conductivity of the PPE-SWNTs/polystyrene nanocomposite as a function of reduced mass fraction of SWNTs. The percolation threshold $m_c$ is 0.045%.

Composites prepared using PPE functionalized nanotubes exhibit very low percolation thresholds and many orders of increase in electrical conductivity. FIG. 2A shows the measured volume conductivity of PPE-SWNTs/polystyrene nanocomposites as a function of the SWNT loading and formed in accordance with an embodiment of the present invention. The conductivity of the composite increases sharply between 0.02 wt % to 0.05 wt % SWNT loading, indicating the formation of a percolating network. At the onset of percolating network, the electrical conductivity obeys the power law relation $$\sigma_c \propto (v-v_c)^{\beta} \quad (1)$$

where $\sigma_c$ is the composite conductivity, v is the SWNT volume fraction, $v_c$ is the percolation threshold and β is the critical exponent. The densities of the polymer and the SWNT are similar, therefore, the mass fraction m and volume fraction v of the SWNT in the polymer are assumed to be the same. As shown in FIG. 2B, the PPE-SWNTs/polystyrene conductivity agrees very well with the percolation behavior of equation (1) above. The straight line with $m_c$=0.045% and β=1.54 gives an excellent fit to the data with a correlation factor of 0.994, indicating an extremely low percolation threshold at 0.045 wt % of SWNT loading. The very low percolation threshold is a signature of excellent dispersion of high aspect ratio soluble f-s-SWNTs. For comparison, the conductivity of pure polystyrene is about $10^{-14}$ S/m (C. A. Harper, *Handbook of plastics, Elastomers, and Composites,* 4th ed. (McGraw-Hill, 2002)), and the conductivity of pristine (unfunctionalized) HiPco-SWNT buckypaper is about $5.1\times10^{4}$ S/m. Buckypaper is not a nanocomposite as used herein since there is no host polymer present.

In addition to the very low percolation threshold, the conductivity of the nanocomposite reached 6.89 S/m at 7 wt % of SWNT loading, which is 14 orders of magnitude higher than that ($10^{-14}$ S/m) of pure polystyrene. The conductivity of 6.89 S/m at 7 wt % of SWNT loading is 5 orders of magnitude higher than that of a nonfunctionalized SWNTs (8.5 wt %)/polystyrene nanocomposite ($1.34\times10^{-5}$ S/m) that was prepared by in situ polymerization (H. J. Barraza, et al., *Nano Lett.* 2, 797 (2002)). In contrast to the in situ polymerization technique, this method of using functionalized carbon nanotube to obtain highly dispersed nanocomposite is applicable to various host matrices and does not require lengthy sonication procedures.

Figure 3A:
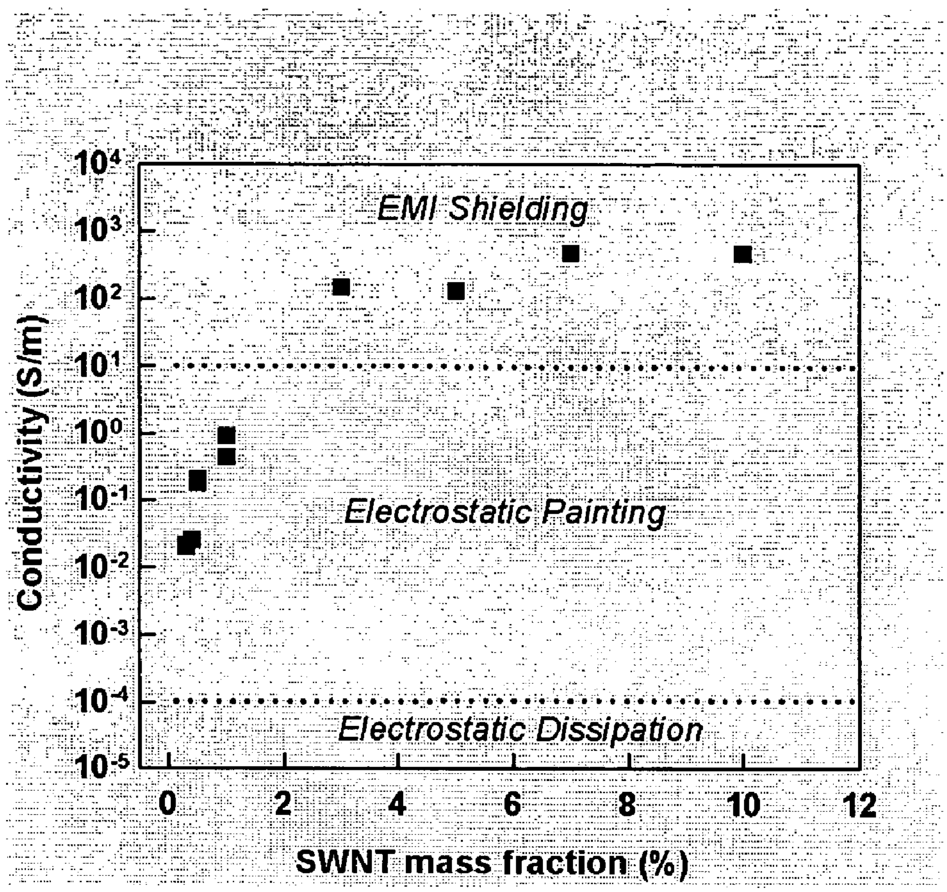
FIG. 3A shows room temperature electrical conductivity of a PPE-SWNTs/polycarbonate nanocomposite versus SWNT weight loading prepared by an embodiment of the present invention. The dashed lines represent approximate conductivity lower bounds required for EMI shielding, electrostatic painting, and for electrostatic dissipation.
Figure 3B:
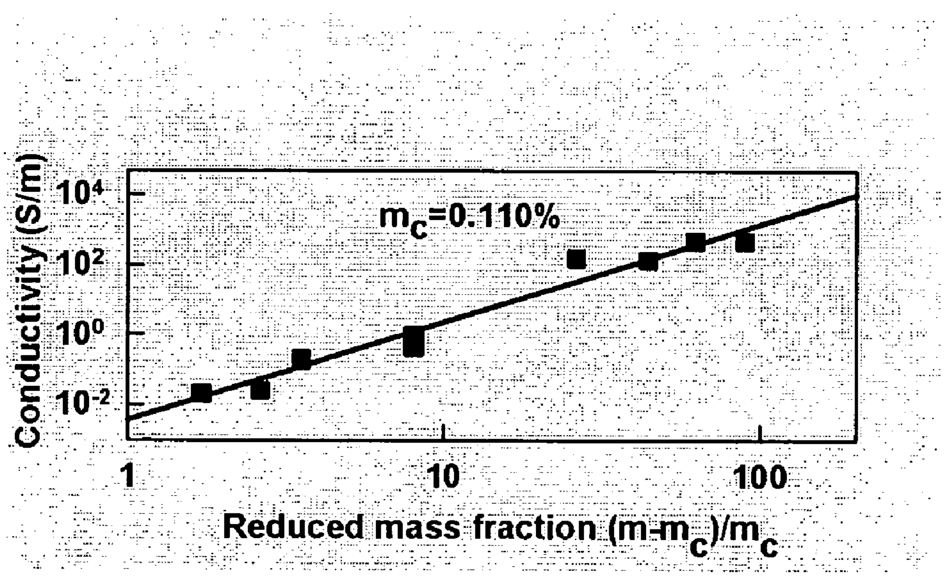
FIG. 3B shows room temperature conductivity of the PPE-SWNTs/polycarbonate nanocomposite as a function of reduced mass fraction of SWNTs. The percolation threshold $m_c$ is 0.110%.

FIG. 3A and FIG. 3B show the electrical conductivity (measured volume conductivity) of PPE-SWNTs/polycarbonate nanocomposites as a function of the SWNT loading for nanocomposites prepared by the same procedure as that of FIG. 2A and FIG. 2B. The conductivity of PPE-SWNTs/polycarbonate is generally higher that that of PPE-SWNTs/polystyrene at the same SWNT loading. For example, the conductivity reached $4.81\times10^{2}$ S/m at 7 wt % of SWNT loading, which is 15 orders of magnitude higher than that of pure polycarbonate (about $10^{-13}$ S/m, C. A. Harper, ibid.). For polycarbonate nanocomposites, as shown in FIG. 3B, a very low percolation threshold of 0.11 wt % of SWNT loading was observed ($m_c$=0.11%; 0=2.79).

FIG. 2A and FIG. 3A also show conductivity levels for electrical applications such as electrostatic dissipation, electrostatic painting and EMI shielding (Miller, *Plastics World,* 54, September, 73 (1996)). As shown in FIG. 3A, 0.3 wt % of SWNT loading in polycarbonate is sufficient for applications such as electrostatic dissipation and electrostatic painting, and 3 wt % of SWNT loading is adequate for EMI shielding applications. Since only a very low f-s-SWNT loading is required to achieve the cited conductivity levels, the host polymer's other preferred physical properties and processability would be minimally compromised within the nanocomposite.

In contrast to previous techniques (M. J. Biercuk, et al., *Appl. Phys. Lett.* 80, 2767 (2002)); Park, C. et al., *Chem. Phys. Lett.,* 364, 303(2002); Barraza, H. J. et al., *Nano Letters,* 2, 797 (2002)) the present process is applicable to assembly of various different polymer matrices and the dispersion of nanotubes is very uniform. The high conductivity levels indicate that the electrical properties of the carbon nanotubes are not affected by the nanocomposite. Further, the lengths of carbon nanotubes are preserved due to the absence of lengthy sonication procedures.

EXAMPLE 2

Thermal Conductivity of Nanocomposites of Polymer and Functionalized, Solubilized Nanomaterial Noncovalently functionalized, soluble SWNTs/polymer nanocomposites of the present example show improvements in thermal conductivity as compared to that of the polymer itself.

Thermal conductivity was measured on nanocomposites with various amounts of SWNT loadings from 0.5 wt % to 10 wt %. Films of the nanocomposites were prepared by solution casting on a PTFE substrate and the free standing films were peeled off from the substrate. A typical film thickness was about 50-100 microns. Out-of-plane thermal conductivity was measured using a commercial Hitachi Thermal Conductivity Measurement System (Hitachi, Ltd., 6, Kanda-Surugadai 4-chome, Chiyoda-ku, Tokyo 101-8010, Japan). At room temperature, f-s-SWNTs/polycarbonate nanocomposite film at 10 wt % of SWNTs loading results in ~35% increase in out-of-plane thermal conductivity as compared to that of pure polycarbonate film.

EXAMPLE 3

Mechanical Properties of Nanocomposites of Polymer and Functionalized, Solubilized Nanomaterial The present example provides improved mechanical properties of nanocomposites of f-s-SWNTs and polymer as compared with that of the polymer itself.

The term, PARMAX® (Mississippi Polymer Technologies, Inc., Bay Saint Louis, Miss.), refers to a class of thermoplastic rigid-rod polymers that are soluble in organic solvents and melt processable. PARMAX® is based on a substituted poly(1,4-phenylene) in which each phenylene ring has a substituted organic group R. The general structure of PARMAX® is shown at I.

I.

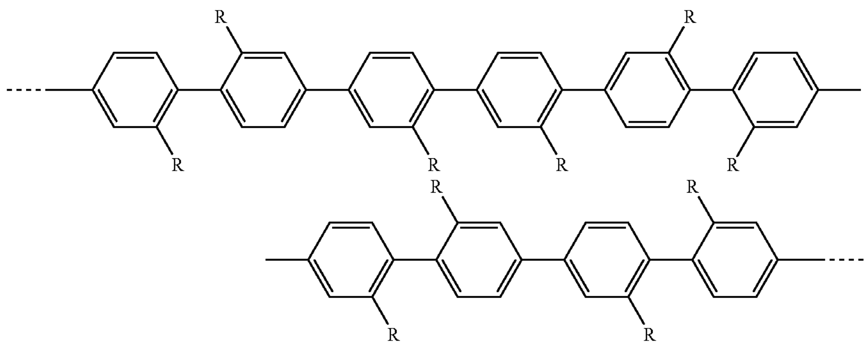

II.

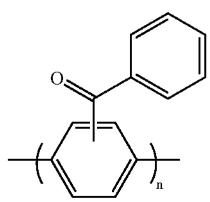

Parmax®-1000

III.

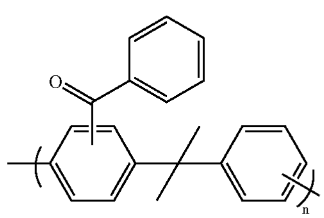

Parmax®-1200

The monomer of PARMAX®-1000 is shown at II. and the monomer of PARMAX®-1200 is shown at III.

A PARMAX®-1200 solution in chloroform was mixed with a PPE-SWNT solution in chloroform. The solution was cast on a substrate, for example, glass, and let dry to form a film. The film was further dried under vacuum and at a temperature appropriate for the solvent; for chloroform, ambient temperature is appropriate.

The mechanical properties of the nanocomposite were measured using an Instron Mechanical Testing System (Model 5567, Instron Corporation Headquarters, 100 Royall Street, Canton, Mass., 02021, USA). The results showed that 2 wt % of SWNTs reinforcement in the nanocomposite results in ~29% increase in tensile strength (from 154 to 199 MPa), and ~51% increase in Young's modulus (from 3.9 to 5.9 GPa) compared to the PARMAX® material itself.

Figure 6A:
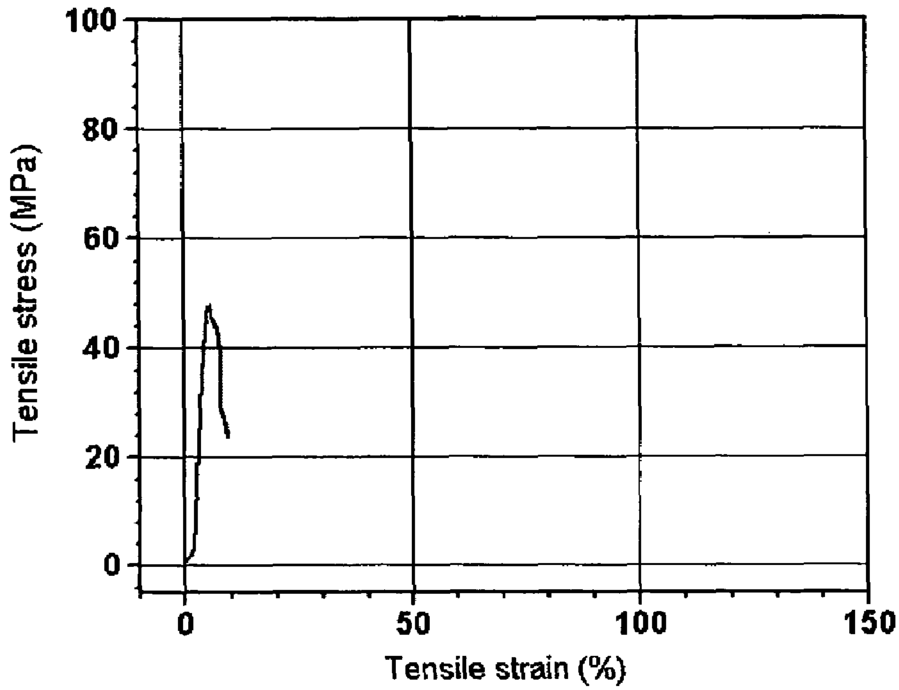
FIG. 6A shows tensile stress vs. tensile strain of pure polycarbonate film prepared by solution casting.
Figure 6B:
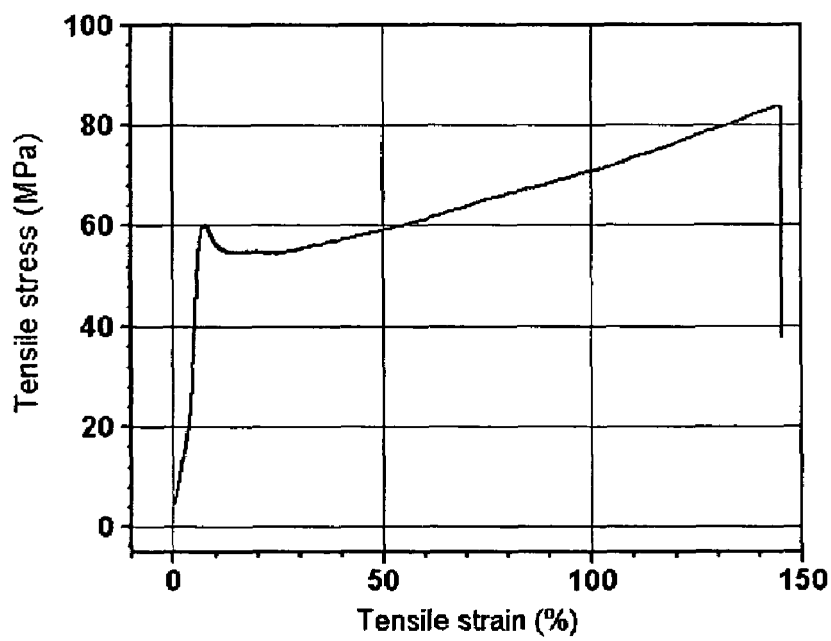
FIG. 6B shows tensile stress vs. tensile strain of f-s-SWNTs/polycarbonate film having 2 wt % SWNTs prepared by solution casting.

Further, pure polycarbonate film and f-s-SWNTs (2 wt % of SWNTs)/polycarbonate film were prepared by the solution casting on PTFE substrate. Mechanical measurements were done as cited supra. FIG. 6A shows the mechanical property of tensile stress vs. tensile strain for pure polycarbonate film, and FIG. 6B shows the mechanical property of tensile stress vs. tensile strain for f-s-SWNTs (2 wt % of SWNTs)/polycarbonate film. For example, the 2 wt % of SWNTs filling results in 79% increase in tensile strength of polycarbonate, and the break strain (tensile strain) is increased by approximately a factor of 10.

In addition to the film-casting method, the PPE-SWNT/PARMAX® nanocomposite can also be manufactured by other methods, such as compression molding, extrusion, or fiber spinning, for example. In one method, a PARMAX®-1200 solution in chloroform was mixed with a PPE-SWNT solution in chloroform to form a uniform solution of PPE-SWNTs/PARMAX® nanocomposite. Ethanol was added to the PPE-SWNTs/PARMAX® nanocomposite solution with vigorous stirring to precipitate the nanocomposite. After filtration and drying, a uniform powder of PPE-SWNTs/PARMAX® nanocomposite was obtained. The resulting nanocomposite powder is fabricated into a variety of shaped-solids by compression molding at 200-400° C. (preferably 315° C.) for ~30 min.

Figure 4:
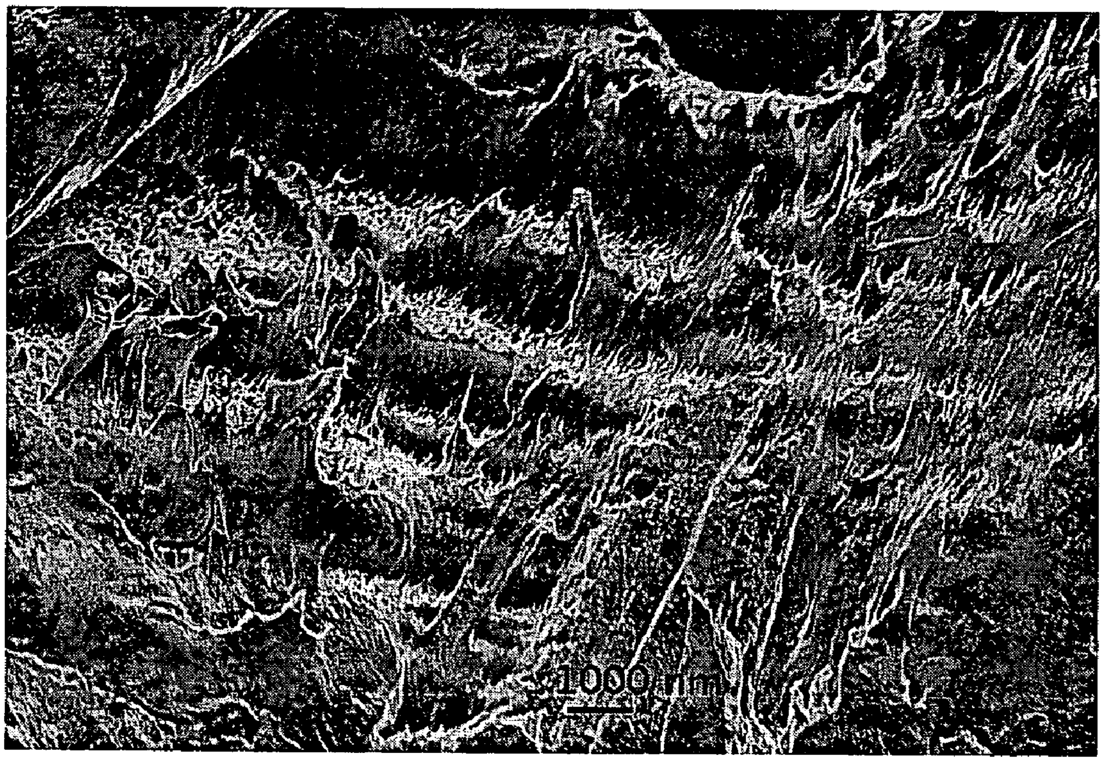
FIG. 4 shows a field-emission scanning electron microscopy image of a fracture surface at a broken end of a f-s-SWNTs polycarbonatenanocomposite film loaded at 1 wt % of SWNTs.

FIG. 4 shows a fracture surface in an f-s-SWNTs/polycarbonate nanocomposite. The nanotubes remain in the matrix even after the fracture, indicating strong interaction with the host polymer. Raw nanotubes often interact poorly with a matrix, that is, a fracture expels them and leaves behind voids in the material.

EXAMPLE 4

Improved Properties of Nanocomposites of Two Host Polymers and Functionalized, Solubilized Nanomaterial The present example provides improved mechanical and electrical properties of nanocomposites of f-s-SWNTs and two host polymers as compared with that of one host polymer.

A comparison was made between nanocomposites comprising f-s-SWNTs/epoxy and f-s-SWNTs/epoxy plus polycarbonate as host polymer(s) regarding electrical and mechanical properties. The nanocomposites were assembled from epoxy resin, epoxy hardener, PPE-SWNTs, and with or without polycarbonate. The processing steps are dispersing PPE-SWNTs and epoxy resin, hardener, and 5% by weight of the final composition of polycarbonate (in those compositions that contain polycarbonate) and stirring or shaking until the mixture is well dispersed to form a nanocomposite. For films, the mixture was either solution-cast or spin-coated and the solvent was removed by evaporation to produce a nanocomposite film with excellent nanotube dispersion.

Resulting mechanical and electrical properties are shown in Table 1 for solvent cast films of approximately 50 micrometers thickness.

TABLE 1

Mechanical and Electrical Properties of Nanocomposite Films Having Two Host Polymers and Functionalized, Solubilized Nanomaterial

| Film | SWNT loading (wt %) | Young's Modulus (GPa) | Tensile Strength at Break (MPa) | Electrical Conductivity (S/m) |
|---|---|---|---|---|
| Epoxy SC-15 | 0 | 0.42 | 16.0 | $10^{-14}$ |
| f-s-SWNTs/epoxy (no polycarbonate) | 5 | 0.75 | 22.2 | 0.053 |
| f-s-SWNTs/epoxy + 5 wt % polycarbonate | 5 | 1.23 | 46.3 | 1.17 |

The effectiveness of adding f-s-SWNTs to epoxy is apparent from the data of Table 1 that show the electrical conductivity of epoxy film alone to be $10^{-14}$ S/m and that of epoxy with functionalized solubilized nantubes to be $5.3\times10^{-2}$ S/m, an increase of about 12 orders of magnitude. Film having epoxy and f-s-SWNTs provides a modest improvement in mechanical properties over that of epoxy alone (Young's modulus is 0.75 GPa for the nanocomposite and 0.42 GPa for the epoxy film, and tensile strength is 22.2 MPa for the nanocomposite and 16.0 MPa for the epoxy film), possibly because of voids in the film.

The effectiveness of adding polycarbonate to the f-s-SWNTs and epoxy is apparent from the data of Table 1 that show the mechanical properties improved about two-fold (Young's modulus is 1.23 GPa for the two-polymer-composite and 0.75 GPa for the one-polymer-composite, and tensile strength is 46.3 MPa for the two-polymer-composite and 22.2 MPa for the one-polymer-composite). Film having the two-polymer nanocomposite provides about a 20-fold improvement in electrical conductivity over that of the one-polymer-composite (1.17 S/m for the two-polymer nanocomposite as compared to 0.053 for the one-polymer-composite).

Other embodiments of the present invention will be apparent to those skilled in the art from a consideration of this specification or practice of the embodiments disclosed herein. However, the foregoing specification is considered merely exemplary of the present invention with the true scope and spirit of the invention being indicated by the following claims.

The references cited herein, to the extent that they provide exemplary procedural or other details supplementary to those set forth herein, are specifically incorporated by reference.

As used herein and unless otherwise indicated, the terms "a" and "an" are taken to mean "one", "at least one" or "one or more".

What is claimed is:

1. A nanocomposite, comprising:

a host matrix comprising polymer matrix or nonpolymer matrix, and a functionalized, solubilized nanomaterial comprising a nanomaterial bonded with a polymer, the polymer being selected from the group consisting of:

(a)

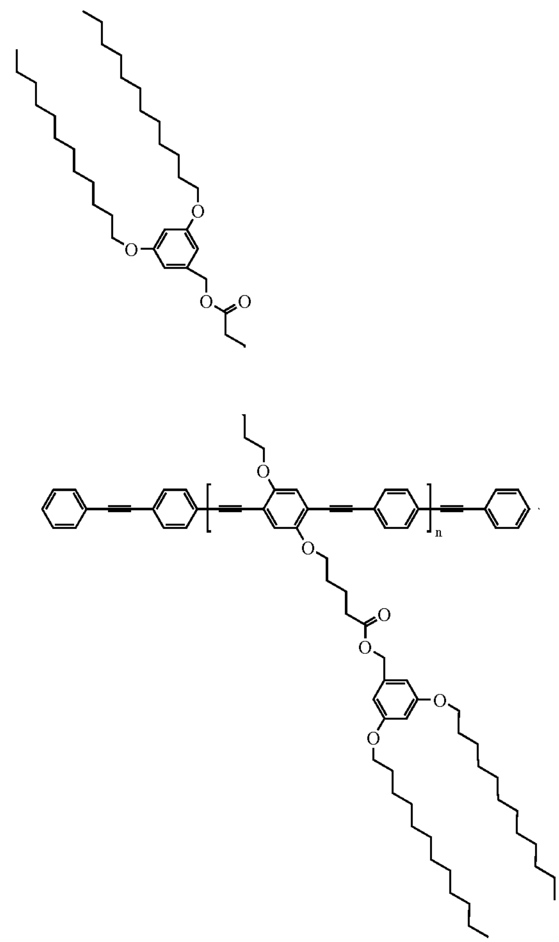

(b)

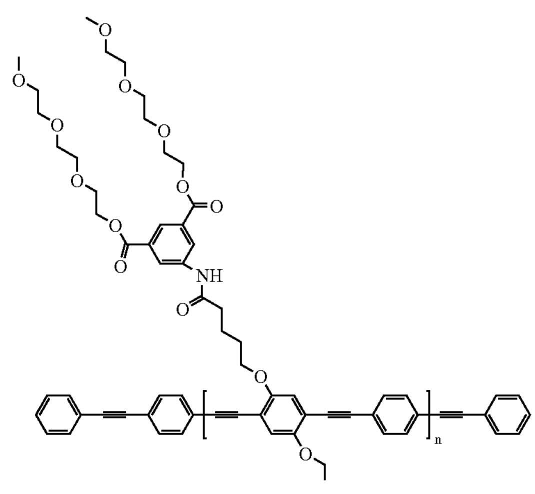

-continued
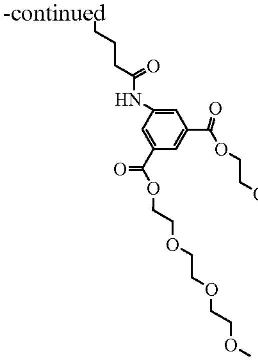
(c)
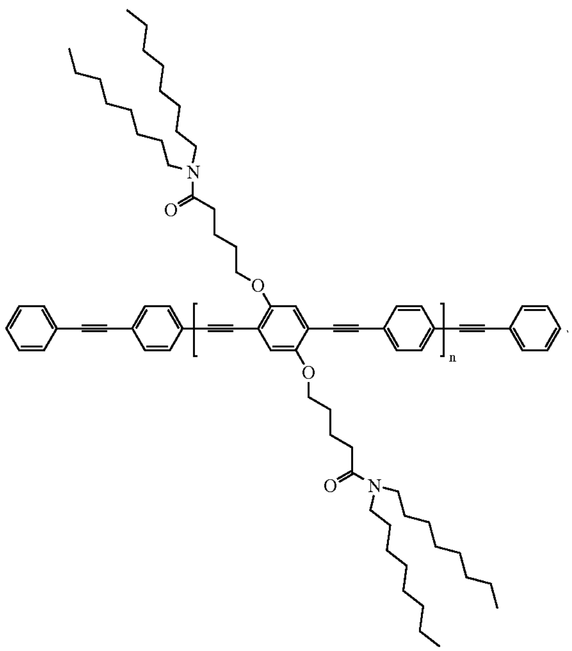
(d)
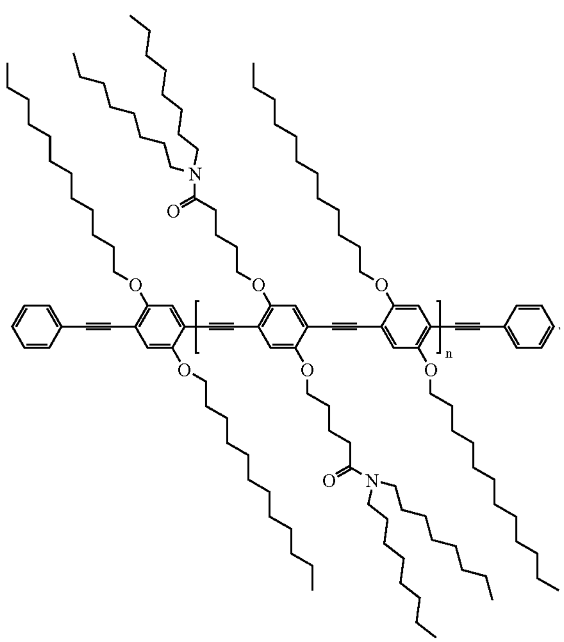
-continued
(e)
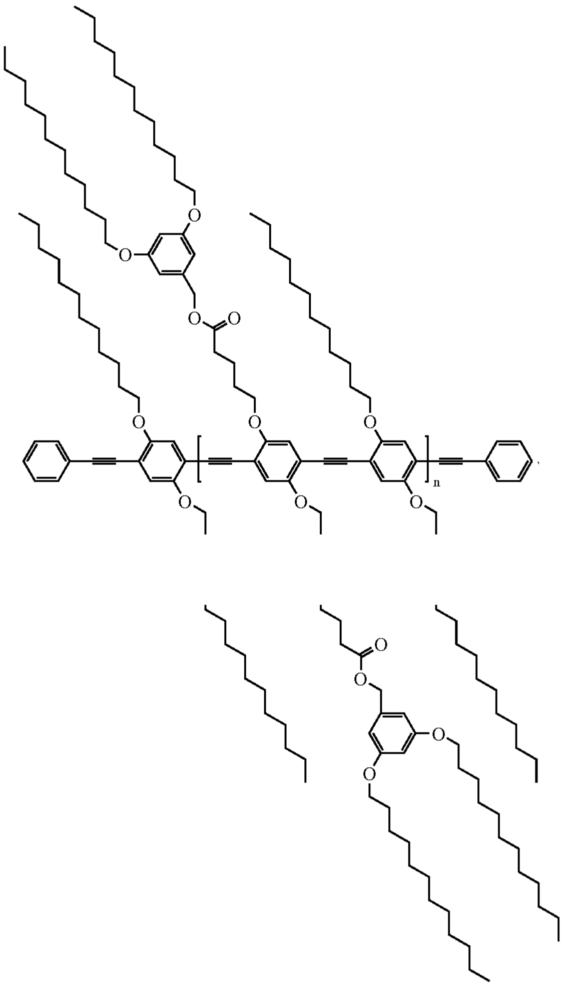
(f)
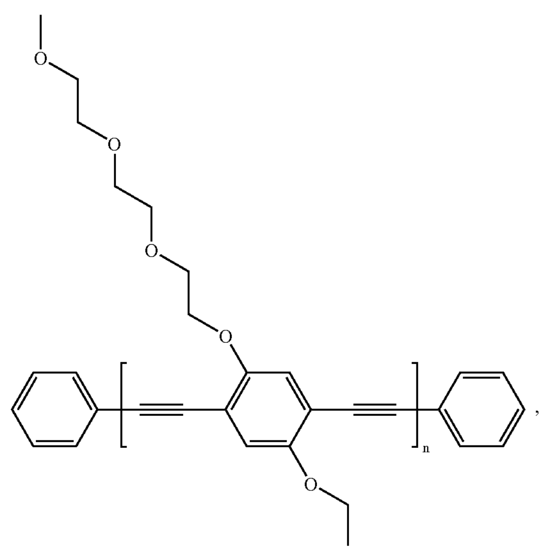

-continued
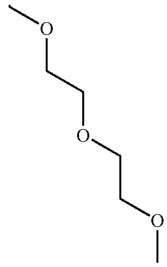
(g)
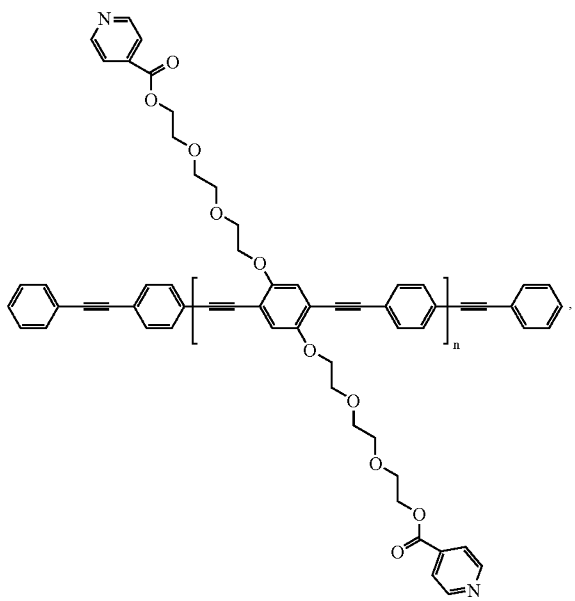
(h)
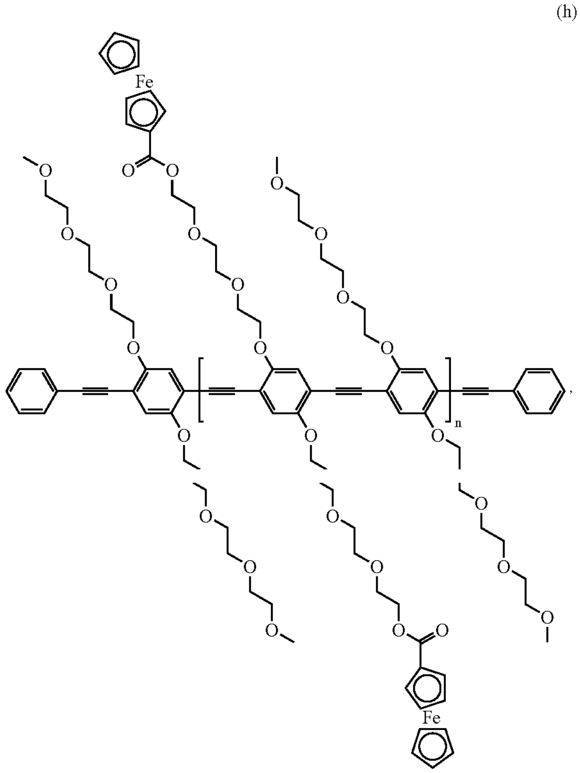
-continued
(i)
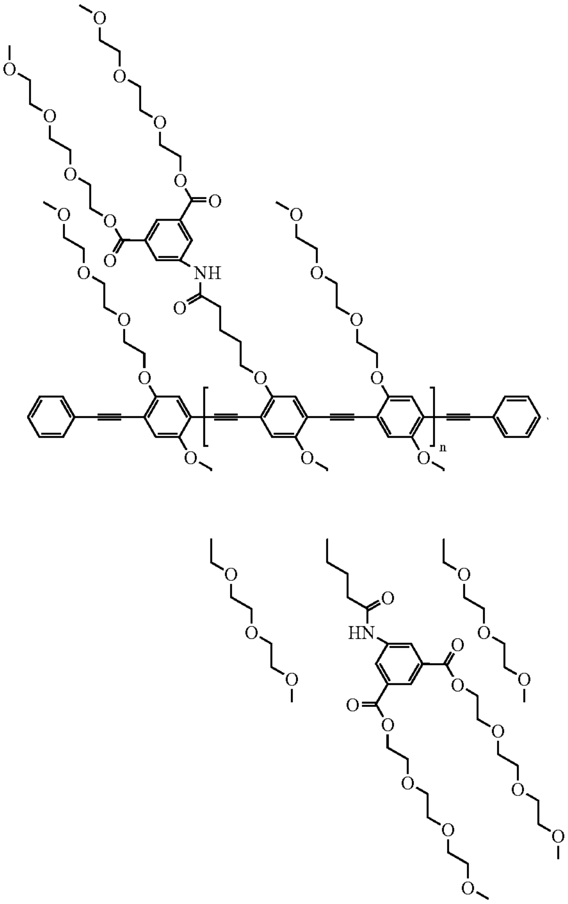
(j)
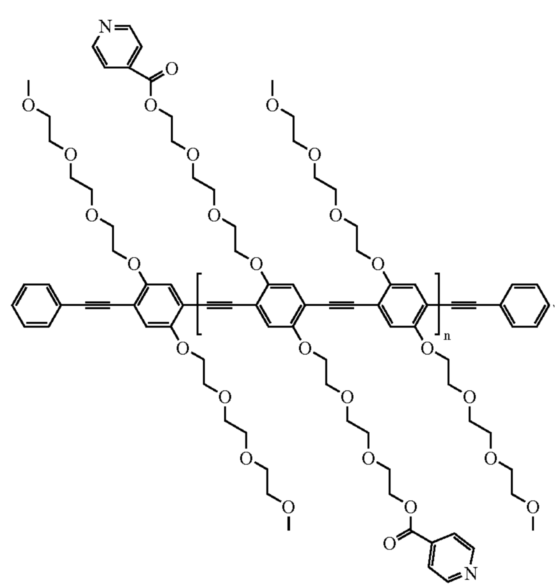

-continued
(k)
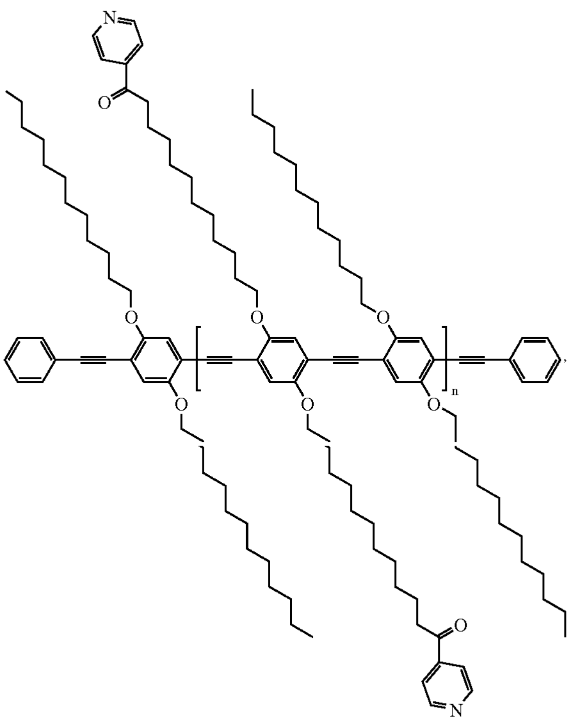
(l)
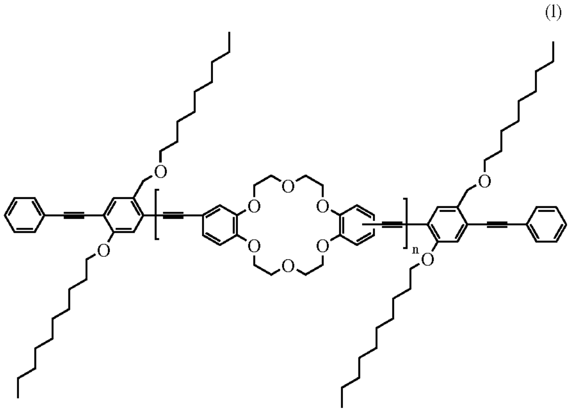
(m)
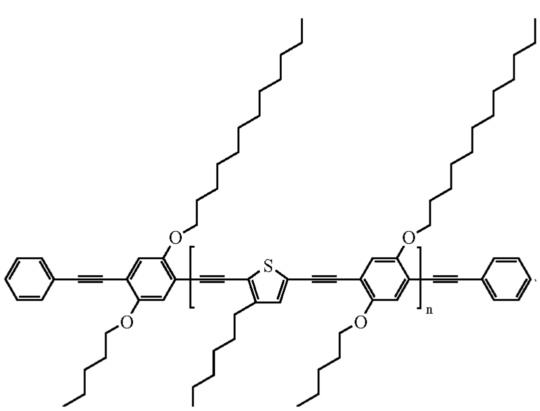
-continued
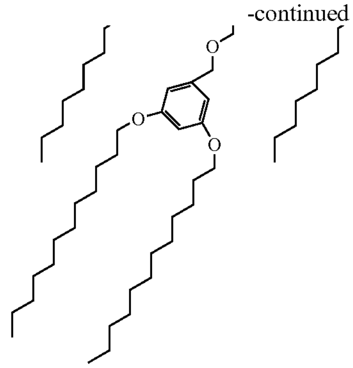
(n)
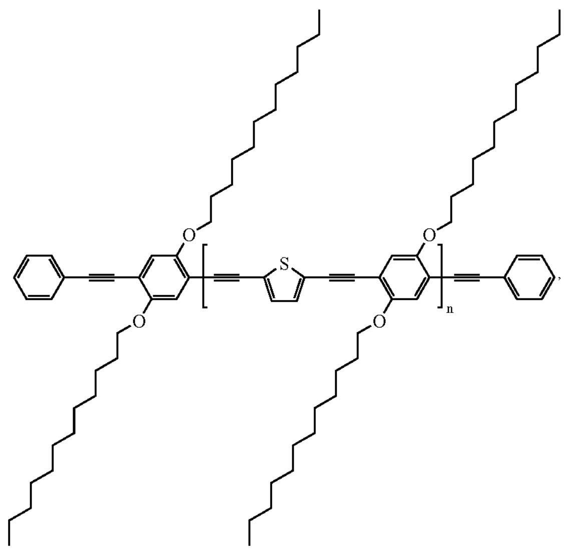
(o)
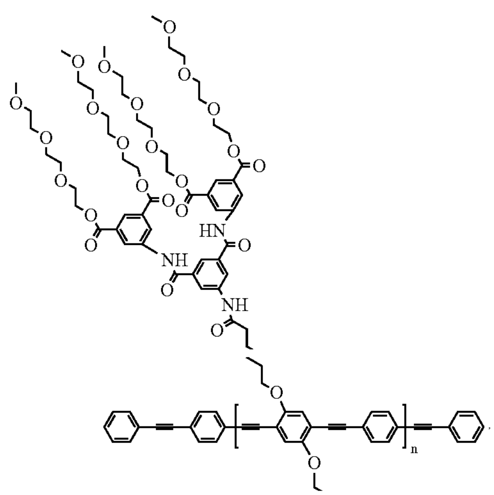

-continued
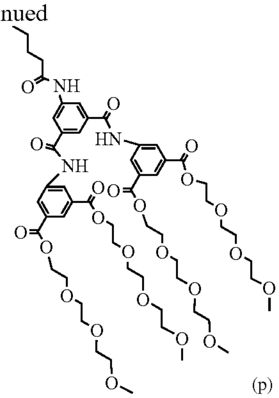
(p)
-continued
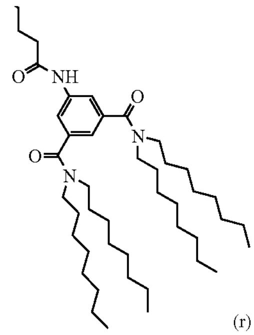
(r)
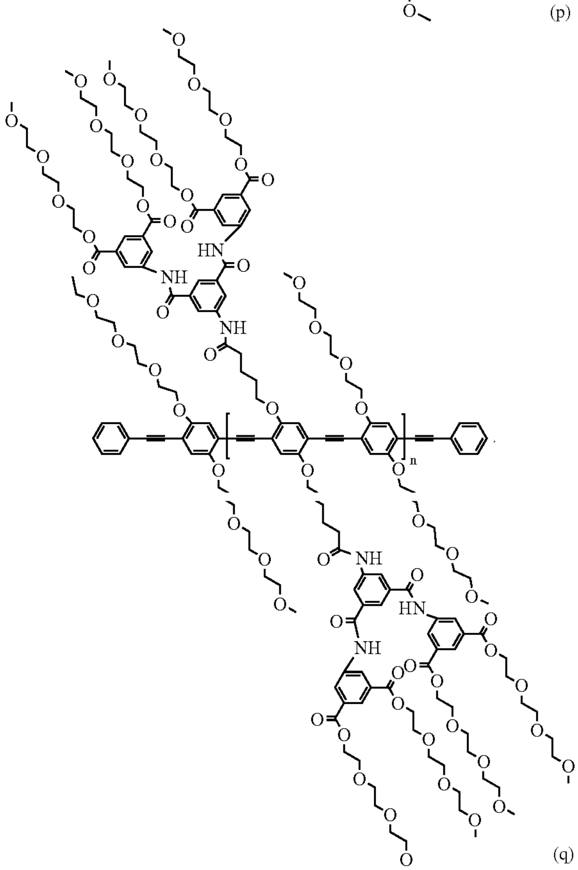
(q)
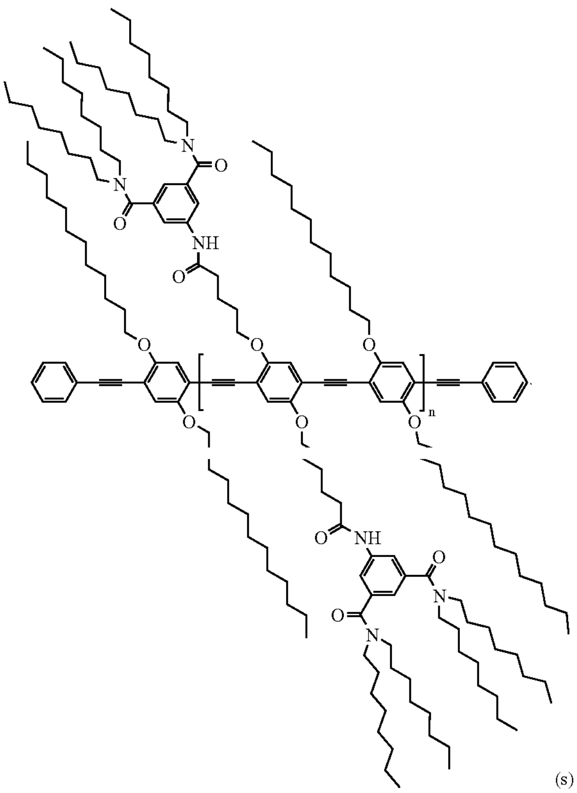
(s)
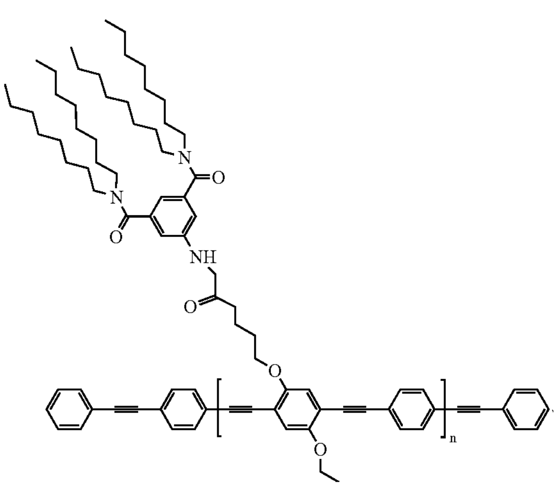
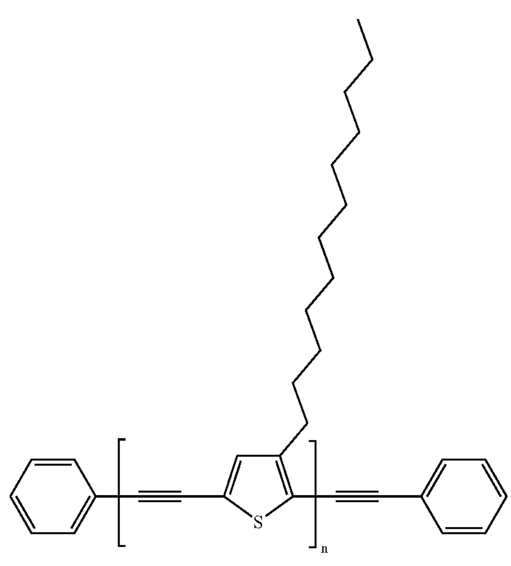
, and -continued (t)

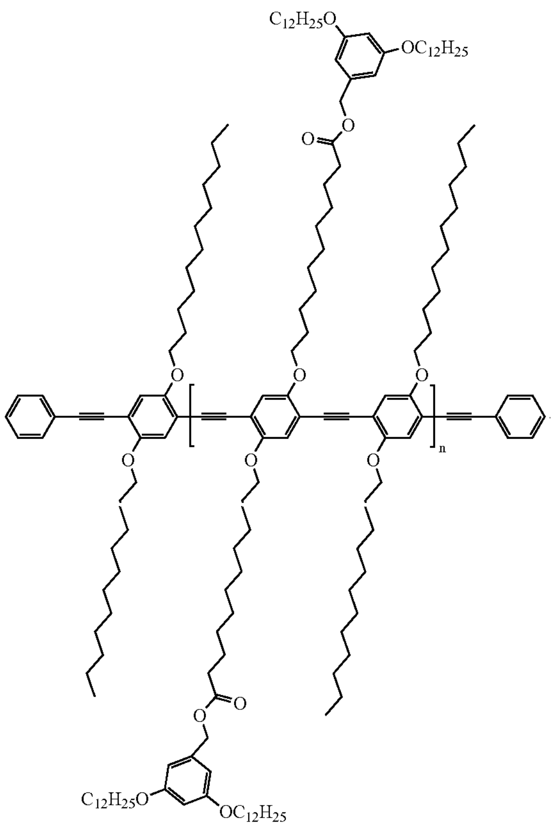

the functionalized, solubilized nanomaterial being dispersed within the host matrix, wherein the nanocomposite has an increased electrical conductivity or an increased thermal conductivity as compared to that of the host matrix alone.

2. The nanocomposite of claim 1 wherein the nanocomposite has an electrical conductivity percolation threshold that is lower than that of the host matrix and a nonfunctionalized nanomaterial.

3. The nanocomposite of claim 1 wherein the host matrix is a polymer matrix and the polymer matrix comprises a thermoplastic polymer, a thermoset polymer, or a combination thereof.

4. The nanocomposite of claim 1 wherein the host matrix is a polymer matrix and the polymer matrix comprises an inorganic polymer matrix.

5. The nanocomposite of claim 4 wherein the inorganic polymer matrix comprises silicone, polysilane, polycarbosilane, polygermane, polystannane, polyphosphazene, or a combination thereof.

6. The nanocomposite of claim 1 wherein the host matrix is a polymer matrix and the polymer matrix comprises a polyethylene, polyisoprene, styrene-butadiene-styrene (SBS) rubber, polydicyclopentadiene, polytetrafluoroethylene, poly (phenylene sulfide), silicone, cellulose, poly(methyl methacrylate), poly(vinylidene chloride), poly(vinylidene fluoride), polyisobutylene, polychloroprene, polybutadiene, polypropylene, poly(vinyl chloride), poly(vinyl acetate), polystyrene, polyvinylpyrrolidone, polycyanoacrylate, polyacrylonitrile, poly(aryleneethynylene), poly(phenyleneethynylene), polythiophene, polyaniline, polypyrrole, polyphenylene, ethylene vinyl alcohol, fluoroplastic, polyacrylate, polybutylene, polyethylenechlorinate, polymethylpentene, polyamide, polyamide-imide, polyaryletherketone, polycarbonate, polyketone, polyester, polyetheretherketone, polyetherimide, polyethersulfone, polyimide, polyphenylene oxide, polyphthalamide, polysulfone, polyethylene terephthalate, epoxy resin, polyurethane, or a combination thereof.

7. The nanocomposite of claim 6 wherein the polymer matrix comprises a polystyrene.

8. The nanocomposite of claim 6 wherein the polymer matrix comprises a polyphenylene.

9. The nanocomposite of claim 6 wherein the polymer matrix comprises a polycarbonate.

10. The nanocomposite of claim 6 wherein the polymer matrix comprises a fluoroplastic and the fluoroplastic comprises polytetrafluoroethylene, fluoroethylene propylene, perfluoroalkoxyalkane, chlorotrifluoroethylene, ethylene chlorotrifluoroethylene, ethylene tetrafluoroethylene, or a combination thereof.

11. The nanocomposite of claim 1 wherein the functionalized, solubilized nanomaterial comprises a functionalized and solubilized single-walled carbon nanotube, multi-walled carbon nanotube, carbon nanoparticle, carbon nanosheet, carbon nanofiber, carbon nanorope, carbon nanoribbon, carbon nanofibril, carbon nanoneedle, carbon nanohorn, carbon nanocone, carbon nanoscroll, carbon nanodot, or a combination thereof.

12. The nanocomposite of claim 1 wherein the functionalized, solubilized nanomaterial comprises a functionalized and solubilized single-walled boron nitride nanotube, multi-walled boron nitride nanotube, boron nitride nanoparticle, boron nitride nanosheet, boron nitride nanofiber, boron nitride nanorope, boron nitride nanoribbon, boron nitride nanofibril, boron nitride nanoneedle, boron nitride nanohorn, boron nitride nanocone, boron nitride nanoscroll, a boron nitride nanodot, or a combination thereof.

13. The nanocomposite of claim 1 wherein the functionalized, solubilized nanomaterial comprises a functionalized and solubilized graphite nanoplatelet, a functionalized and solubilized fullerene material, or a combination thereof.

14. The nanocomposite of claim 1 wherein the functionalized, solubilized nanomaterial comprises an amount equal to or greater than 0.01% and less than or equal to 75.0% by weight or volume of the nanocomposite.

15. The nanocomposite of claim 1 wherein the functionalized, solubilized nanomaterial comprises an amount equal to or greater than 0.04% and less than or equal to 50.0% by weight or volume of the nanocomposite.

16. The nanocomposite of claim 1 wherein the functionalized, solubilized nanomaterial comprises an amount equal to or greater than 0.1% and less than or equal to 10.0% by weight or volume of the nanocomposite.

17. The nanocomposite of claim 1 wherein the functionalized, solubilized nanomaterial of the nanocomposite is a first filler and the nanocomposite further comprises a second filler to form a complex nanocomposite, wherein the second filler comprises a continuous fiber, a discontinuous fiber, a nanoparticle, a microparticle, a macroparticle, or a combination thereof, and the second filler is other than a functionalized, solubilized nanomaterial.

18. The nanocomposite of claim 1 wherein the host matrix is a first host polymer matrix and the nanocomposite further comprises a second host polymer matrix, wherein the functionalized, solubilized nanomaterial is dispersed within the first and second host polymer matrices, and wherein the nanocomposite has an increased electrical conductivity as compared to that of the first host polymer matrix alone.

19. The nanocomposite of claim 18 wherein the first host polymer matrix is an epoxy and the second host polymer matrix is a polycarbonate.

20. An article of manufacture comprising the nanocomposite of claim 1.

21. An article of manufacture comprising the nanocomposite of claim 2.

22. An article of manufacture comprising the nanocomposite of claim 11.

23. An article of manufacture comprising the nanocomposite of claim 17.

24. An article of manufacture comprising the nanocomposite of claim 18.

25. The article of manufacture of claim 20 wherein the article of manufacture comprises a fiber.

26. The article of manufacture of claim 20 wherein the article of manufacture comprises a film.

27. The article of manufacture of claim 20 wherein the article of manufacture comprises a powder.

28. The article of manufacture of claim 22 wherein the article of manufacture comprises a fiber.

29. A method of increasing electrical or thermal conductivity of a host matrix comprising a polymer matrix or non-polymer matrix, the method comprising:

dispersing a functionalized, solubilized nanomaterial comprising a nanomaterial bonded with a polymer, the polymer being selected from the group consisting of:

(a)

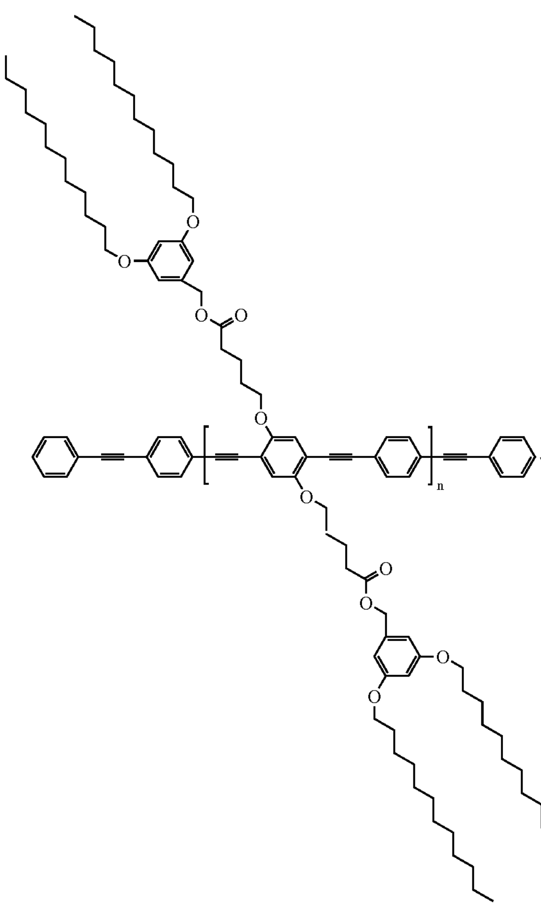

-continued (b)

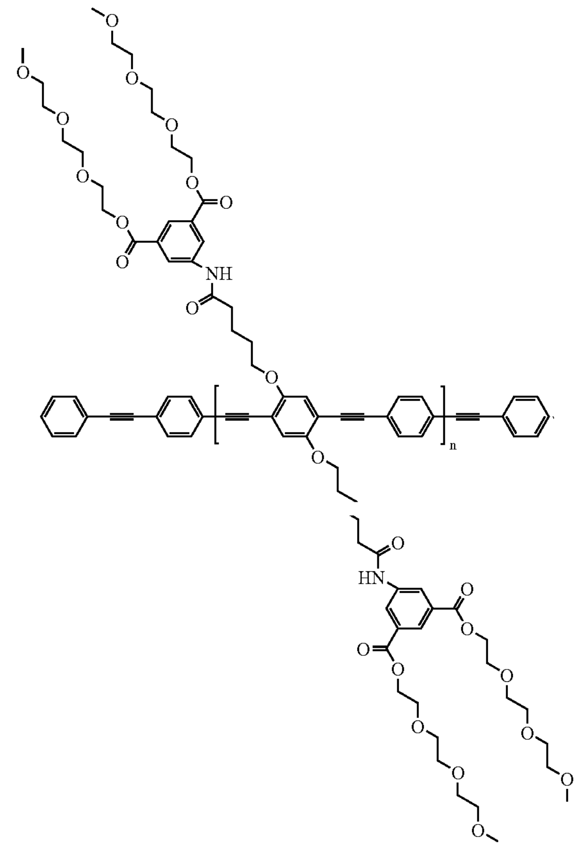

(c)

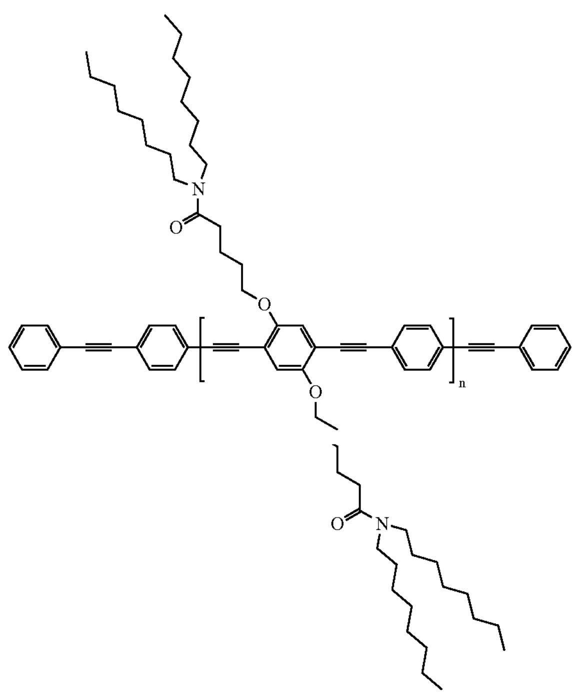

-continued
(d)
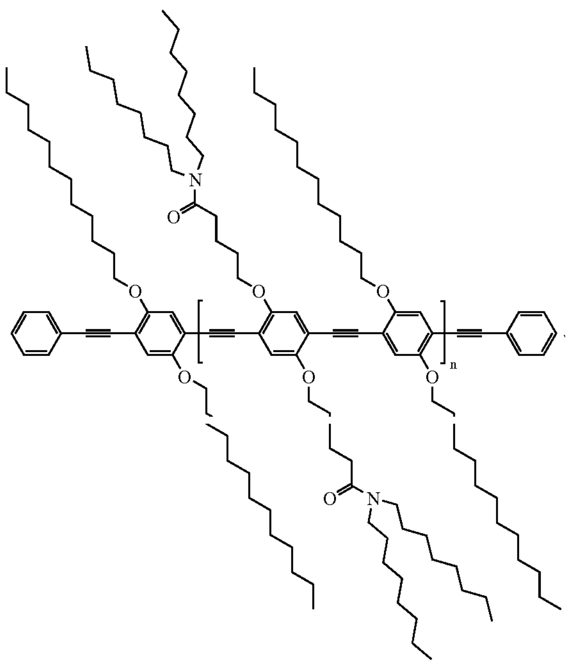
(e)
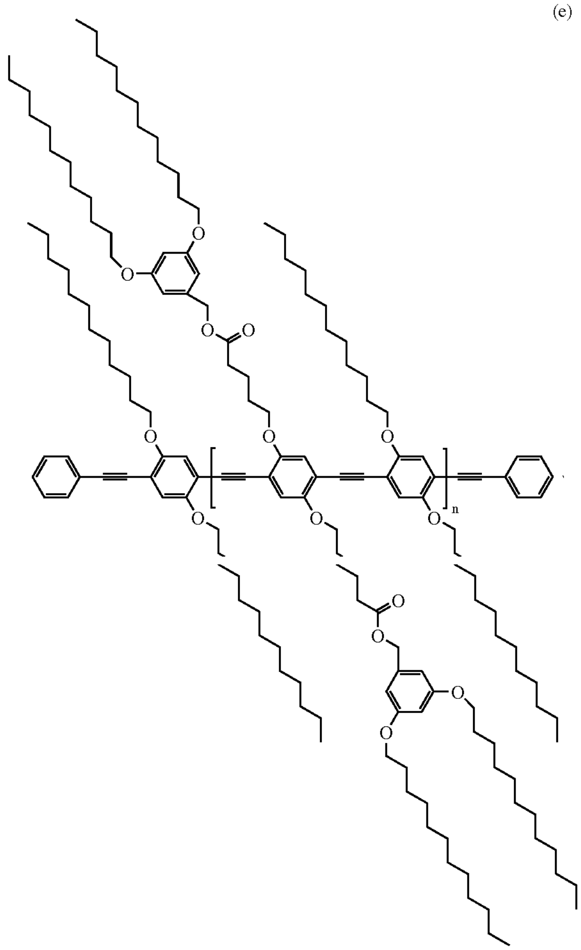
-continued
(f)
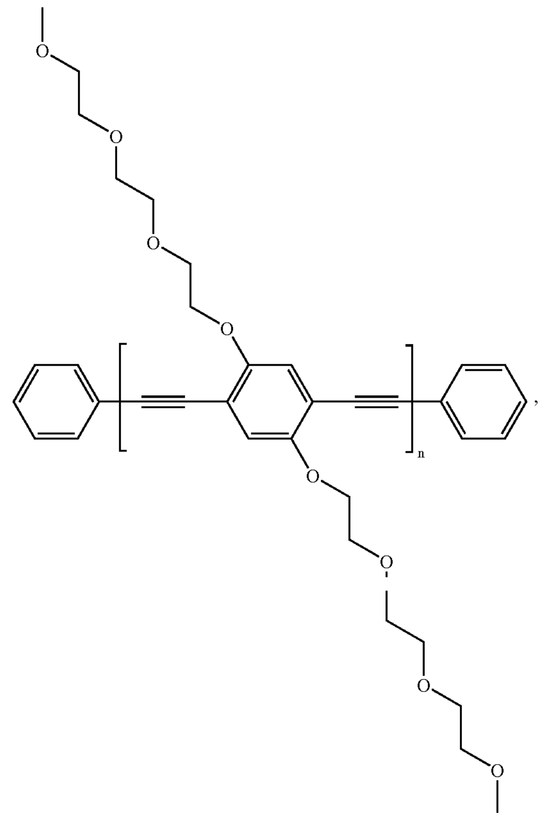
(g)
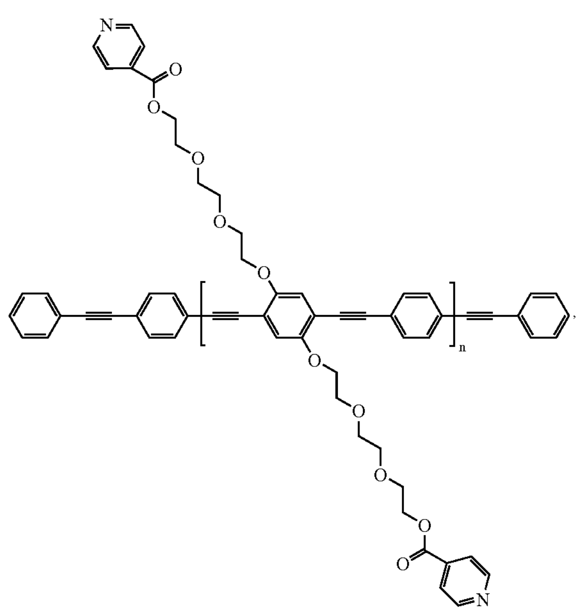

-continued
(h)
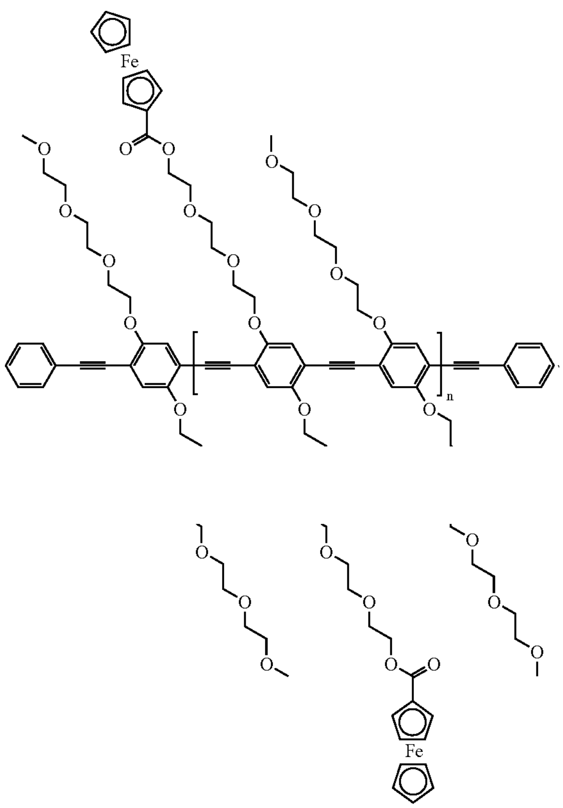
(i)
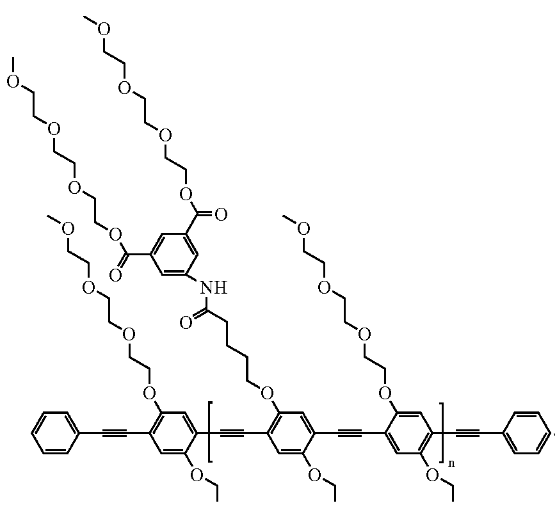
-continued
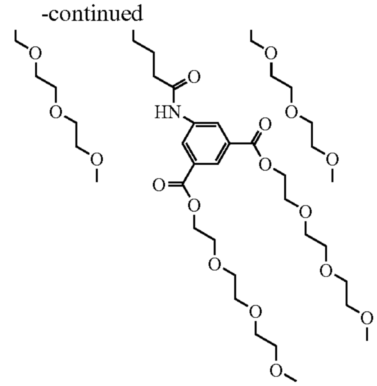
(j)
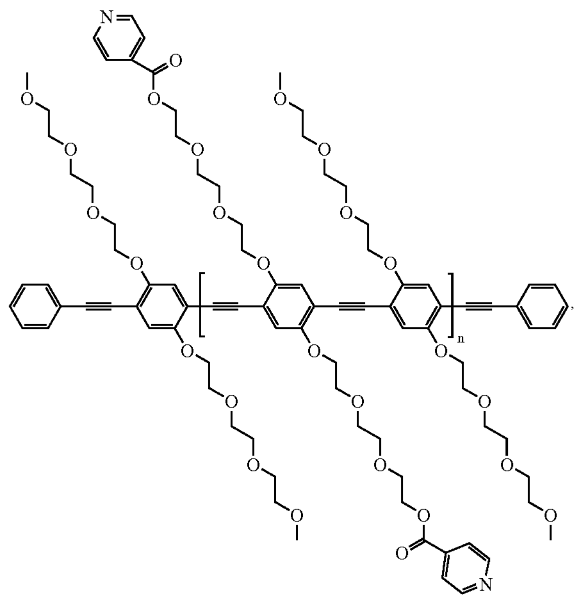
(k)
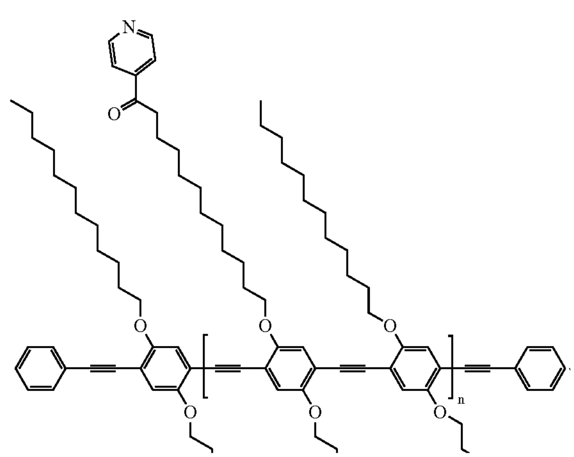

-continued
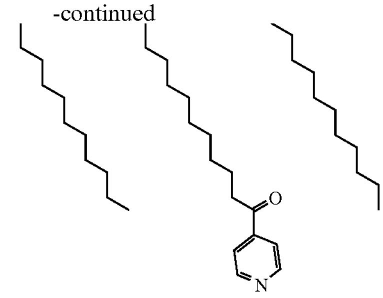
(l)
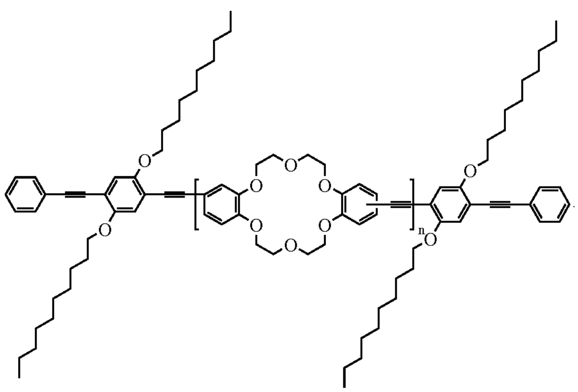
(m)
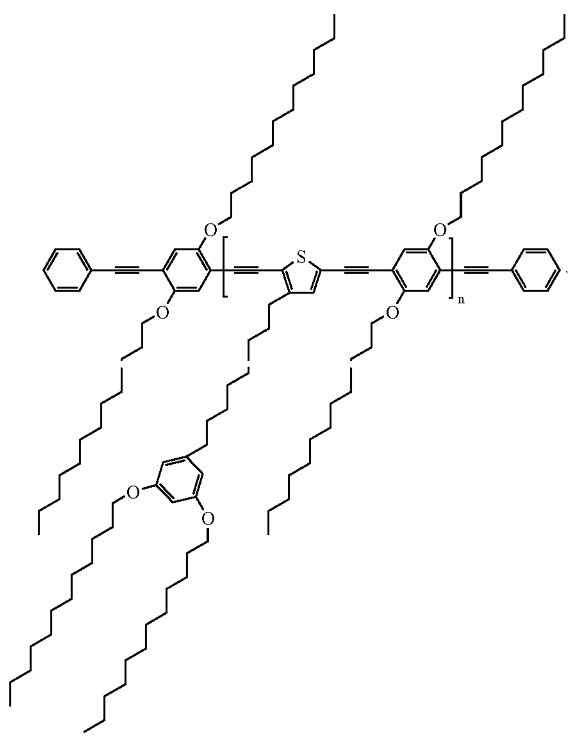
-continued
(n)
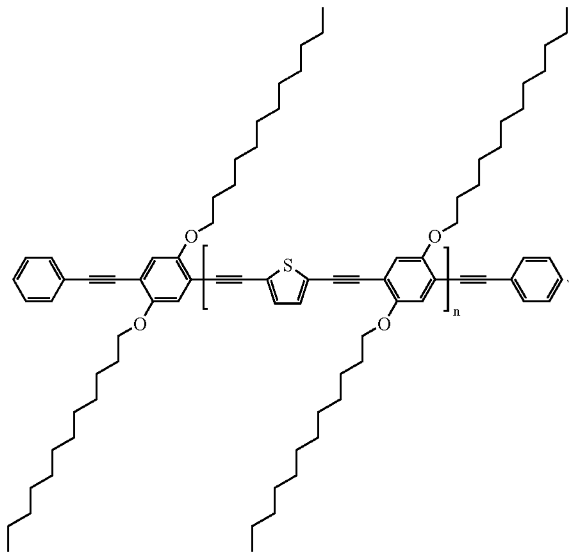
(o)
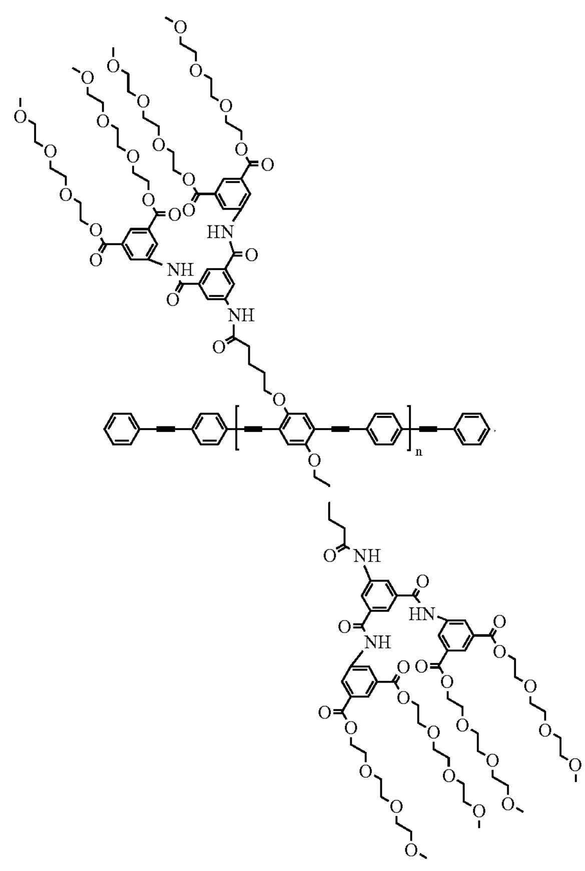

-continued
(p)
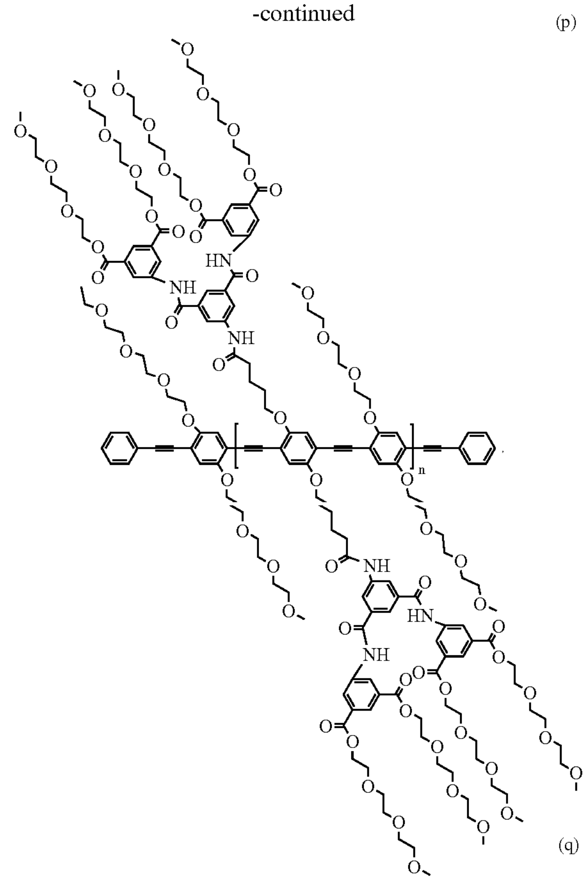
(q)
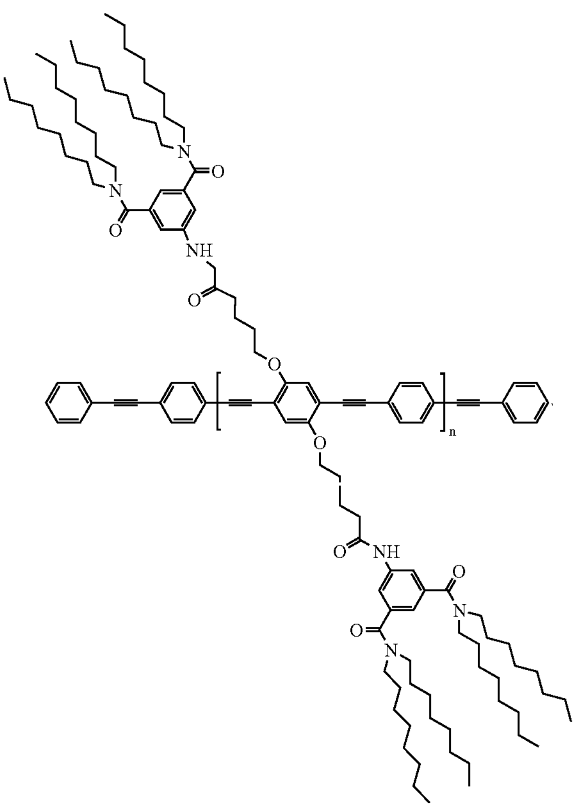
-continued
(r)
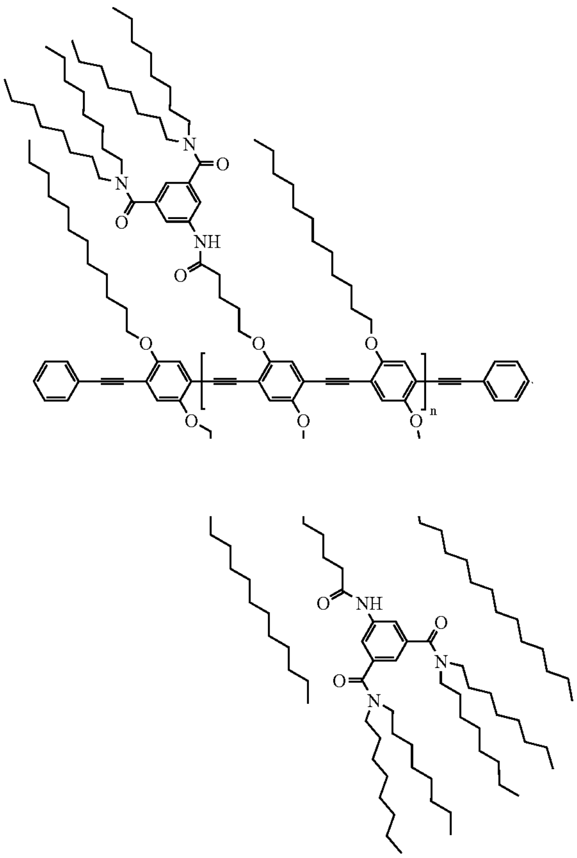
(s)
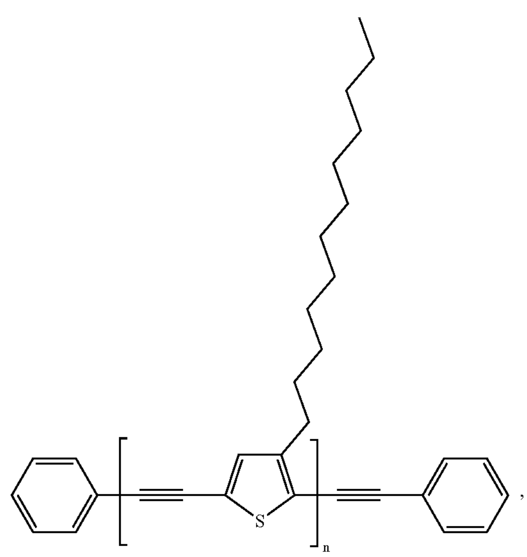
, and -continued (t)

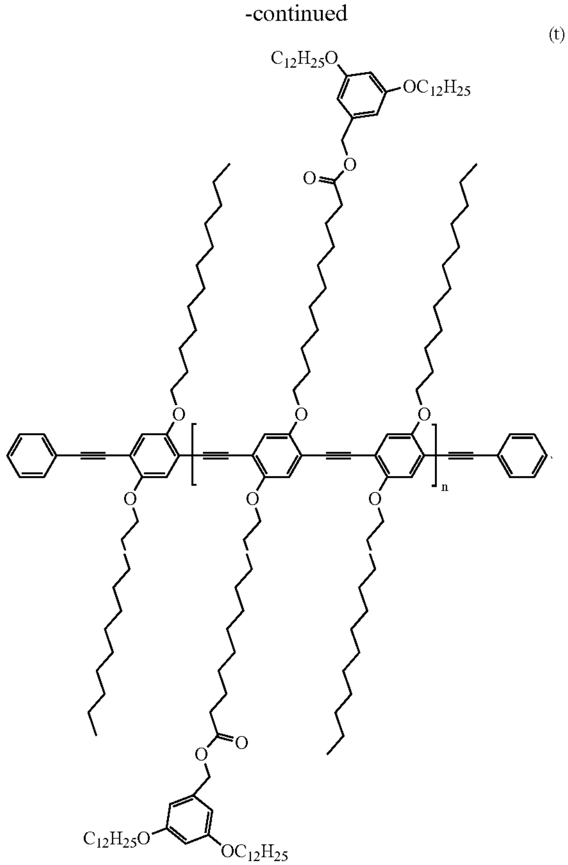

and the dispersing of the functionalized, solubilized nanomaterial is within a host matrix material to form a nanocomposite, wherein the nanocomposite has an increased electrical conductivity or an increased thermal conductivity as compared to that of the host matrix alone.

30. The method of claim 29 wherein the host matrix material is the host matrix.

31. The method of claim 29 wherein the host matrix material comprises a monomer of a host polymer matrix and the method further comprises the step of polymerizing the host polymer matrix material in the presence of the functionalized, solubilized nanomaterial.

32. The method of claim 29 wherein the host matrix is a first host polymer matrix and the method further comprises:

dispersing a second host polymer matrix material with functionalized, solubilized nanomaterial and with a first host polymer matrix material to form a nanocomposite comprising the first host polymer matrix and a second host polymer matrix, wherein the nanocomposite has an increased electrical conductivity as compared to that of the first host polymer matrix alone.

33. The method of claim 32 wherein the first host polymer matrix material is the first host polymer matrix and the second host polymer matrix material is the second host polymer matrix.

34. The method of claim 32 wherein the first host polymer matrix material comprises a monomer of the first host polymer matrix material, the second host polymer matrix material comprises a monomer of the second host polymer matrix material, and the method further comprises the step of polymerizing the host polymer matrix material in the presence of the functionalized, solubilized nanomaterial.

35. The method of claim 29 wherein the nanocomposite has an electrical conductivity percolation threshold that is lower than that of the host matrix and a nonfunctionalized nanomaterial.

36. The method of claim 29 wherein the host matrix material comprises a thermoplastic polymer or monomer thereof, or a thermoset polymer, or monomer thereof, or a combination thereof.

37. The method of claim 29 wherein the host matrix is a polymer matrix and the polymer matrix comprises an inorganic polymer matrix.

38. The method of claim 37 wherein the inorganic polymer matrix comprises silicone, polysilane, polycarbosilane, polygermane, polystannane, a polyphosphazene, or a combination thereof.

39. The method of claim 29 wherein the host matrix comprises a host polymer matrix material comprising a polyethylene, polyisoprene, styrene-butadiene-styrene (SBS) rubber, polydicyclopentadiene, polytetrafluoroethylene, poly(phenylene sulfide), silicone, cellulose, poly(methyl methacrylate), poly(vinylidene chloride), poly(vinylidene fluoride), polyisobutylene, polychloroprene, polybutadiene, polypropylene, poly(vinyl chloride), poly(vinyl acetate), polystyrene, polyvinylpyrrolidone, polycyanoacrylate, polyacrylonitrile, poly(aryleneethynylene), poly (phenyleneethynylene), polythiophene, polyaniline, polypyrrole, polyphenylene, ethylene vinyl alcohol, fluoroplastic, polyacrylate, polybutylene, polyethylenechlorinate, polymethylpentene, polyamide, polyamide-imide, polyaryletherketone, polycarbonate, polyketone, polyester, polyetheretherketone, polyetherimide, polyethersulfone, polyimide, polyphenylene oxide, polyphthalamide, polysulfone, polyethylene terephthalate, epoxy resin, or a polyurethane, or monomer thereof, or a combination thereof.

40. The method of claim 39 wherein the host polymer matrix material comprises a polystyrene, or monomer thereof.

41. The method of claim 39 wherein the host polymer matrix material comprises a polyphenylene, or monomer thereof.

42. The method of claim 39 wherein the host polymer matrix material comprises a polycarbonate, or monomer thereof.

43. The method of claim 39 wherein the host polymer matrix material comprises a fluoroplastic and the fluoroplastic comprises polytetrafluoroethylene, fluoroethylene propylene, perfluoroalkoxyalkane, chlorotrifluoroethylene, ethylene chlorotrifluoroethylene, or ethylene tetrafluoroethylene, or monomer thereof, or combination thereof.

44. The method of claim 29 wherein the functionalized, solubilized nanomaterial comprises a functionalized, solubilized single-walled carbon nanotube, multi-walled carbon nanotube, carbon nanoparticle, carbon nanosheet, carbon nanofiber, carbon nanorope, carbon nanoribbon, carbon nanofibril, carbon nanoneedle, carbon nanohorn, carbon nanocone, carbon nanoscroll, carbon nanodot, or a combination thereof.

45. The method of claim 29 wherein the functionalized, solubilized nanomaterial comprises a functionalized, solubilized single-walled boron nitride nanotube, multi-walled boron nitride nanotube, boron nitride nanoparticle, boron nitride nanosheet, boron nitride nanofiber, boron nitride nanorope, boron nitride nanoribbon, boron nitride nanofibril, boron nitride nanoneedle, boron nitride nanohorn, boron nitride nanocone, boron nitride nanoscroll, a boron nitride nanodot, or a combination thereof.

46. The method of claim 29 wherein the functionalized, solubilized nanomaterial comprises a functionalized, solubilized graphite nanoplatelet, a functionalized, solubilized fullerene material, or a combination thereof.

47. The method of claim 29 wherein the functionalized, solubilized nanomaterial comprises an amount equal to or greater than 0.01% and less than or equal to 75.0% by weight or volume of the nanocomposite.

48. The method of claim 29 wherein the functionalized, solubilized nanomaterial comprises an amount equal to or greater than 0.04% and less than or equal to 50.0% by weight or volume of the nanocomposite.

49. The method of claim 29 wherein the functionalized, solubilized nanomaterial comprises an amount equal to or greater than 0.1% and less than or equal to 10.0% by weight or volume of the nanocomposite.

50. The method of claim 29 wherein the functionalized, solubilized nanomaterial is a first filler, and the dispersing further comprises dispersing a second filler within the host matrix material to form a complex nanocomposite, wherein the second filler comprises a continuous fiber, a discontinuous fiber, a nanoparticle, a microparticle, a macroparticle, or a combination thereof, and wherein the second filler is other than a functionalized, solubilized nanomaterial.

51. The method of claim 32 wherein the first host polymer matrix is an epoxy polymer and the second host polymer matrix is a polycarbonate polymer.

52. A nanocomposite, comprising:

a host matrix of polymer matrix or nonpolymer matrix, wherein the polymer matrix is other than polystyrene and polycarbonate, and a functionalized, solubilized nanomaterial comprising a nanomaterial bonded with a polymer, the polymer being selected from the group consisting of:

(a)

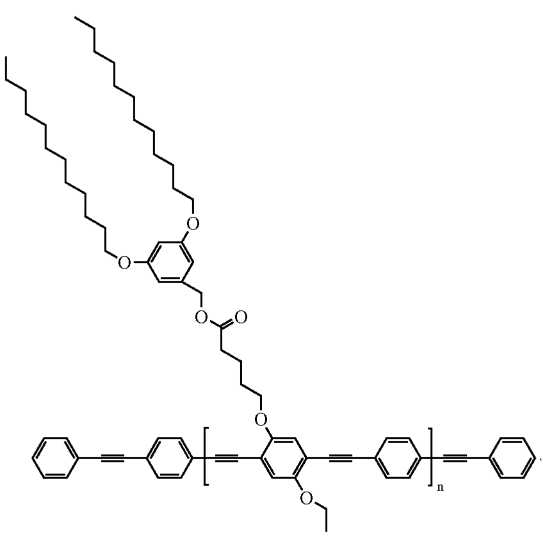

-continued

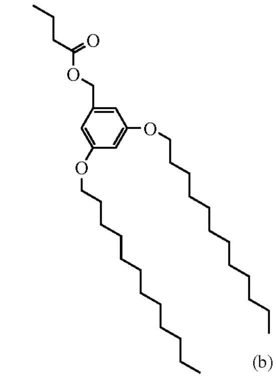

(b)

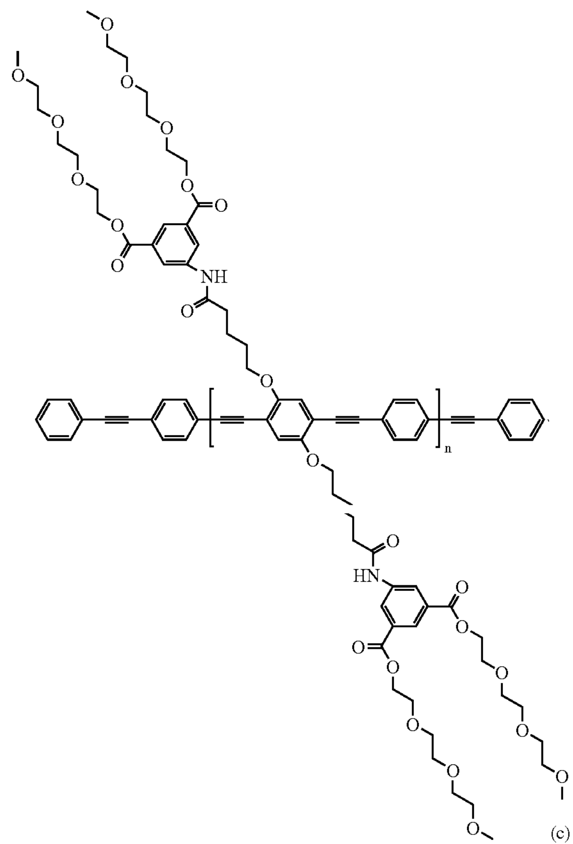

(c)

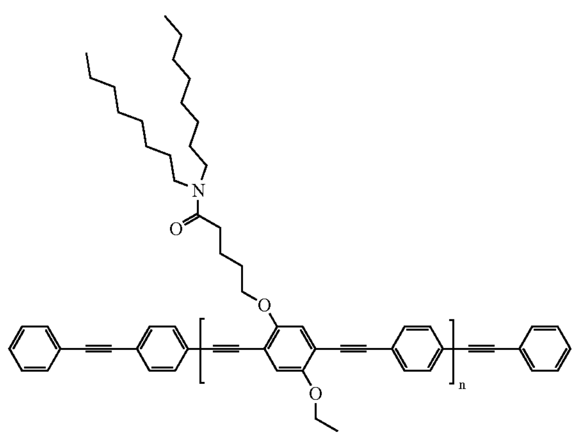

-continued
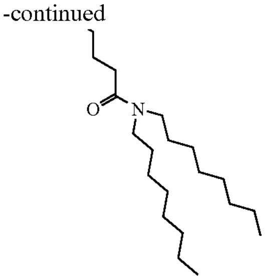
(d)
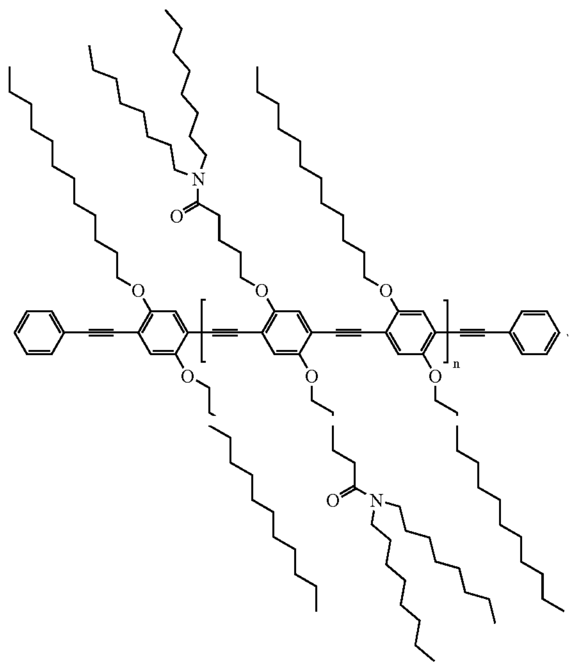
(e)
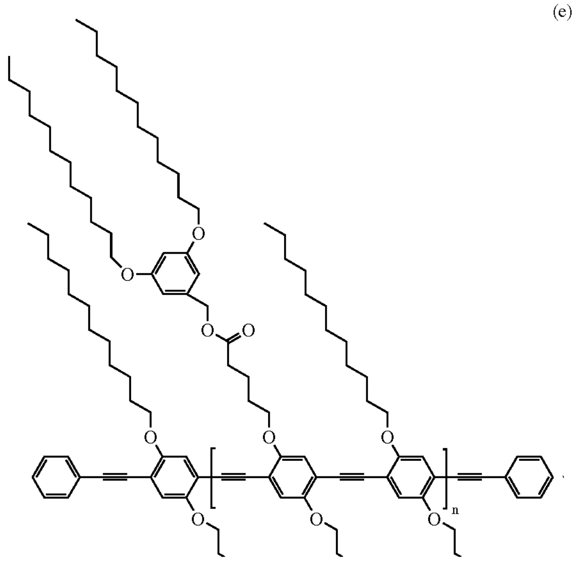
-continued
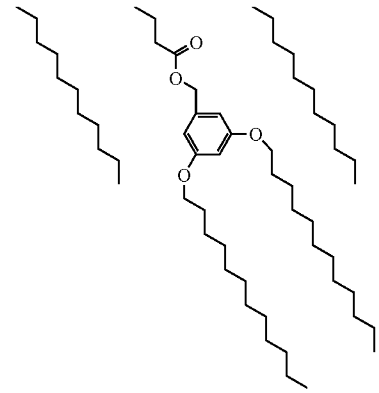
(f)
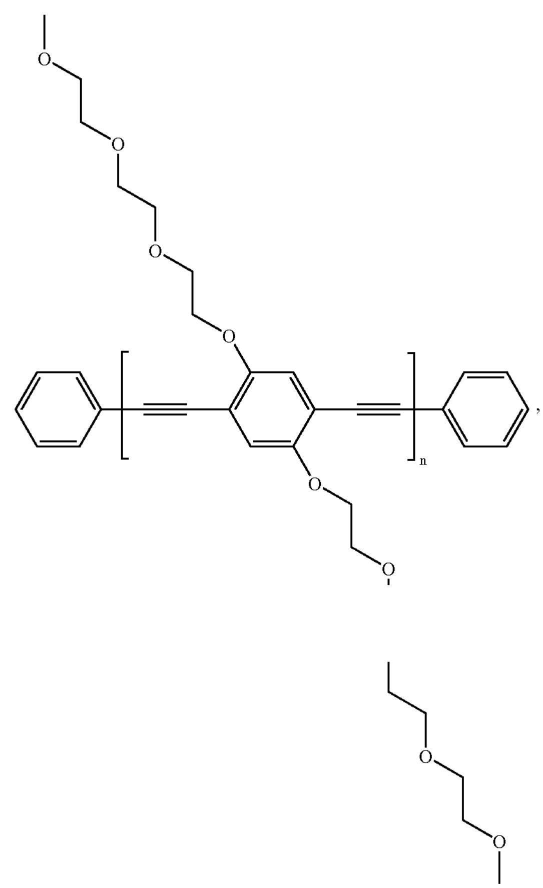

-continued
(g)
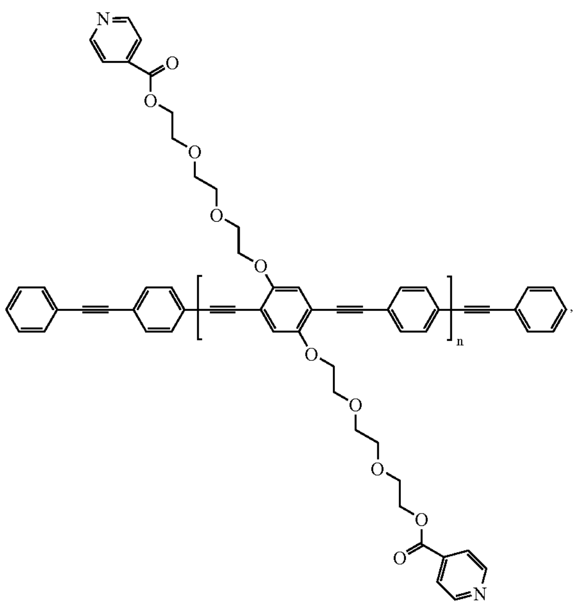
(h)
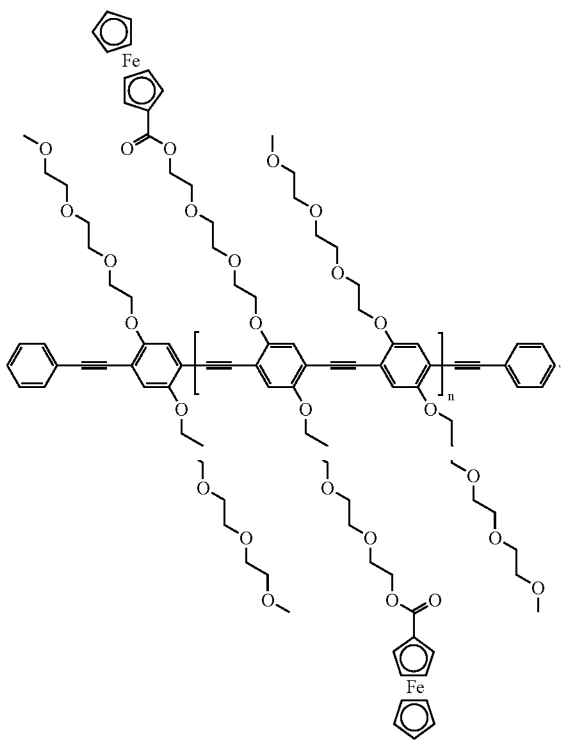
-continued
(i)
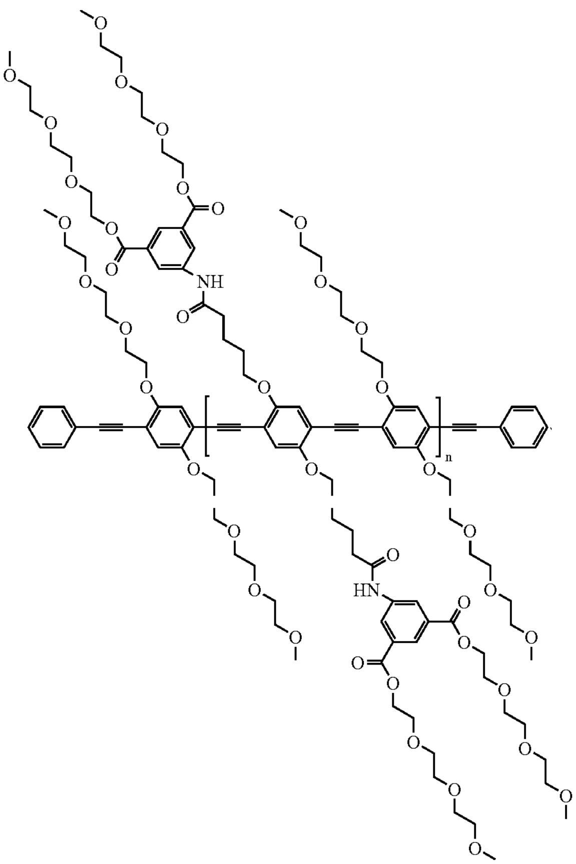
(j)
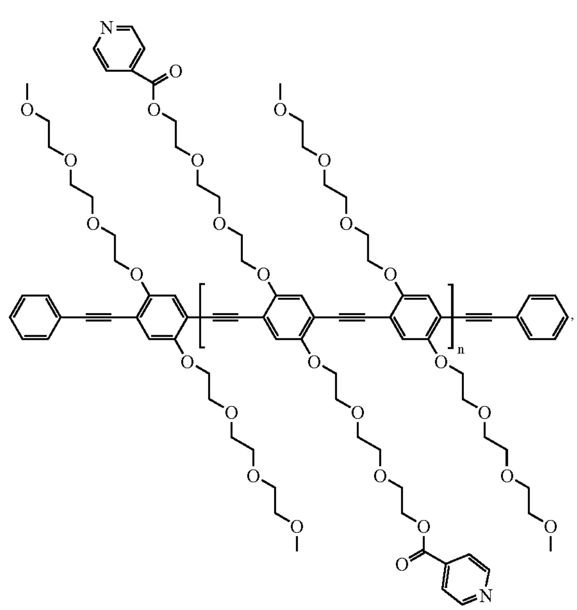

-continued
(k)
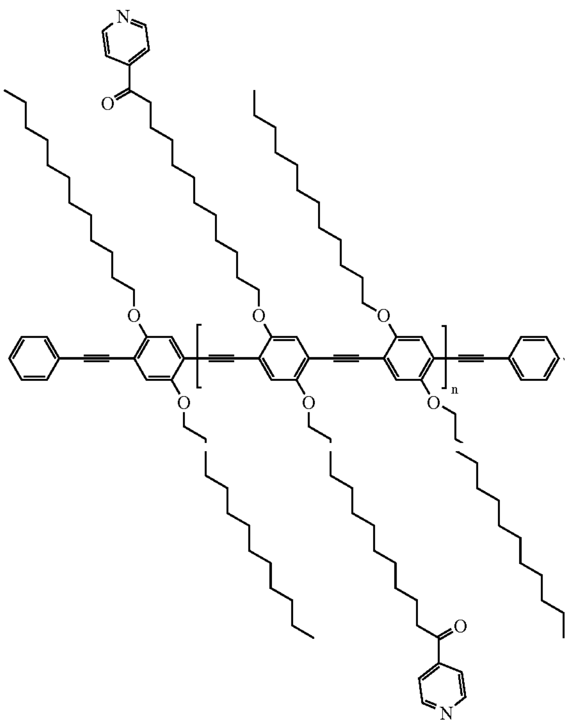
(l)
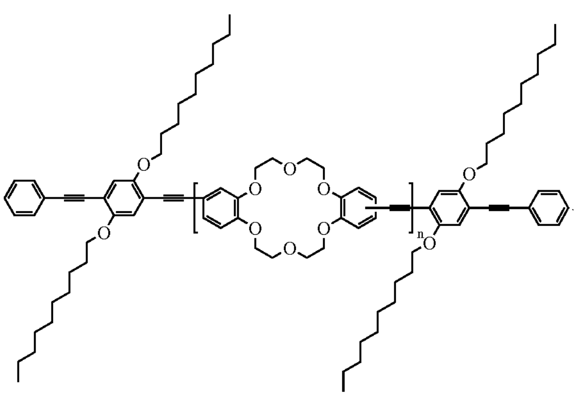
(m)
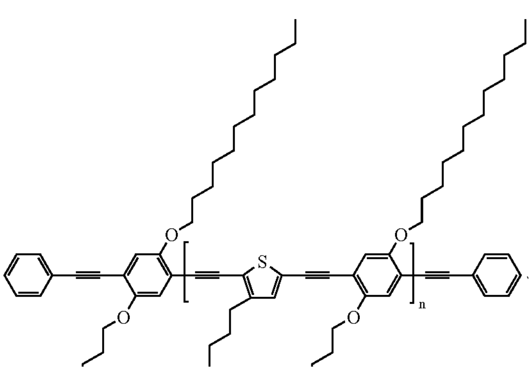
-continued
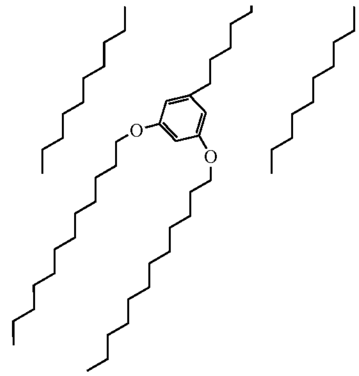
(n)
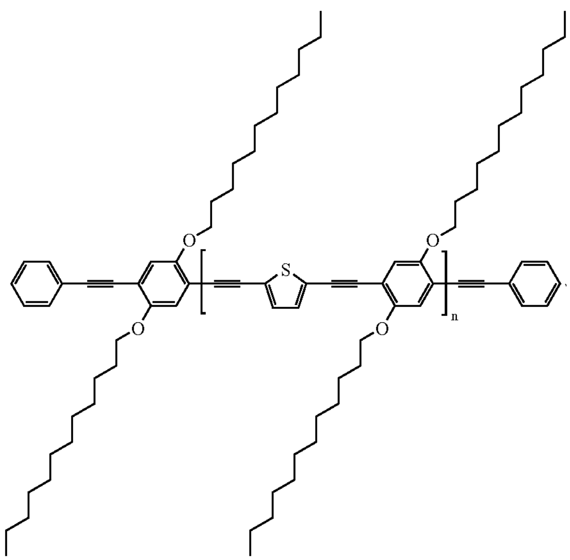
(o)
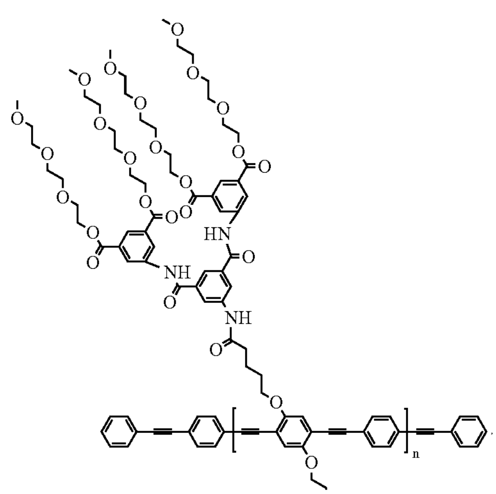

-continued
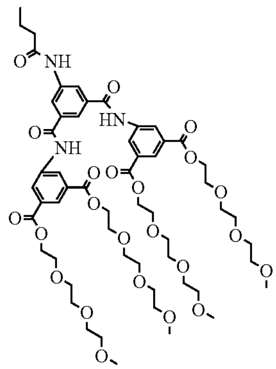
(p)
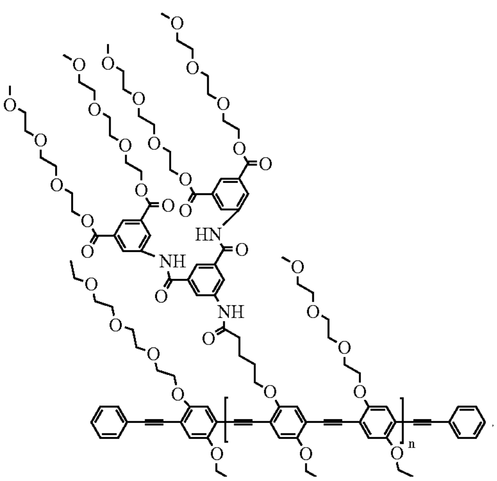
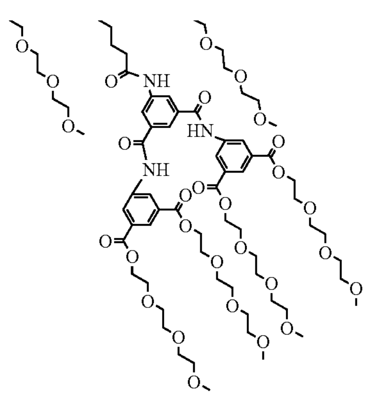
-continued
(q)
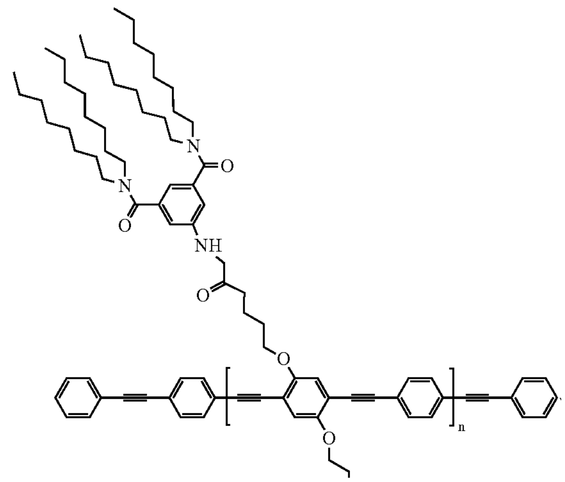
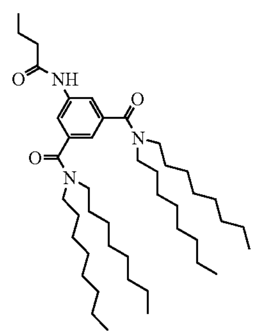
(r)
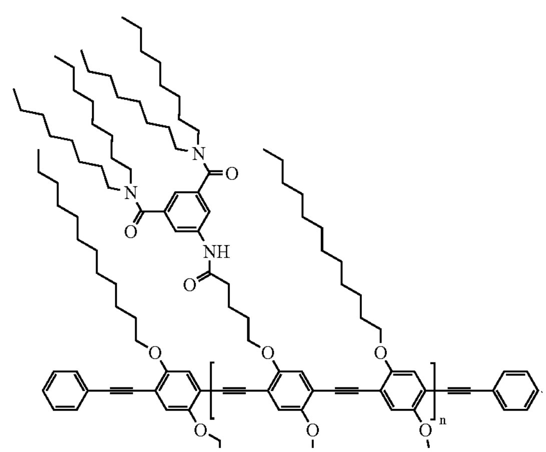

-continued

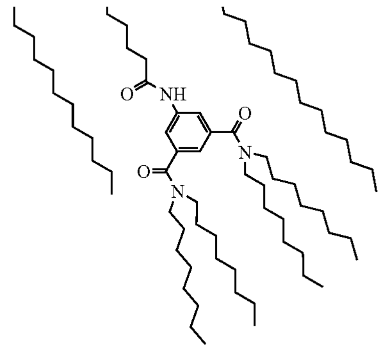

-continued

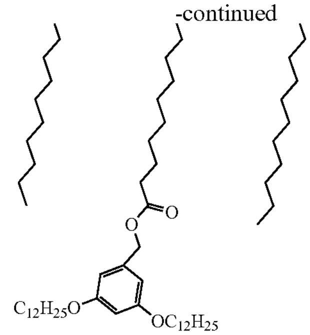

(s)

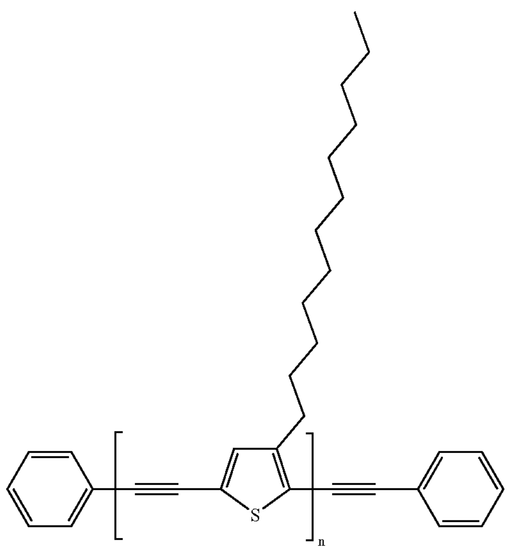

, and (t)

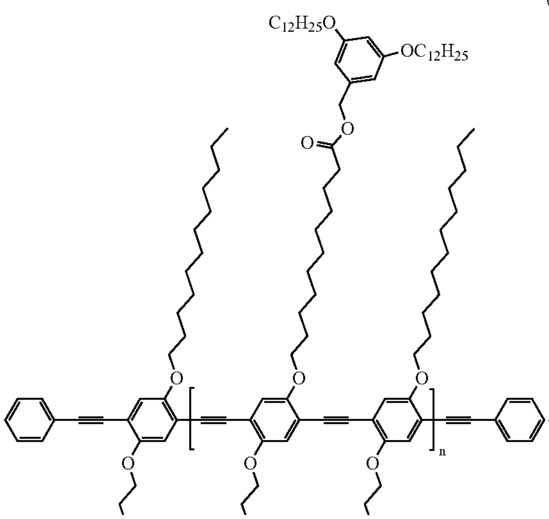

and the functionalized, solubilized nanomaterial is dispersed within the host matrix, wherein the nanocomposite has a mechanical property that is enhanced as compared to that of the host matrix alone.

53. The nanocomposite of claim 52 wherein the host matrix is a polymer matrix and the polymer matrix comprises a thermoplastic polymer, a thermoset polymer, or a combination thereof.

54. The nanocomposite of claim 52 wherein the host matrix is a polymer matrix and the polymer matrix comprises an inorganic polymer matrix.

55. The nanocomposite of claim 52 wherein the host matrix is a polymer matrix and the host polymer matrix comprises a polyethylene, polyisoprene, styrene-butadiene-styrene (SBS) rubber, polydicyclopentadiene, polytetrafluoroethylene, poly(phenylene sulfide), silicone, cellulose, poly(methyl methacrylate), poly(vinylidene chloride), poly(vinylidene fluoride), polyisobutylene, polychloroprene, polybutadiene, polypropylene, poly(vinyl chloride), poly(vinyl acetate), polystyrene, polyvinylpyrrolidone, polycyanoacrylate, polyacrylonitrile, poly(aryleneethynylene), poly(phenyleneethynylene), polythiophene, polyaniline, polypyrrole, polyphenylene, ethylene vinyl alcohol, fluoroplastic, polyacrylate, polybutylene, polyethylenechlorinate, polymethylpentene, polyamide, polyamide-imide, polyaryletherketone, polyketone, polyester, polyetheretherketone, polyetherimide, polyethersulfone, polyimide, polyphenylene oxide, polyphthalamide, polysulfone, polyethylene terephthalate, epoxy resin, a polyurethane, or a combination thereof.

56. The nanocomposite of claim 52 wherein the host polymer matrix comprises a polyphenylene.

57. The nanocomposite of claim 52 wherein the host polymer matrix comprises a fluoroplastic and the fluoroplastic comprises polytetrafluoroethylene, fluoroethylene propylene, perfluoroalkoxyalkane, chlorotrifluoroethylene, ethylene chlorotrifluoroethylene, ethylene tetrafluoroethylene, or a combination thereof.

58. The nanocomposite of claim 52 wherein the host matrix is a first host polymer matrix and the nanocomposite further comprises a second host polymer matrix, wherein the functionalized, solubilized nanomaterial is dispersed within the first and second host polymer matrices, and wherein the nanocomposite has a mechanical property that is enhanced as compared to that of the first matrix alone.

59. The nanocomposite of claim 52 wherein the functionalized, solubilized nanomaterial comprises a functionalized and solubilized single-walled carbon nanotube, multi-walled carbon nanotube, carbon nanoparticle, carbon nanosheet, carbon nanofiber, carbon nanorope, carbon nanoribbon, carbon nanofibril, carbon nanoneedle, carbon nanohorn, carbon nanocone, carbon nanoscroll, carbon nanodot, or a combination thereof.

60. The nanocomposite of claim 52 wherein the functionalized, solubilized nanomaterial comprises a functionalized and solubilized single-walled boron nitride nanotube, multi-walled boron nitride nanotube, boron nitride nanoparticle, boron nitride nanosheet, boron nitride nanofiber, boron nitride nanorope, boron nitride nanoribbon, boron nitride nanofibril, boron nitride nanoneedle, boron nitride nanohorn, boron nitride nanocone, boron nitride nanoscroll, a boron nitride nanodot, or a combination thereof.

61. The nanocomposite of claim 52 wherein the functionalized, solubilized nanomaterial comprises a functionalized, solubilized graphite nanoplatelet, a functionalized, solubilized fullerene material, or a combination thereof.

62. The nanocomposite of claim 52 wherein the functionalized, solubilized nanomaterial comprises an amount of equal to or greater than 0.01% and less than or equal to 75.0% by weight or volume of the nanocomposite.

63. The nanocomposite of claim 52 wherein the functionalized, solubilized nanomaterial comprises an amount of equal to or greater than 0.04% and less than or equal to 50.0% by weight or volume of the nanocomposite.

64. The nanocomposite of claim 52 wherein the functionalized, solubilized nanomaterial of the nanocomposite is a first filler and the nanocomposite further comprises a second filler to form a complex nanocomposite, wherein the second filler comprises a continuous fiber, a discontinuous fiber, a nanoparticle, a microparticle, a macroparticle, or a combination thereof, and the second filler is other than a functionalized, solubilized nanomaterial.

65. A nanocomposite, comprising:

a polystyrene, and functionalized, solubilized nanomaterial comprising a nanomaterial bonded with a polymer, the polymer being selected from the group consisting of:

(a)

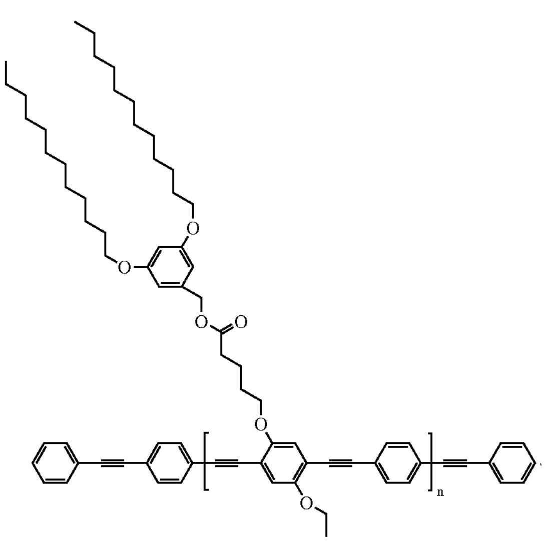

-continued

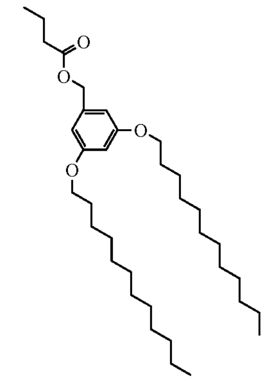

(b)

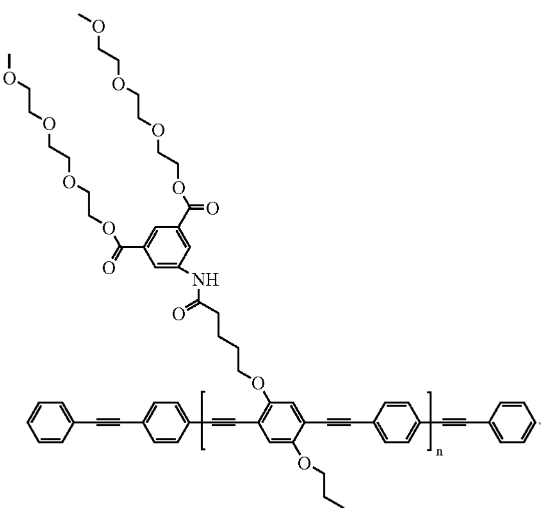

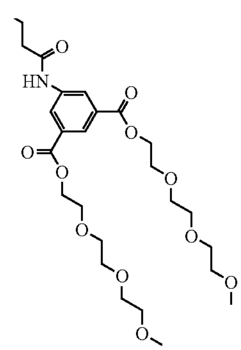

-continued
(c)
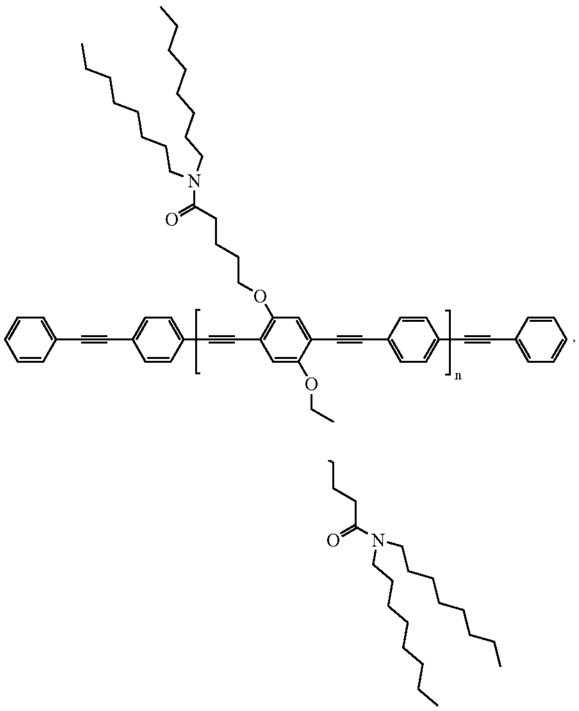
(d)
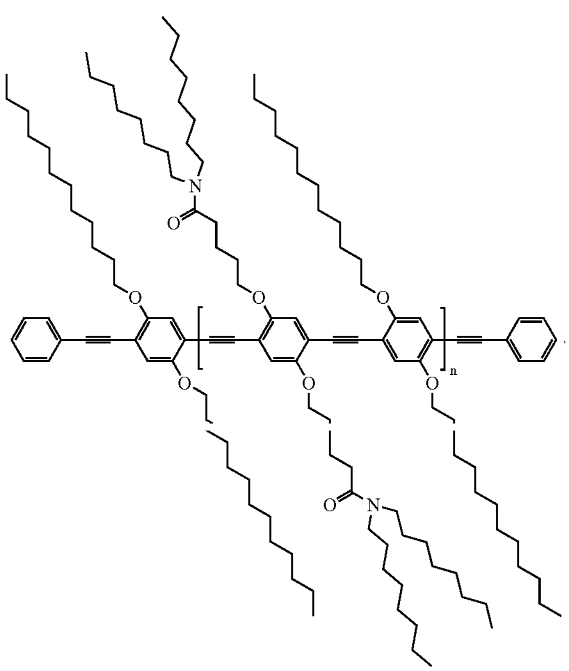
-continued
(e)
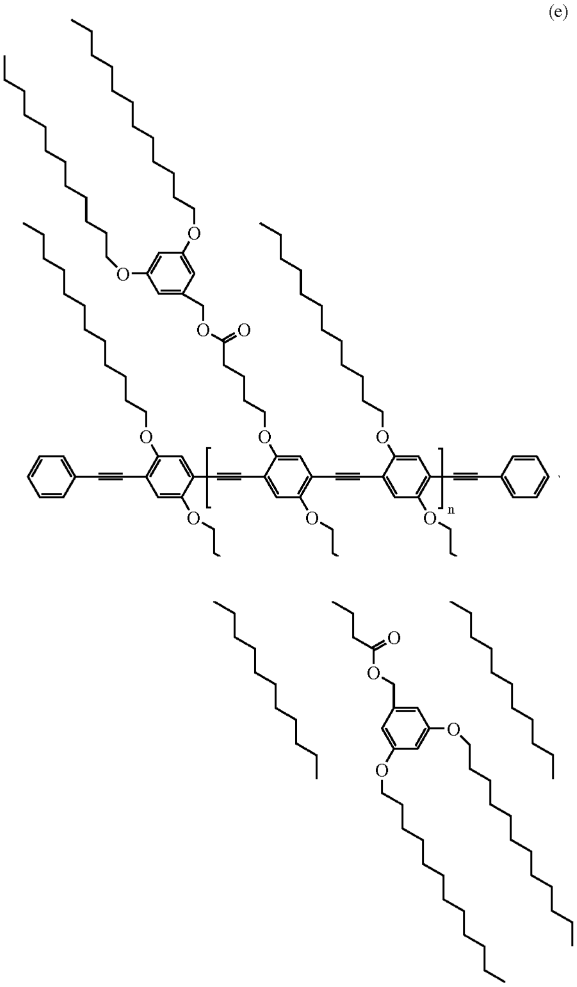
(f)
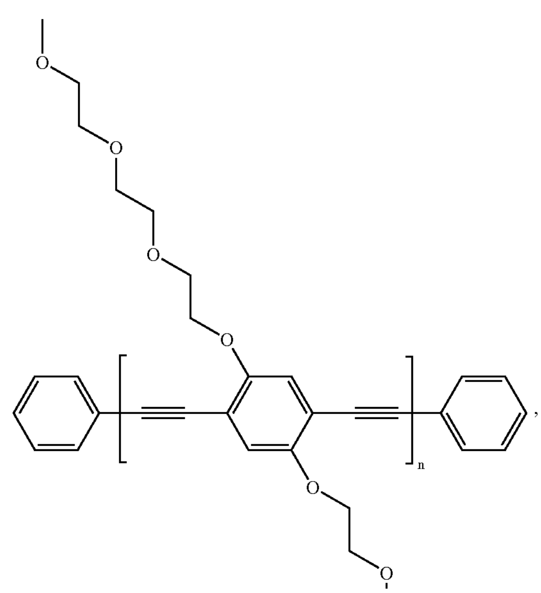

-continued
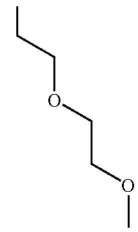
-continued
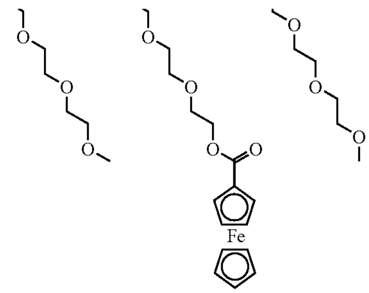
(g)
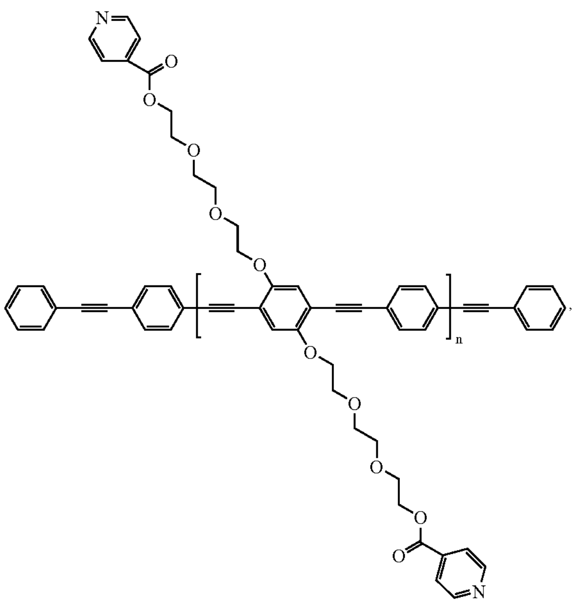
(h)
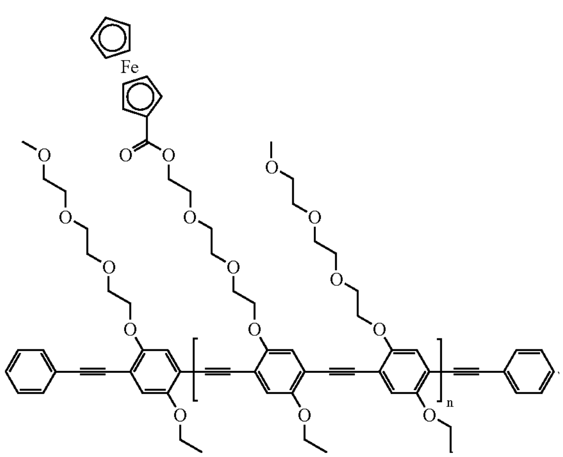
(i)
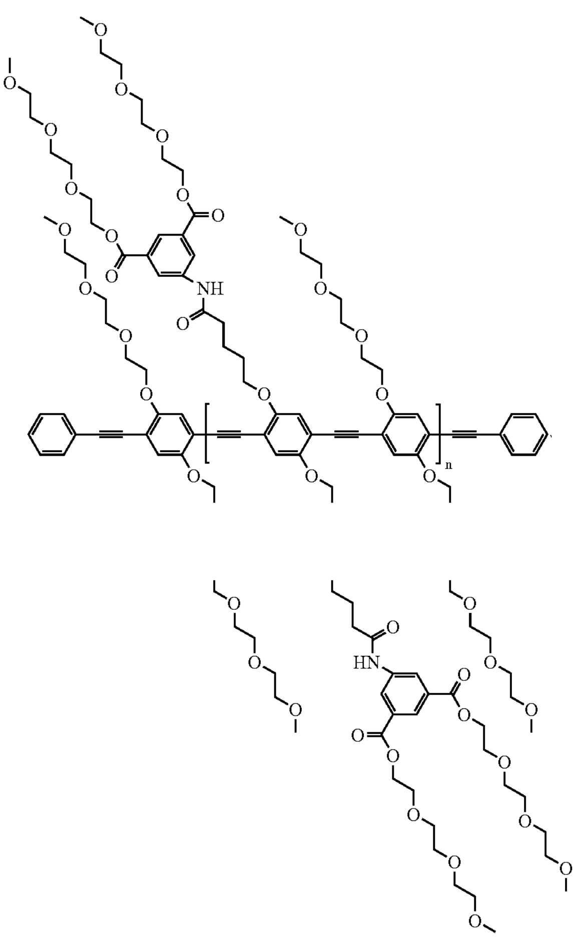

-continued
(j)
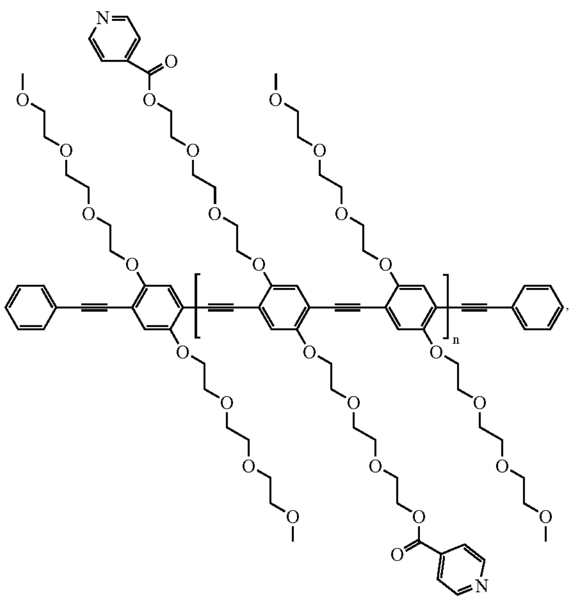
(k)
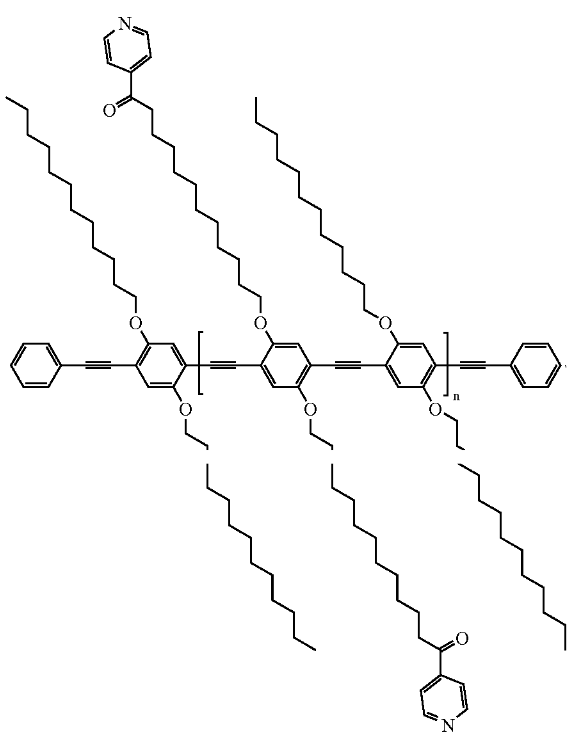
-continued
(l)
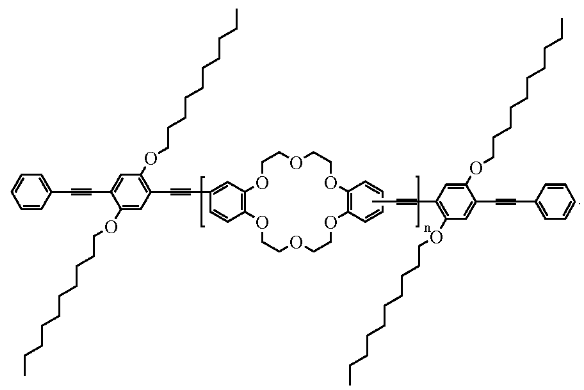
(m)
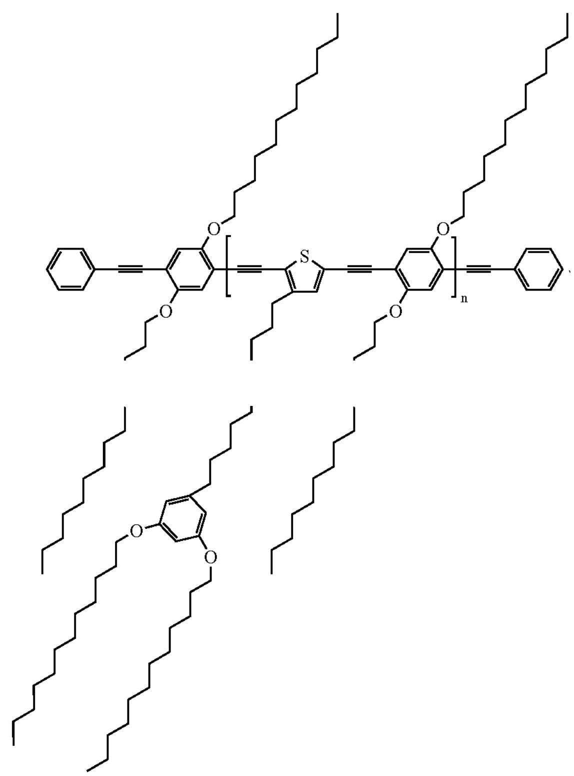

-continued
(n)
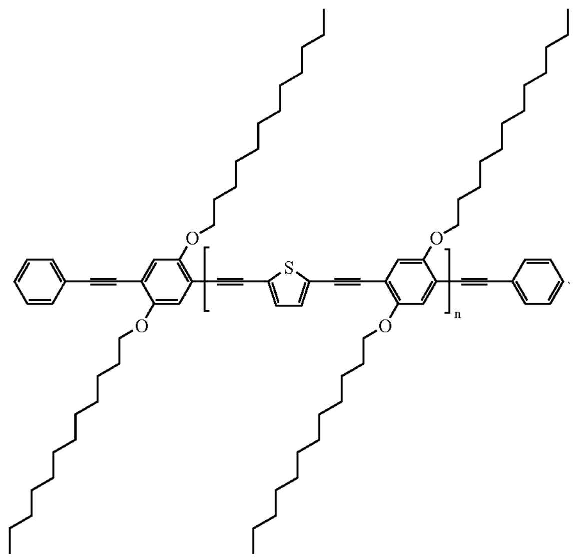
(o)
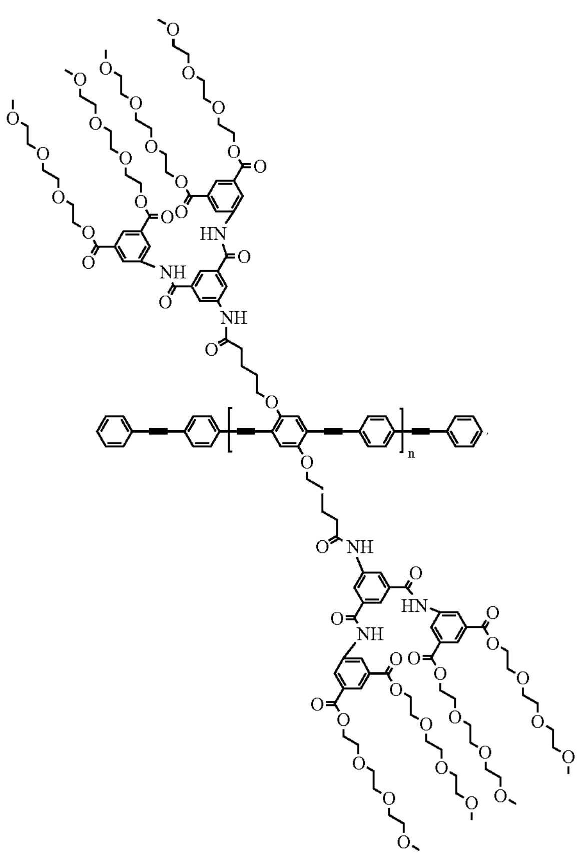
-continued
(p)
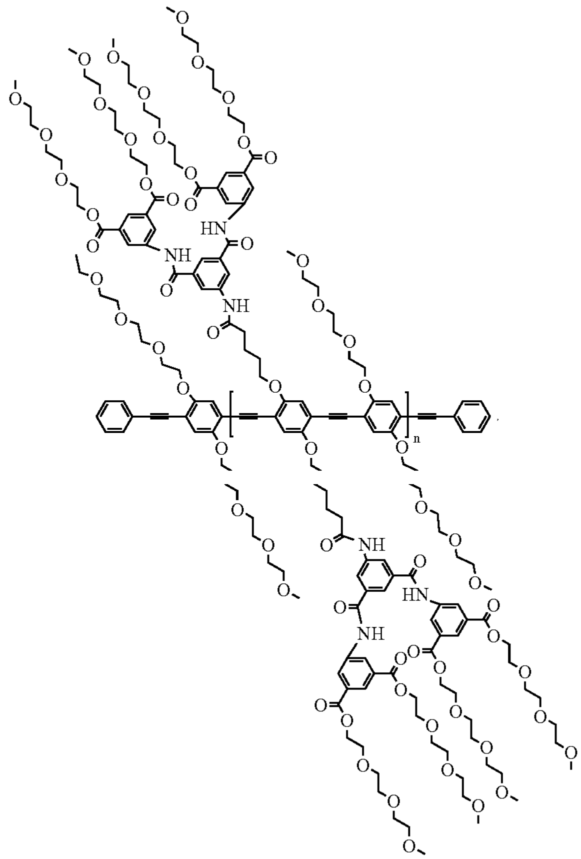
(q)
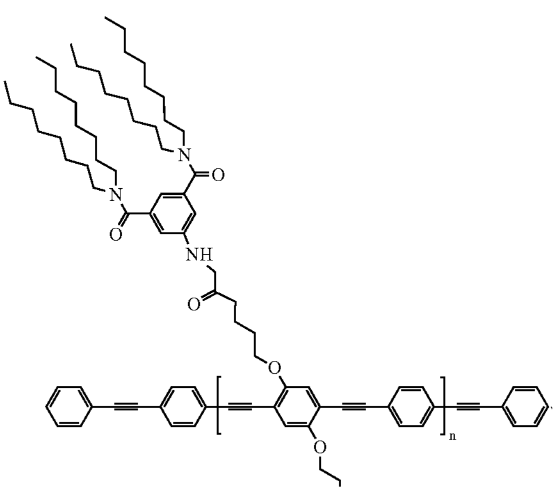

-continued

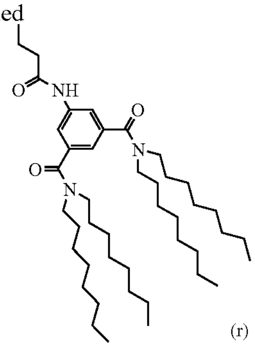

(r)

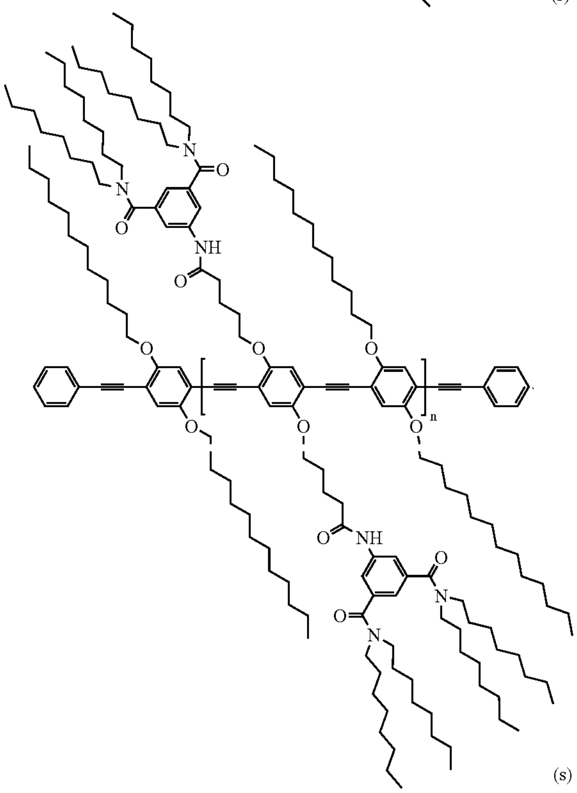

(s)

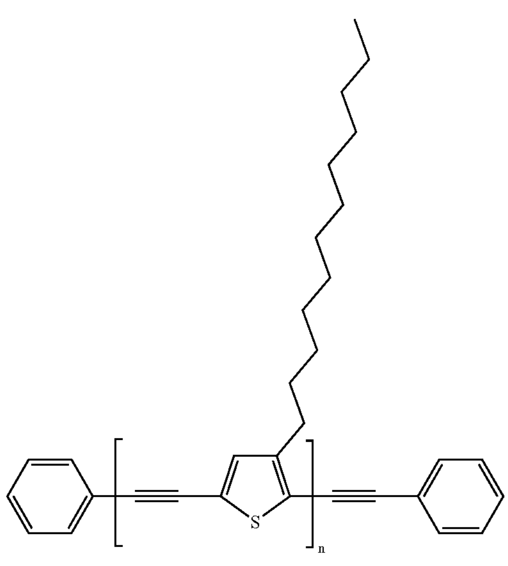

, and

-continued (t)

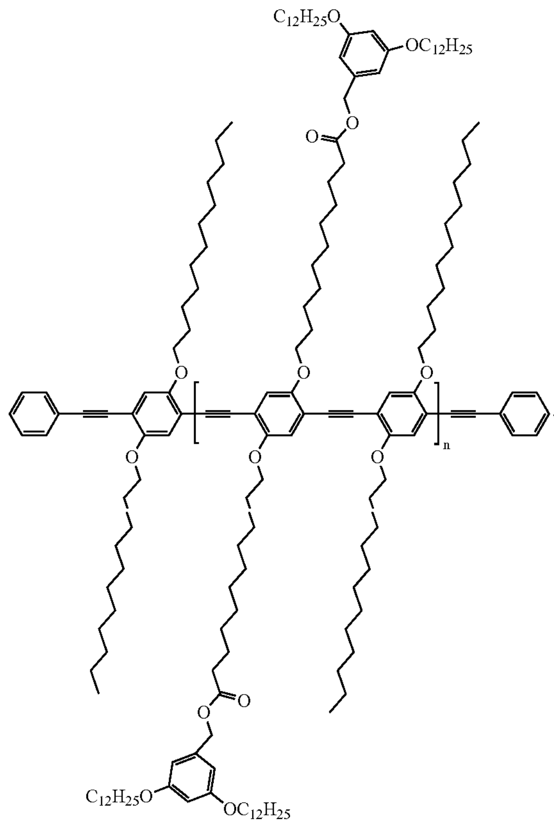

and the functionalized, solubilized nanomaterial being dispersed within the polystyrene, wherein the nanocomposite has an increased electrical conductivity as compared to that of polystyrene alone.

66. The nanocomposite of claim 65 wherein the polystyrene is a first host polymer matrix and the nanocomposite further comprises a second host polymer matrix, wherein the functionalized, solubilized nanomaterial is dispersed within the first and second host polymer matrices.

67. The nanocomposite of claim 65 wherein the functionalized, solubilized nanomaterial comprises a functionalized, solubilized single-walled carbon nanotube, multi-walled carbon nanotube, carbon nanoparticle, carbon nanosheet, carbon nanofiber, carbon nanorope, carbon nanoribbon, carbon nanofibril, carbon nanoneedle, carbon nanohorn, carbon nanocone, carbon nanoscroll, carbon nanodot, or a combination thereof.

68. The nanocomposite of claim 65 wherein the functionalized, solubilized nanomaterial comprises an amount of equal to or greater than 0.01% and less than or equal to 75.0% by weight or volume of the nanocomposite.

69. The nanocomposite of claim 65 wherein the functionalized, solubilized nanomaterial comprises an amount of equal to or greater than 0.04% and less than or equal to 50.0% by weight or volume of the nanocomposite.

70. A nanocomposite, comprising:

a host matrix comprising a first polymer matrix and a second polymer matrix wherein the first polymer matrix is polycarbonate, and a functionalized, solubilized nanomaterial comprising a nanomaterial bonded with a polymer, the polymer being selected from the group consisting of:
(a)
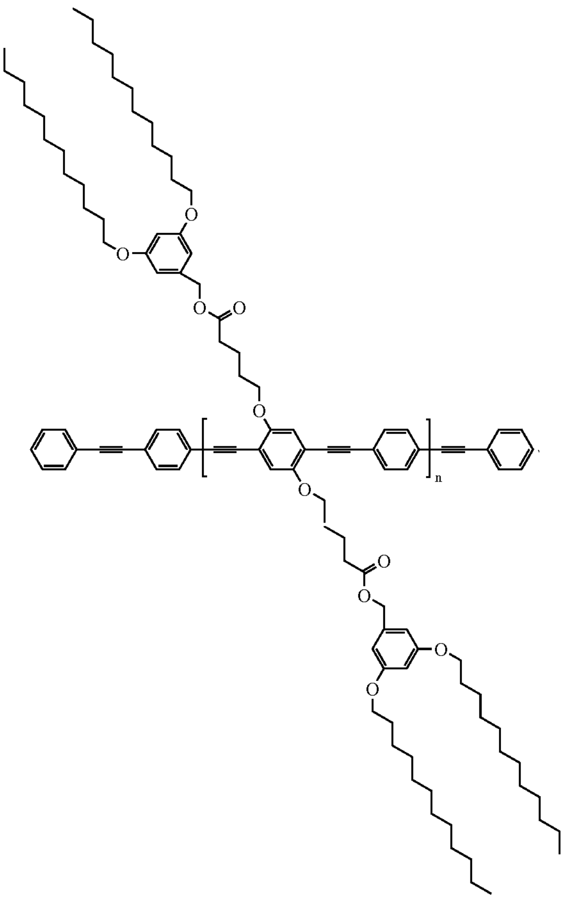
(b)
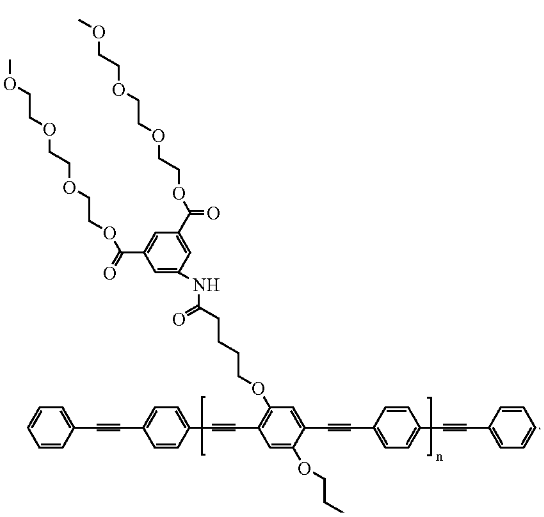
-continued
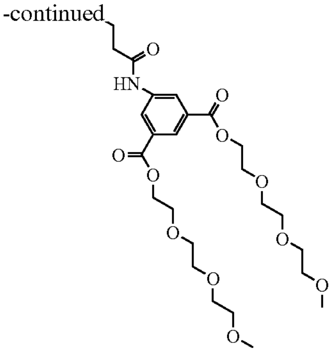
(c)
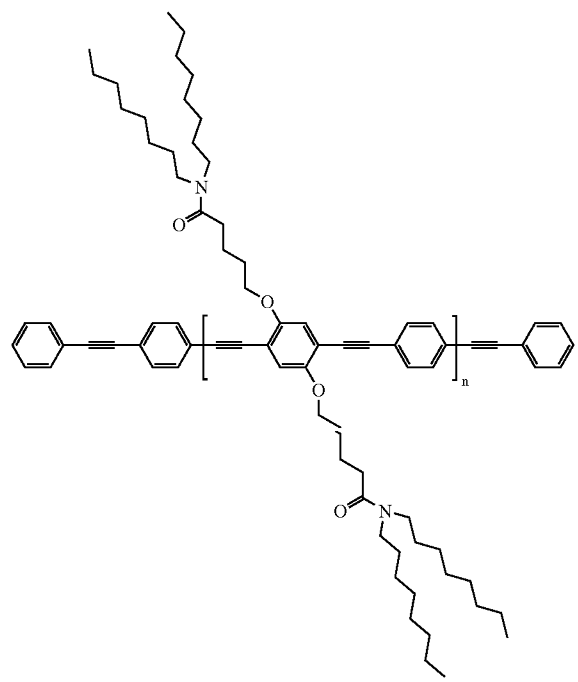
(d)
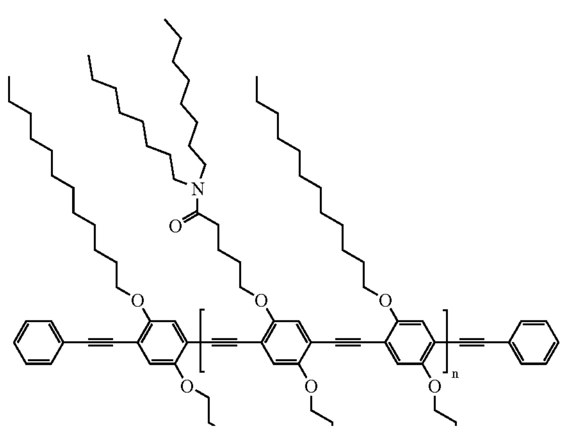

-continued
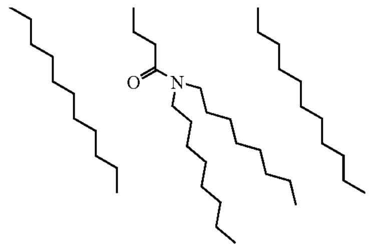
(e)
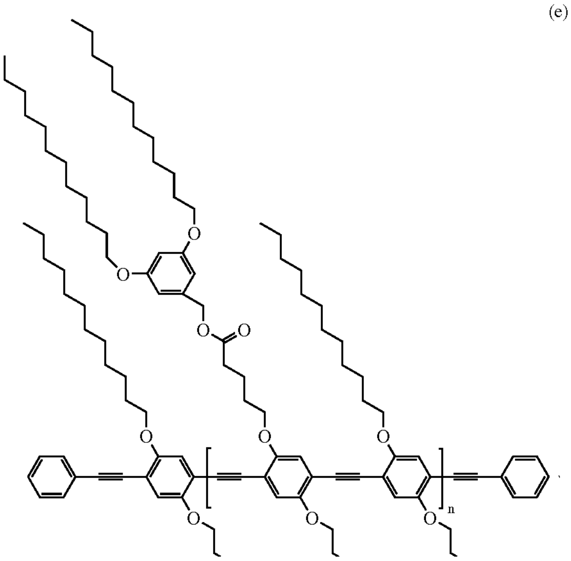
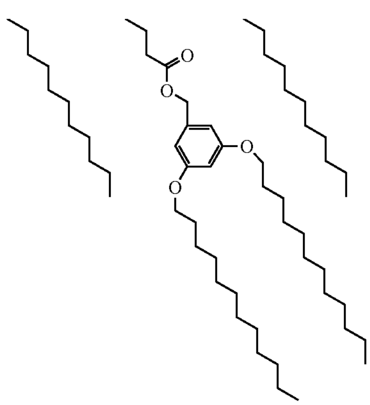
-continued
(f)
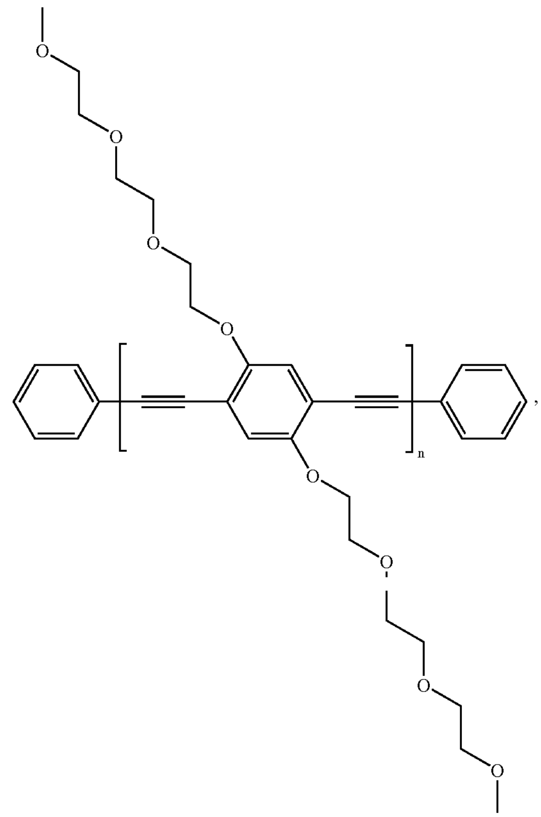
(g)
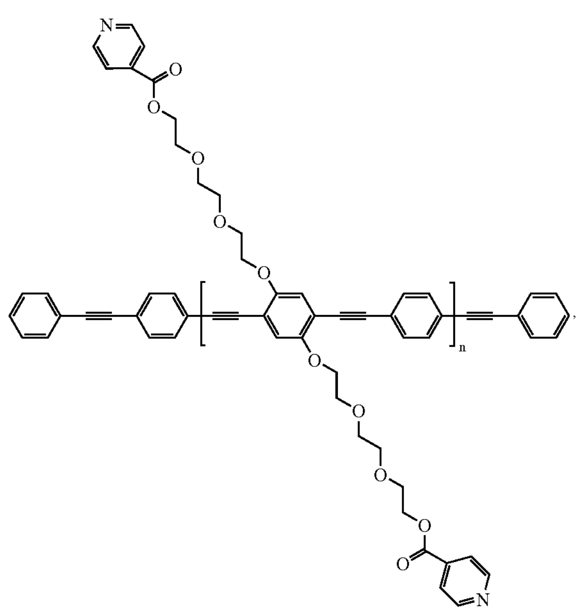

-continued
(h)
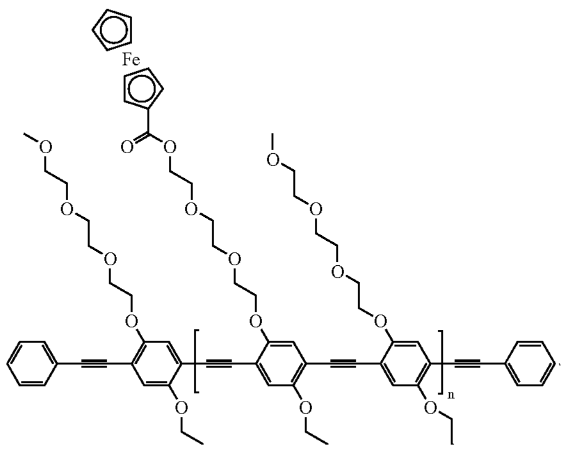
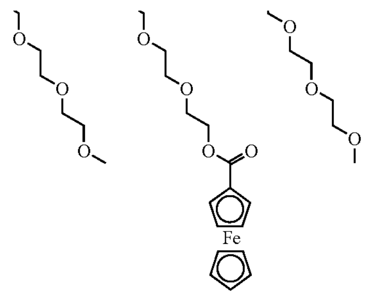
(i)
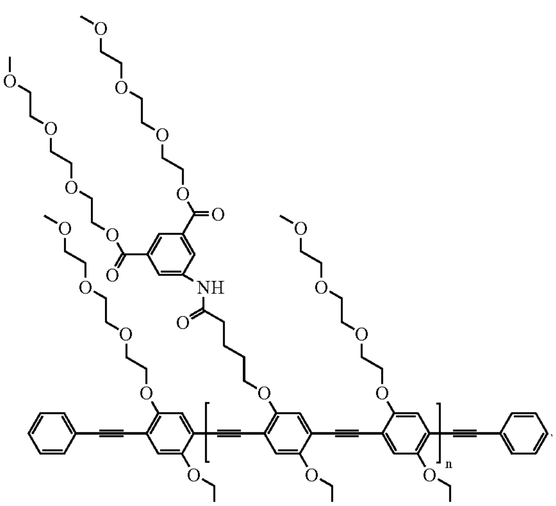
-continued
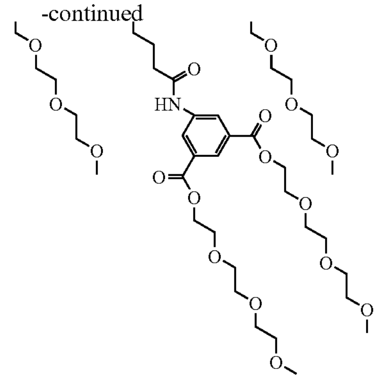
(j)
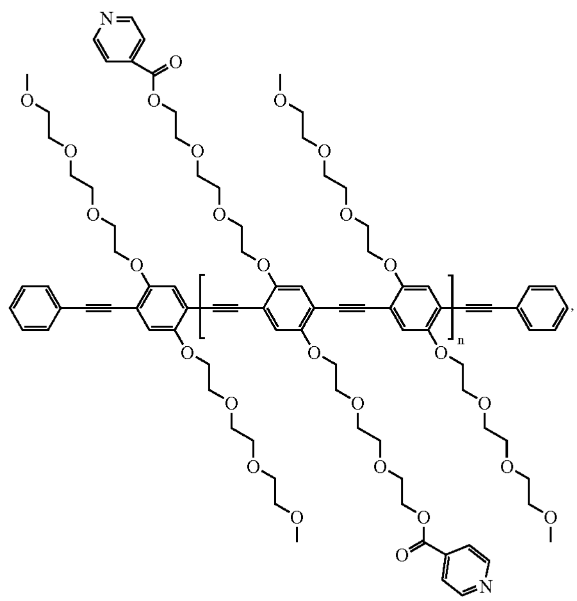
(k)
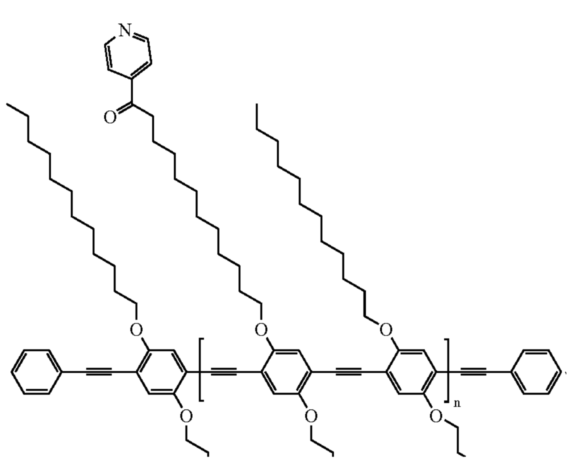

-continued
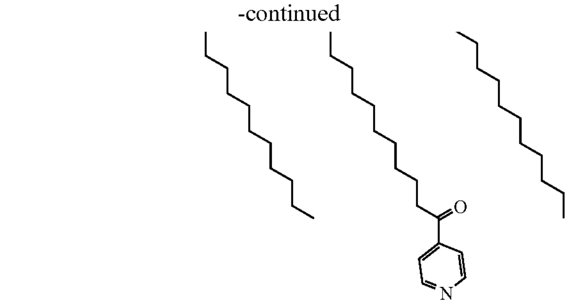
(l)
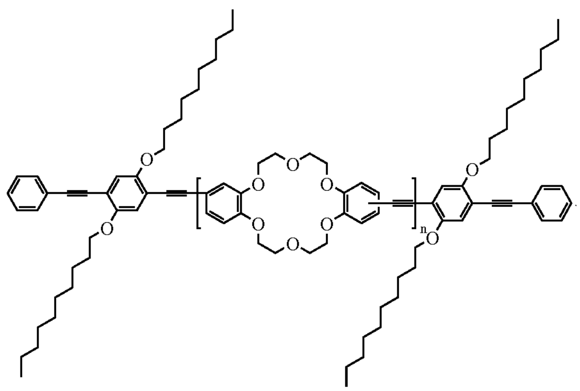
(m)
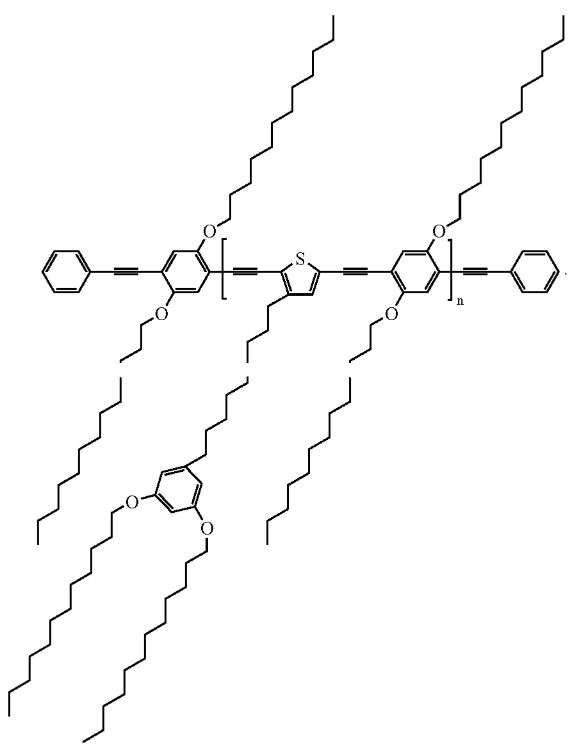
-continued
(n)
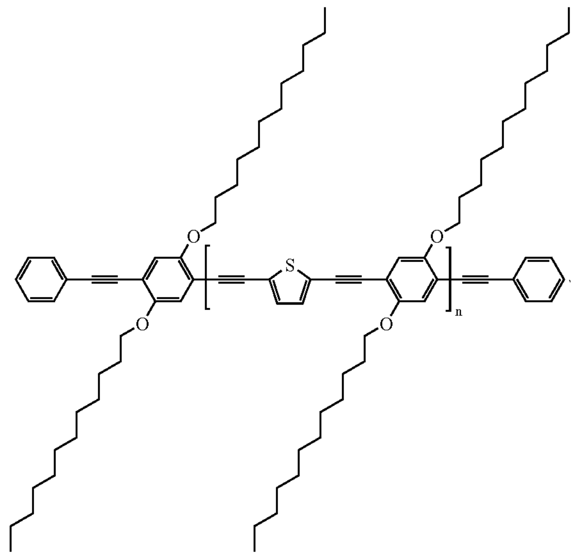
(o)
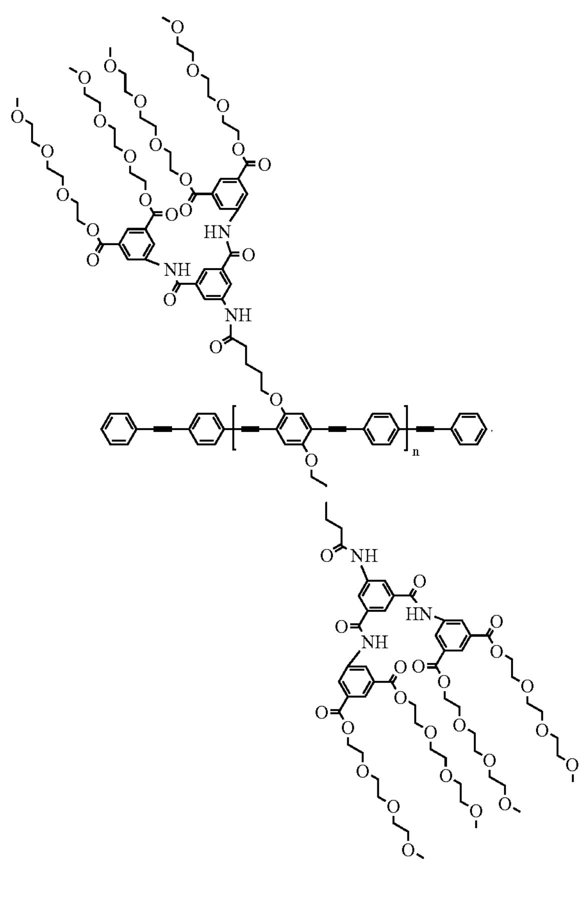

-continued
(p)
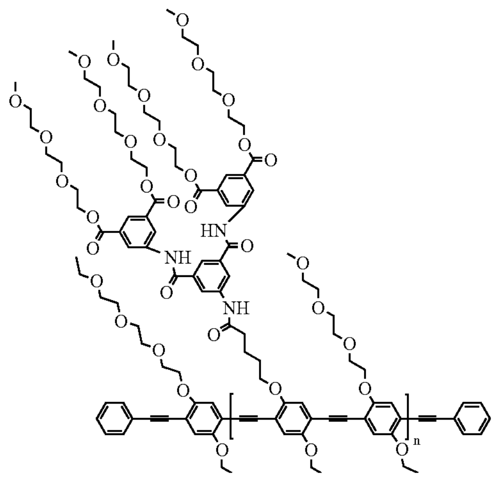
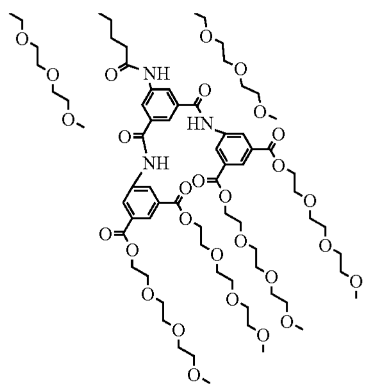
(q)
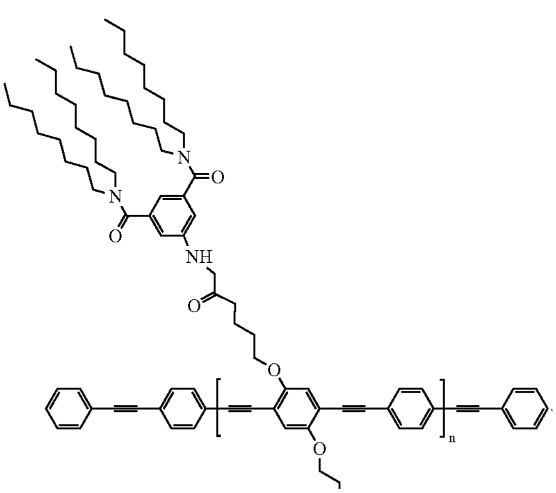
-continued
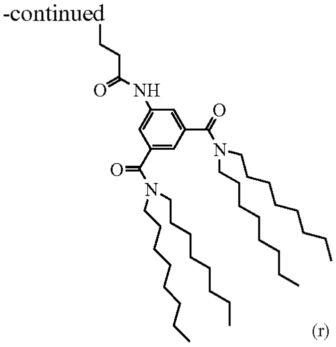
(r)
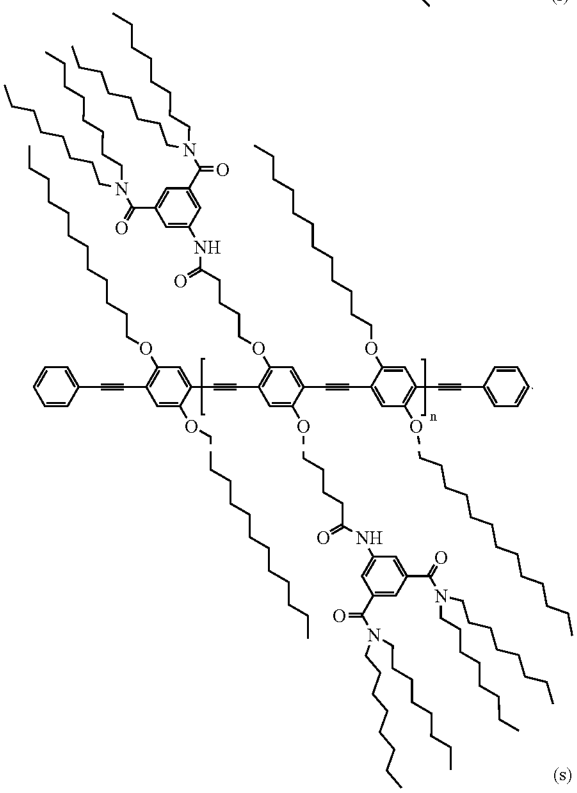
(s)
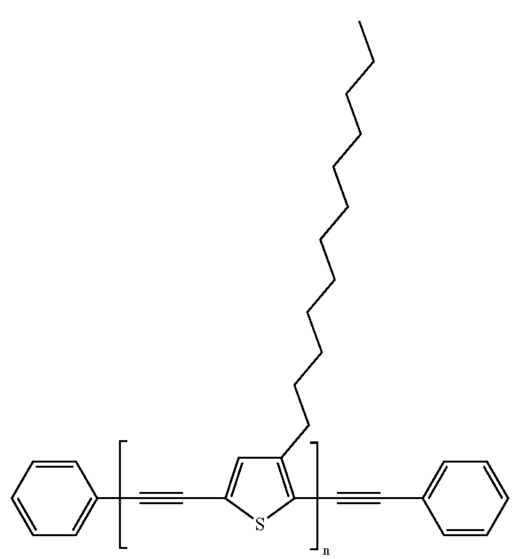
, and -continued (t)

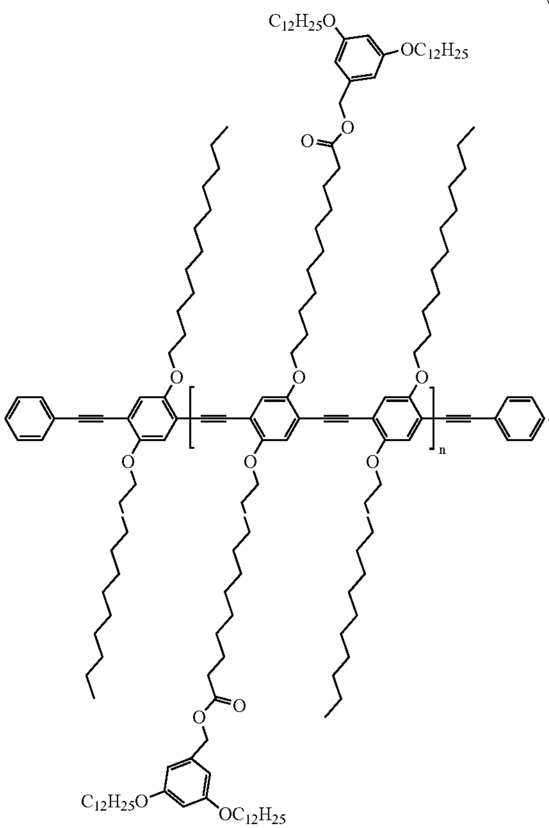

the functionalized, solubilized nanomaterial being dispersed within the host matrix, wherein the nanocomposite has a mechanical property that is enhanced as compared to that of the host matrix alone.

71. The nanocomposite of claim 70 wherein the functionalized, solubilized nanomaterial comprises a functionalized and solubilized single-walled carbon nanotube, multi-walled carbon nanotube, carbon nanoparticle, carbon nanosheet, carbon nanofiber, carbon nanorope, carbon nanoribbon, carbon nanofibril, carbon nanoneedle, carbon nanohorn, carbon nanocone, carbon nanoscroll, carbon nanodot, or a combination thereof.

72. The nanocomposite of claim 70 wherein the functionalized, solubilized nanomaterial comprises an amount of equal to or greater than 0.01% and less than or equal to 75.0% by weight or volume of the nanocomposite.

73. The nanocomposite of claim 70 wherein the functionalized, solubilized nanomaterial comprises an amount of equal to or greater than 0.04% and less than or equal to 50.0% by weight or volume of the nanocomposite.

74. The nanocomposite of claim 70 wherein the functionalized, solubilized nanomaterial of the nanocomposite is a first filler and the nanocomposite further comprises a second filler to form a complex nanocomposite wherein the second filler comprises a continuous fiber, a discontinuous fiber, a nanoparticle, a microparticle, a macroparticle, or a combination thereof, and the second filler is other than a functionalized, solubilized nanomaterial.

75. An article of manufacture comprising the nanocomposite of claim 52.

76. An article of manufacture comprising the nanocomposite of claim 54.

77. An article of manufacture comprising the nanocomposite of claim 55.

78. A method of improving a mechanical property of a host matrix comprising polymer matrix or nonpolymer matrix, wherein the host matrix is other than polystyrene or polycarbonate, the method comprising:

dispersing a functionalized, solubilized nanomaterial comprising a nanomaterial bonded with a polymer, the polymer being selected from the group consisting of:

(a)

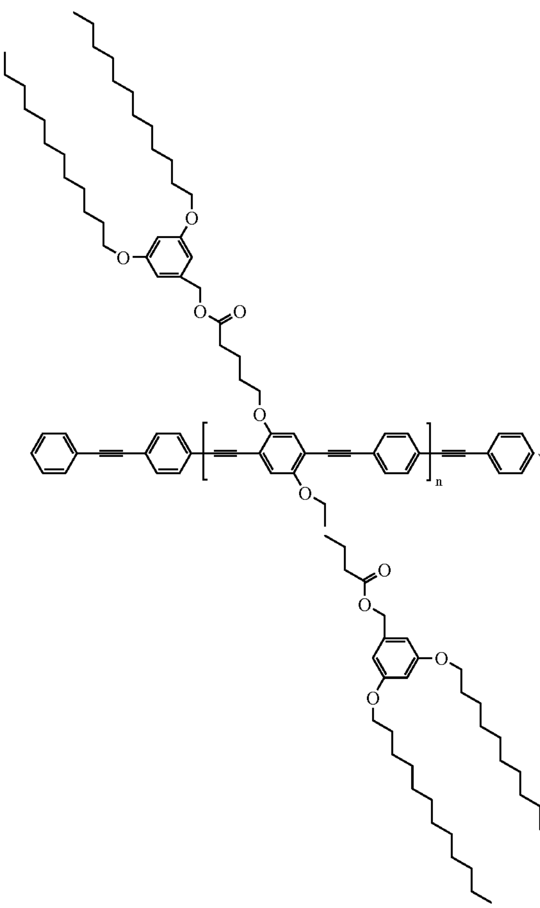

(b)

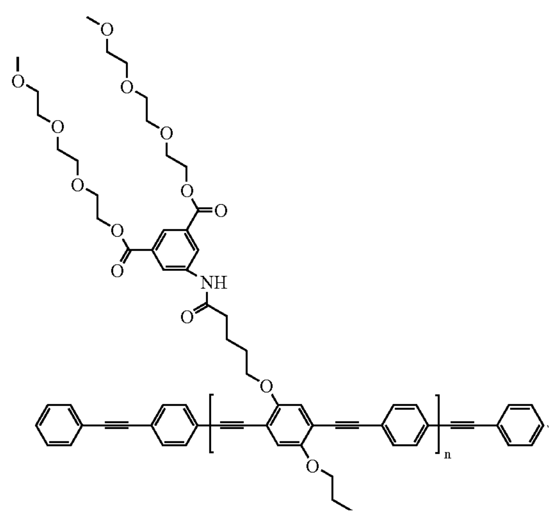

-continued
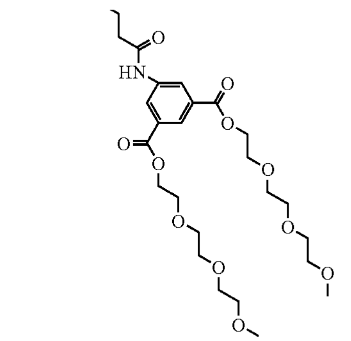
(c)
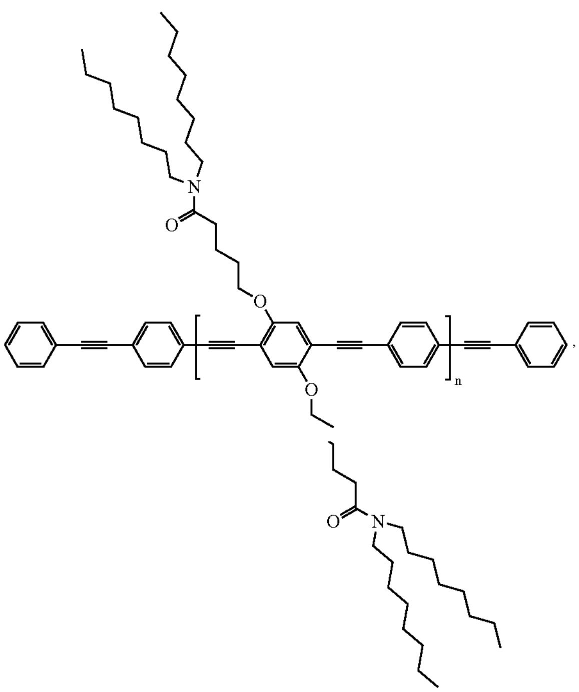
(d)
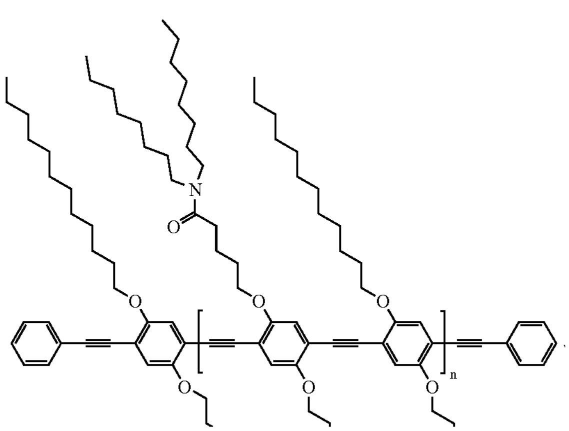
-continued
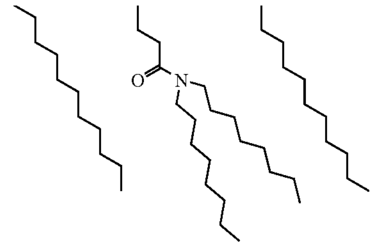
(e)
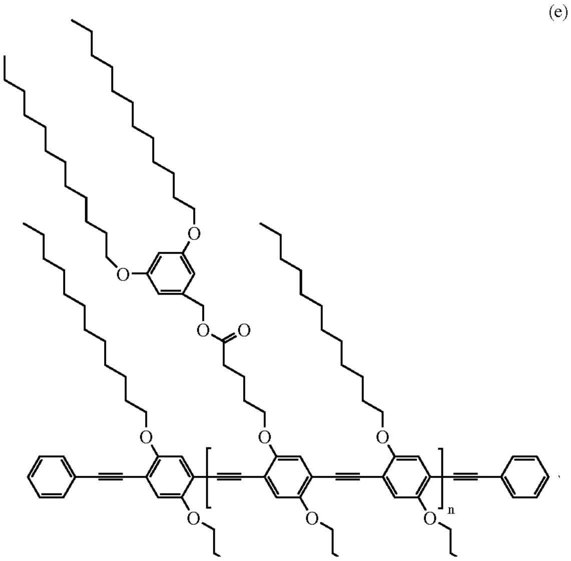
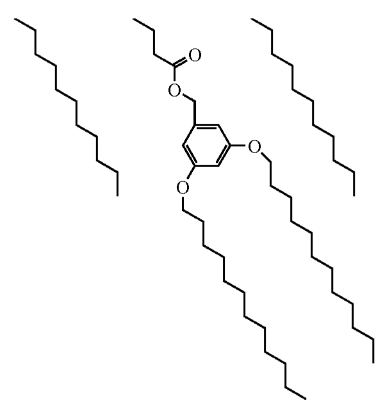

-continued
(f)
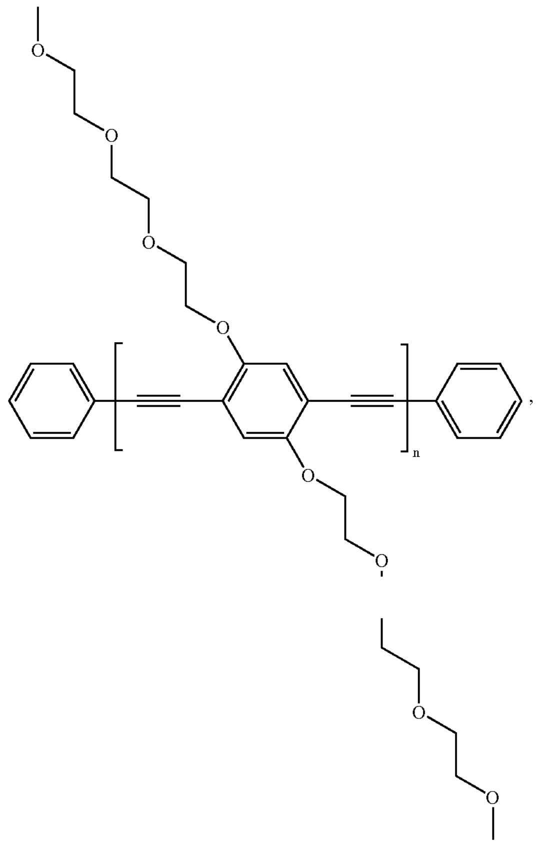
(g)
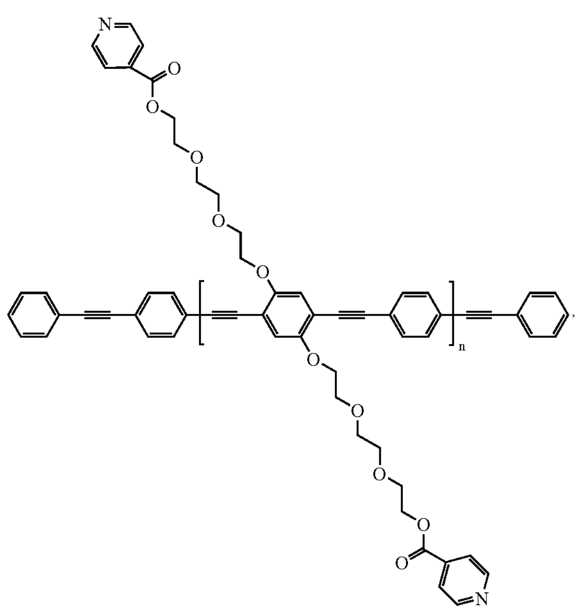
-continued
(h)
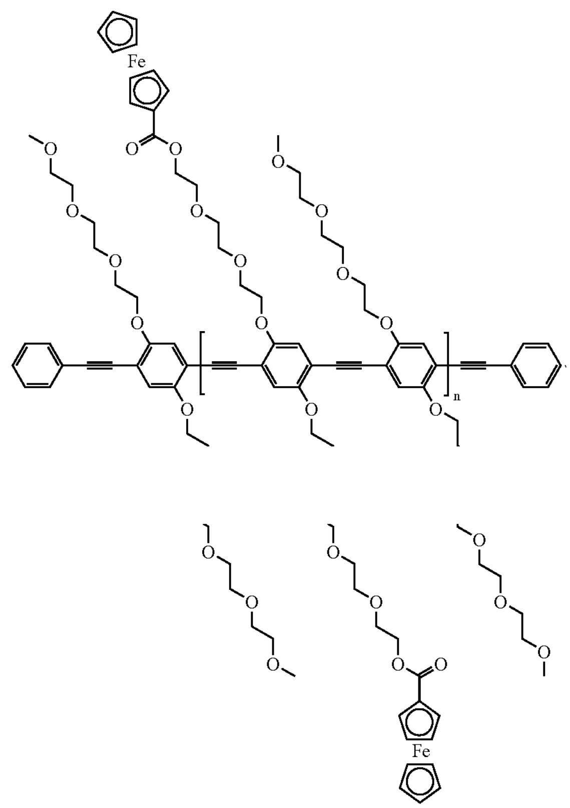
(i)
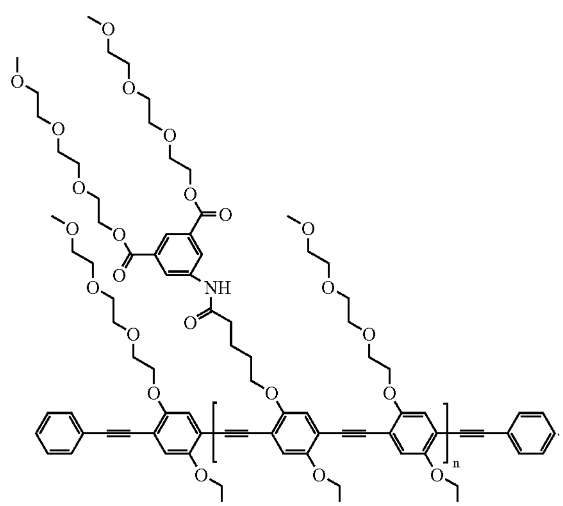

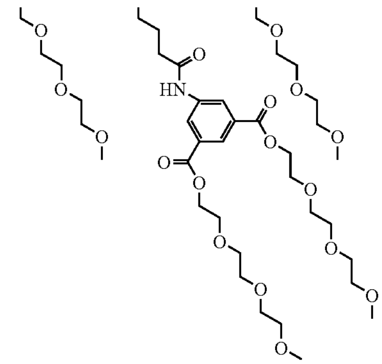
(j)
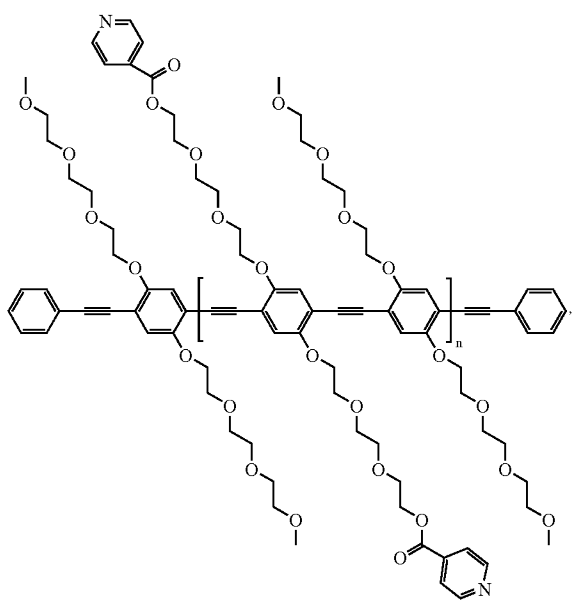
(k)
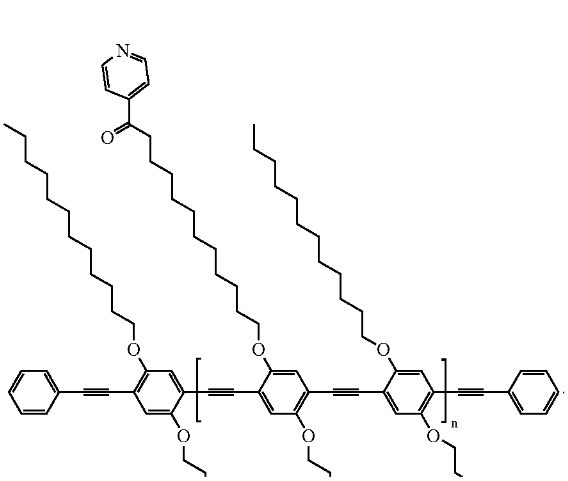
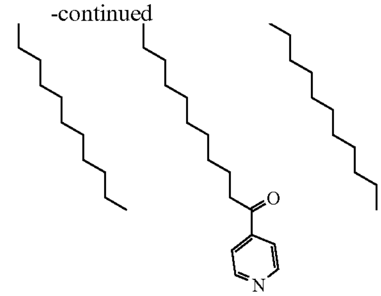
(l)
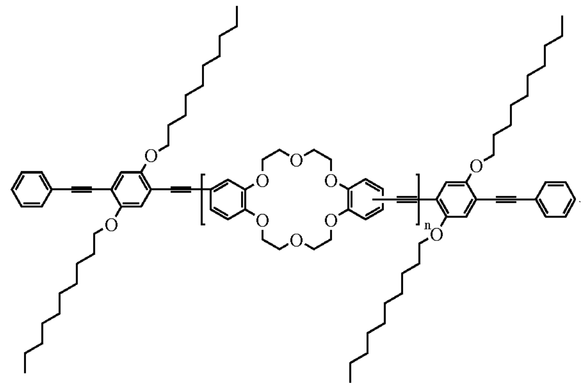
(m)
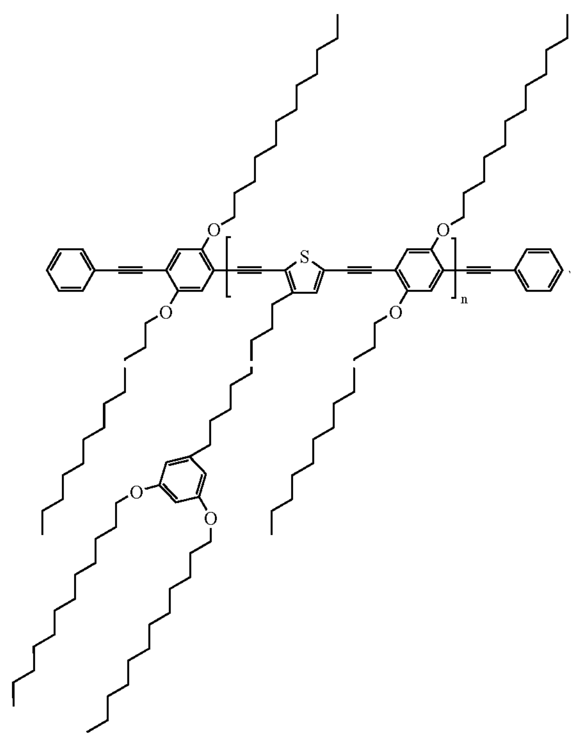

-continued
(n)
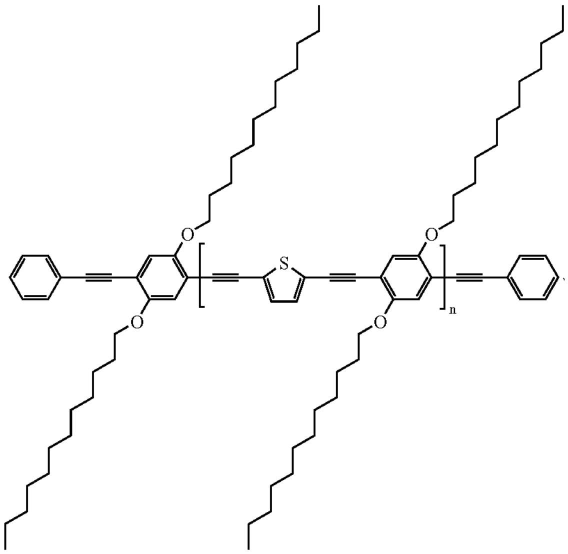
(o)
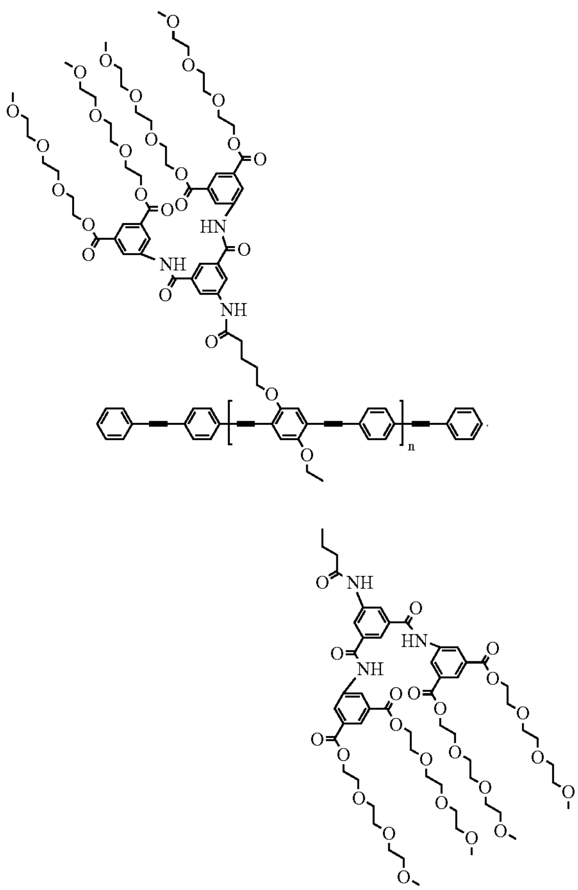
-continued
(p)
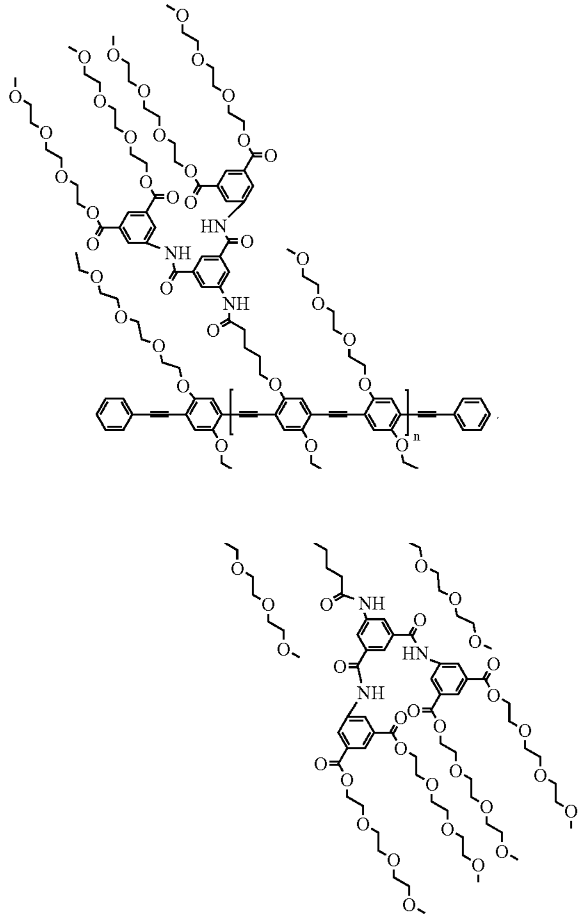
(q)
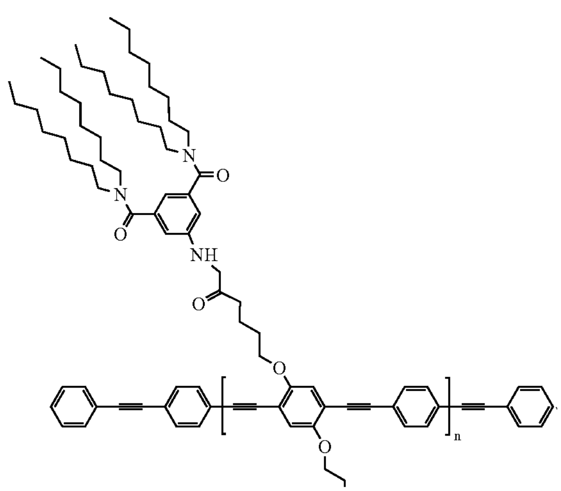

-continued

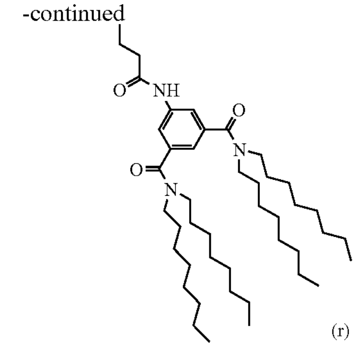

(r)

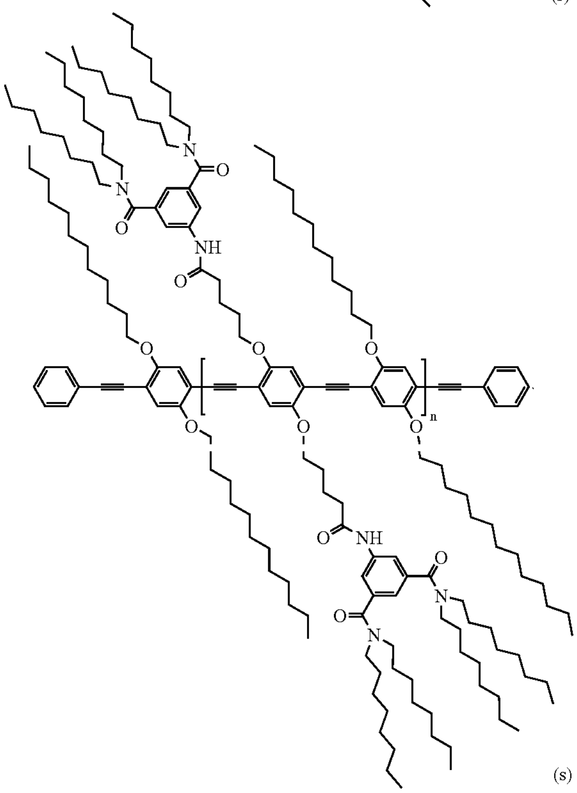

(s)

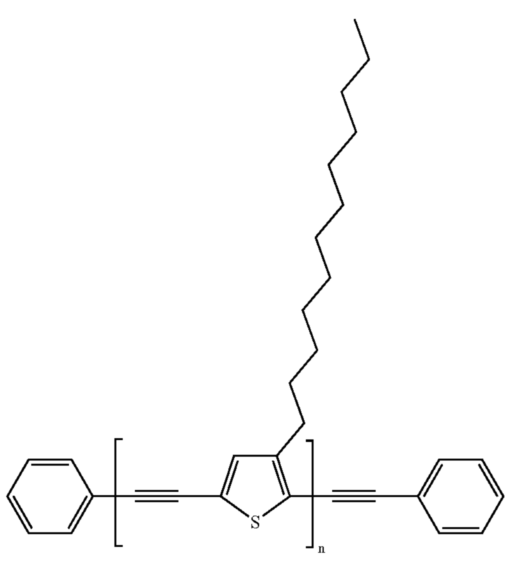

, and

-continued (t)

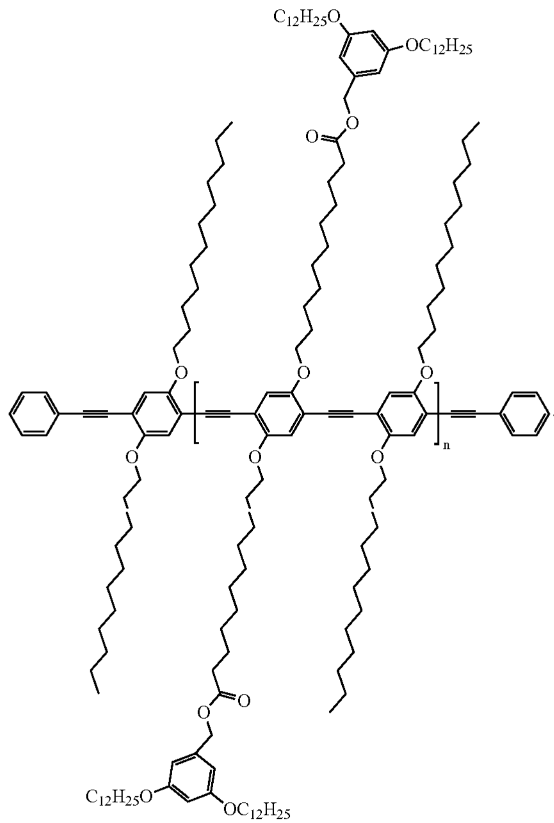

and the dispersing of the functionalized, solubilized nanomaterial is within a host matrix material to form a nanocomposite, wherein the nanocomposite has an improved mechanical property compared to that of the host matrix alone.

79. The method of claim 78 wherein the host matrix material comprises a monomer of the host matrix and the method further comprises the step of polymerizing the host matrix material in the presence of the functionalized, solubilized nanomaterial.

80. The method of claim 78 wherein the host matrix is a first host polymer matrix and the method further comprises:

dispersing a second host polymer matrix material with functionalized, solubilized nanomaterial and with a first host polymer matrix material to form a nanocomposite comprising a first host polymer matrix and a second host polymer matrix, wherein the nanocomposite has an improved mechanical property compared to that of the first host polymer matrix alone.

81. The method of claim 80 wherein the first host polymer matrix material is the first host polymer matrix.

82. The method of claim 80 wherein the first host polymer matrix material comprises a monomer of the first host polymer matrix material and the method further comprises the step of polymerizing the host polymer matrix material in the presence of the functionalized, solubilized nanomaterial.

83. The method of claim 78 wherein the host polymer matrix comprises a thermoplastic polymer or monomer thereof, a thermoset polymer resin, or monomer thereof, or a combination thereof.

84. The method of claim 78 wherein the host material is a polymer matrix and the polymer matrix comprises an inorganic polymer matrix.

85. The method of claim 84 wherein the inorganic polymer matrix comprises silicone, polysilane, polycarbosilane, polygermane, polystannane, a polyphosphazene, or a combination thereof.

86. The method of claim 78 wherein the host matrix comprises a host polymer matrix material comprising a polyethylene, polyisoprene, styrene-butadiene-styrene (SBS) rubber, polydicyclopentadiene, polytetrafluoroethylene, poly(phenylene sulfide), silicone, cellulose, rayon, poly(methyl methacrylate), poly(vinylidene chloride), poly(vinylidene fluoride), polyisobutylene, polychloroprene, polybutadiene, polypropylene, poly(vinyl chloride), poly(vinyl acetate), polyvinylpyrrolidone, polycyanoacrylate, polyacrylonitrile, poly(aryleneethynylene), poly(phenyleneethynylene), polythiophene, polyaniline, polypyrrole, polyphenylene, ethylene vinyl alcohol, fluoroplastic, ionomer, polyacrylate, polybutylene, polyethylenechlorinate, polymethylpentene, polyamide, polyamide-imide, polyaryletherketone, polyketone, polyester, polyetheretherketone, polyetherimide, polyethersulfone, polyimide, polyphenylene oxide, polyphthalamide, polysulfone, polyethylene terephthalate, epoxy resin, or a polyurethane, or monomer thereof, or a combination thereof.

87. The method of claim 86 wherein the host polymer matrix material comprises a polyphenylene, or monomer thereof.

88. The method of claim 86 wherein the host polymer matrix material comprises a fluoroplastic and the fluoroplastic comprises polytetrafluoroethylene, fluoroethylene propylene, perfluoroalkoxyalkane, chlorotrifluoroethylene, ethylene chlorotrifluoroethylene, or ethylene tetrafluoroethylene, or monomer thereof, or combination thereof.

89. The method of claim 78 wherein the functionalized, solubilized nanomaterial comprises a functionalized, solubilized single-walled carbon nanotube, multi-walled carbon nanotube, carbon nanoparticle, carbon nanosheet, carbon nanofiber, carbon nanorope, carbon nanoribbon, carbon nanofibril, carbon nanoneedle, carbon nanohorn, carbon nanocone, carbon nanoscroll, carbon nanodot, or a combination thereof.

90. The method of claim 78 wherein the functionalized, solubilized nanomaterial comprises an amount equal to or greater than 0.01% and less than or equal to 75.0% by weight or volume of the nanocomposite.

91. The method of claim 78 wherein the functionalized, solubilized nanomaterial comprises an amount equal to or greater than 0.04% and less than or equal to 50.0% by weight or volume of the nanocomposite.

92. The method of claim 78 wherein the functionalized, solubilized nanomaterial is a first filler, and the dispersing further comprises dispersing a second filler within host matrix material to form a complex nanocomposite, wherein the second filler comprises a continuous fiber, a discontinuous fiber, a nanoparticle, a microparticle, a macroparticle, or a combination thereof, and wherein the second filler is other than a functionalized, solubilized nanomaterial.

93. A method of improving a mechanical property of a host matrix comprising a first polymer matrix and a second polymer matrix wherein the first polymer matrix is polycarbonate, the method comprising:

dispersing functionalized, solubilized nanomaterial comprising a nanomaterial bonded with a polymer, the polymer being selected from the group consisting of:

(a)

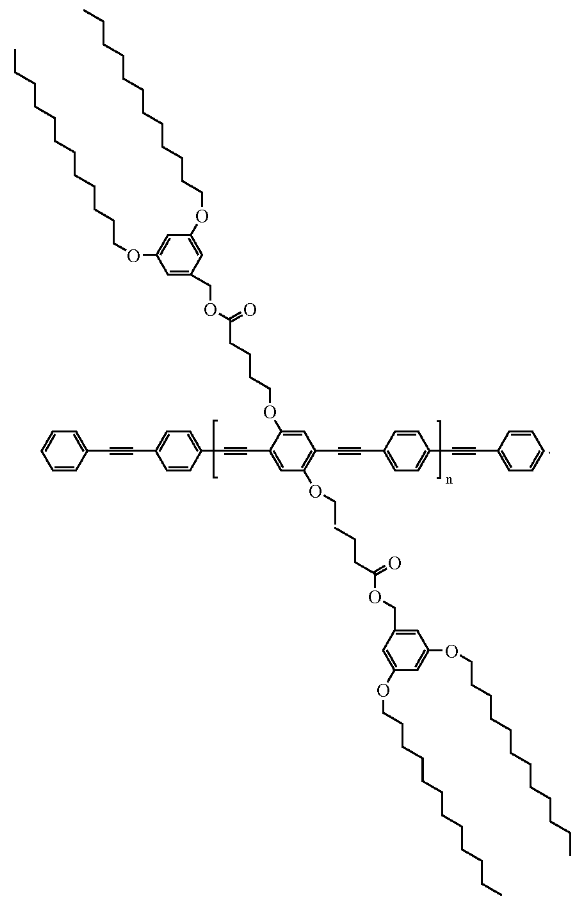

(b)

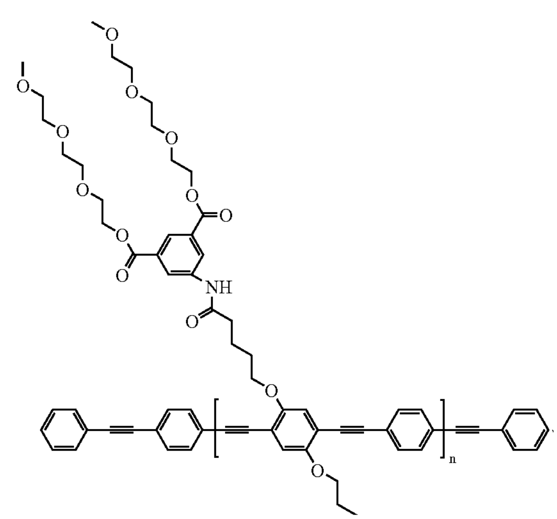

-continued
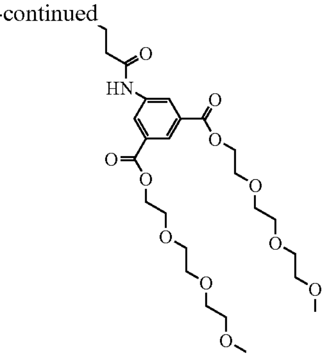
(c)
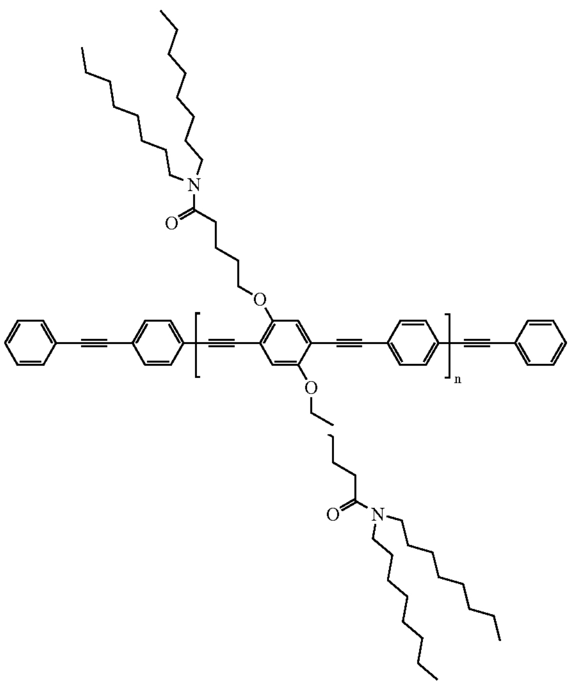
(d)
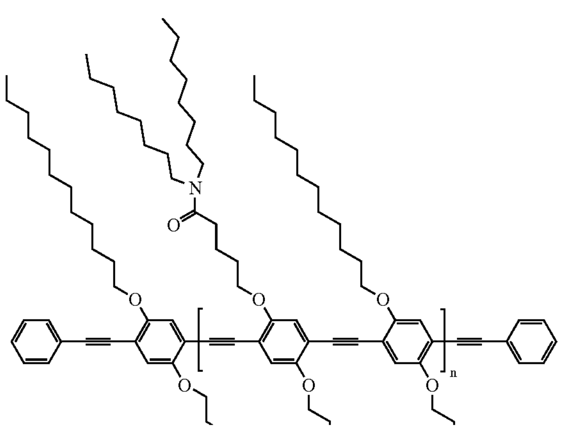
-continued
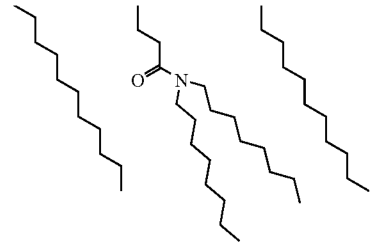
(e)
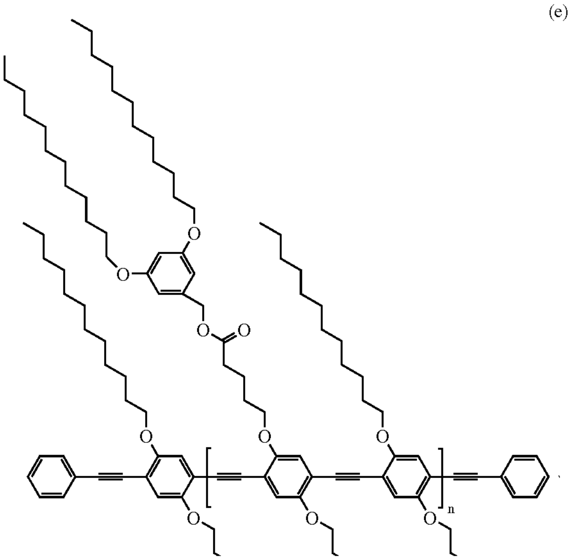
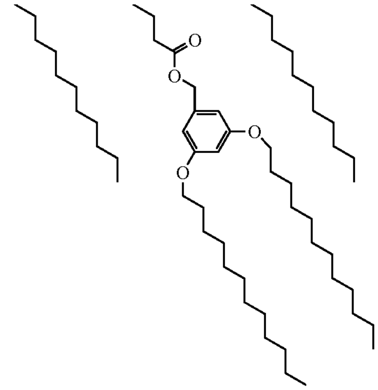

-continued
(f)
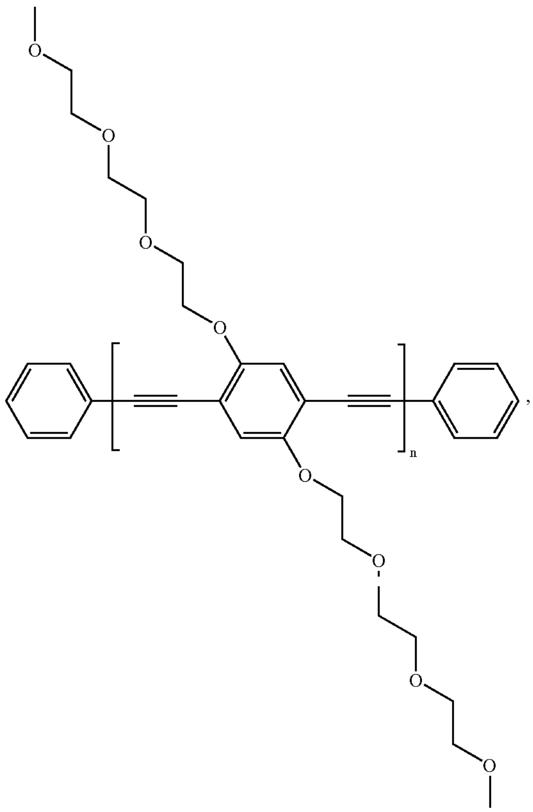
(g)
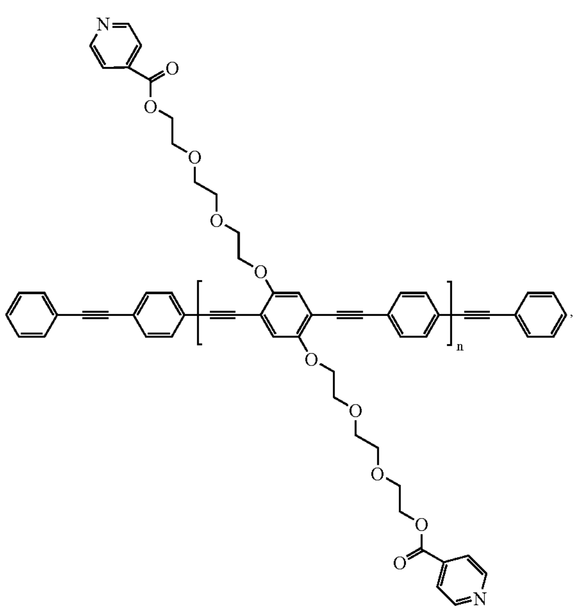
-continued
(h)
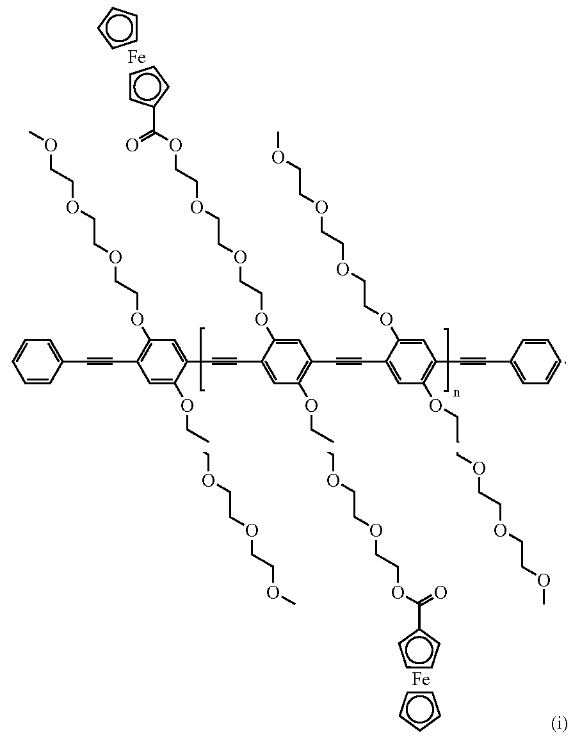
(i)
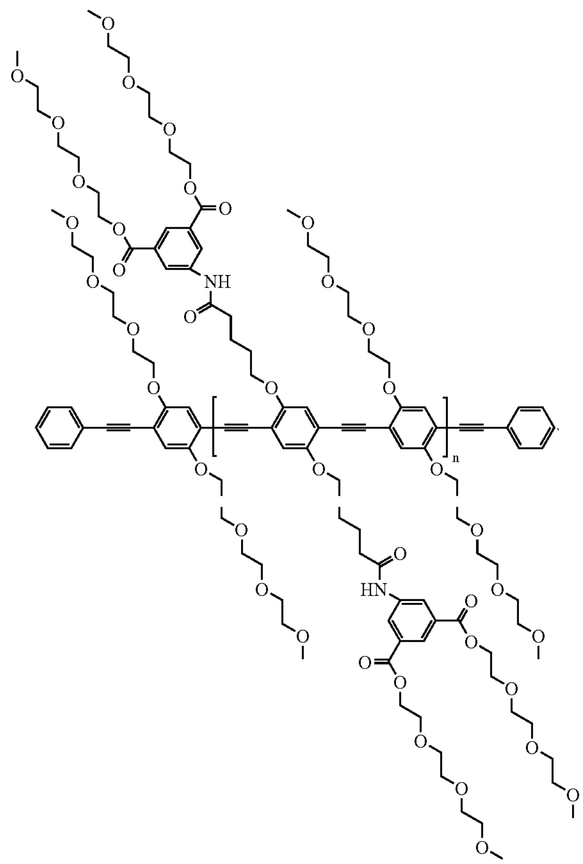

-continued
(j)
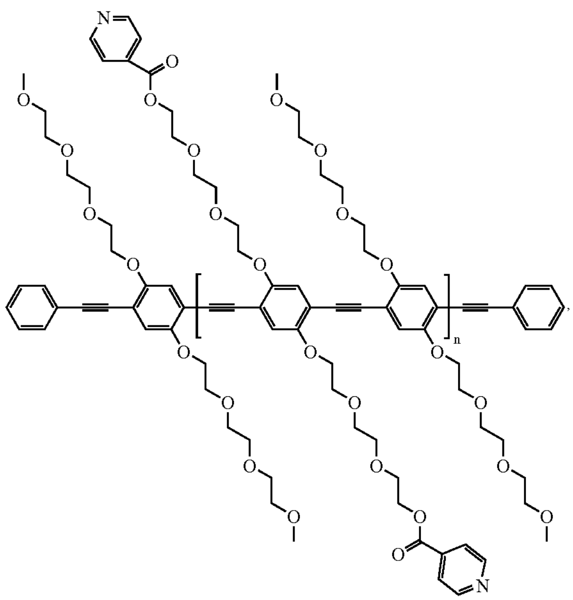
(k)
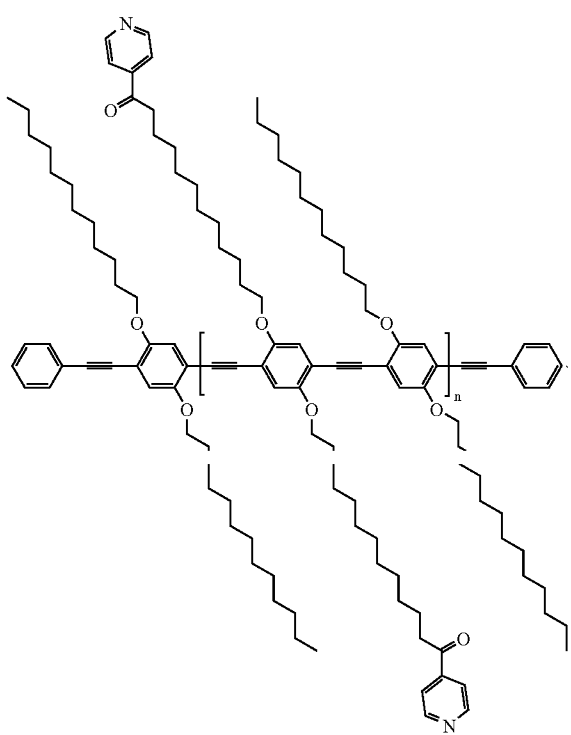
-continued
(l)
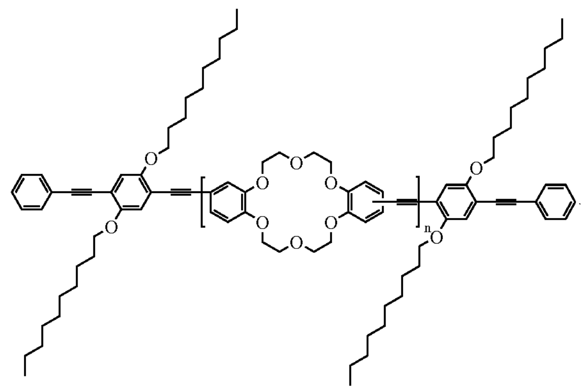
(m)
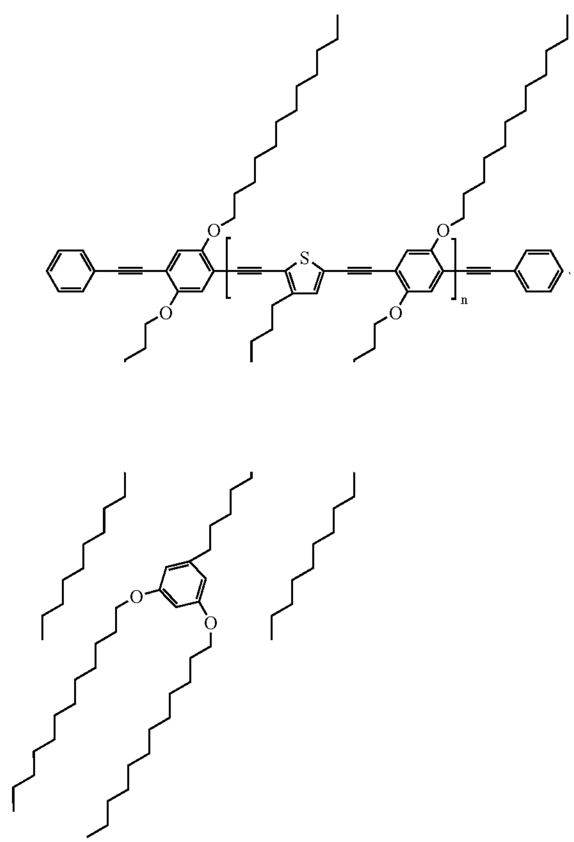

-continued
(n)
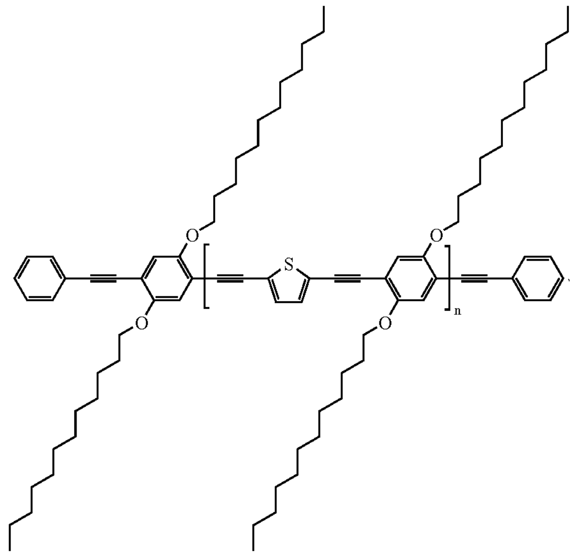
(o)
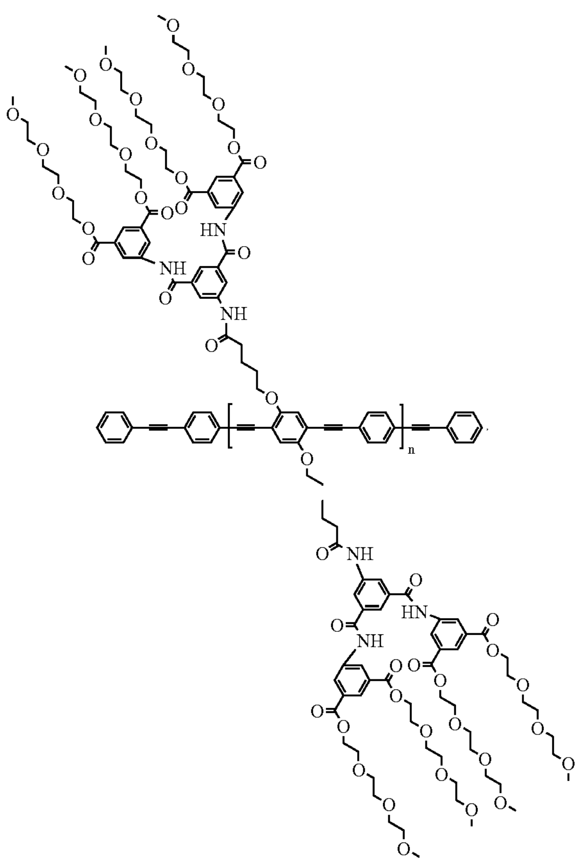
-continued
(p)
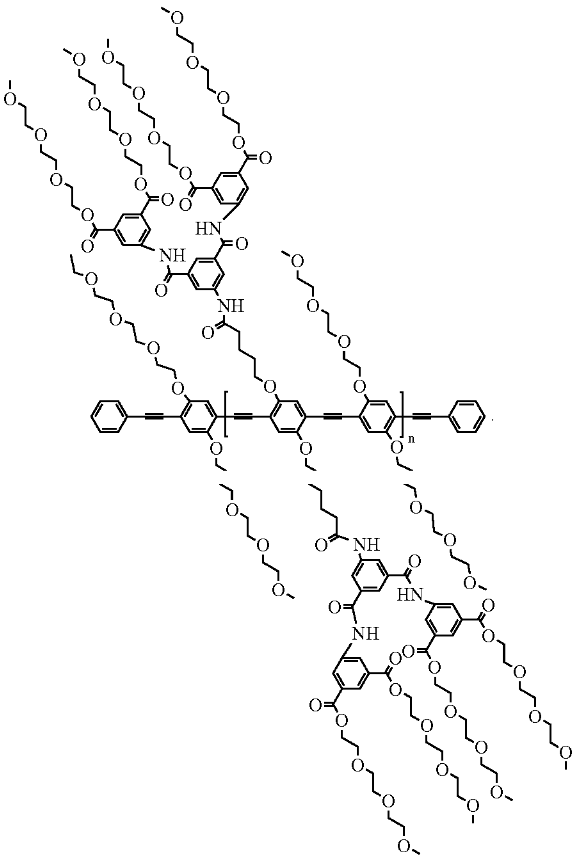
(q)
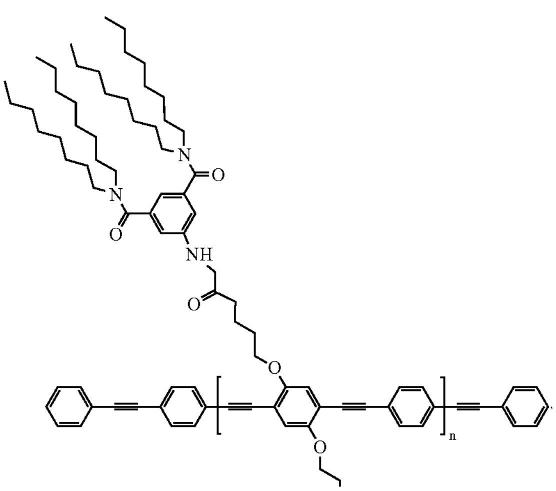

-continued

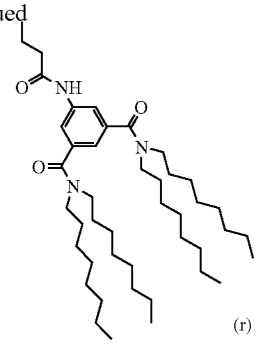

(r)

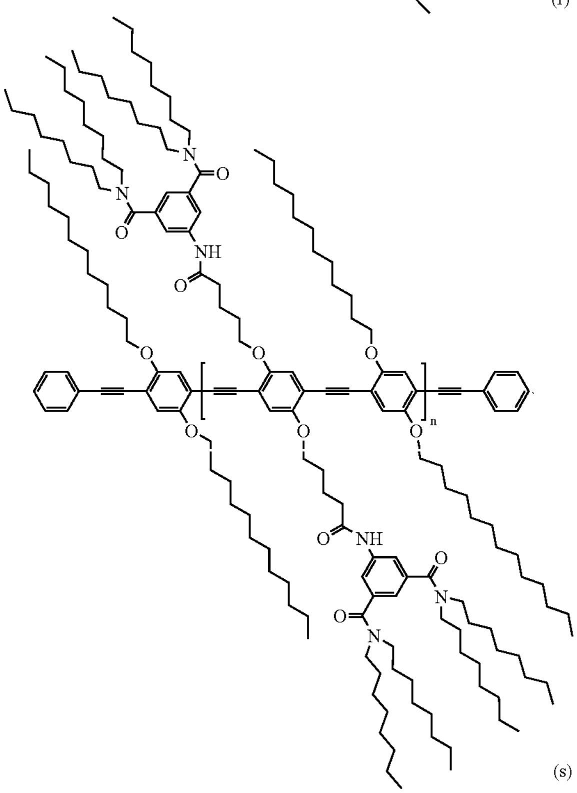

(s)

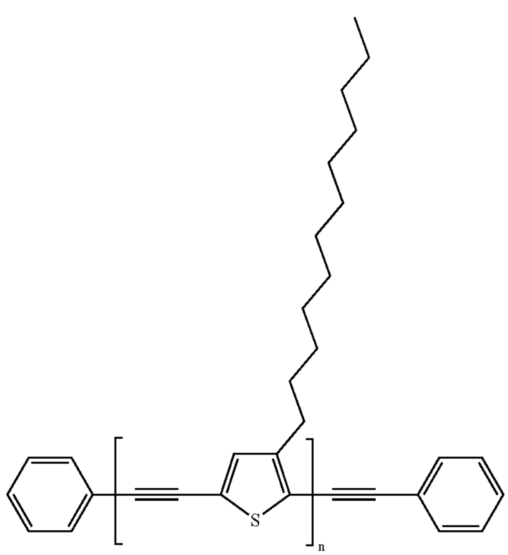

, and

-continued (t)

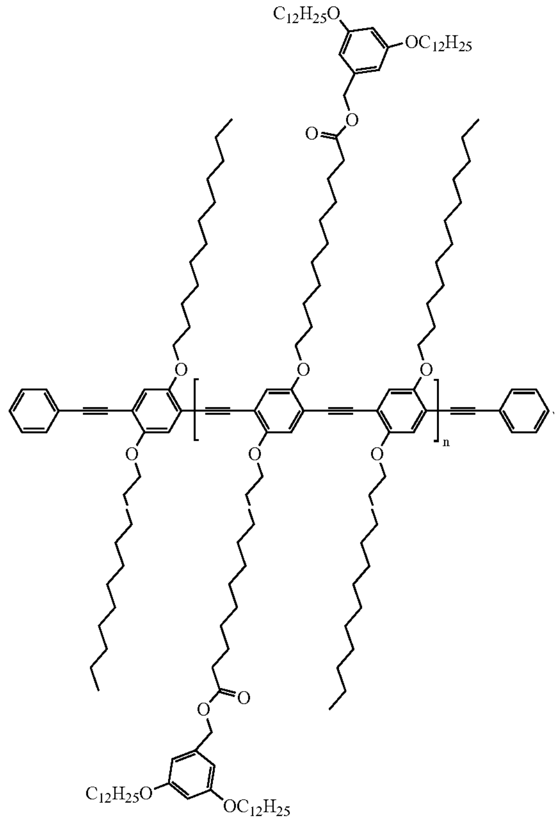

the dispersing of the functionalized, solubilized nanomaterial being within the host matrix to form a nanocomposite wherein the nanocomposite has an improved mechanical property compared to that of the second polymer matrix alone.

94. The method of claim 93 wherein the functionalized, solubilized nanomaterial is a first filler, and the dispersing further comprises dispersing a second filler within host matrix material to form a complex nanocomposite, wherein the second filler comprises a continuous fiber, a discontinuous fiber, a nanoparticle, a microparticle, a macroparticle, or a combination thereof, and wherein the second filler is other than a functionalized, solubilized nanomaterial.

95. An article of manufacture comprising the nanocomposite of claim 58.

96. An article of manufacture comprising the nanocomposite of claim 59.

97. An article of manufacture comprising the nanocomposite of claim 64.

98. An article of manufacture comprising the nanocomposite of claim 65.

99. An article of manufacture comprising the nanocomposite of claim 70.

* * * * *

UNITED STATES PATENT AND TRADEMARK OFFICE

CERTIFICATE OF CORRECTION

PATENT NO. : 7,479,516 B2
APPLICATION NO. : 10/850721
DATED : January 20, 2009
INVENTOR(S) : Jian Chen and Ramasubramaniam Rajagopal It is certified that error appears in the above-identified patent and that said Letters Patent is hereby corrected as shown below:

In the Specification at Column 1, line 3, the following language should be inserted:

--STATEMENT OF GOVERNMENT RIGHTS

The invention was made with government support under NASA Contract Number 9-03019 awarded by National Aeronautics and Space Administration. The Government has certain rights in this invention.--

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,479,516 B2
APPLICATION NO. : 10/850721
DATED : January 20, 2009
INVENTOR(S) : Jian Chen et al.

It is certified that error appears in the above-identified patent and that said Letters Patent is hereby corrected as shown below:

In the Specification:

In Columns 7 and 8 and through Columns 47 and 48 delete the existing formula and replace with the following formula:

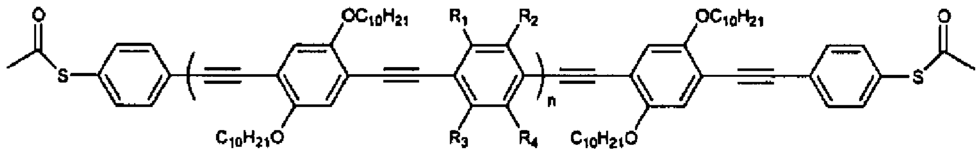

a) ,

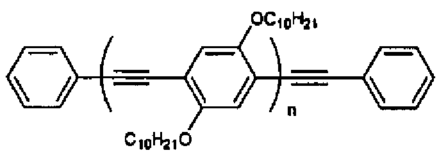

b(i))

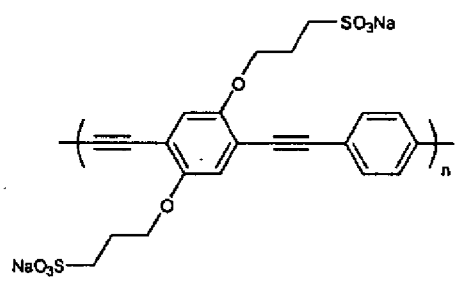

, b(ii)) ,

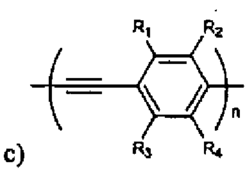

c) ,

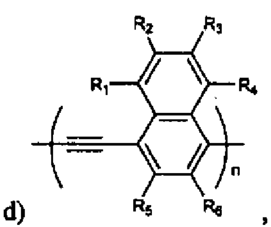

d) ,

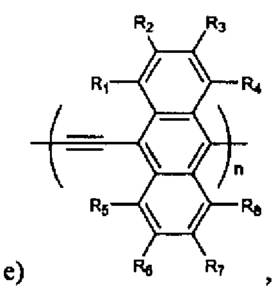

e) ,

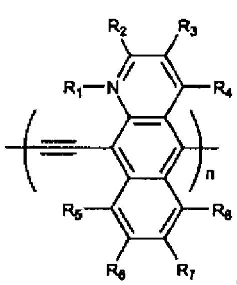

f) ,

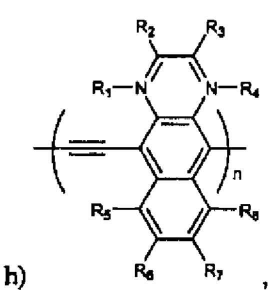

h) ,

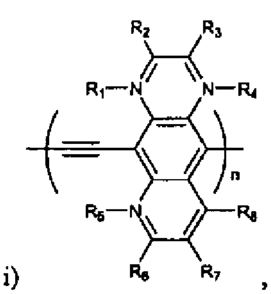

i) , j) 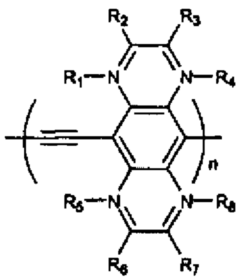 , k) 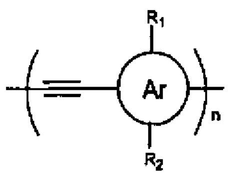 , l) 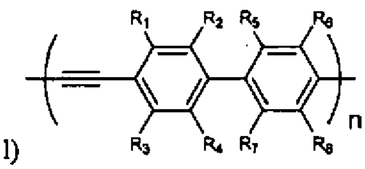 ,
m) 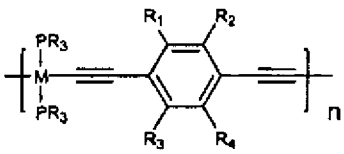 ,wherein M is selected from the group consisting of Ni, Pd, and Pt,
n) 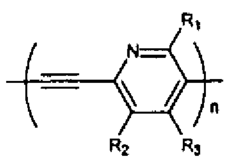 , o) 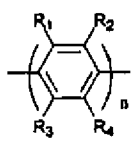 , p) 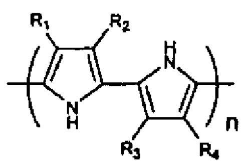 , or q) 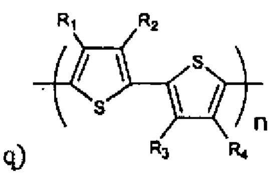 ;
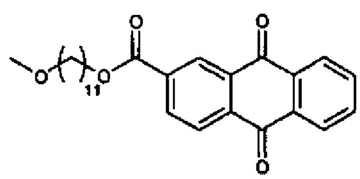 , or
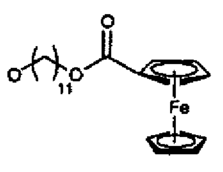
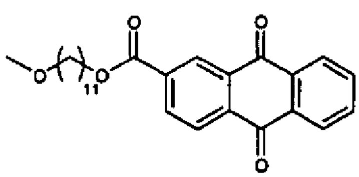 , or 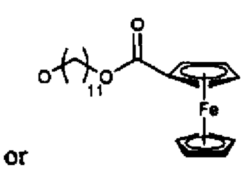 .

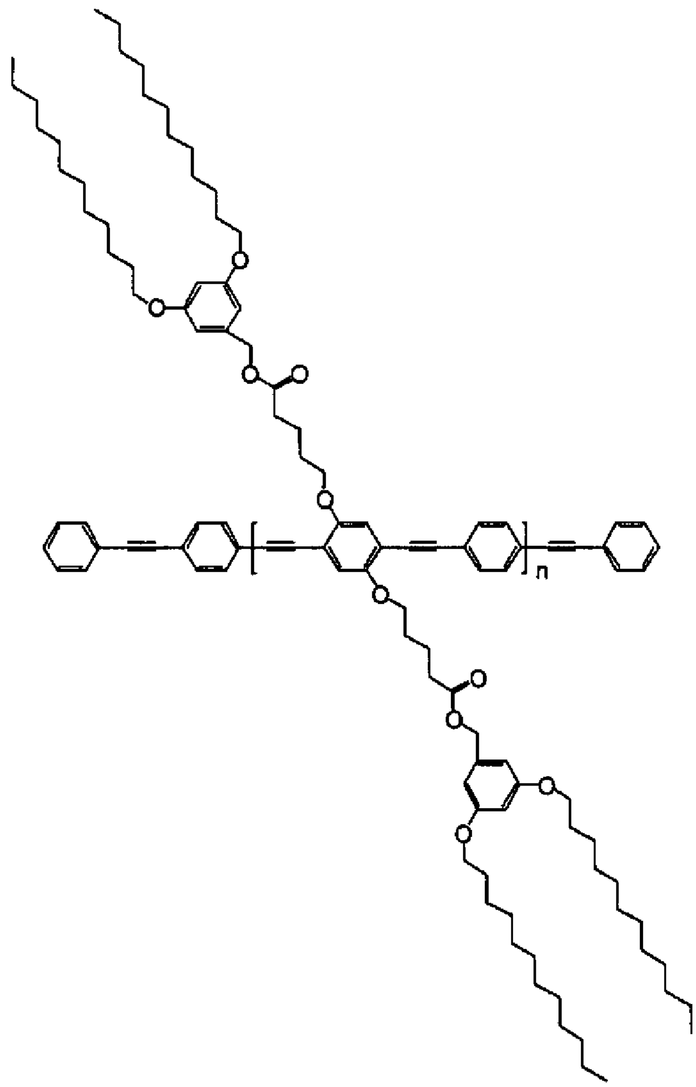
r),

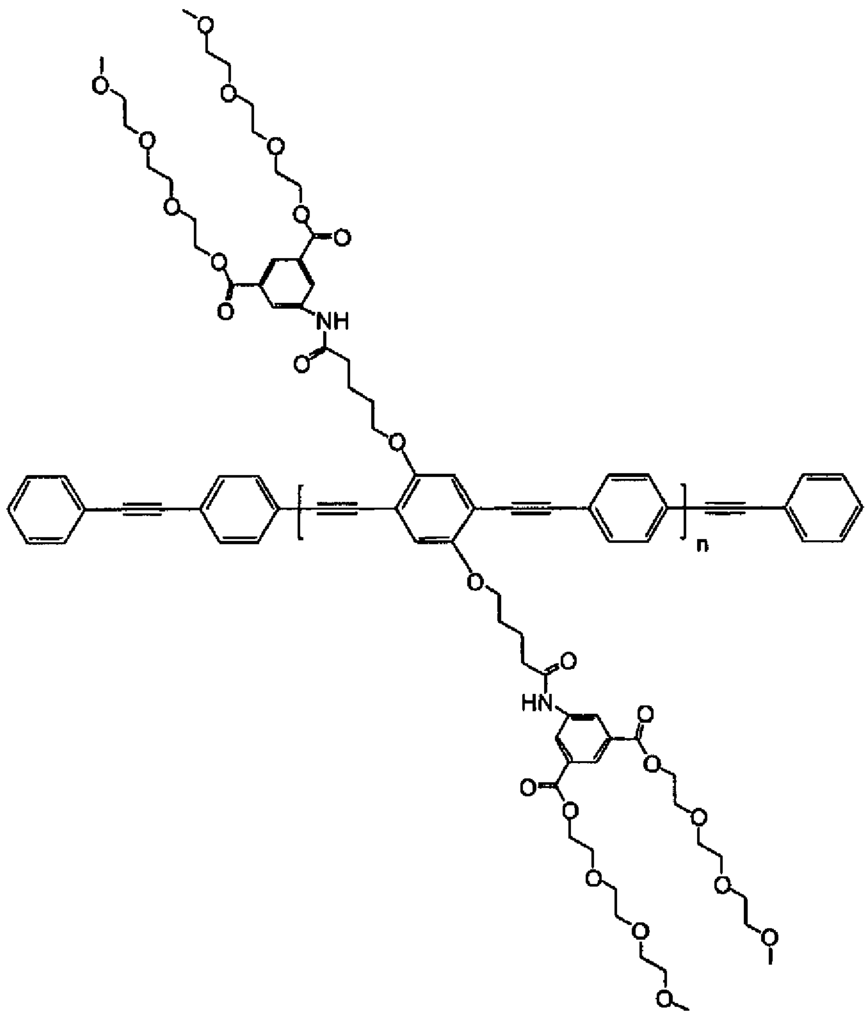
s),

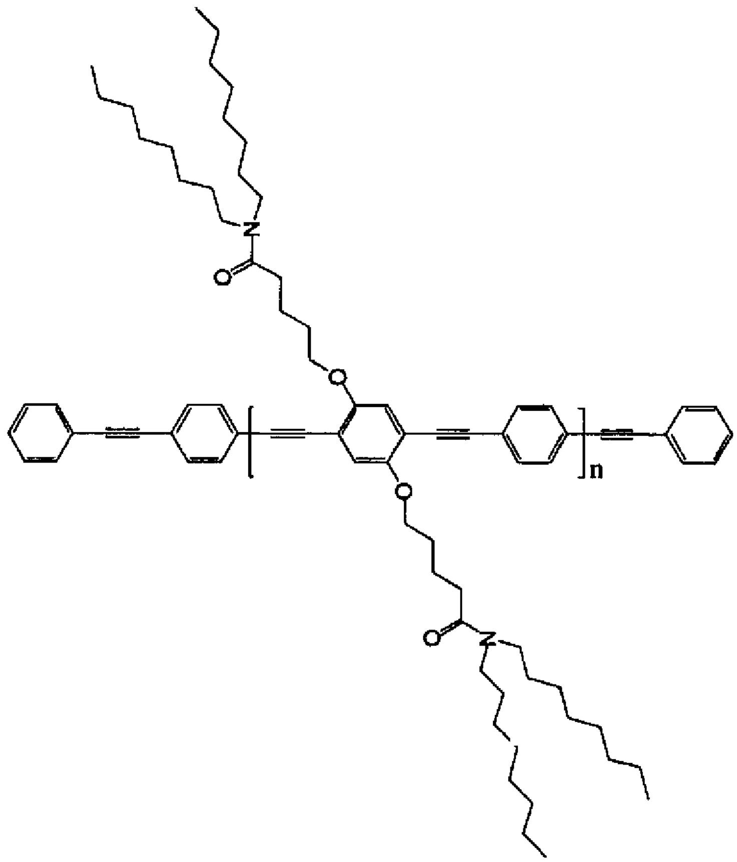
t),

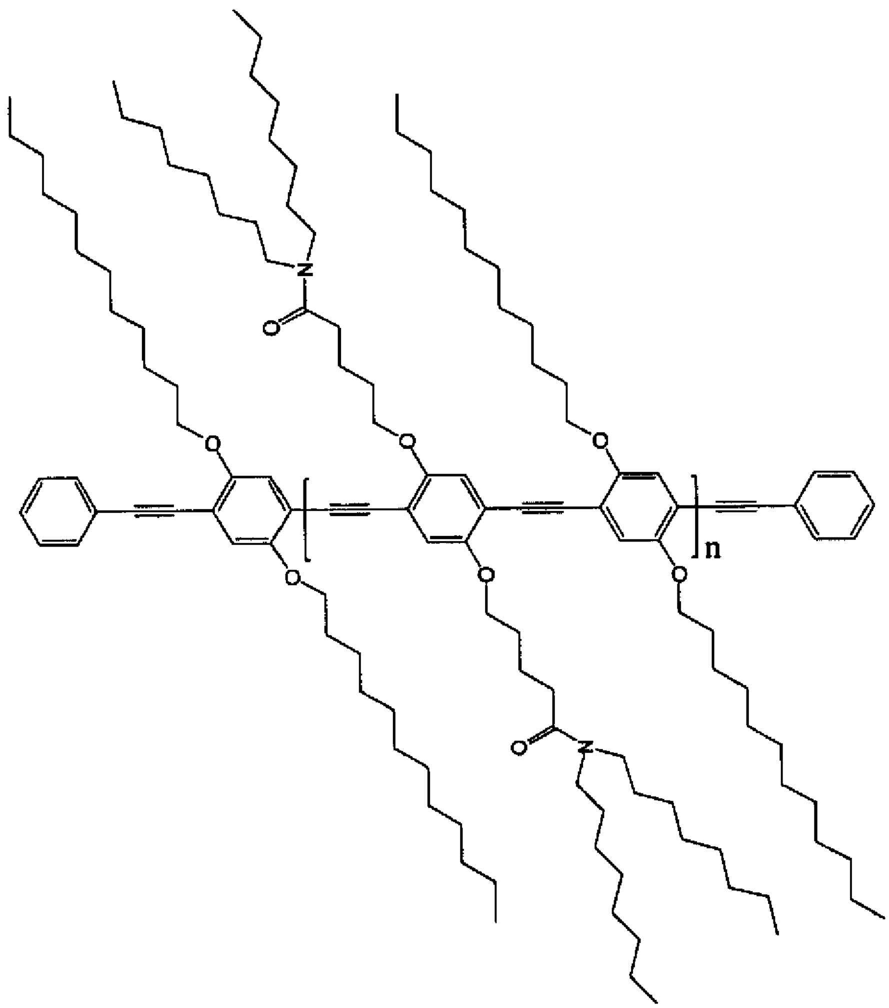
u),

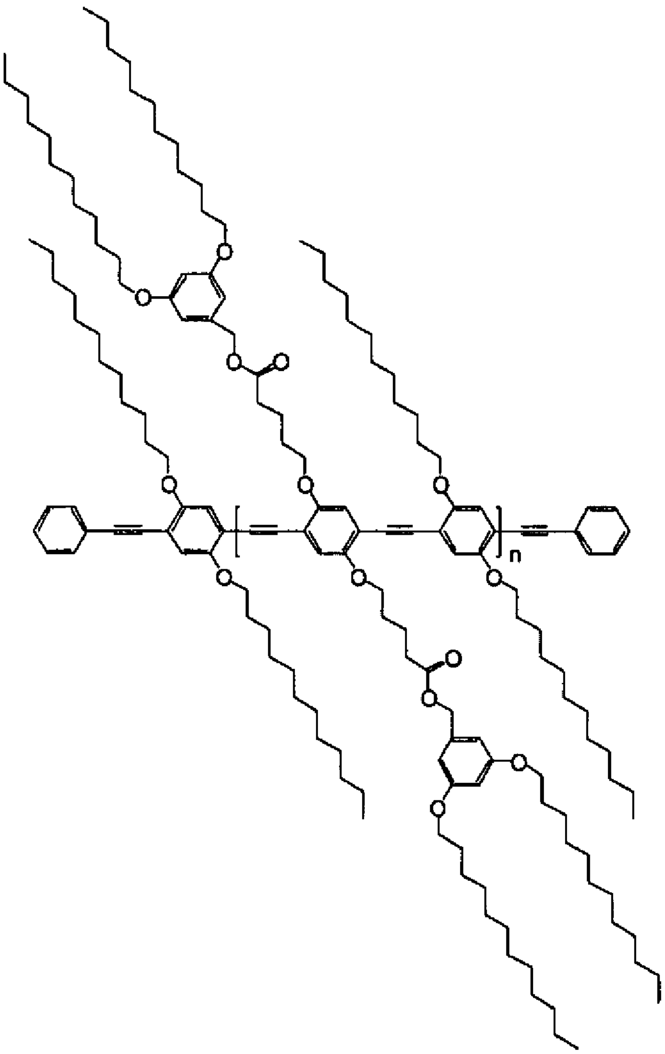
v),

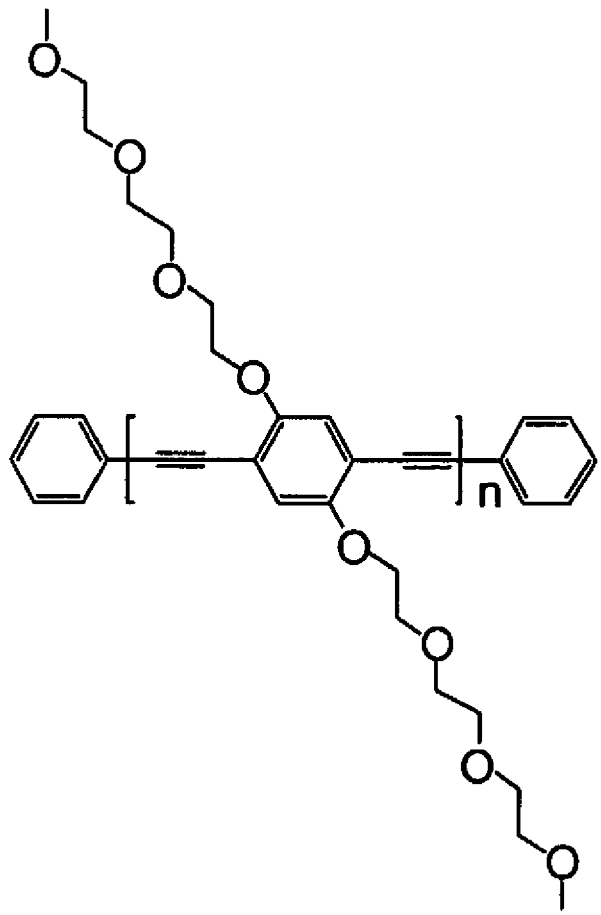
w),

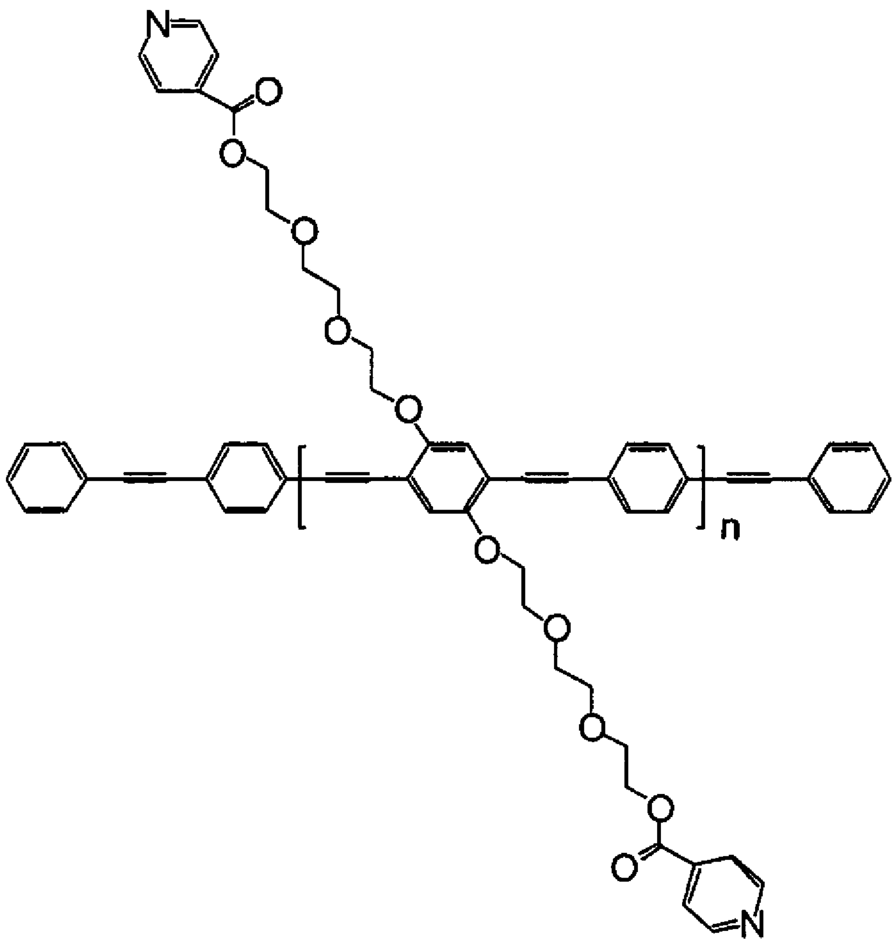
x),

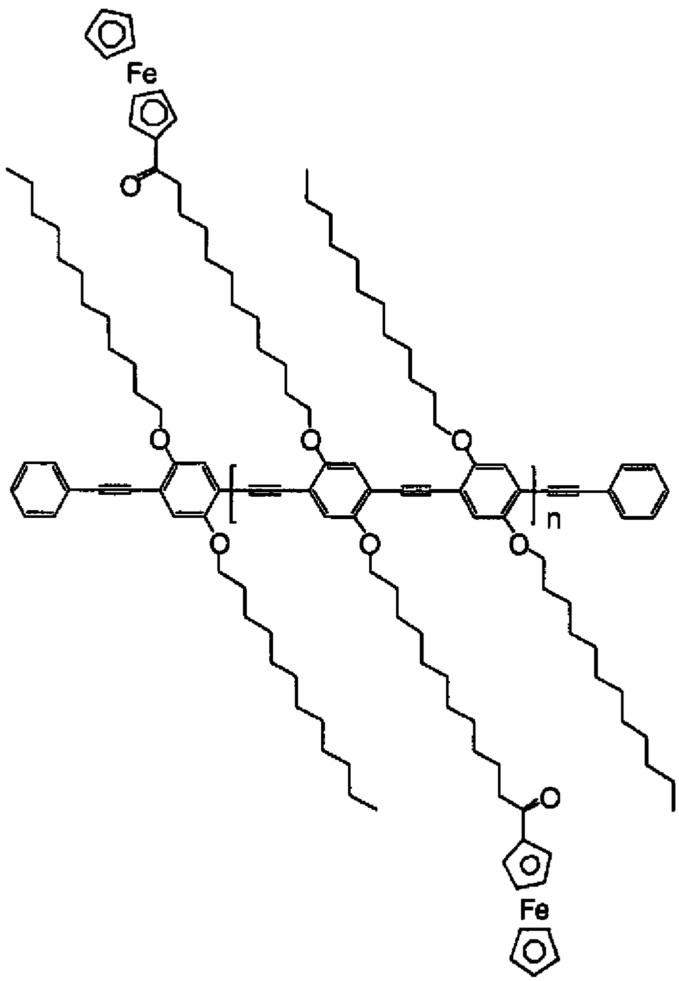
y),

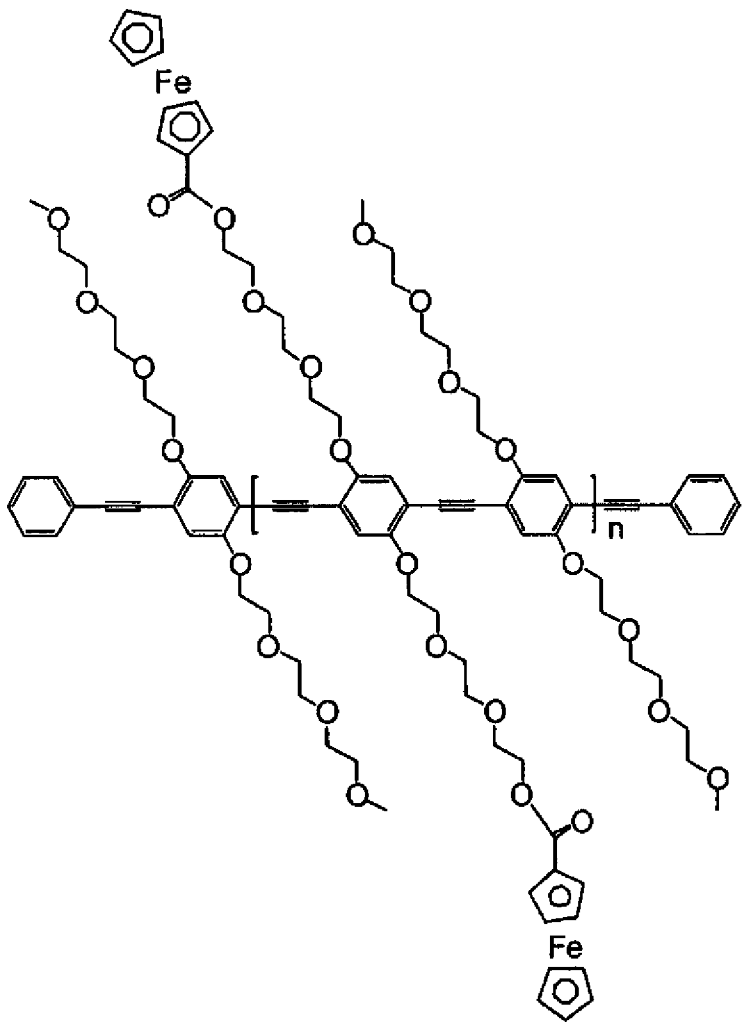
z),

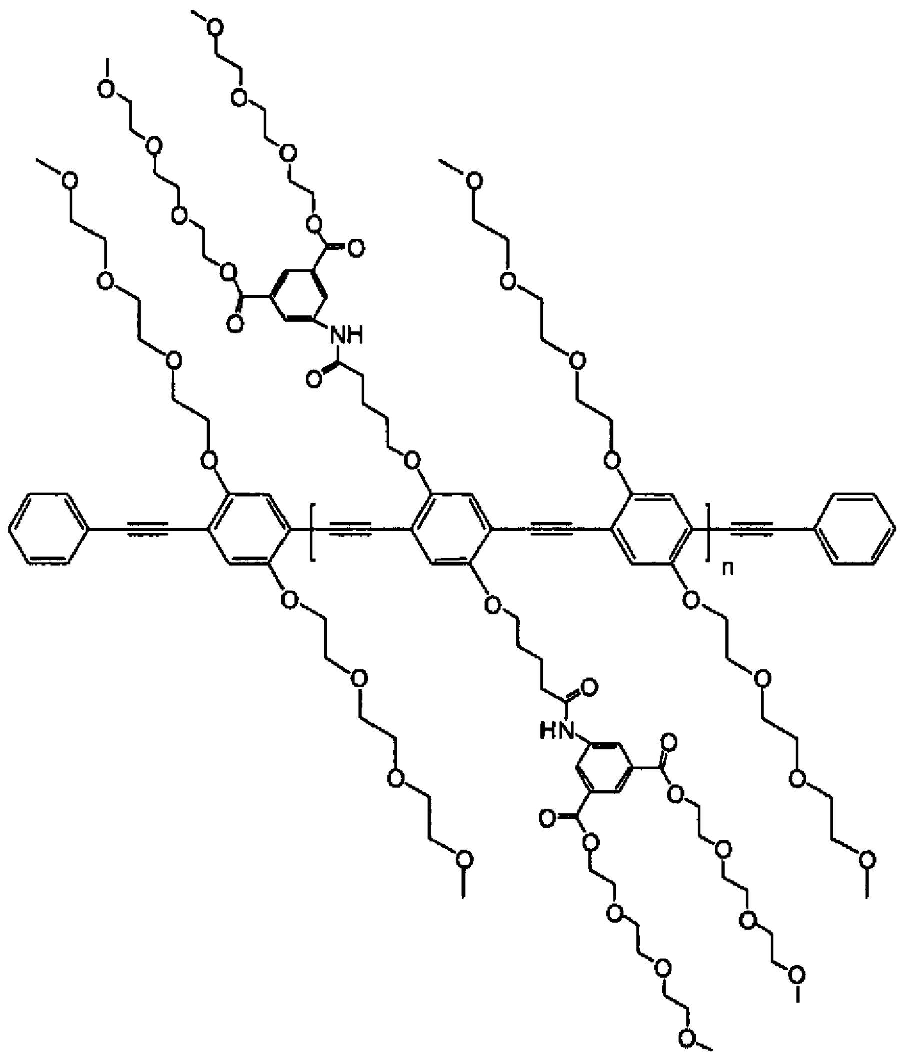
aa),

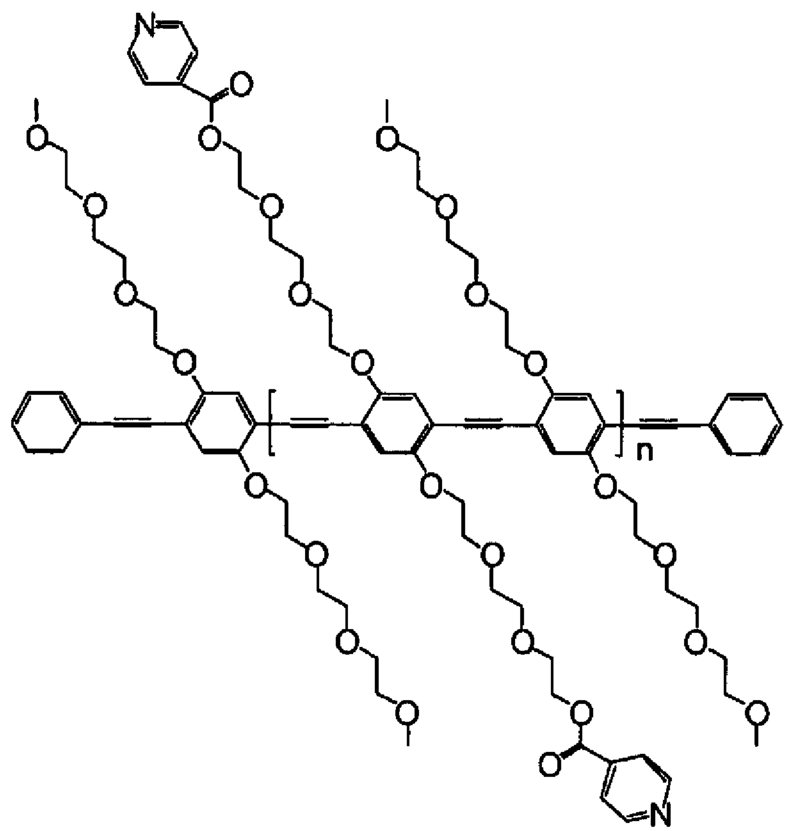
bb),

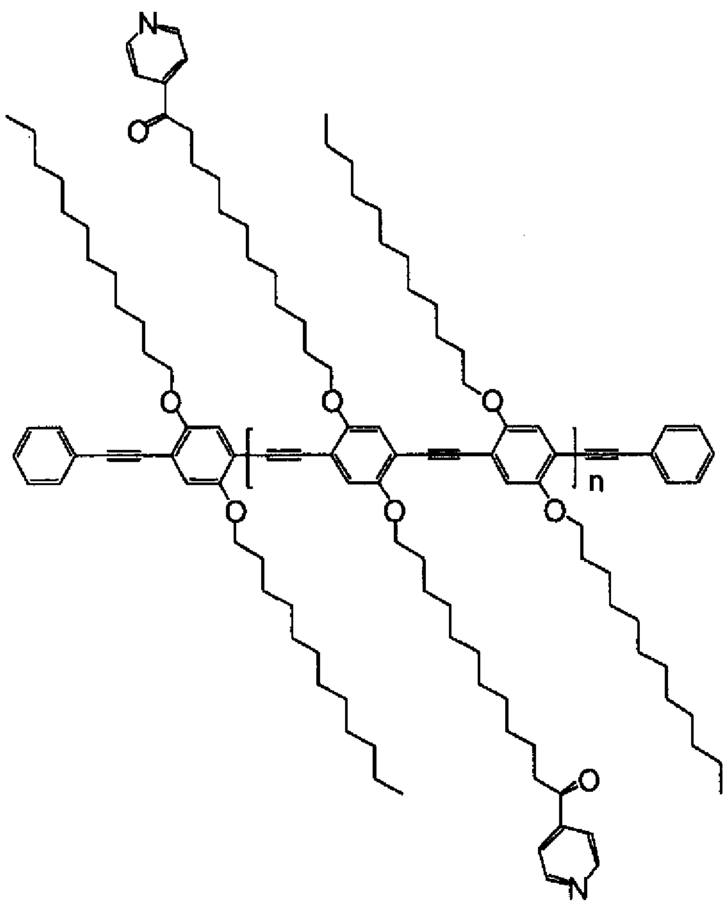
cc),

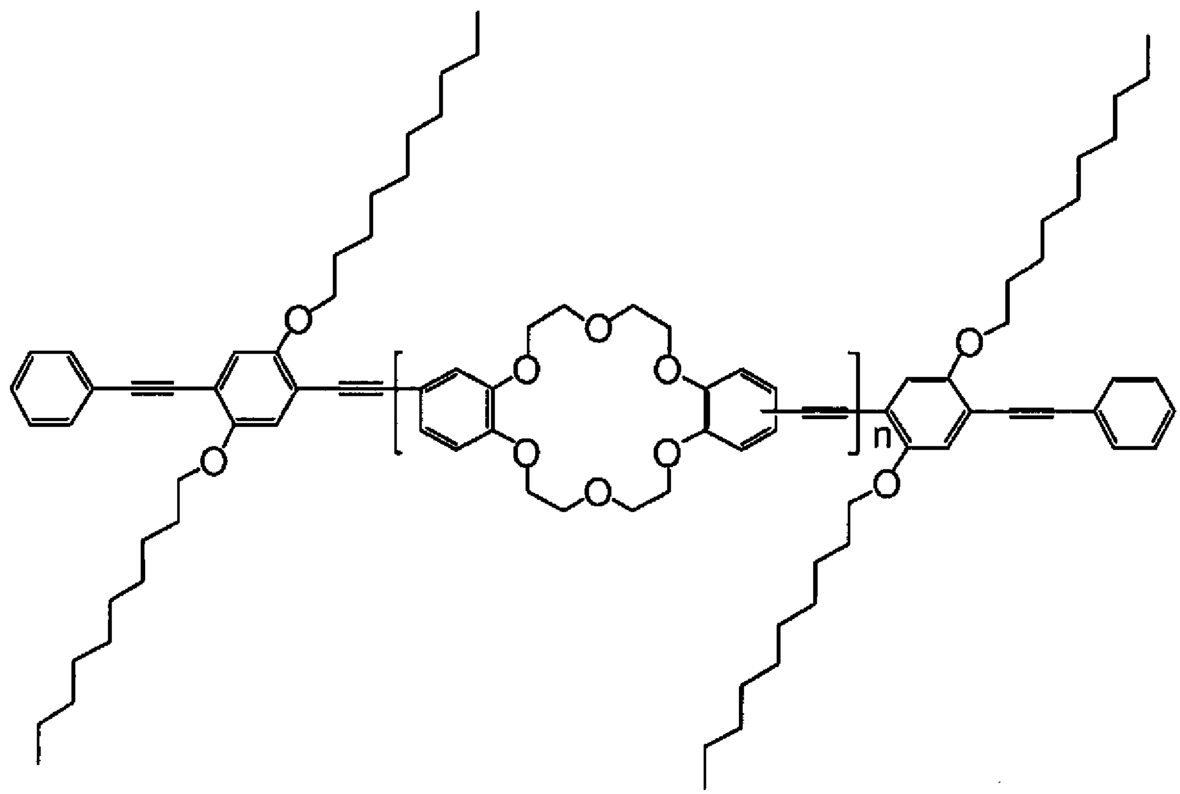
dd); or, in addition, a carbon linkage as shown in ee) or jj),

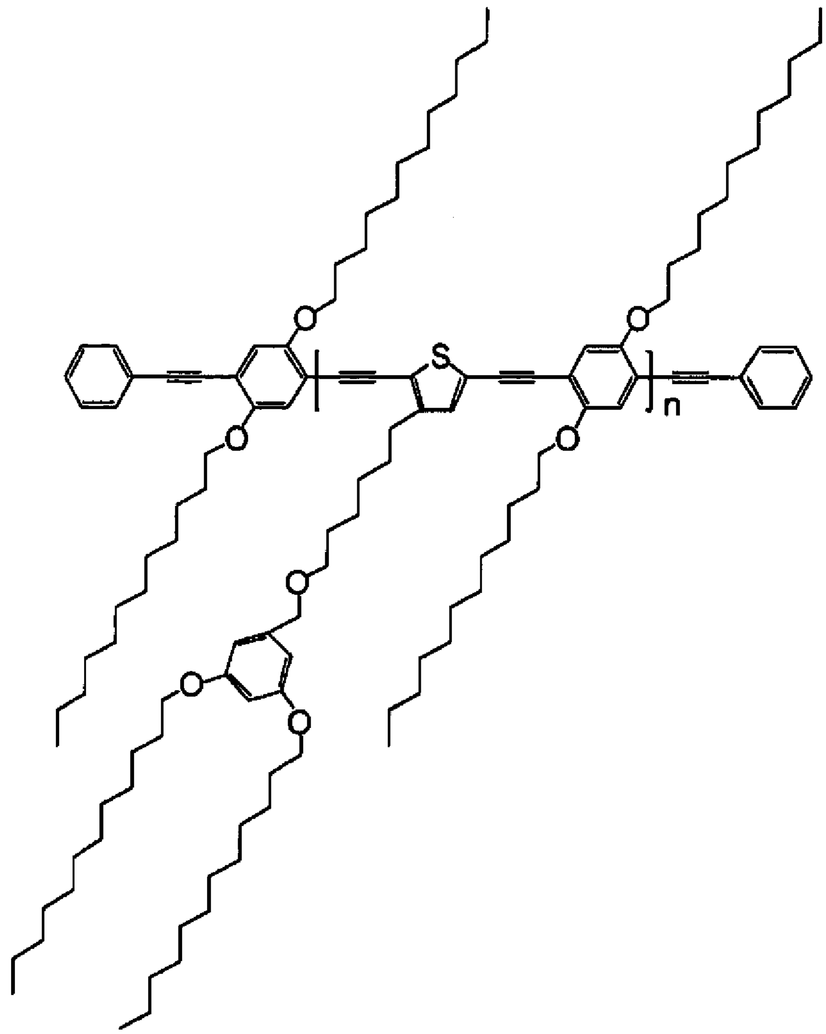
ee),

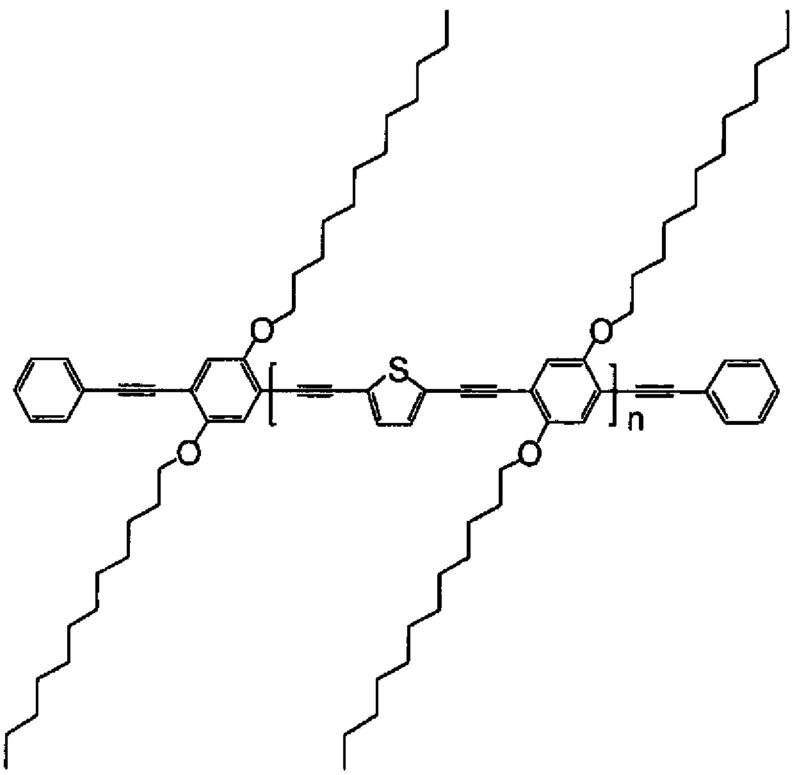
ff),

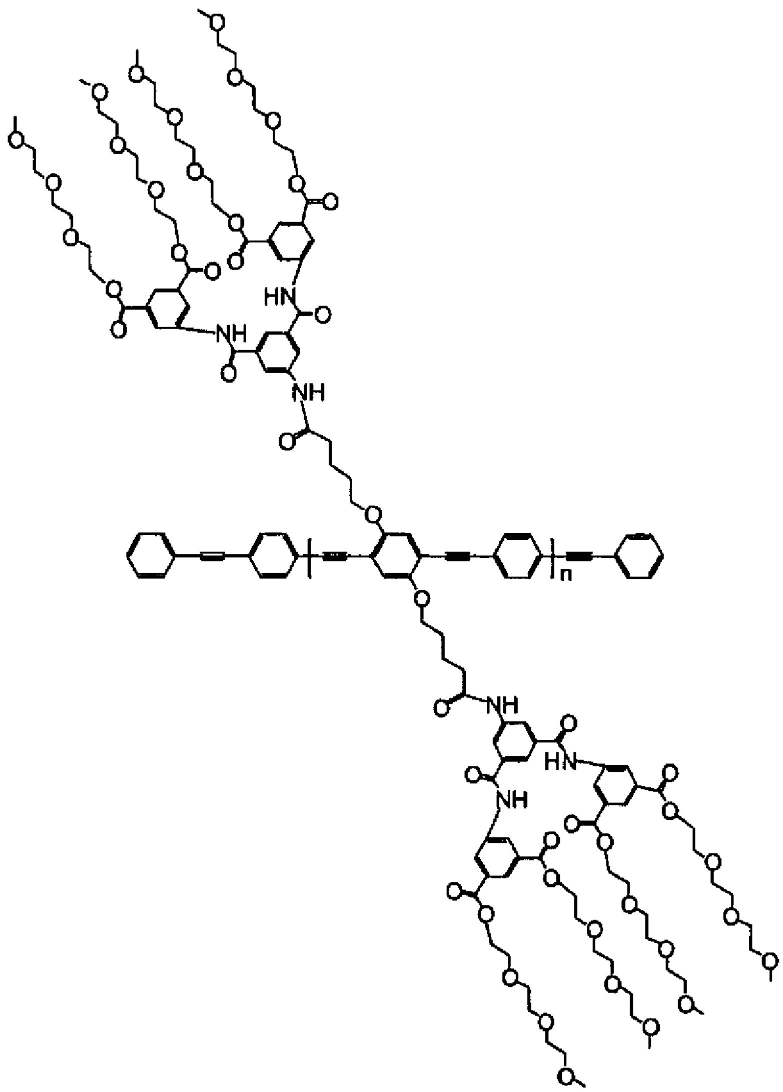
gg),

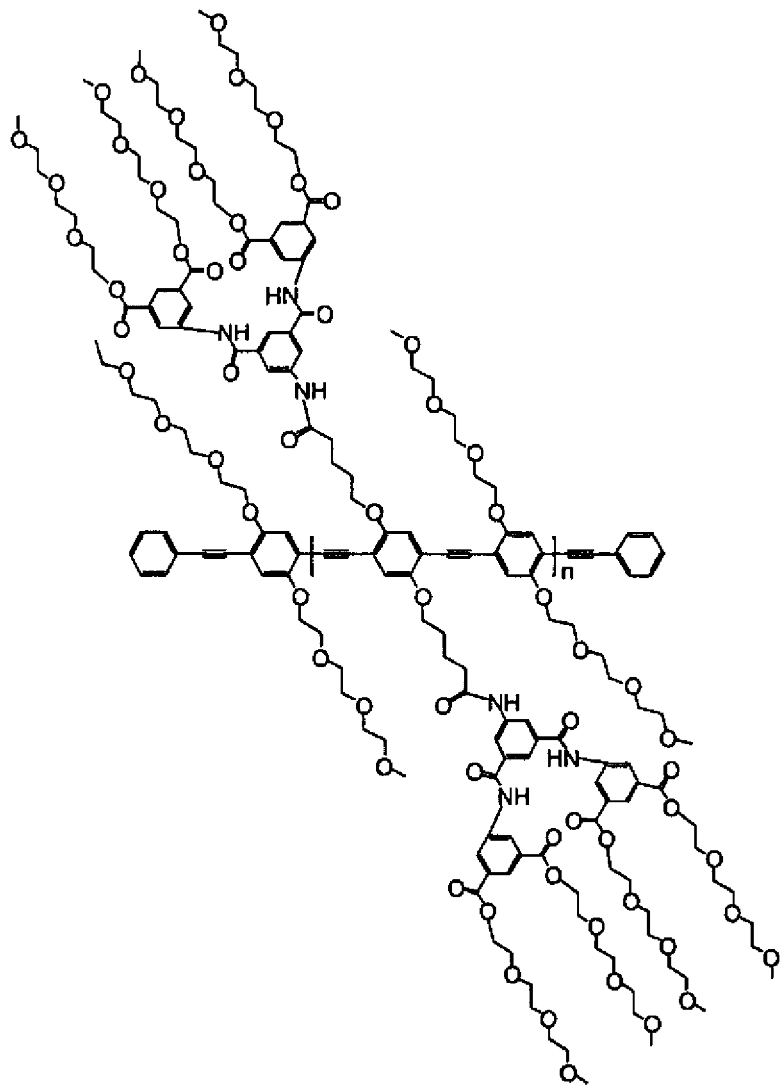
hh),

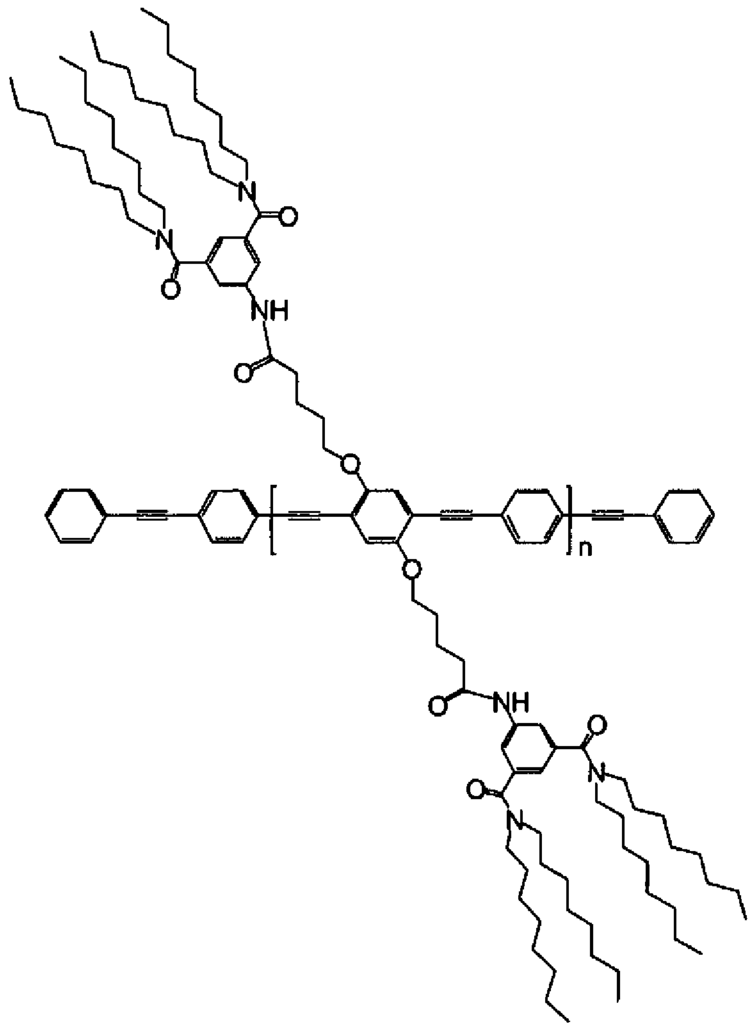
ii),

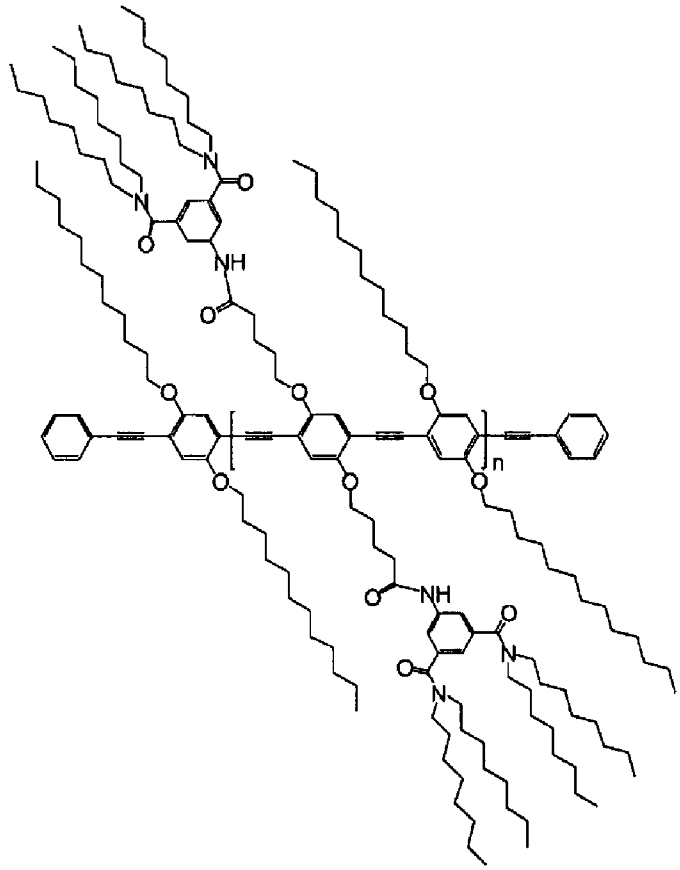
jj),
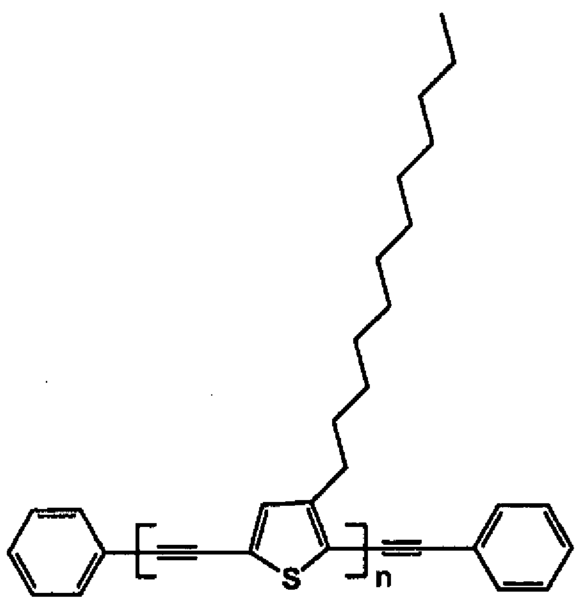
kk), or

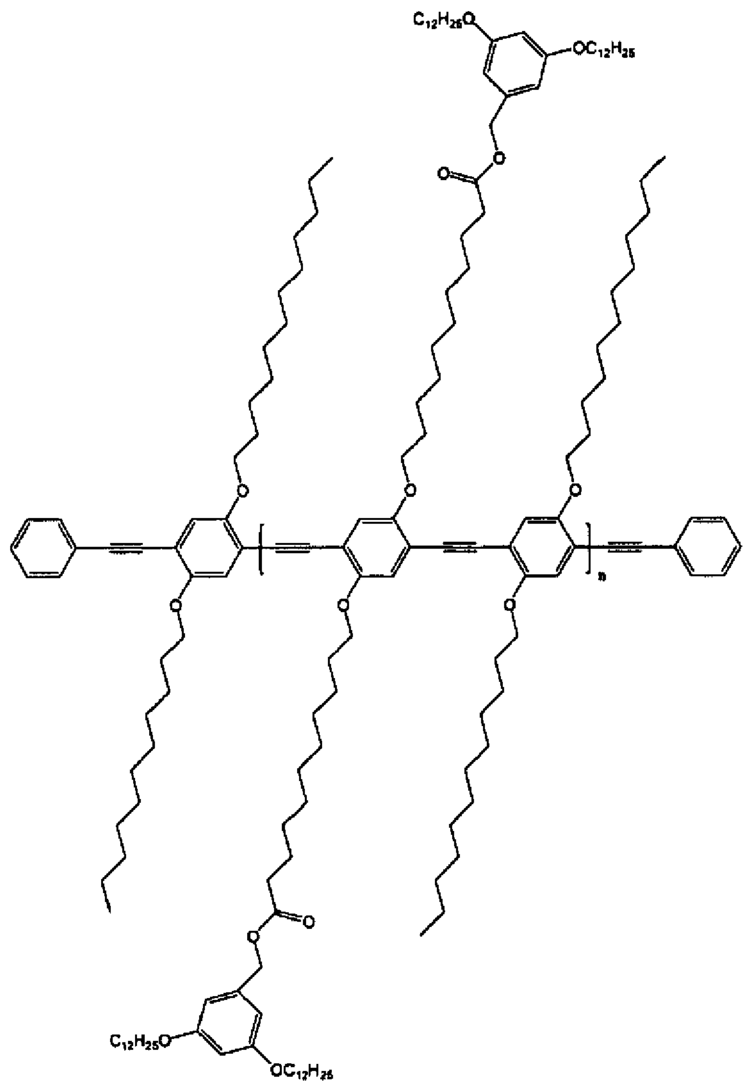
ll).

In Columns 60 through 69, Claim 1 delete the existing formulas and replace with the following formulas:
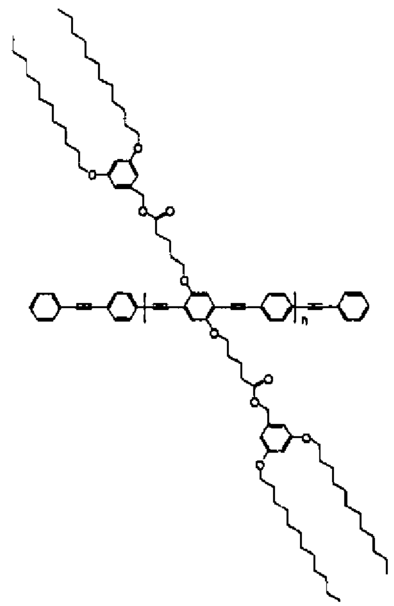
(a) ,
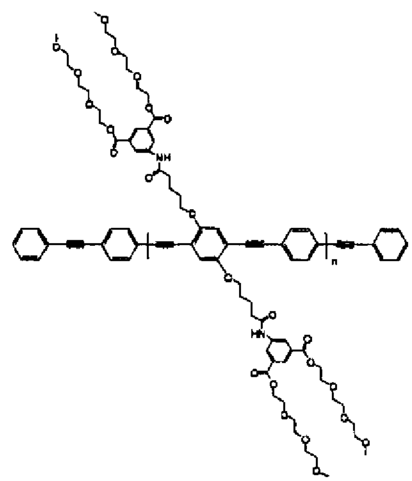
(b) ,
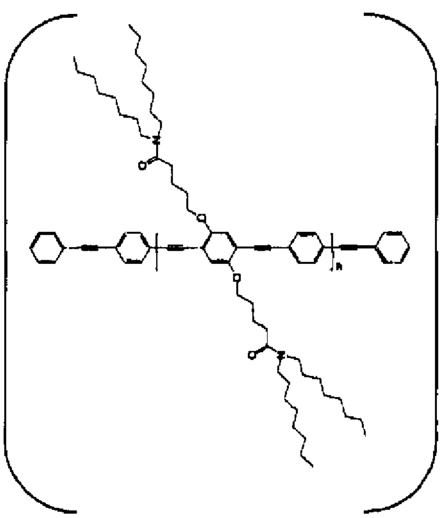
[(c)] ,
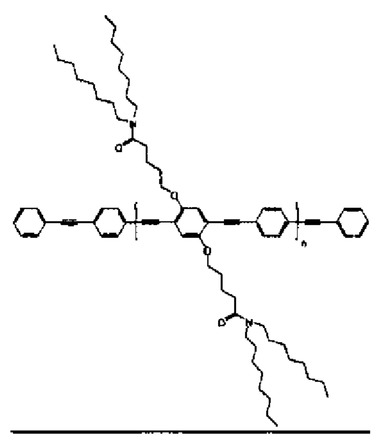
(c) ,

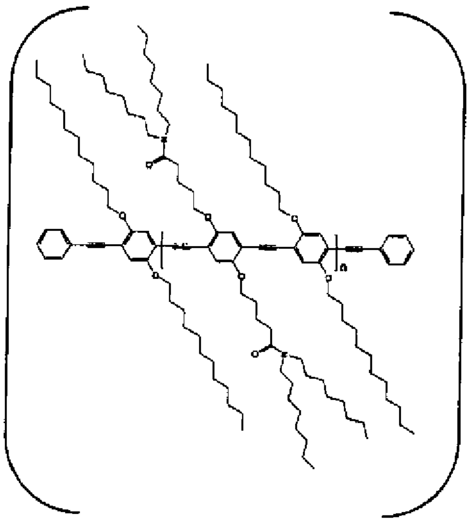
[(d)] ,
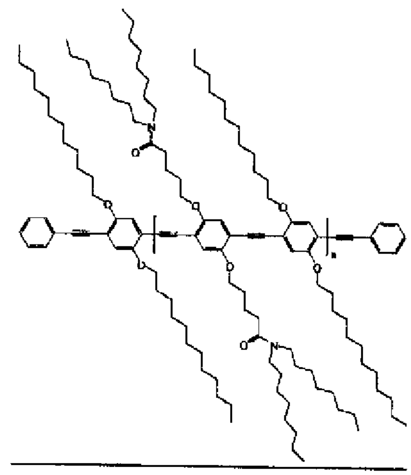
<u>(d)</u> ,
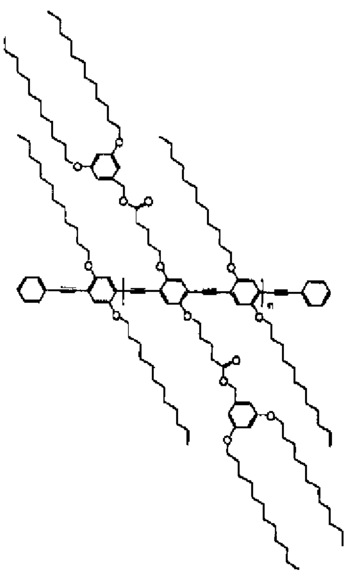
(e) ,
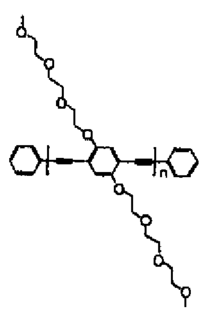
(f) ,
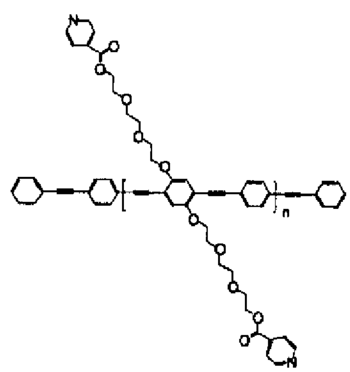
(g) ,

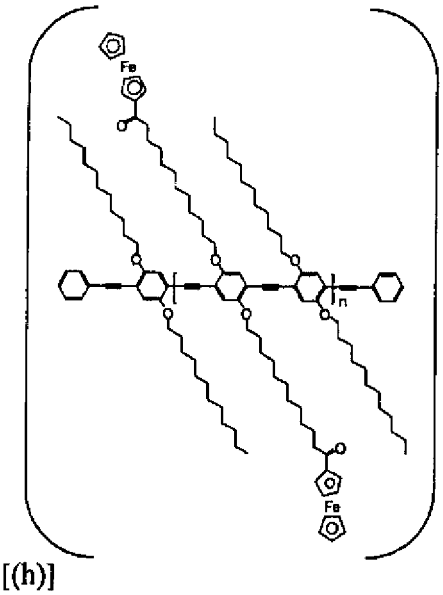
[(h)] ,
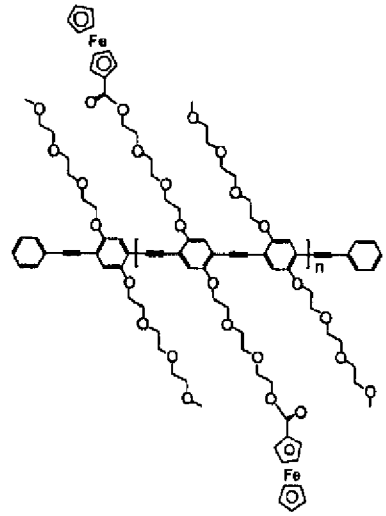
[(i)] (h) ,
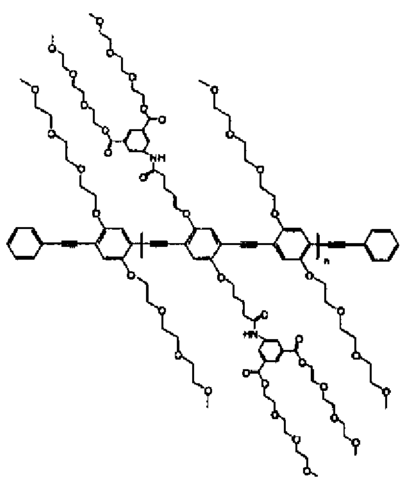
[(j)] (i) ,
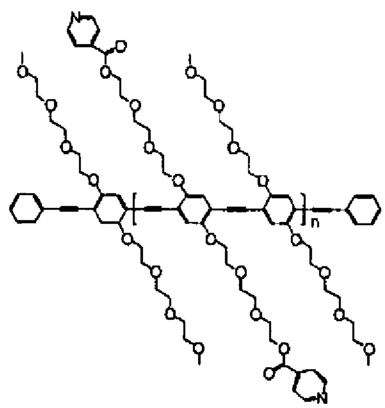
[(k)] (j) ,

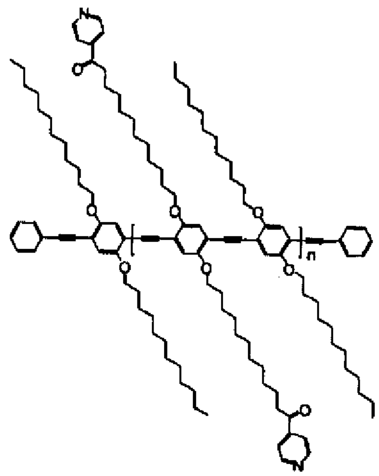
[(l)] (k) ,
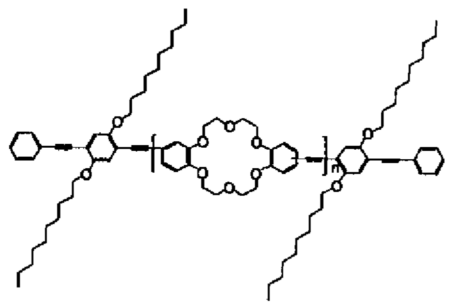
[(m)] (l) ,
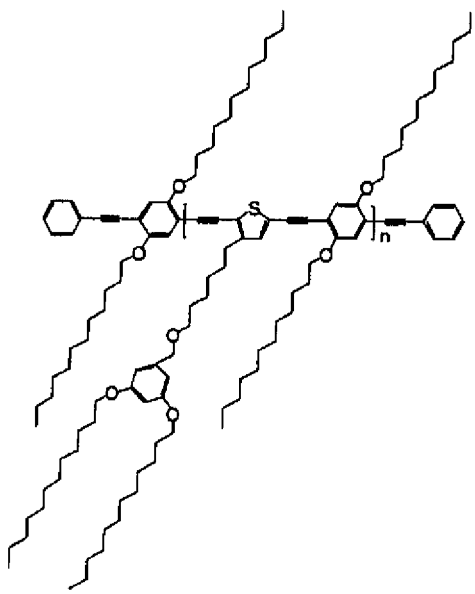
[(n)] (m) ,
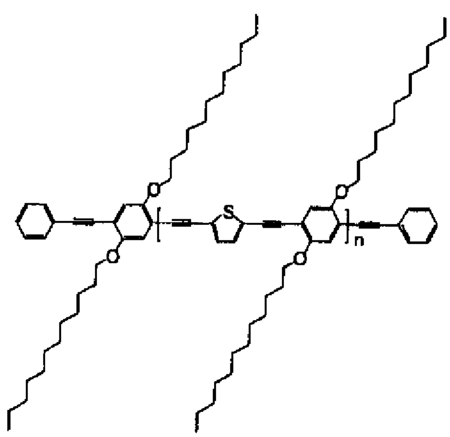
[(o)] (n) ,

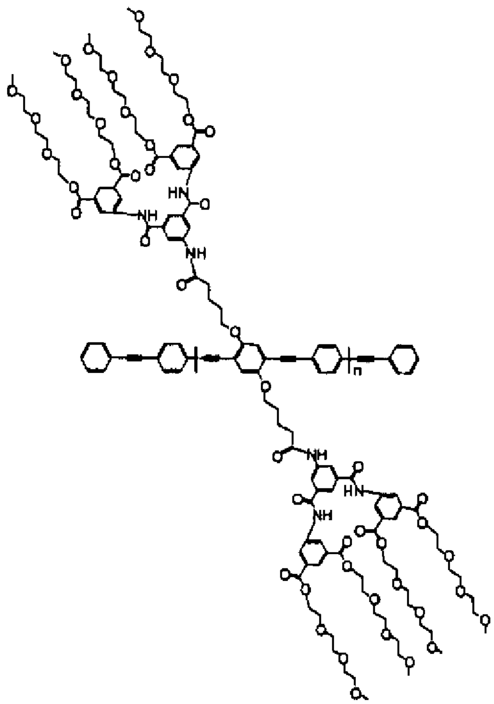
[(p)] (o) ,
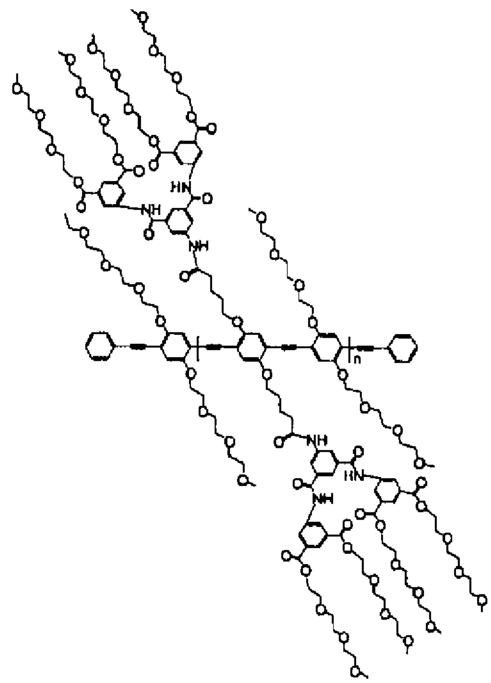
[(q)] (p) ,
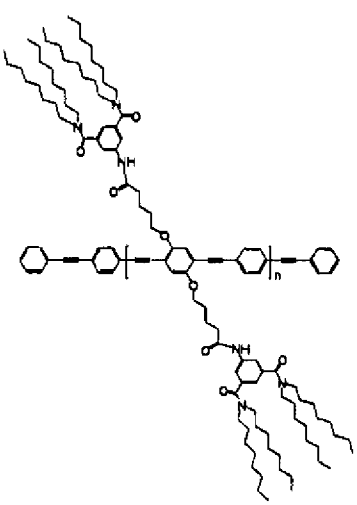
[(r)] (q) ,
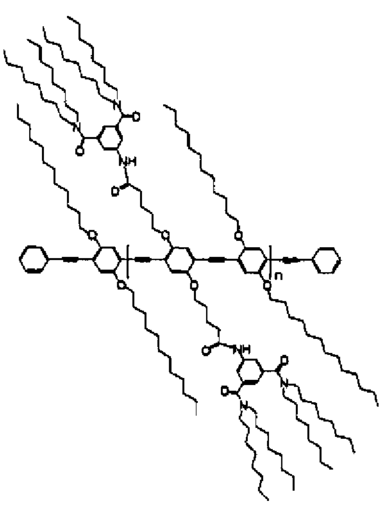
[(s)] (r) ,

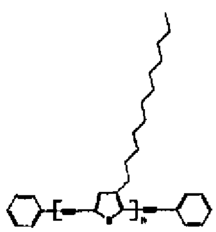
[(t)] (s) ,
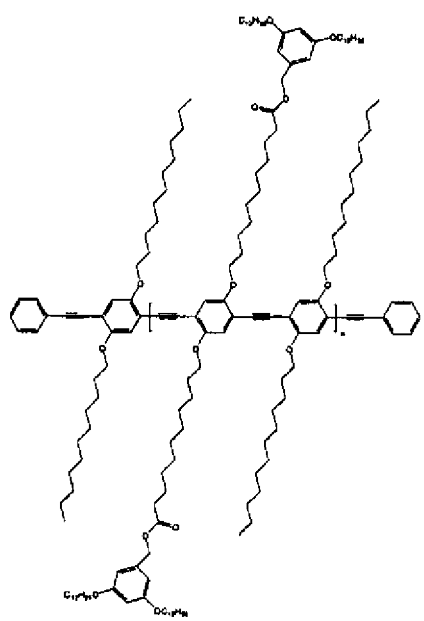
and [(u)] (t) ,

In Columns 71 and 72 and through Column 81, Claim 29 delete the existing formulas and replace with the following formulas:
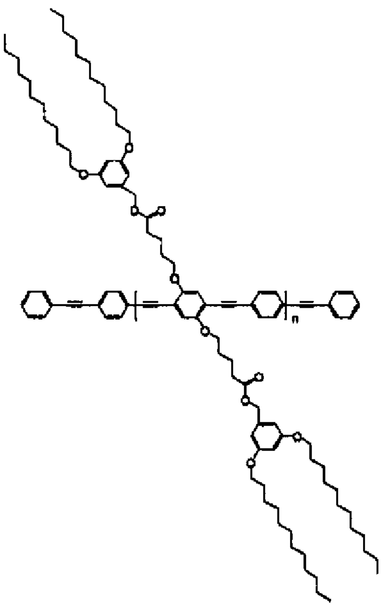
(a) ,
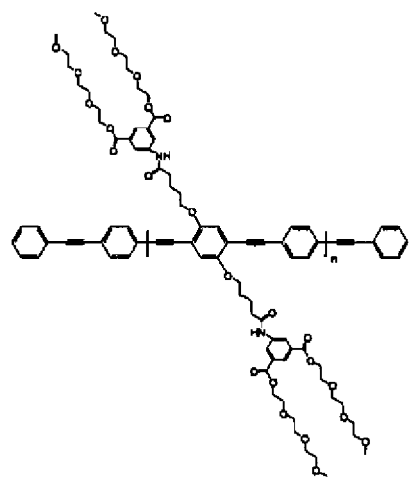
(b) ,
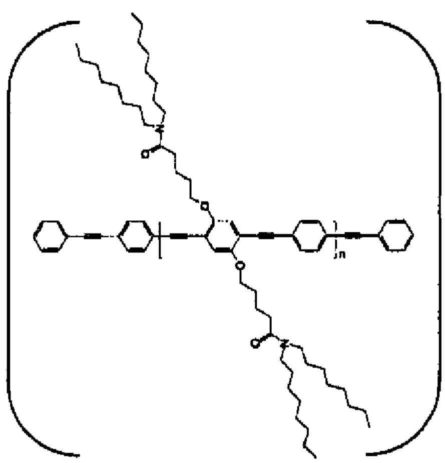
[(c)] ,
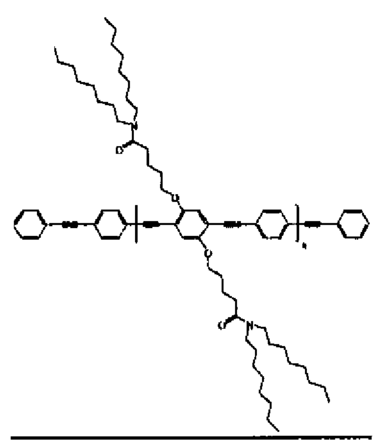
(c) ,

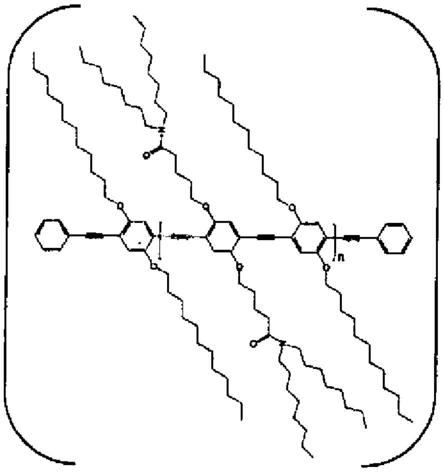
[(d)] ,
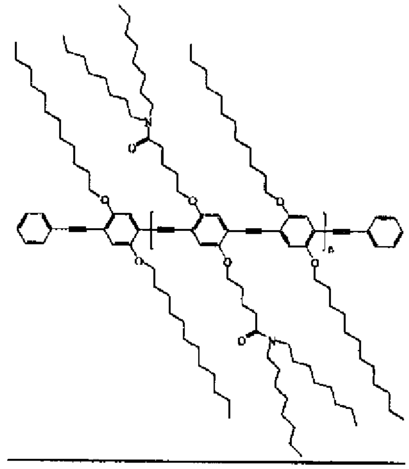
(d) ,
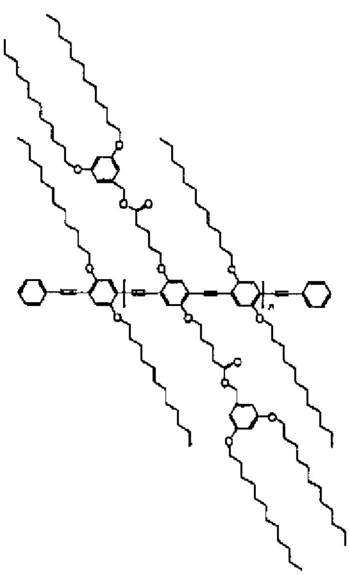
(e) ,
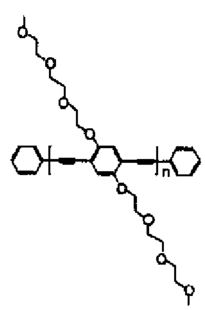
(f) ,
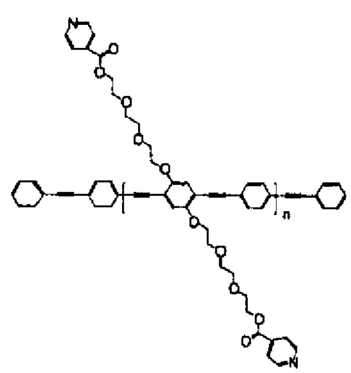
(g) ,

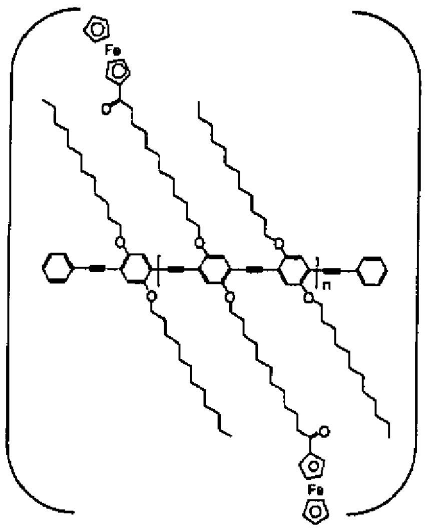
[(h)] ,
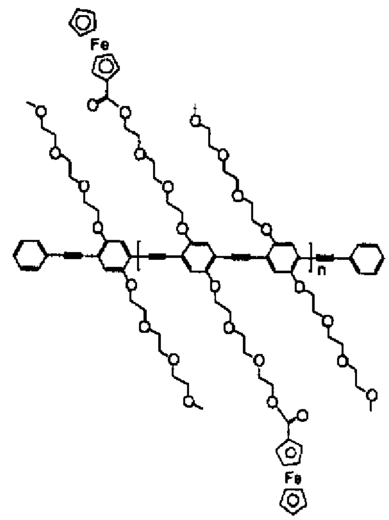
[(i)] (h) ,
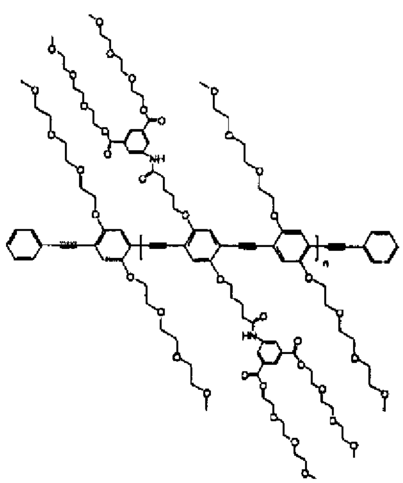
[(j)] (i) ,
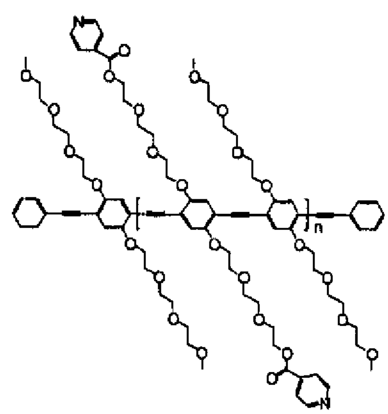
[(k)] (j) ,

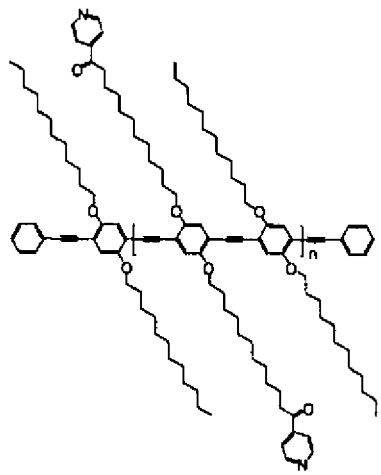
[(l)] <u>(k)</u> ,
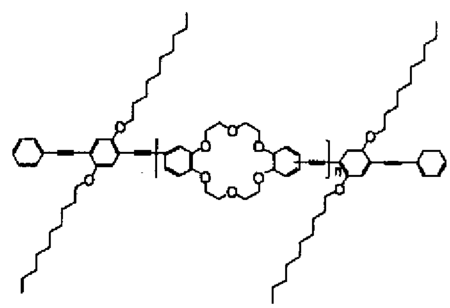
[(m)] <u>(l)</u> ,
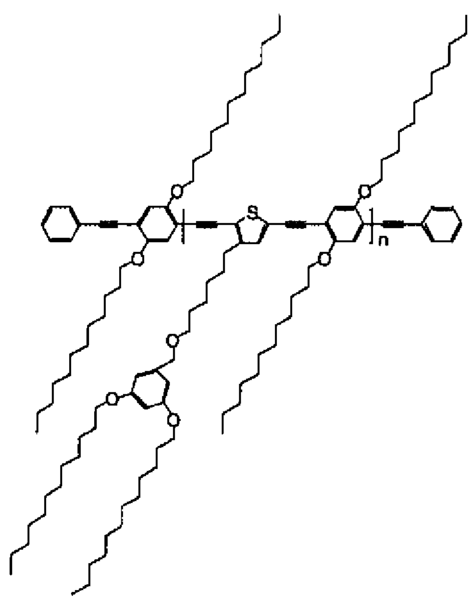
[(n)] <u>(m)</u> ,
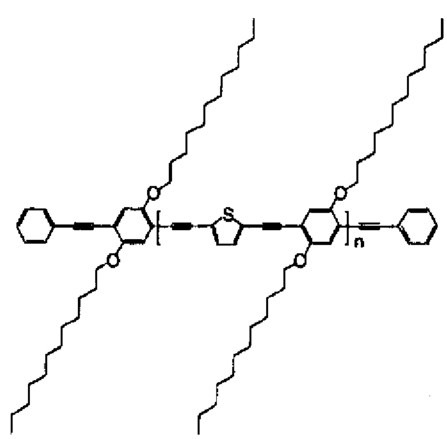
[(o)] <u>(n)</u> ,

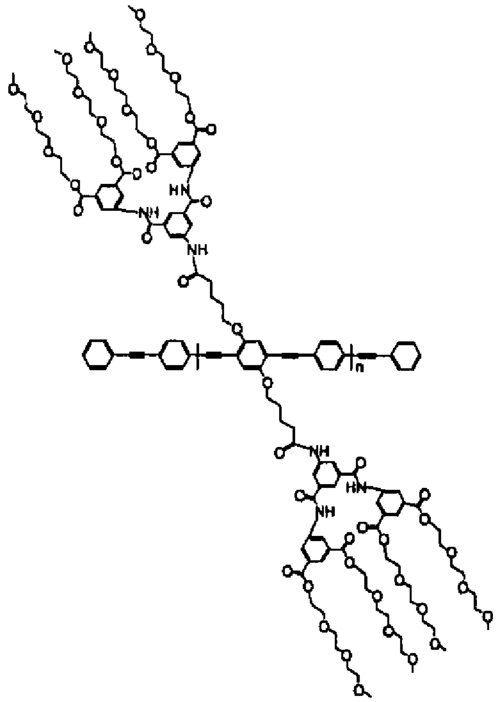
[(p)] (o) ,
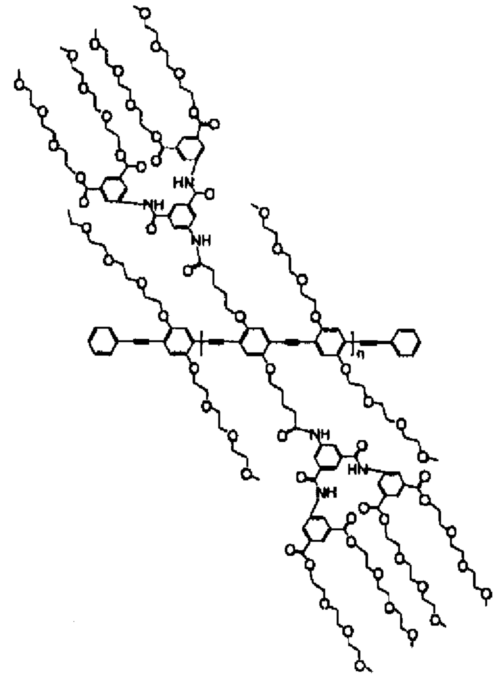
[(q)] (p) ,
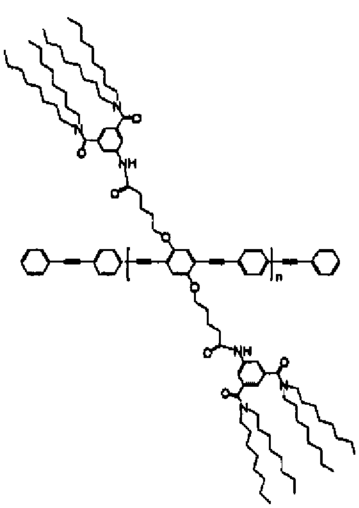
[(r)] (q) ,
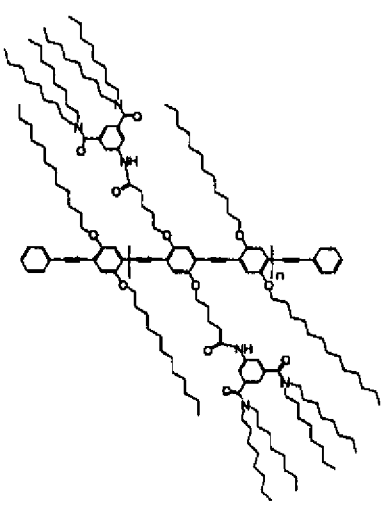
[(s)] (r) ,

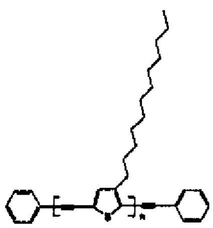
[(t)] (s) ,
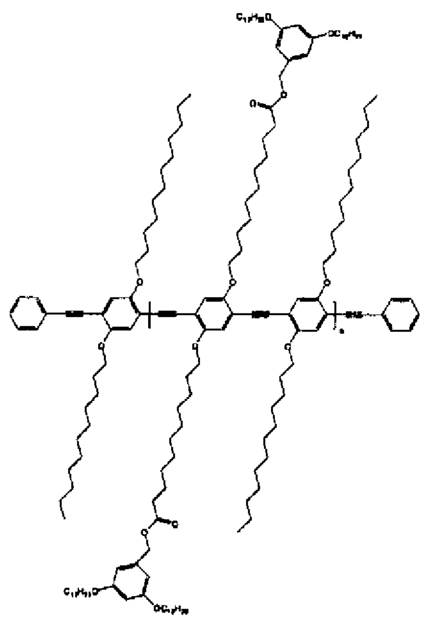
and [(u)] (t) ,

In Columns 83 and 84 and through Column 93, Claim 52 delete the existing formulas and replace with the following formulas:
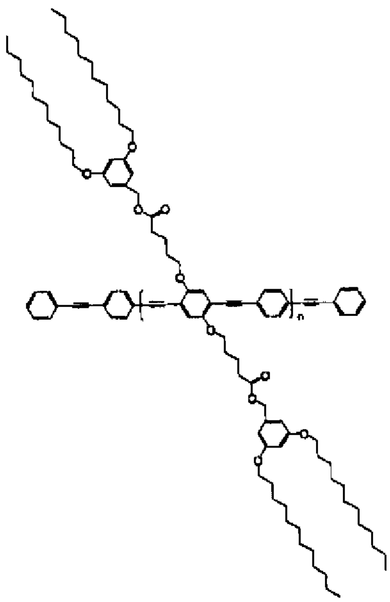
(a) ,
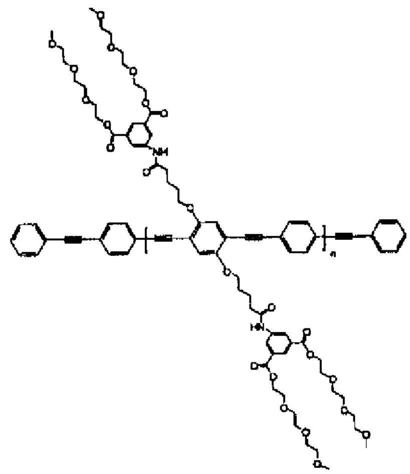
(b) ,
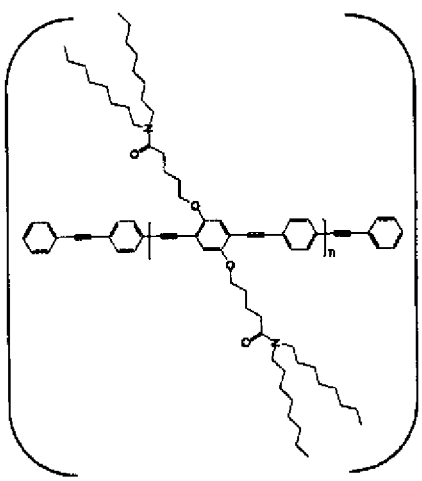
[(c)] ,
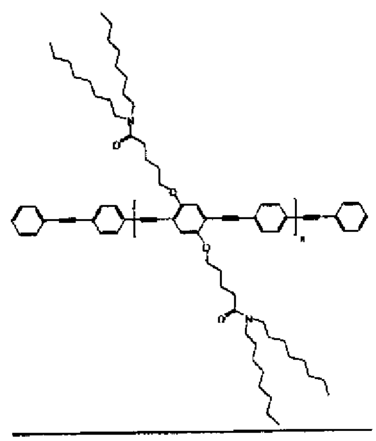
(c) ,

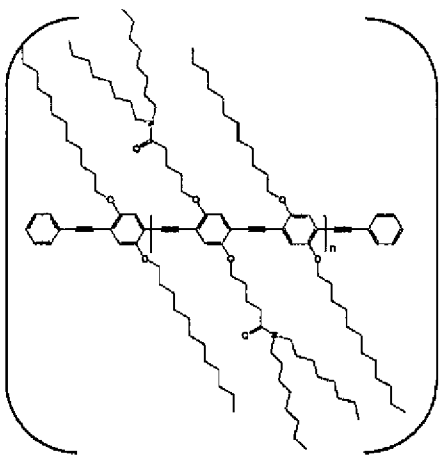
[(d)] ,
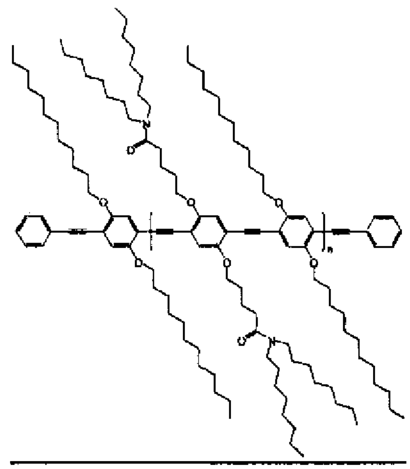
(d) ,
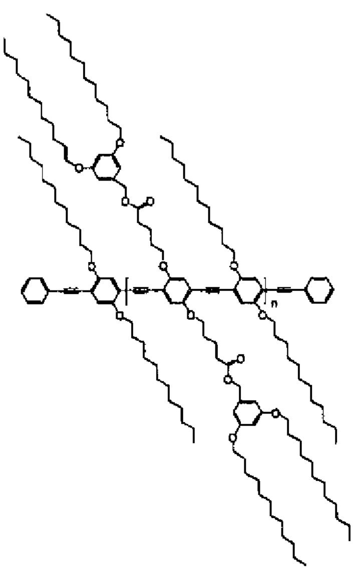
(e) ,
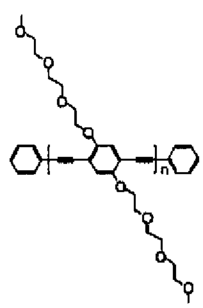
(f) ,
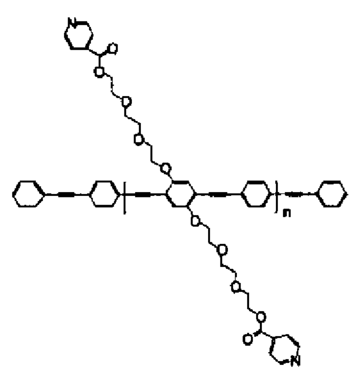
(g) ,

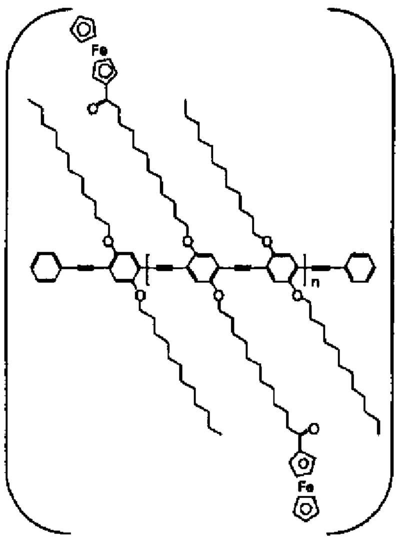
[(h)] ,
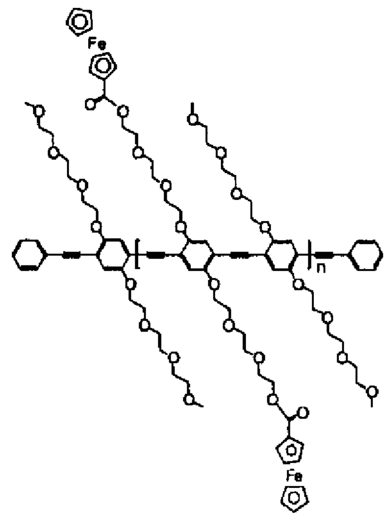
[(i)] (h) ,
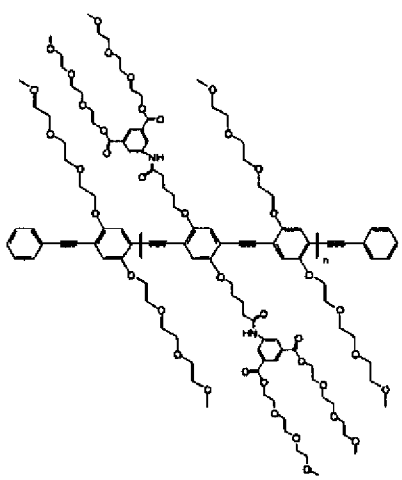
[(j)] (i) ,
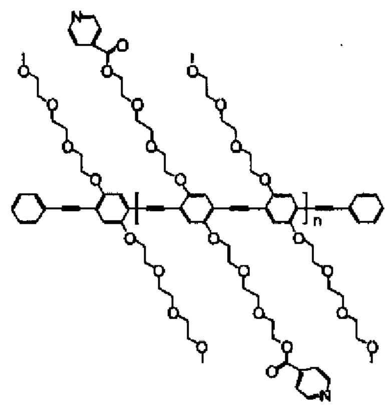
[(k)] (j) ,

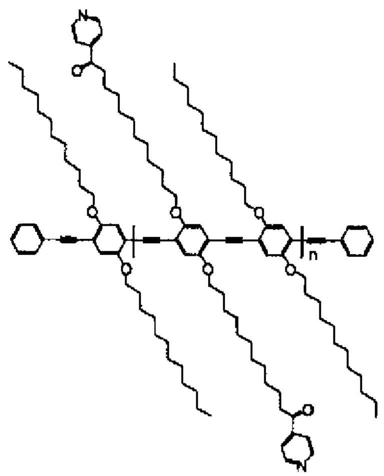
[(l)] (k) ,
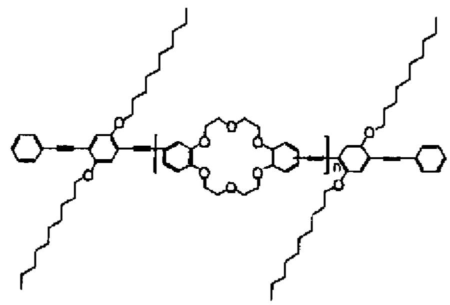
[(m)] (l) ,
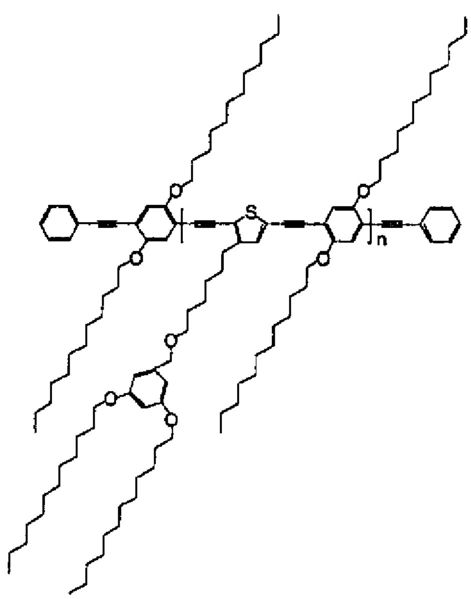
[(n)] (m) ,
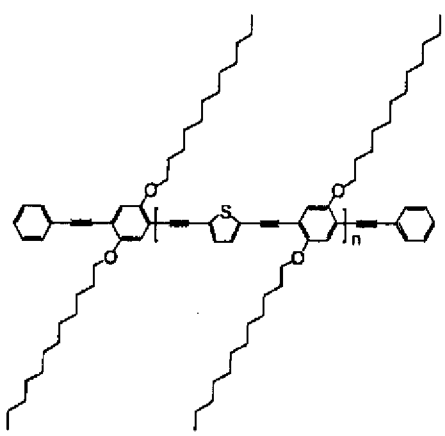
[(o)] (n) ,

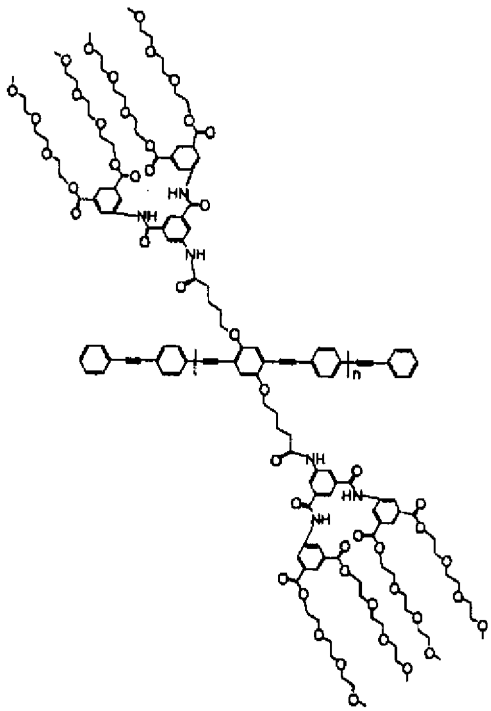
[(p)] (o) ,
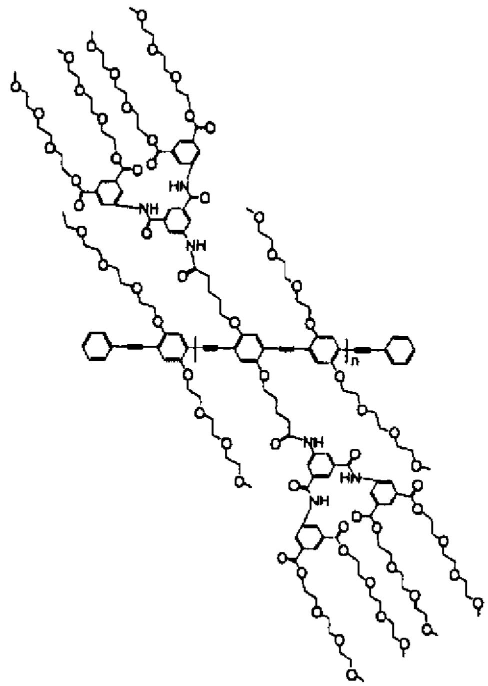
[(q)] (p) ,
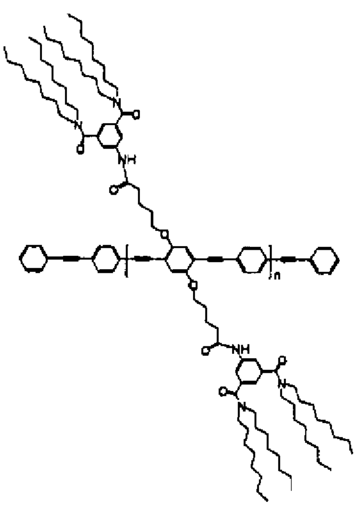
[(r)] (q) ,
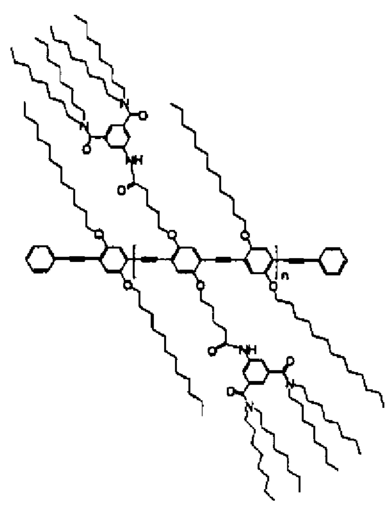
[(s)] (r) ,

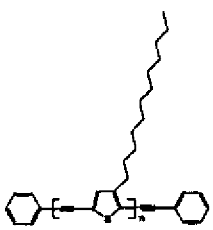
[(t)] (s) ,
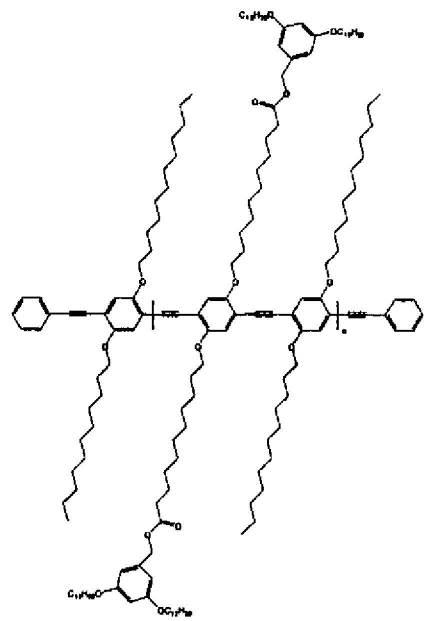
and [(u)] (t) ,

In Columns 95 and 96 and through Column 106, Claim 65 delete the existing formulas and replace with the following formulas:
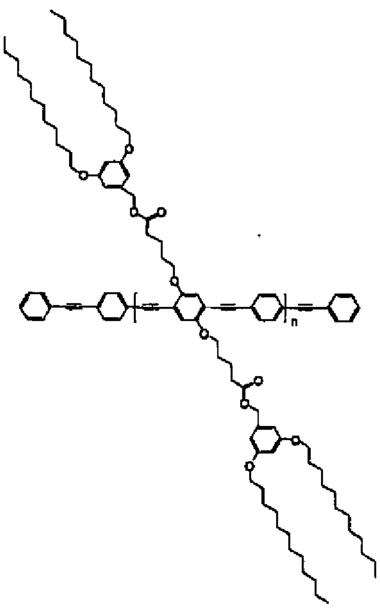
(a) ,
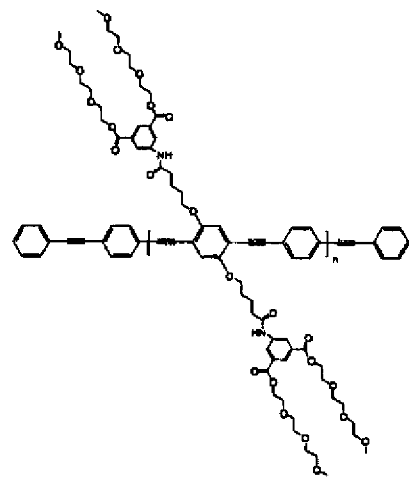
(b) ,
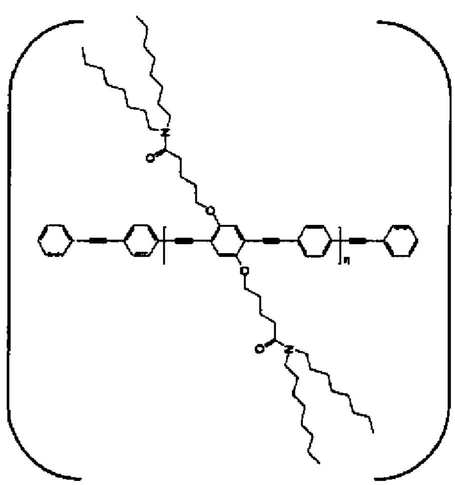
[(c)] ,
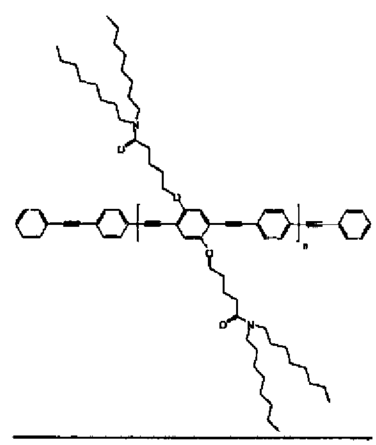
(c) ,

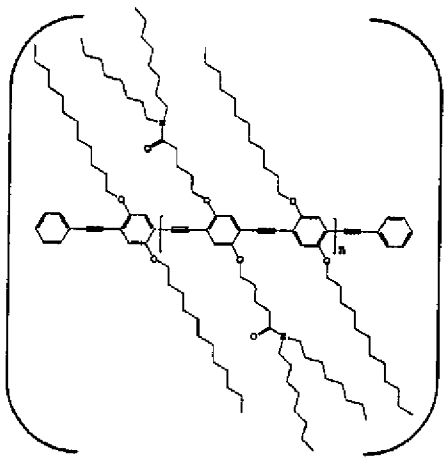
[(d)] ,
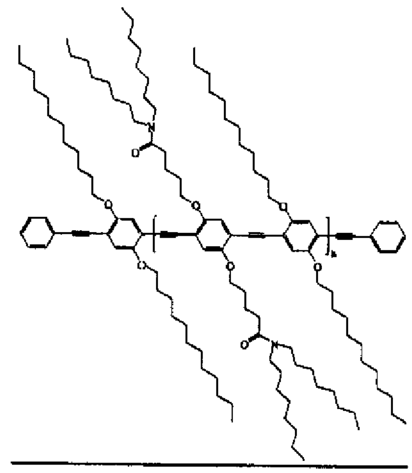
<u>(d)</u> ,
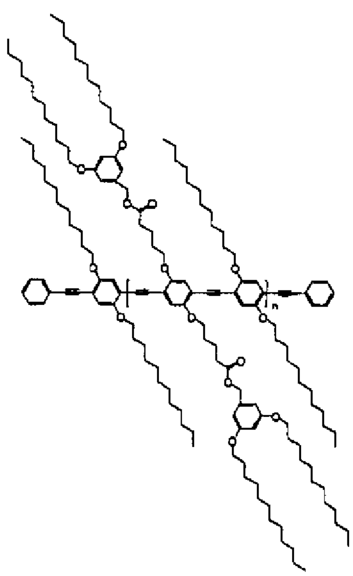
(e) ,
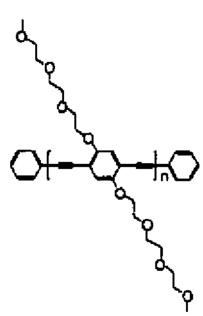
(f) ,
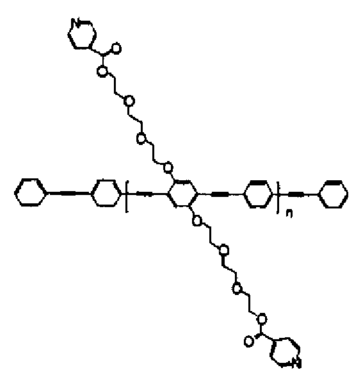
(g) ,

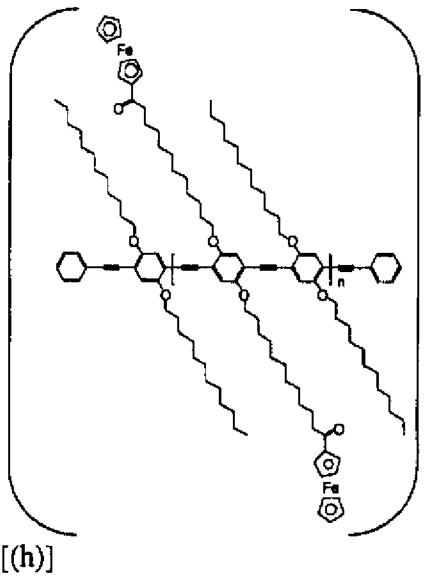
[(h)] ,
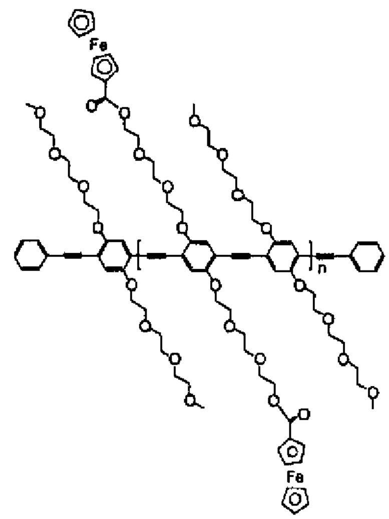
[(i)] (h) ,
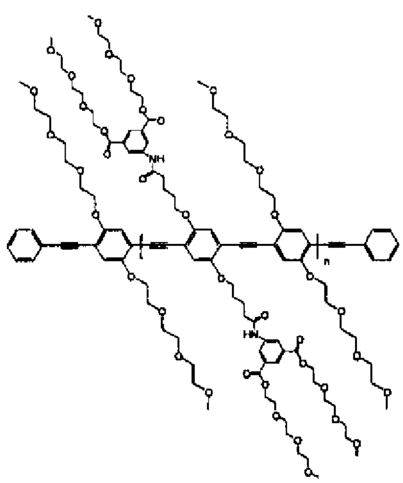
[(j)] (i) ,
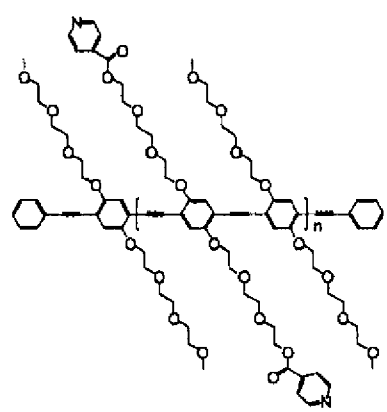
[(k)] (j) ,

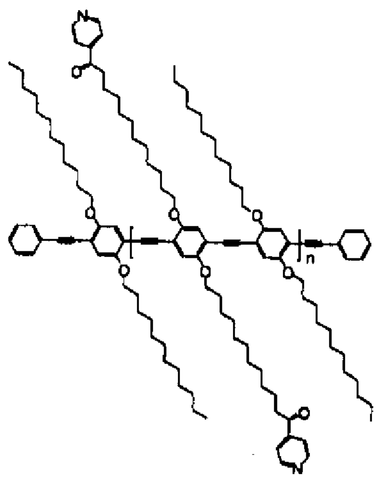
[(l)] (k) ,
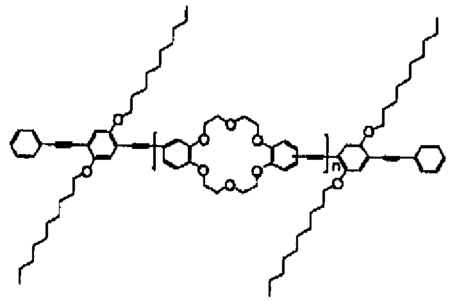
[(m)] (l) ,
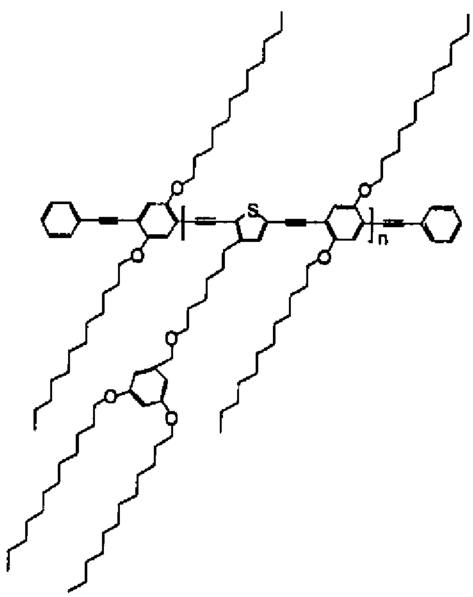
[(n)] (m) ,
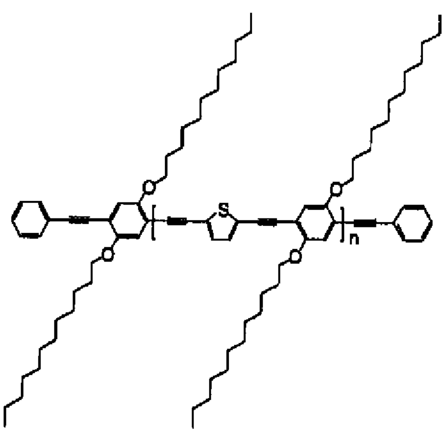
[(o)] (n) ,

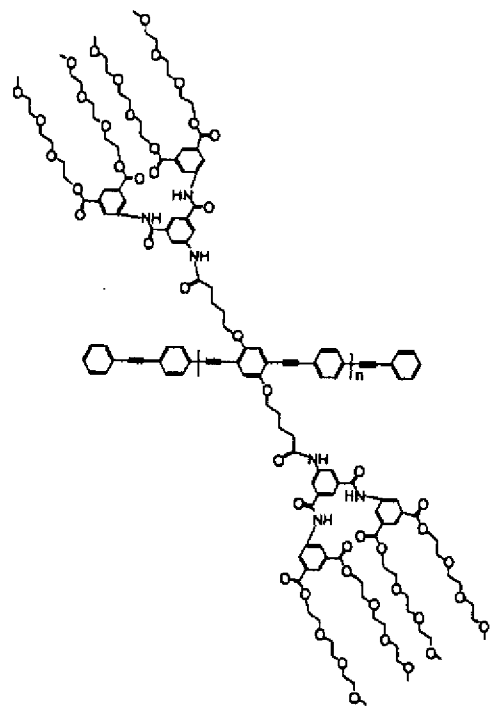
[(p)] (o) ,
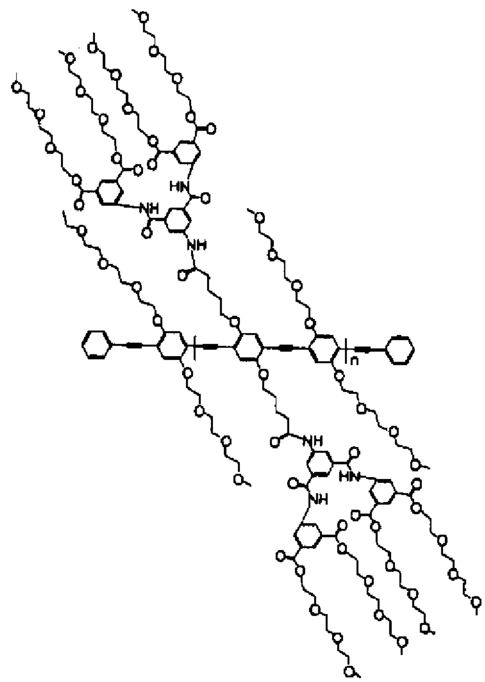
[(q)] (p) ,
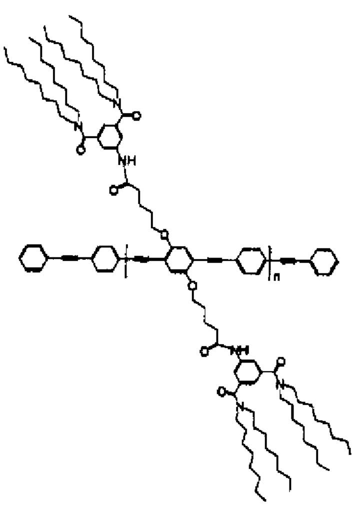
[(r)] (q) ,
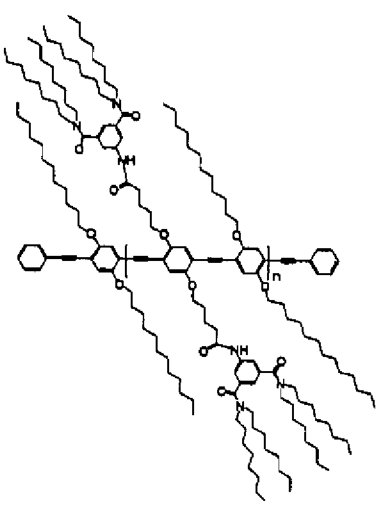
[(s)] (r) ,

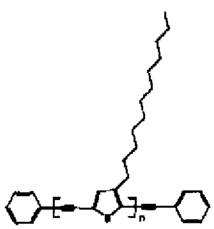
[(t)] (s) ,
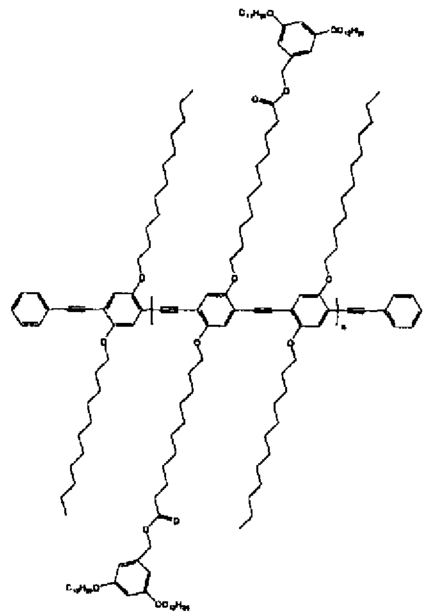
and [(u)] (t) ,

In Columns 107 and 108 and through Column 117, Claim 70 delete the existing formulas and replace with the following formulas:
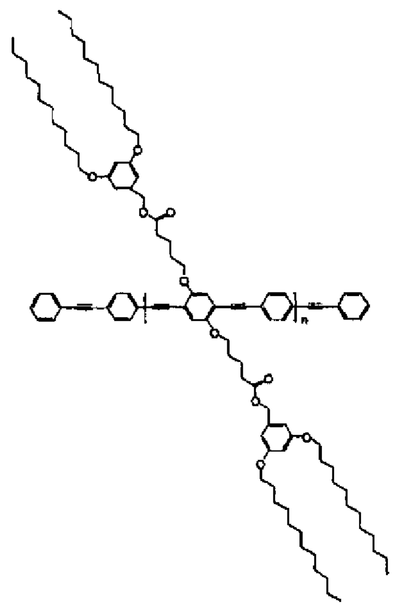
(a) ,
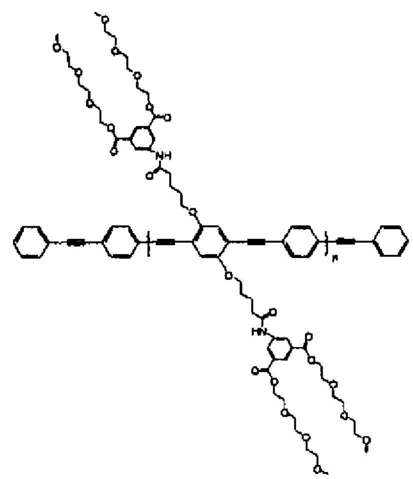
(b) ,

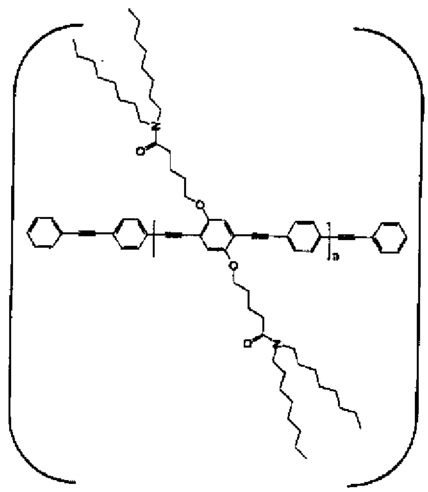
[(c)] ,
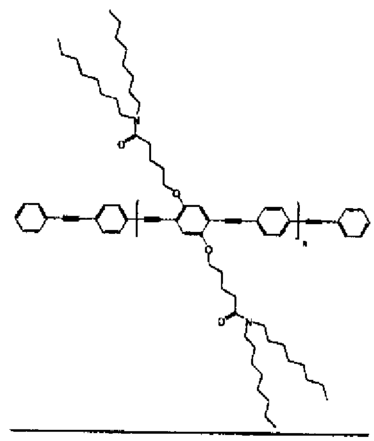
(c) ,
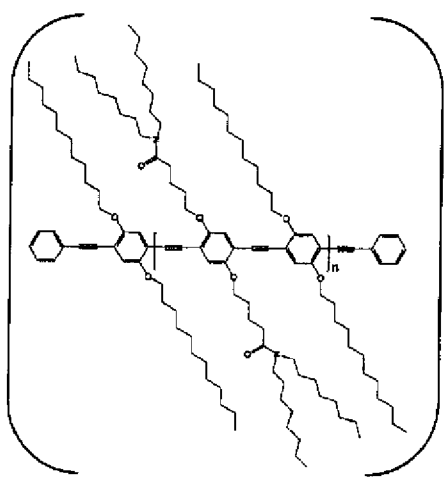
[(d)] ,
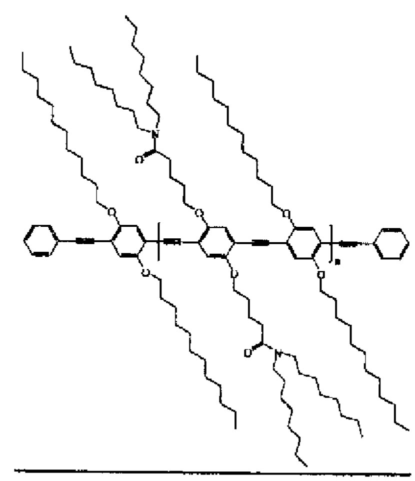
(d) ,

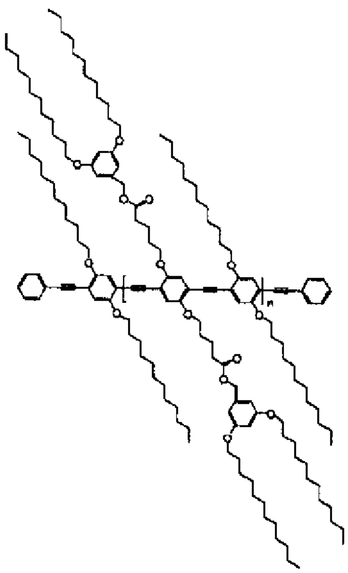
(e) ,
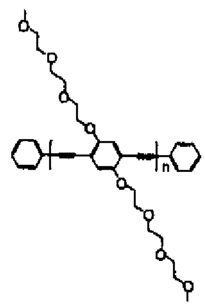
(f) ,
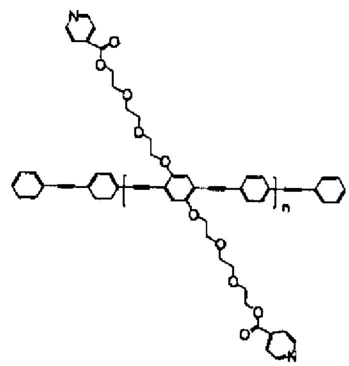
(g) ,
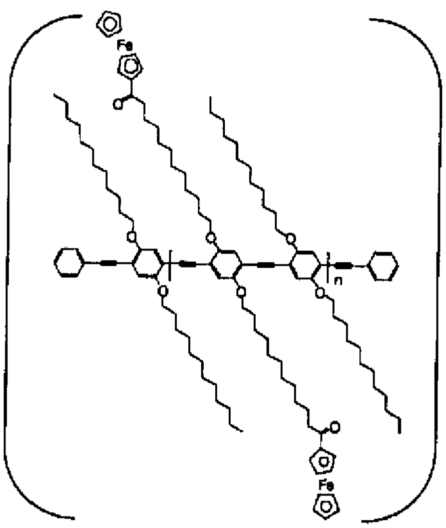
[(h)] ,
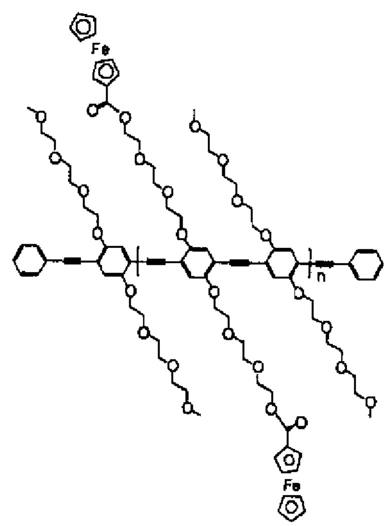
[(i)] <u>(h)</u> ,

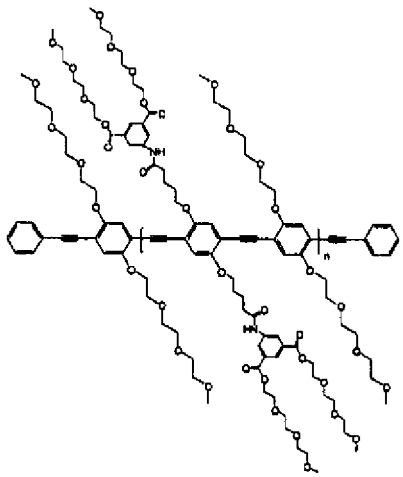
[(j)] (i) ,
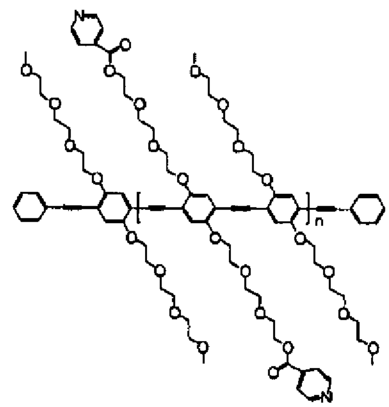
[(k)] (j) ,
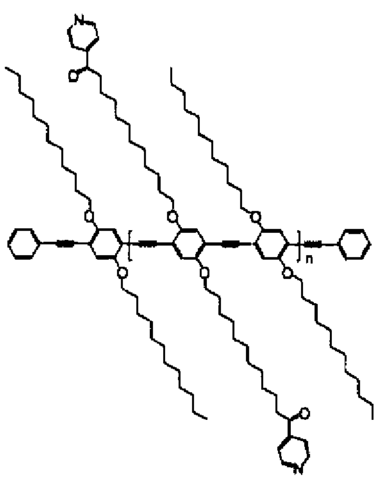
[(l)] (k) ,
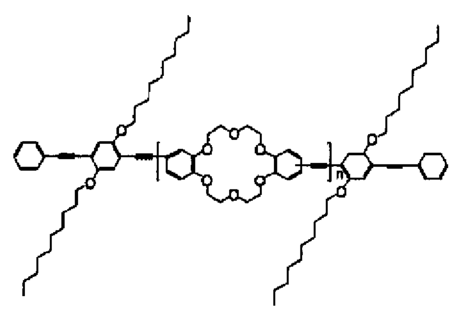
[(m)] (l) ,

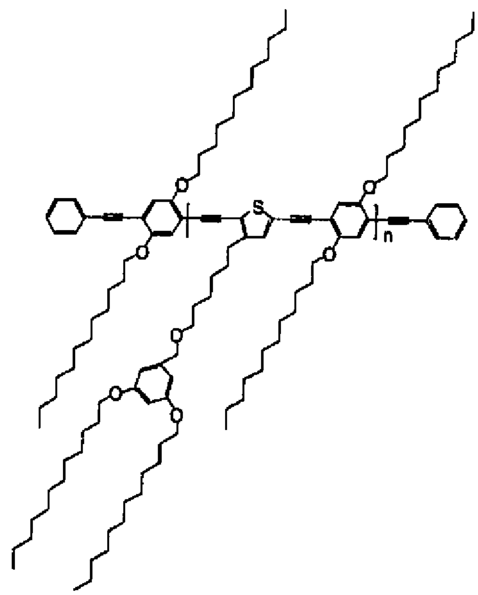
[(n)] (m) ,
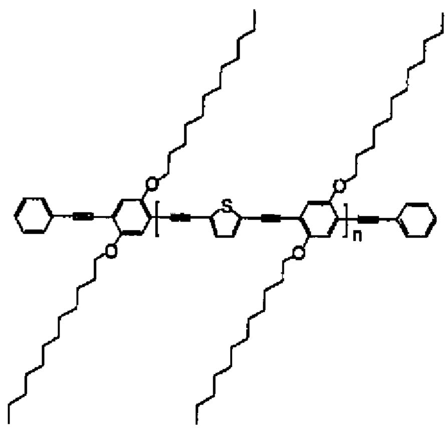
[(o)] (n) ,
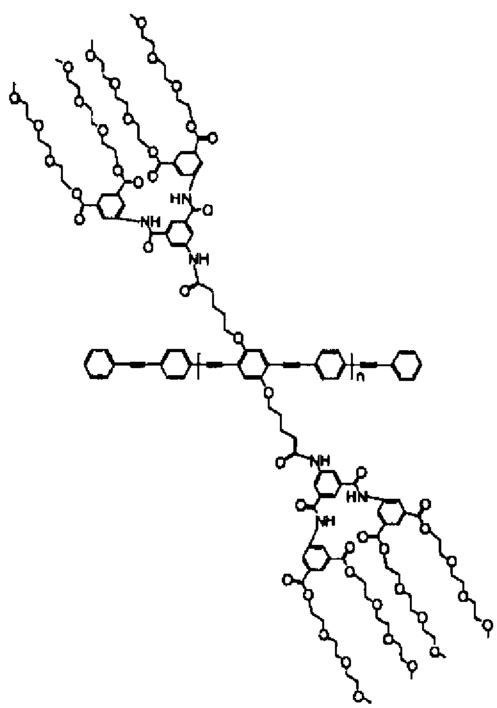
[(p)] (o) ,
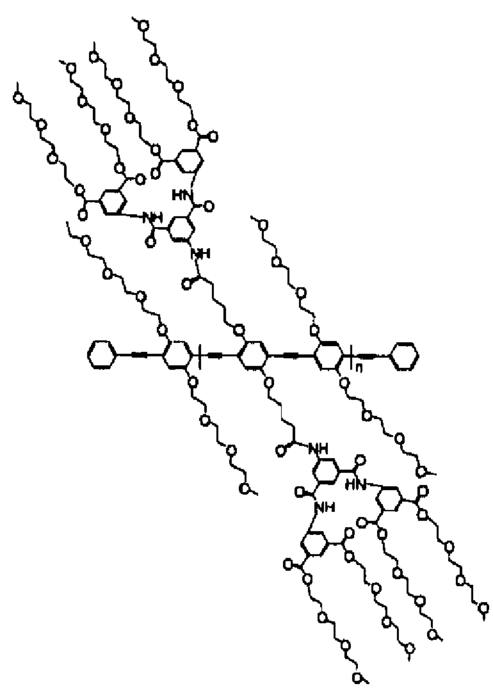
[(q)] (p) ,

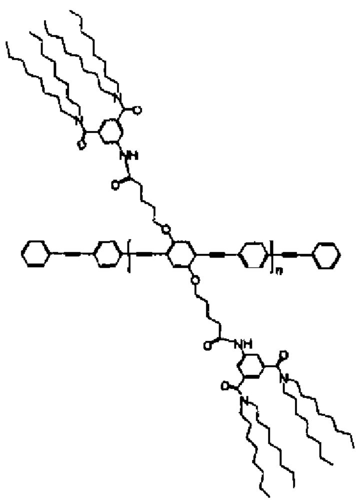
[(r)] (q) ,
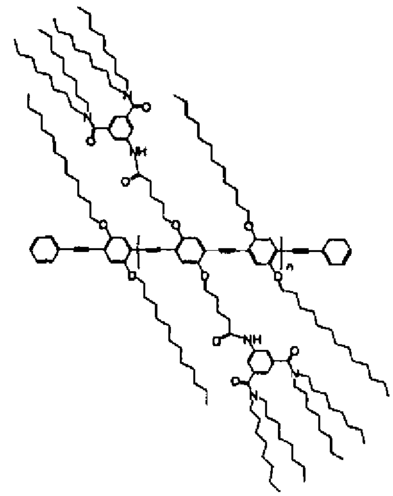
[(s)] (r) ,
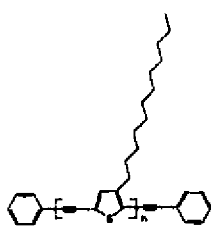
[(t)] (s) ,
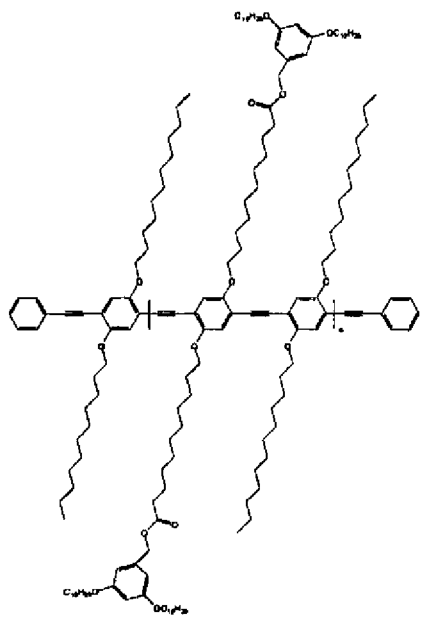
and [(u)] (t) , In Column 118 and through Column 128, Claim 78 delete the existing formulas and replace with the following formulas:
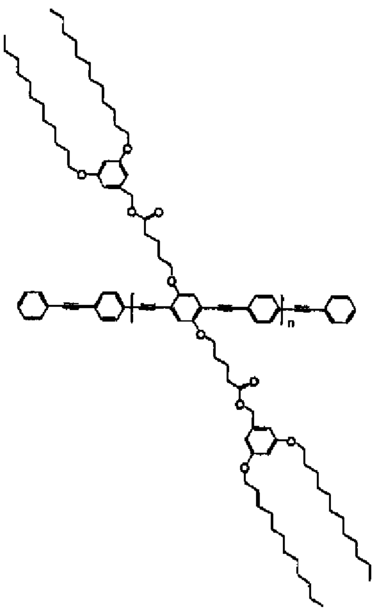
(a) ,
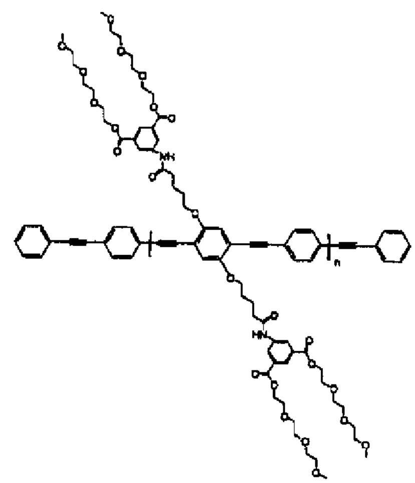
(b) ,
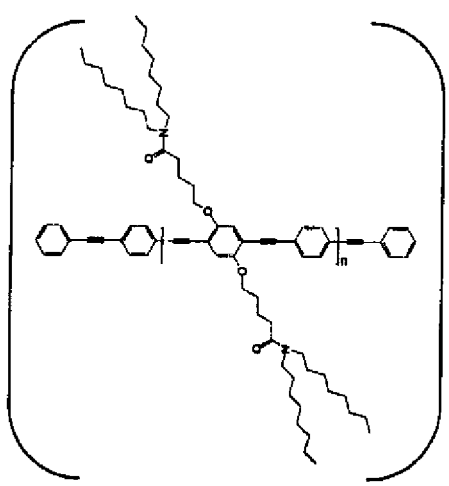
[(c)] ,
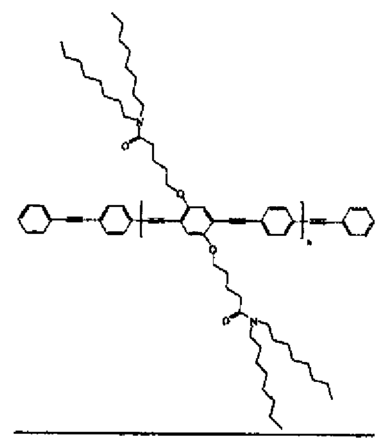
(c) ,

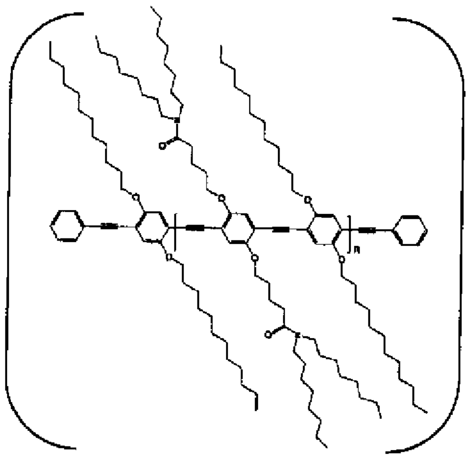
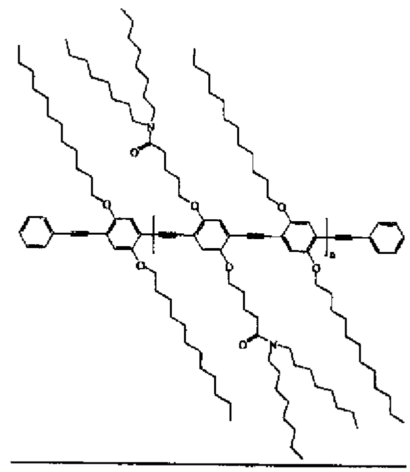
[(d)] , <u>(d)</u> ,
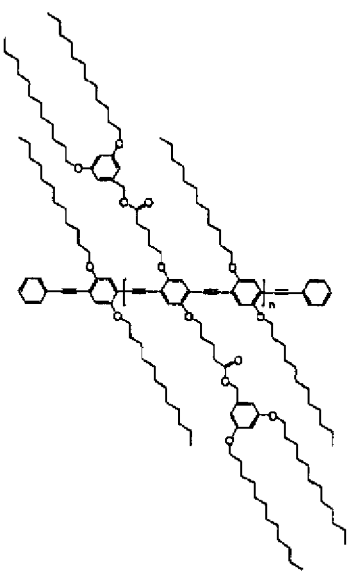
(e) ,
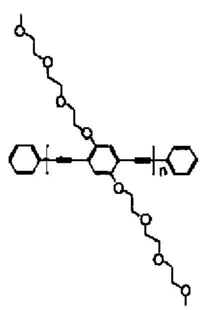
(f) ,
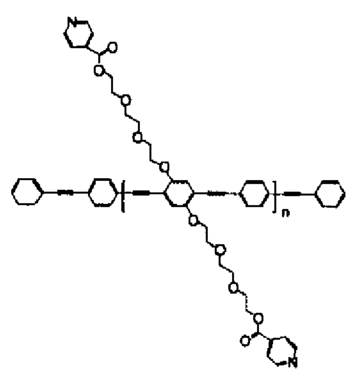
(g) ,

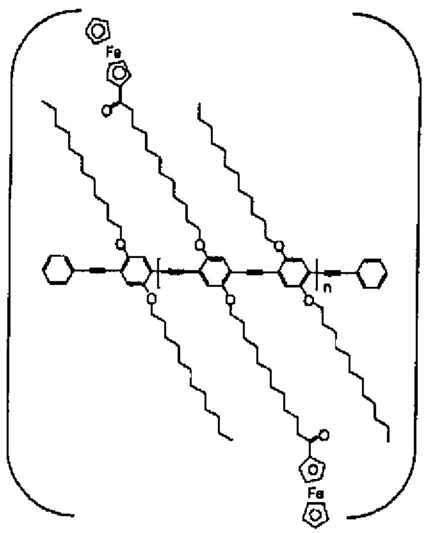
[(h)] ,
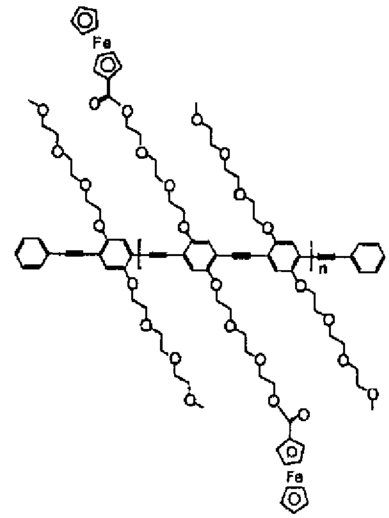
[(i)] (h) ,
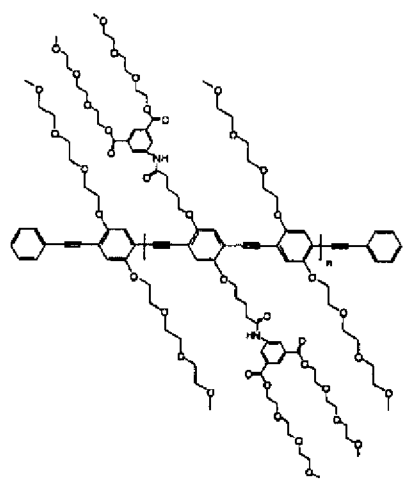
[(j)] (i) ,
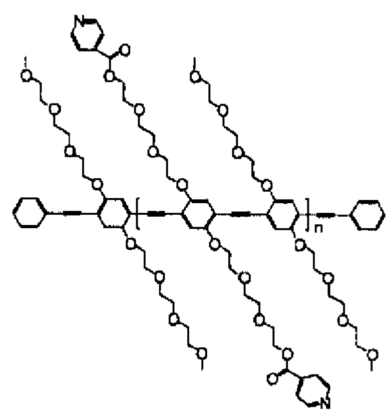
[(k)] (j) ,

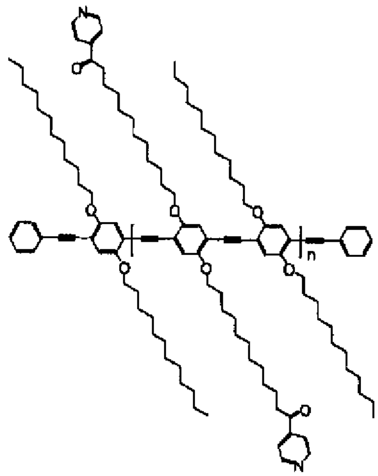
[(l)] (k) ,
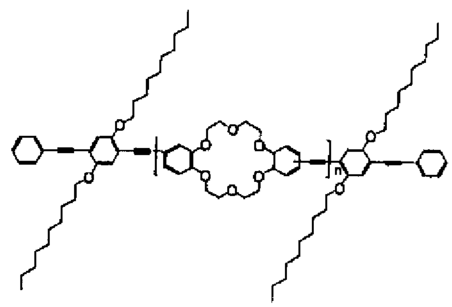
[(m)] (l) ,
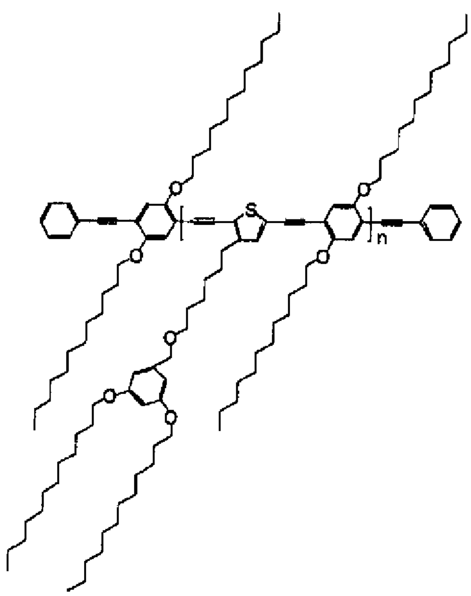
[(n)] (m) ,
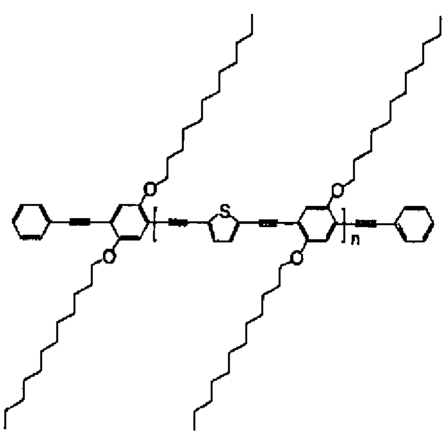
[(o)] (n) ,

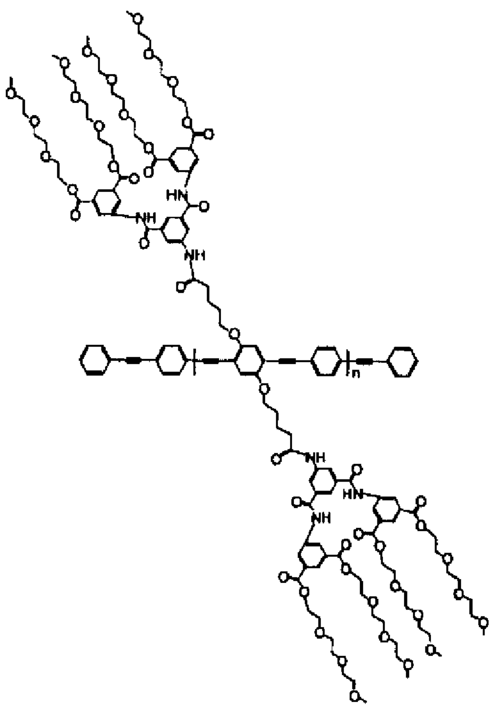
[(p)] (o) ,
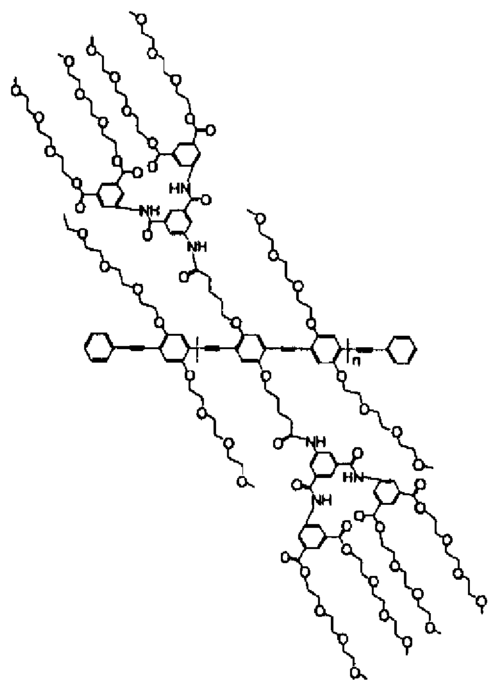
[(q)] (p) ,
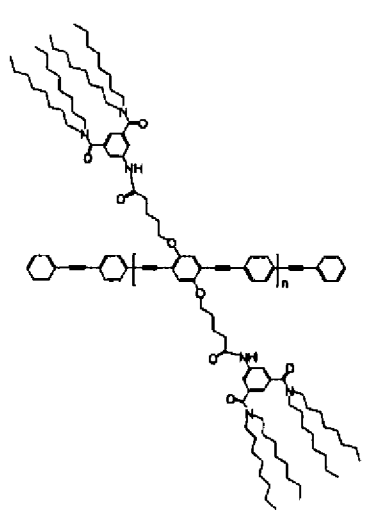
[(r)] (q) ,
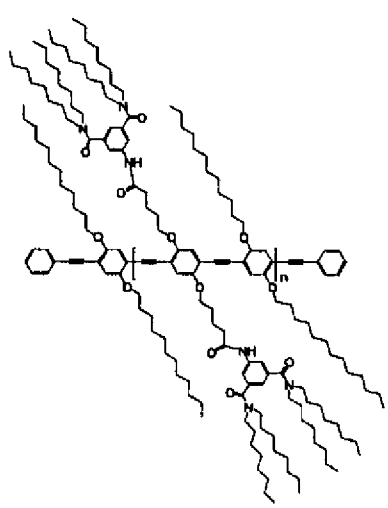
[(s)] (r) ,

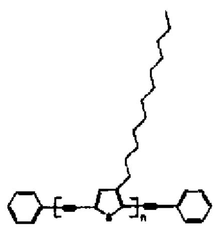
[(t)] (s) ,
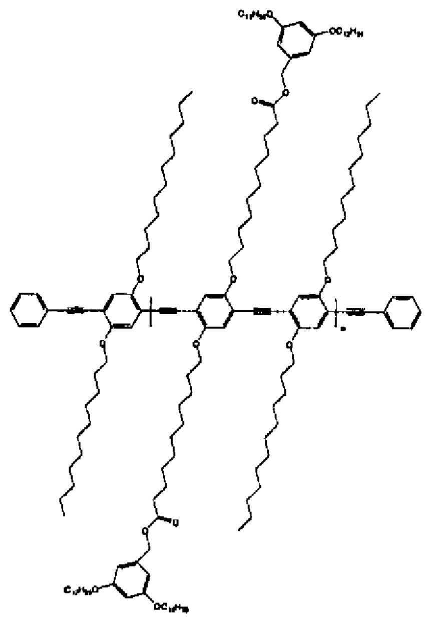
and [(u)] (t) ,

In Column 130 and through Column 140, Claim 93 delete the existing formulas and replace with the following formulas:
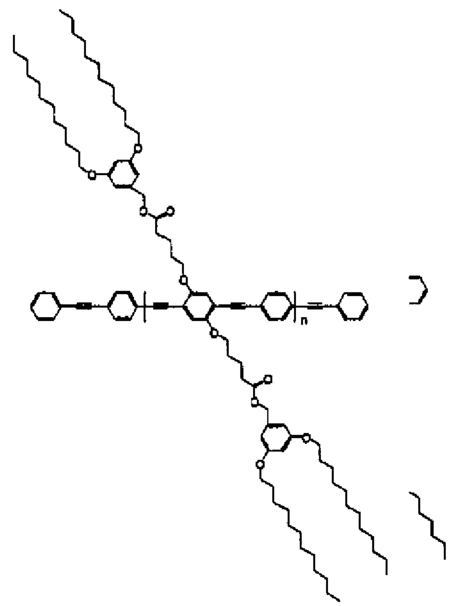
(a) ,
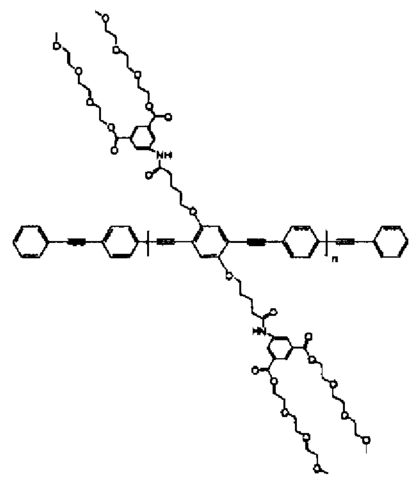
(b) ,
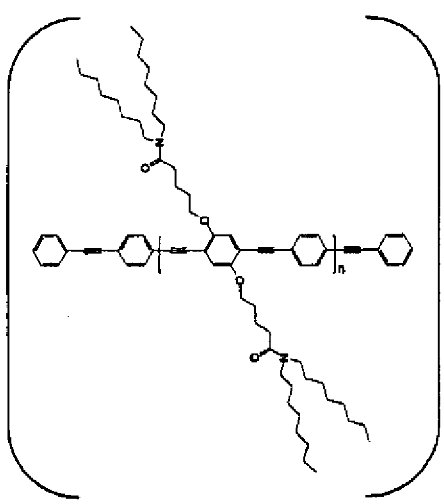
[(c)] ,
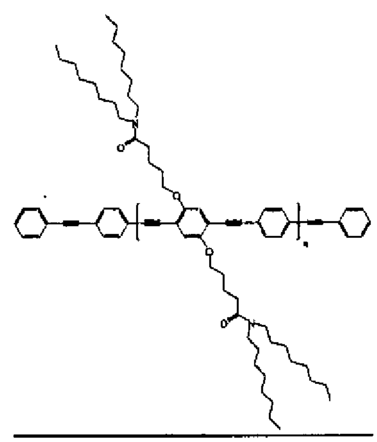
<u>(c)</u> ,

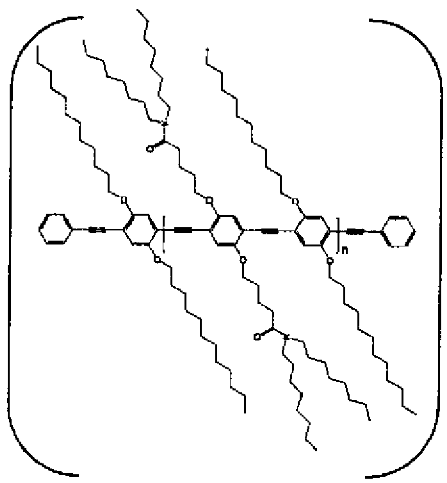
[(d)] ,
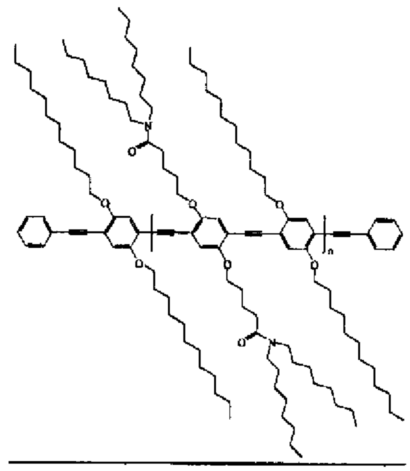
(d) ,
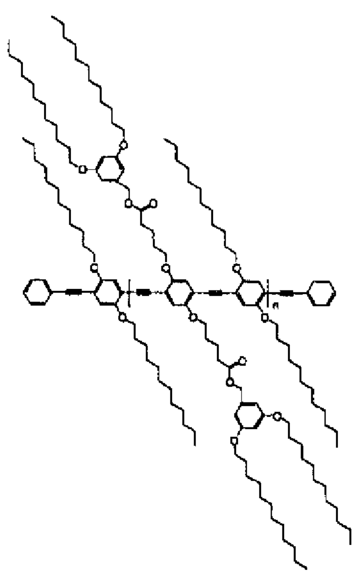
(e) ,
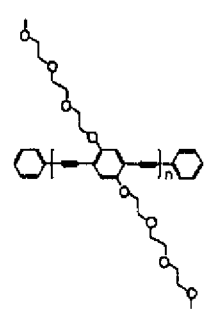
(f) ,
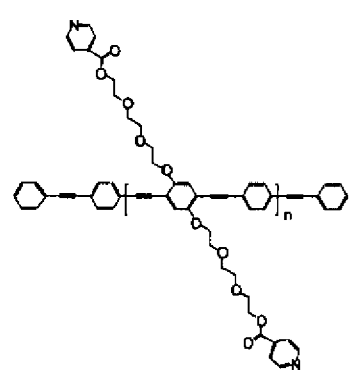
(g) ,

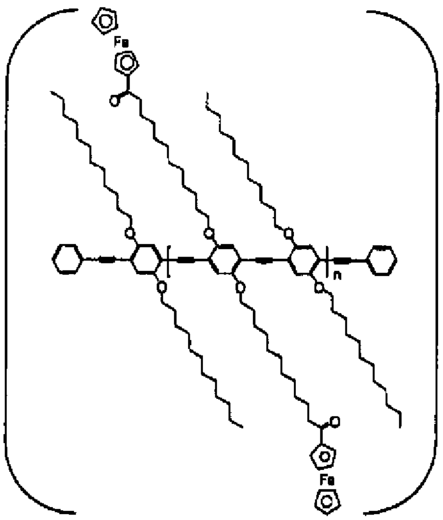
[(h)] ,
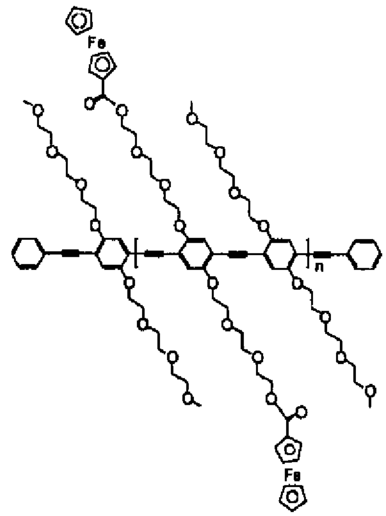
[(i)] (h) ,
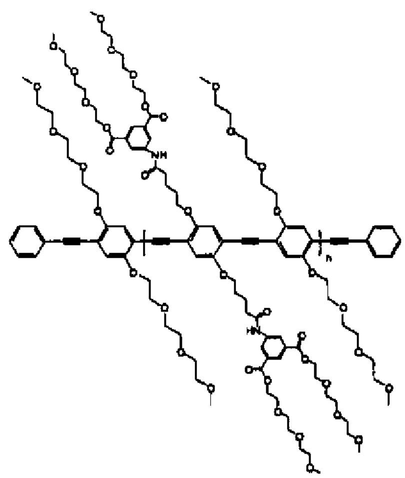
[(j)] (i) ,
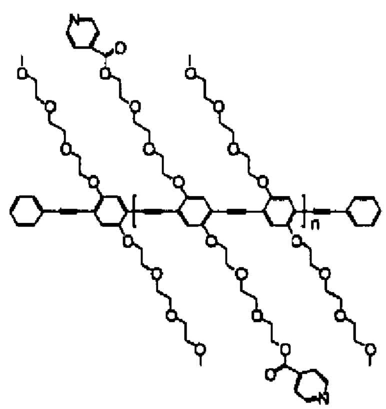
[(k)] (j) ,

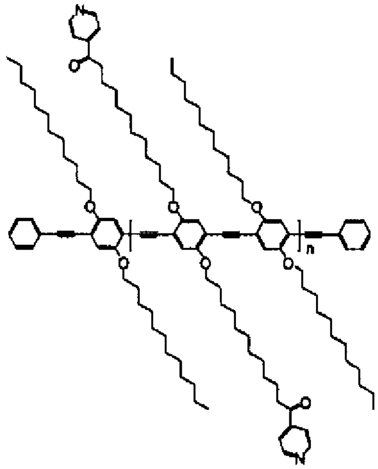
[(l)] (k) ,
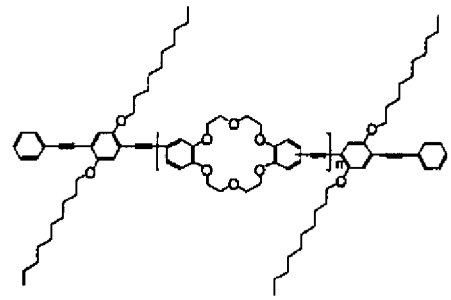
[(m)] (l) ,
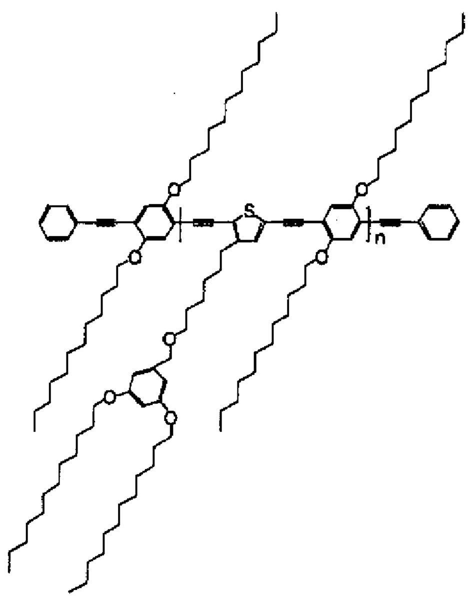
[(n)] (m) ,
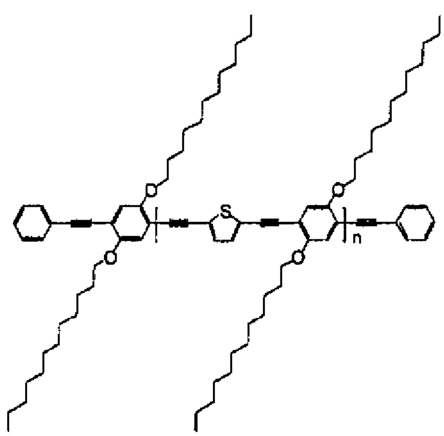
[(o)] (n) ,

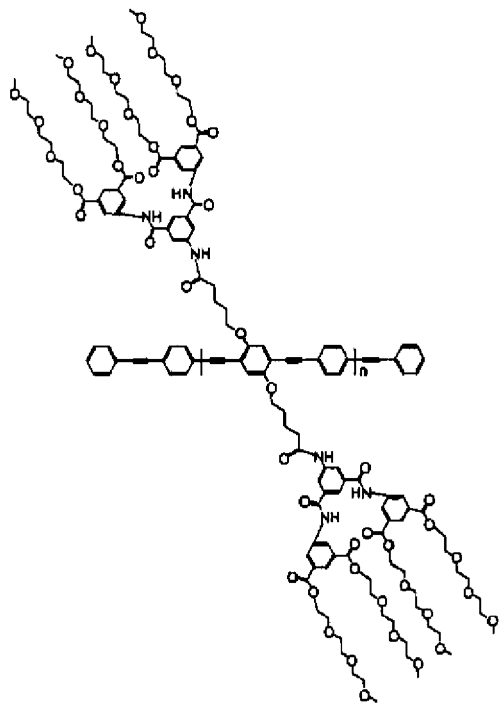
[(p)] (o) ,
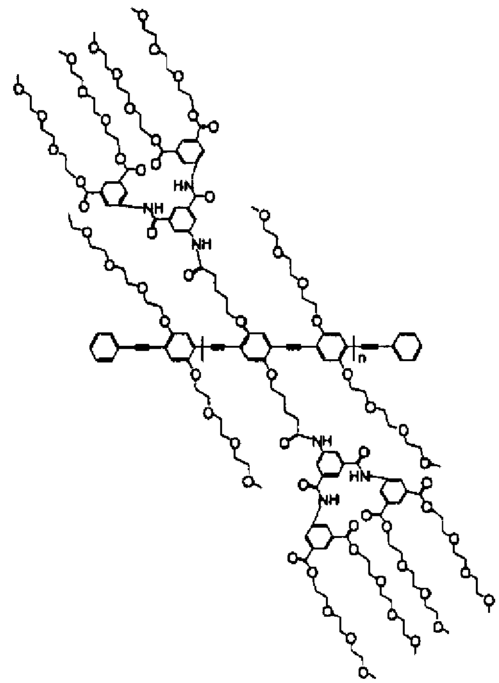
[(q)] (p) ,
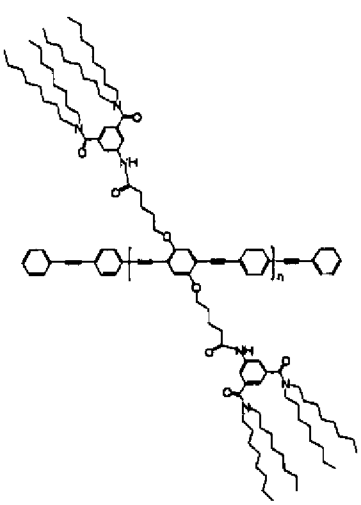
[(r)] (q) ,
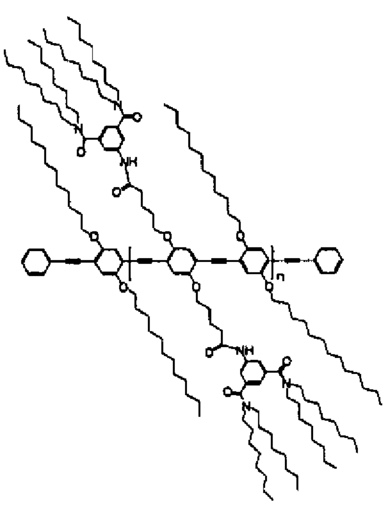
[(s)] (r) ,

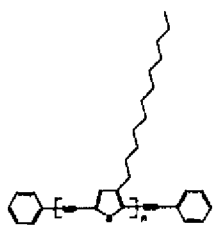

[(t)] (s) ,

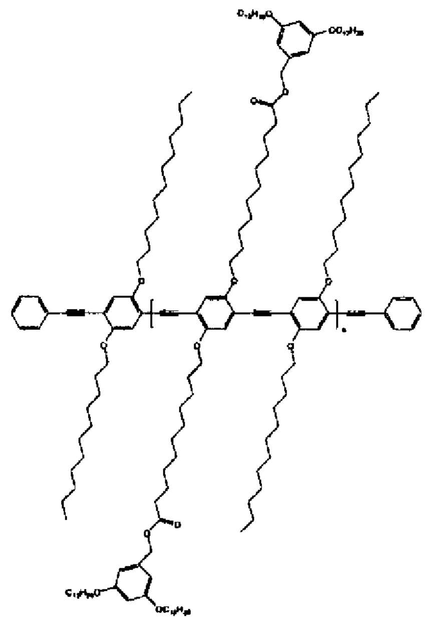

and [(u)] (t) ,

Signed and Sealed this

Twelfth Day of January, 2010

David J. Kappos
*Director of the United States Patent and Trademark Office*